US009054406B2

(12) United States Patent
Ueda et al.

(10) Patent No.: US 9,054,406 B2
(45) Date of Patent: Jun. 9, 2015

(54) NONRECIPROCAL TRANSMISSION LINE APPARATUS HAVING ASYMMETRIC STRUCTURE OF TRANSMISSION LINE

(75) Inventors: Tetsuya Ueda, Kyoto (JP); Hiroyuki Kishimoto, Kyoto (JP)

(73) Assignee: NATIONAL UNIVERSITY CORPORATION KYOTO INSTITUTE OF TECHNOLOGY, Kyoto (JP)

( * ) Notice: Subject to any disclaimer, the term of this patent is extended or adjusted under 35 U.S.C. 154(b) by 50 days.

(21) Appl. No.: 14/001,297

(22) PCT Filed: Feb. 24, 2012

(86) PCT No.: PCT/JP2012/054632
§ 371 (c)(1),
(2), (4) Date: Aug. 23, 2013

(87) PCT Pub. No.: WO2012/115245
PCT Pub. Date: Aug. 30, 2012

(65) Prior Publication Data
US 2013/0321093 A1    Dec. 5, 2013

(30) Foreign Application Priority Data
Feb. 25, 2011    (JP) .................. 2011-040383

(51) Int. Cl.
H01P 1/32    (2006.01)
H01P 1/36    (2006.01)
H03B 5/18    (2006.01)
(Continued)

(52) U.S. Cl.
CPC .. *H01P 1/36* (2013.01); *H01P 1/32* (2013.01); *H03B 5/1852* (2013.01); *H03B 5/1894* (2013.01); *H01Q 1/38* (2013.01);
(Continued)

(58) Field of Classification Search
CPC ..................................... H01P 1/32; H01P 1/36
See application file for complete search history.

(56) References Cited

U.S. PATENT DOCUMENTS
2013/0120217 A1    5/2013 Ueda et al.

FOREIGN PATENT DOCUMENTS
WO    2008/111460    9/2008
WO    2011/024575    3/2011
WO    2012/014984    2/2012

OTHER PUBLICATIONS

English translation of International Preliminary Report on Patentability issued Sep. 6, 2013 in International (PCT) Application No. PCT/JP2012/054632.

(Continued)

*Primary Examiner* — Stephen E Jones
(74) *Attorney, Agent, or Firm* — Wenderoth, Lind & Ponack, L.L.P.

(57) ABSTRACT

A nonreciprocal transmission line apparatus is provided with a cascade connection of unit cells between ports. Each unit cell includes a transmission line part for a microwave signal, and shunt branch circuits equivalently including inductive elements. Each unit cells has spontaneous magnetization or is magnetized by an external magnetic field so as to have gyrotropy by being magnetized in a magnetization direction different from a propagation direction of the transmission line part. In each of the unit cells, the shunt branch circuits includes a first stub conductor formed on one side with respect to a plane composed of the propagation direction and the magnetization direction, and a second stub conductor formed on the other side with respect to the plane, and the stub conductors have different electric length from each other.

37 Claims, 72 Drawing Sheets

(51) Int. Cl.
  *H01Q 1/38* (2006.01)
  *H03H 7/40* (2006.01)
  *H01Q 9/04* (2006.01)
  *H01Q 13/20* (2006.01)

(52) U.S. Cl.
  CPC  *H03H 7/40* (2013.01); *H01Q 9/04* (2013.01); *H01Q 13/206* (2013.01)

(56) References Cited

OTHER PUBLICATIONS

International Search Report issued May 29, 2013 in International Application No. PCT/JP2012/054632.
Tetsuya Ueda et al., "Nonreciprocal Phase-Shift Composite Right/Left Handed Transmission Lines and Their Application to Leaky Wave Antennas", IEEE Transactions on Antennas and Propagation, Vo. 57, No. 7, pp. 1995-2005, Jul. 2009.
Tetsuya Ueda et al., "Nonreciprocal Phase-Shift Composite Right/Left Handed Microstrip Lines Using Ferrite-Rod-Embedded Substrate", IEEE Transactions on Magnetics, vol. 45, No. 10, pp. 4203-4206, Oct. 2009.
Ken Horikawa et al., "Influence of Reflected Waves at a Terminal of Nonreciprocal Phase-Shift CRLH Transmission Lines on the Leaky Wave Radiation", Proceedings of the 2009 Asia-Pacific Microwave Conference, TU3C-5, pp. 1-4, Singapore, Dec. 7-10, 2009.
Atsushi Sanada et al., "Novel Zeroth-Order Resonance in Composite Right/Left Handed Transmission Line Resonators", Proceedings of Asia-Pacific Microwave Conference 2003, pp. 1588-1591, Nov. 2003.
Tetsuya Ueda et al., "Transmission-Line Resonators Using Nonreciprocal Right/Left Handed Transmission Lines", Proceedings of the IEICE general conference, Electronics, C-2-79, Mar. 2008, with partial English translation.
Makoto Tsutsumi et al, "Left-Handed Microstrip Line using Thick Ferrite Substrate and its Application to Tunable Filter", IEICE Technical Report, vol. 108, No. 350, pp. 13-18, MW2008-148, Dec. 2008.

NONRECIPROCAL TRANSMISSION LINE APPARATUS HAVING ASYMMETRIC STRUCTURE OF TRANSMISSION LINE

TECHNICAL FIELD

The present invention relates to a nonreciprocal transmission line apparatus with different forward and backward propagation constants, and relates to an antenna apparatus provided with such a nonreciprocal transmission line apparatus.

BACKGROUND ART

Recently, CRLH (composite right/left-handed) transmission line apparatuses are studied. Conventional composite right/left-handed transmission line apparatuses propagate both a forward wave and a backward wave. In the forward wave (right-handed mode) propagation, the transmission power and the phase flow of electromagnetic waves have the same direction. In the backward wave (left-handed mode) propagation, the transmission power and the phase flow have opposite directions. These two propagation characteristics are selectively changed depending on their different operating bands. On the other hand, in Patent Literature 1, Non-Patent Literatures 1 to 3, and so on, one of the inventors of the present application proposed a nonreciprocal transmission line apparatus operable in a single operating band capable of both forward propagation in the right-handed mode and backward propagation in left-handed mode.

FIG. 117 is a perspective view of a configuration of a conventional nonreciprocal transmission line apparatus as disclosed in Patent Literature 1. The nonreciprocal transmission line apparatus of FIG. 117 comprises:

(a) a substrate, the substrate comprising: a ferrite substrate 10F, a dielectric substrate 10, and a ground conductor 11, the ferrite substrate 10F having a magnetization $M_s$ due to its spontaneous magnetization or an external magnetic field in a direction perpendicular to a surface of the substrate, the dielectric substrate 10 made of, for example, glass epoxy resin or the like, the ferrite substrate 10F and the dielectric substrate 10 connected side by side along a boundary portion between them, and the ground conductor 11 provided on the back surfaces of the ferrite substrate 10F and the dielectric substrate 10;

(b) a microstrip line 12A formed on the boundary portion of the substrate;

(c) a plurality of capacitors C, each connecting a pair of adjacent strip conductors 12 of a plurality of strip conductors 12, the plurality of strip conductors 12 forming a microstrip line 12A; and (d) a plurality of short-circuit stub conductors 13, each connecting a strip conductor 12 to the ground conductor 11.

Thus, the nonreciprocal transmission line apparatus of FIG. 117 includes a cascade connection of unit cells of the transmission line between ports P1 and P2, each of the unit cells having a series branch circuit including an equivalent capacitive element, and a shunt branch circuit including an equivalent inductive element, each of the unit cells having gyrotropic characteristic by being magnetized in a magnetization direction different from a propagation direction of a microwave, each of the unit cells having an asymmetric structure with respect to a plane composed of the propagation direction and the magnetization direction, each of the unit cells being set with a propagation constant and an operating frequency on dispersion curves representing a relation between the propagation constant and the operating frequency, so as to have nonreciprocal phase characteristics with different forward and backward propagation constants.

CITATION LIST

Patent Literature

Patent Literature 1: PCT International Publication WO2008/111460.

Non-Patent Literature

Non-Patent Literature 1: T. Ueda, K. Horikawa, M. Akiyama, M. Tsutsumi, "Nonreciprocal phase-shift composite right/left handed transmission lines and their application to leaky wave antennas", IEEE Transactions on Antennas and Propagation, vol. 57, no. 7, pp. 1995-2005, July 2009.

Non-Patent Literature 2: T. Ueda, M. Akiyama, "Nonreciprocal phase-shift composite right/left handed microstrip lines using ferrite-rod-embedded substrate", IEEE Transactions on Magnetics, vol. 45, no. 10, pp. 4203-4206, October 2009.

Non-Patent Literature 3: K. Horikawa, T. Ueda, M. Akiyama, "Influence of reflected waves at a terminal of non-reciprocal phase-shift CRLH transmission lines on the leaky wave radiation," Proceedings of the 2009 Asia-Pacific Microwave Conference, TU3C-5, pp. 1-4, Singapore, December 7-10, 2009.

Non-Patent Literature 4: A. Sanada et al., "Novel zeroth-order resonance in composite right/left-handed transmission line resonators", Proceedings of Asia-Pacific Microwave Conference 2003, pp. 1588-1591, November 2003.

Non-Patent Literature 5: T. Ueda, "Transmission-Line Resonators Using Nonreciprocal Right/Left Handed Transmission Lines", Proceedings of the IEICE general conference, Electronics, C-2-79, March 2008.

SUMMARY OF INVENTION

Technical Problem

In order to achieve the nonreciprocal transmission line apparatus, a material and a structure that exhibit gyrotropy are used in combination with the asymmetry of the transmission line structure. According to the conventional nonreciprocal transmission line apparatuses, the asymmetry of the transmission line structure is obtained mainly from a difference of the substrate material (a ferrite substrate 10F is used on the +X side of the microstrip line 12A, and a dielectric substrate 10 is used on the −X side of the microstrip line 12A), and other parameters relevant to the constituent elements of the nonreciprocal transmission line apparatus are not considered. Therefore, it is desired to provide a novel principle for achieving an asymmetric line structure.

Moreover, according to the conventional nonreciprocal transmission line apparatuses, it is assumed that soft magnetic material, i.e., ferrite is used as a gyrotropic material, the strength of an external DC magnetic field applied to the ferrite is changed to control the degree of nonreciprocity. The strength and the direction of an external DC magnetic field are controlled by mechanically moving a permanent magnet, or by controlling the intensity of a current flowing through an electromagnet. However, the mechanical moving means has problems of a slow working speed and an increased device size. On the other hand, the electromagnet has a problem of an increased power consumption, because of the current control.

Therefore, it is desired to provide a method for controlling the nonreciprocity using the voltage control with a relatively small power consumption.

An object of the present invention is to solve the aforementioned problems, and to provide a nonreciprocal transmission line apparatus having an asymmetric line structure based on a novel principle, the nonreciprocal transmission line apparatus capable of controlling the nonreciprocity with a small power consumption, and to provide an antenna apparatus provided with such a nonreciprocal transmission line apparatus.

Solution to Problem

According to a first aspect of a nonreciprocal transmission line apparatus of the present invention, a nonreciprocal transmission line apparatus has forward and backward propagation constants different from each other. The nonreciprocal transmission line apparatus is provided with a cascade connection of at least one unit cell between first and second ports, each of the at least one unit cell is provided with a transmission line part for a microwave signal, and first and second shunt branch circuits, each of the first and second shunt branch circuits is branched from the transmission line part and equivalently include an inductive element. Each of the at least one unit cell has spontaneous magnetization or is magnetized by an external magnetic field so as to have gyrotropy by being magnetized in a magnetization direction different from a propagation direction of the transmission line part. In each of the at least one unit cell, the first shunt branch circuit is formed on one side with respect to a plane composed of the propagation direction and the magnetization direction, and the second shunt branch circuit is formed on the other side with respect to the plane, and an impedance of the first shunt branch circuit seen from the transmission line part is different from an impedance of the second shunt branch circuit seen from the transmission line part.

In the nonreciprocal transmission line apparatus, each of the at least one unit cell further is provided with a series branch circuit inserted in series with the transmission line part and equivalently including a capacitive element.

In the nonreciprocal transmission line apparatus, each of the at least one unit cell is provided with: a ground conductor; and a magnetic rod provided between the transmission line part and the ground conductor.

In the nonreciprocal transmission line apparatus, each of the at least one unit cell is provided with: a magnetic material substrate having first and second surfaces; and a ground conductor provided on the first surface of the magnetic material substrate. The transmission line part, and the first and second shunt branch circuits are provided on the second surface of the magnetic material substrate.

In the nonreciprocal transmission line apparatus, the first and second shunt branch circuits are stub conductors having electrical lengths different from each other.

In the nonreciprocal transmission line apparatus, the first and second shunt branch circuits are stub conductors, each stub conductor including a phase shifter, and the impedances of the first and second shunt branch circuits are changed by controlling voltages applied to the phase shifters.

In the nonreciprocal transmission line apparatus, each of the at least one unit cell further is provided with: a first dielectric substrate provided between the first shunt branch circuit and the ground conductor; a first electrode provided on a surface of the first dielectric substrate, the surface being opposite to the ground conductor; a second dielectric substrate provided between the second shunt branch circuit and the ground conductor; and a second electrode provided on a surface of the second dielectric substrate, the surface being opposite to the ground conductor. The impedances of the first and second shunt branch circuits are changed by controlling a first voltage applied between the first electrode and the ground conductor, and controlling a second voltage applied between the second electrode and the ground conductor.

In the nonreciprocal transmission line apparatus, the first and second shunt branch circuits are short-circuited stubs.

In the nonreciprocal transmission line apparatus, the first and second shunt branch circuits are open stubs.

In the nonreciprocal transmission line apparatus, the transmission line part of each of the at least one unit cell is a microstrip line.

In the nonreciprocal transmission line apparatus, a propagation constant and an operating frequency are set in dispersion curves indicative of a relation between propagation constants and operating frequencies, so that forward power transmission occurs as right-handed transmission and backward power transmission occurs as left-handed transmission at a predetermined operating frequency.

In the nonreciprocal transmission line apparatus, a propagation constant and an operating frequency are set in dispersion curves indicative of a relation between propagation constants and operating frequencies, so that forward power transmission occurs as left-handed or right-handed transmission and backward power transmission occurs with zero propagation constant and infinite guide wavelength at a predetermined operating frequency.

In the nonreciprocal transmission line apparatus, the nonreciprocal transmission line apparatus is a microwave phase shifter for shifting a phase by a predetermined amount of phase shift, the microwave phase shifter being configured by setting a propagation constant and an operating frequency in dispersion curves indicative of a relation between propagation constants and operating frequencies.

In the nonreciprocal transmission line apparatus, the nonreciprocal transmission line apparatus is a microwave resonator satisfying $\beta_+ = -\beta_- \neq 0$, where $\beta_+$ denotes the forward propagation constant as a first mode, and $\beta_-$ denotes the backward propagation constant as a second mode.

The nonreciprocal transmission line apparatus is further provided with a coupling transmission line provided to be coupled to the nonreciprocal transmission line apparatus, the nonreciprocal transmission line apparatus is operable as a microwave filter.

The nonreciprocal transmission line apparatus is further provide with a negative resistance element provided to be coupled to the nonreciprocal transmission line apparatus, the nonreciprocal transmission line apparatus is operable as a microwave oscillator.

The nonreciprocal transmission line apparatus is further provided with a feeding transmission line provided to be coupled to the nonreciprocal transmission line apparatus, the nonreciprocal transmission line apparatus is operable as a microwave antenna apparatus.

The nonreciprocal transmission line apparatus is further provided with: a feeding transmission line provided to be coupled to the nonreciprocal transmission line apparatus, and a plurality of branching transmission lines provided to be coupled to the nonreciprocal transmission line apparatus. The nonreciprocal transmission line apparatus is operable as a microwave power divider.

In the nonreciprocal transmission line apparatus, the capacitive element is a microwave element having a negative effective permeability for an electromagnetic wave mode propagation along the transmission line, and the inductive element is a microwave element a negative effective permittivity for the electromagnetic wave mode of propagation through the transmission line.

According to a second aspect of an antenna apparatus of the present invention, the antenna apparatus is provided with the nonreciprocal transmission line apparatus. When a microwave signal propagates in a predetermined propagation direction of the nonreciprocal transmission line apparatus at a predetermined operating frequency, the nonreciprocal transmission line apparatus radiates an electromagnetic wave with a radiation pattern having a main beam of a leaky wave in a direction substantially the same as the propagation direction, and radiates an electromagnetic wave with a radiation pattern having a main beam of a leaky wave in a direction substantially opposite to or substantially perpendicular to the propagation direction. The antenna apparatus is further provided with: control means being configured to: input a microwave signal to at least one of a first port and a second port of the nonreciprocal transmission line apparatus, make the nonreciprocal transmission line apparatus operate as a forward transmission line or a backward transmission line at a predetermined operating frequency, and control at least one of an amplitude and a phase of the inputted microwave signal using nonreciprocity of the nonreciprocal transmission line apparatus, so as to form a main beam including a leaky wave from the nonreciprocal transmission line apparatus as a radiation wave.

In the antenna apparatus, the control means is configured to: input the microwave signal to the first port and the second port of the nonreciprocal transmission line apparatus, and control at least one of the amplitude and the phase of the inputted microwave signal, so as to form the main beam of the radiation wave.

In the antenna apparatus, the control means is configured to: input the microwave signal to the first port, control at least one of the amplitude and the phase of the inputted microwave signal, and reflect a forward wave at the second port, so as to form the main beam of the radiation wave.

In the antenna apparatus, the control means is configured to: input the microwave signal to the second port, control at least one of the amplitude and the phase of the inputted microwave signal, and reflect a backward wave at the first port, so as to form the main beam of the radiation wave.

In the antenna apparatus, the control means is configured to: selectively input the microwave signal to the first port and the second port of the nonreciprocal transmission line apparatus, and control at least one of the amplitude and the phase of the inputted microwave signal, so as to form the main beam of the radiation wave.

According to a third aspect of a nonreciprocal transmission line apparatus of the present invention, the nonreciprocal transmission line apparatus operates as a microwave resonator. Each unit cell of the nonreciprocal transmission line apparatus has such a circuit configuration that the nonreciprocal transmission line apparatus has a predetermined phase constant in dispersion curves indicative of a relation between an operating frequency of a microwave signal inputted to the nonreciprocal transmission line apparatus and a phase constant of the nonreciprocal transmission line apparatus. The nonreciprocal transmission line apparatus further is provided with: a first reflective impedance circuit connected to the first port, and having a first impedance seen from the first port at a predetermined operating frequency, and a second reflective impedance circuit connected to the second port, and having a second impedance seen from the first port at the operating frequency. The first impedance is a complex number having substantially no real part. The second impedance is a complex number having substantially no real part and substantially conjugate with the first impedance.

In the nonreciprocal transmission line apparatus, each unit cell of the nonreciprocal transmission line apparatus has such a circuit configuration that the nonreciprocal transmission line apparatus has such a propagation constant in the dispersion curves that forward power transmission occurs as right-handed transmission and backward power transmission occurs as left-handed transmission at the operating frequency.

In the nonreciprocal transmission line apparatus, each unit cell of the nonreciprocal transmission line apparatus has such a circuit configuration that the nonreciprocal transmission line apparatus has such a propagation constant in the dispersion curves that forward power transmission occurs as left-handed transmission and backward power transmission occurs as right-handed transmission at the operating frequency.

In the nonreciprocal transmission line apparatus, each unit cell of the nonreciprocal transmission line apparatus has such a circuit configuration that the nonreciprocal transmission line apparatus has such a propagation constant in the dispersion curves that both forward and backward power transmissions occur with the microwave signal having zero phase constant at the operating frequency.

In the nonreciprocal transmission line apparatus, the capacitive element is a microwave element having a negative effective permeability for an electromagnetic wave mode propagation along the transmission line, and the inductive element is a microwave element a negative effective permittivity for the electromagnetic wave mode of propagation through the transmission line.

According to a fourth aspect of an antenna apparatus of the present invention, the antenna apparatus is provided with the nonreciprocal transmission line apparatus of the third aspect of the present invention, the antenna apparatus is further provided with a feeding circuit connected to one of the first reflective impedance circuit and the second reflective impedance circuit, the feeding circuit being configured to supply a microwave signal to the nonreciprocal transmission line apparatus.

According to a fifth aspect of an antenna apparatus of the present invention, the antenna apparatus is provided with the nonreciprocal transmission line apparatus of the third aspect of the present invention, the antenna apparatus is further provided with a feeding circuit connected to one of the first reflective impedance circuit and the second reflective impedance circuit, the feeding circuit being configured to output a microwave signal received by the nonreciprocal transmission line apparatus.

In the antenna apparatus, the first reflective impedance circuit is provided with first impedance changing means being configured to change the first impedance. The second reflective impedance circuit is provided with second impedance changing means being configured to change the second impedance. The antenna apparatus further is provided with: received power detecting means being configured to detect a received power of the outputted microwave signal, and control means being configured to control the first and second impedance changing means so as to maximize the received power based on the detected received power. The changes in the first and second impedances result in a change in the polarization direction of the antenna apparatus.

In the antenna apparatus, the first and second impedances change discretely.

In the antenna apparatus, the first and second impedances change continuously.

In the antenna apparatus, each of the first and second reflective impedance circuits is provided with a varactor diode and an inductor.

In the antenna apparatus, each of the first and second reflective impedance circuits is provided with a phase shifter and a transmission line.

In the antenna apparatus, the first and second shunt branch circuits includes a phase shifter, and impedances of the first and second shunt branch circuits are changed by controlling voltages applied to the phase shifters. The changes in the impedances of the first and second shunt branch circuits result in a change in the radiation direction of the antenna apparatus.

Advantageous Effects of Invention

According to the nonreciprocal transmission line apparatus of the present invention, it is possible to obtain an asymmetric line structure based on a novel principle, and control the nonreciprocity with a small power consumption. Moreover, according to the present invention, it is possible to provide an antenna apparatus provided with such a nonreciprocal transmission line apparatus.

Moreover, according to the present invention, it is possible to change the degree of nonreciprocity of the nonreciprocal transmission line apparatus by changing a voltage applied to the phase shifter of the nonreciprocal transmission line apparatus, and thus, it is possible to provide a steerable antenna apparatus having a variable radiation angle.

Moreover, according to the present invention, it is possible to provide a transmission line resonator operable as a novel zeroth-order traveling wave resonator capable of achieving a series resonance state and a shunt resonance state, and further achieving their mixed state.

DESCRIPTION OF EMBODIMENTS

Figure 1:
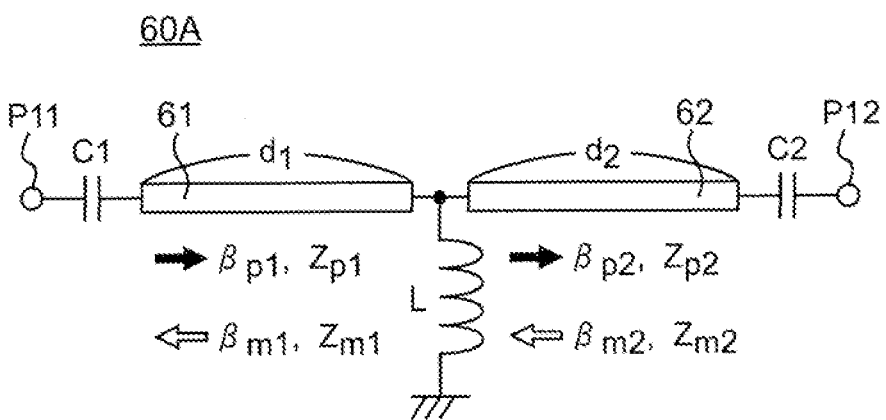
FIG. 1 is an equivalent circuit diagram of a unit cell 60A of a first exemplary transmission line as a nonreciprocal transmission line apparatus according to a first embodiment of the present invention.

Embodiments of the present invention will be described below with reference to the drawings. In the following embodiments, like components are denoted by the same reference signs.

First Embodiment

First, the fundamental configuration and the operation principle of the nonreciprocal transmission line apparatus according to the present invention are described below with reference to FIGS. 1 to 12. Mathematical expressions indicated in the present specification are respectively identified by parenthesized numbers each positioned after a mathematical formula.

A nonreciprocal transmission line apparatus according to an embodiment of the present invention is configured by cascade connecting a plurality of unit cells of a transmission line. FIGS. 1 to 4 are equivalent circuit diagrams of unit cells 60A to 60D of exemplary transmission lines as a nonreciprocal transmission line apparatus according to a first embodiment of the present invention. Each of the unit cell is configured to include a transmission line part having a nonreciprocal phase shift characteristic of different forward and backward propagation constants, and configured such that a capacitive element is equivalently inserted in a series branch circuit and an inductive element is equivalently inserted in a shunt branch circuit (See FIGS. 1 to 4). The circuit or apparatus, to which the configuration of the nonreciprocal transmission line apparatus according to the present invention can be applied, includes: printed board circuits, waveguides, and dielectric lines for use in microwave, millimeter wave, sub-millimeter wave, or terahertz wave, such as strip lines, microstrip lines, slot lines, and coplanar lines; and further includes: all sorts of configurations supporting a waveguide mode or an evanescent mode, including plasmon, polariton, magnon, or the like; combinations thereof; and free spaces capable of being considered as their equivalent circuit. Electromagnetic waves transmitted by the nonreciprocal transmission line apparatus include microwaves, millimeter waves, quasi-millimeter waves, and terahertz waves in the frequency bands of the UHF (Ultra High Frequency) band or higher, and in the present specification, these electromagnetic waves are collectively referred to as "microwave".

The transmission line having the nonreciprocal phase shift characteristics is configured by including such a transmission line among the aforementioned transmission lines that is configured to particularly include gyrotropic materials in part or as a whole, and to be magnetized in a magnetization direction different from a propagation direction of the electromagnetic wave (more preferably, in a direction orthogonal to the propagation direction) to be asymmetric with respect to a plane composed of the propagation direction and the magnetization direction. In addition to such a transmission line, a lumped-parameter element, having an equivalent nonreciprocal phase shift feature and being sufficiently small as compared to a wavelength, is also available as a transmission line having the nonreciprocal phase shift characteristics. The gyrotropic materials include all the materials in which a permittivity tensor, a permeability tensor, or both of them exhibits gyrotropy, due to spontaneous magnetization, magnetization produced by an externally supplied DC or low-frequency magnetic field, or an orbiting free charge. Exemplary and specific gyrotropic materials include: ferrimagnetic materials such as ferrite, ferromagnetic materials, solid-state plasma (semiconductor materials etc.), liquid and gaseous plasma media, and magnetic artificial media made by micromachining or the like, for use in microwave, millimeter wave, and so on.

The capacitive element inserted in the series branch circuit may include a capacitor commonly used in electric circuits, a distributed-parameter capacitance element for microwave, millimeter wave, etc., and may include equivalent circuits or circuit elements having a negative effective permeability for the electromagnetic wave mode of propagation through the transmission line. In order to obtain the negative effective permeability, the series branch circuit should be equivalent to a line dominantly operating as a capacitive element. Concrete examples of elements having the negative effective permeability include: a split ring resonator made of metal; a spatial arrangement including at least one magnetic resonator of a spiral structure; a spatial arrangement of a magnetically resonating dielectric resonator; or a microwave circuit operable in the waveguide mode or the evanescent mode having the negative effective permeability, such as an edge mode propagation along a ferrite substrate microstrip line. In addition, the capacitive element inserted in the series branch circuit may be a series or parallel connection of capacitive elements and inductive elements, or a combination of their series and parallel connections. The element or circuit to which to be inserted may be capacitive as a whole.

The inductive element inserted in the shunt branch circuit may include a lumped-parameter element such as a coil used in electrical circuits, and a distributed-parameter inductive element such as a short-circuit stub conductor for microwave, millimeter wave, etc., and may include a circuit or a element having a negative effective permittivity for the electromagnetic wave mode of propagation through the transmission line. In order to obtain the negative effective permittivity, the shunt branch circuit should be equivalent to a transmission line dominantly operating as an inductive element. Concrete examples of elements having the negative effective permittivity include: a spatial arrangement including at least one electric resonator of a metal thin wire, a metal sphere, etc.; a spatial arrangement of an electrically resonating dielectric resonator other than metal; or a microwave circuit operable in the waveguide mode or the evanescent mode having the negative effective permittivity, such as waveguides and parallel planar lines in which the TE mode is in the blocking region. In addition, the inductive element inserted in the shunt branch circuit may be a series or parallel connection of capacitive elements and inductive elements, or a combination of their series and parallel connections. The element or circuit to which to be inserted may be inductive as a whole.

The evanescent mode may occur in the transmission line apparatus having the nonreciprocal phase shift characteristics, when the transmission line apparatus has the negative effective permeability for the electromagnetic wave mode of propagation through the transmission line apparatus. Since the negative effective permeability corresponds to a case where a capacitive element is inserted in the series branch circuit, the equivalent circuit of the transmission line apparatus includes both the nonreciprocal phase shift part and the series capacitive element part.

The evanescent mode may occur in the transmission line apparatus having the nonreciprocal phase shift characteristics, when the transmission line apparatus has the negative effective permittivity for the electromagnetic wave mode of propagation through the transmission line apparatus. Since the negative effective permittivity corresponds to a case where an inductive element is inserted in the shunt branch circuit, the equivalent circuit of the transmission line apparatus includes both the nonreciprocal phase shift part and the shunt inductive element part.

Figure 2:
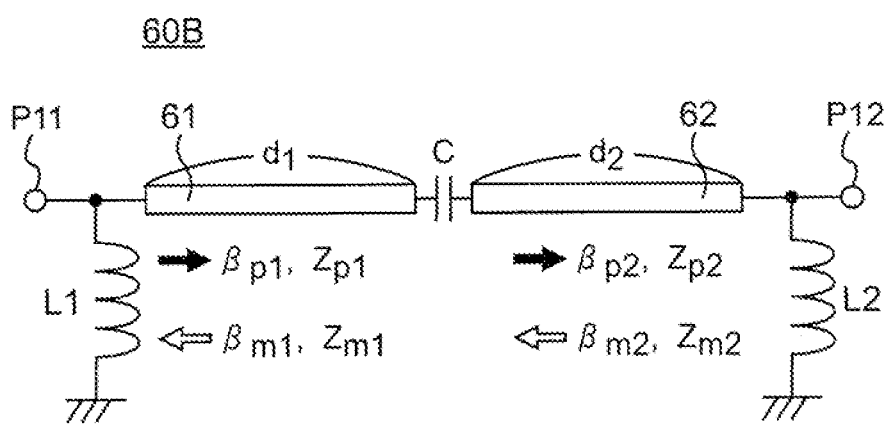
FIG. 2 is an equivalent circuit diagram of a unit cell 60B of a second exemplary transmission line as the nonreciprocal transmission line apparatus according to the first embodiment of the present invention.
Figure 3:
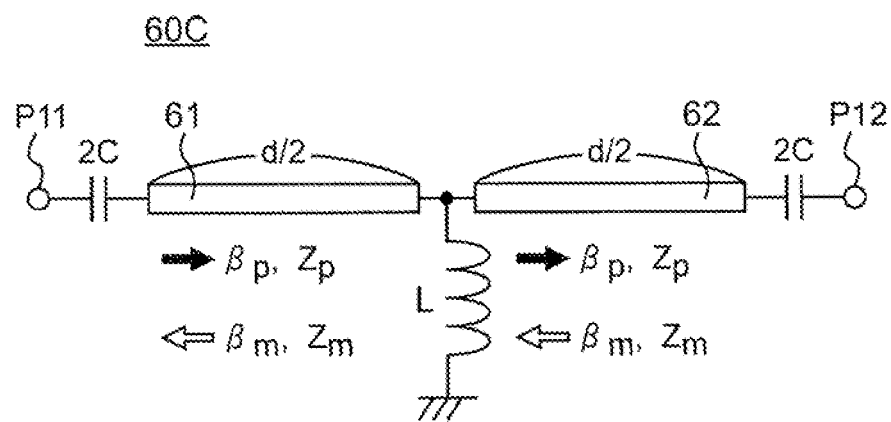
FIG. 3 is an equivalent circuit diagram of a unit cell 60C of a third exemplary transmission line as the nonreciprocal transmission line apparatus according to the first embodiment of the present invention.
Figure 4:
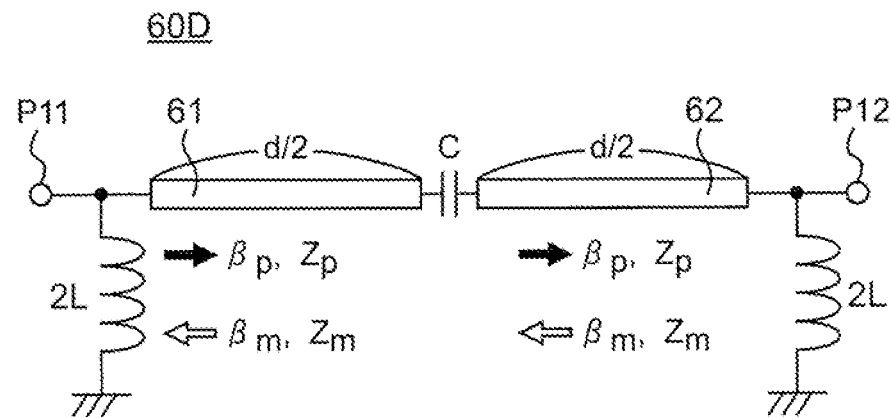
FIG. 4 is an equivalent circuit diagram of a unit cell 60D of a fourth exemplary transmission line as the nonreciprocal transmission line apparatus according to the first embodiment of the present invention.

FIGS. 1 and 2 show the cases where the unit cells 60A and 60B have an asymmetric T-structure and an asymmetric π-structure, respectively. FIGS. 3 and 4 show the more simple cases where the unit cells 60C and 60D have a symmetric T-structure and a symmetric π-structure, respectively. Hereinafter, it is assumed in principle that the line length of the unit cells 60A to 60D (i.e., period length d=d1+d2) is sufficiently small with respect to the wavelength. Therefore, essentially the same result will be obtained for any of the T-structure, the π-structure, or L-structure, as similar to the case of unit cells of a transmission line in the conventional composite right/left-handed transmission line apparatus. In fact, the L-structure falls under the case of FIG. 1 or 2 with parameters being set appropriately. It is emphasized that the line length of the unit cells 60A to 60D with respect to the wavelength does not restrict the fundamental operation described here.

FIGS. 1 to 4 show simple line structures, where a transmission line includes two transmission line parts 61 and 62 having predetermined line lengths (the line lengths of FIGS. 1 and 2 are d1 and d2, respectively, and both the line lengths of FIGS. 3 and 4 are d/2), a capacitive element or a capacitive circuit network is inserted in the series branch circuit of the transmission line, and an inductive element or an inductive circuit network is inserted in the shunt branch circuit of the transmission line. FIG. 1 shows capacitors C1 and C2 and an inductor L inserted in the transmission line, in order to simply and collectively represent the effective values of these elements. Similarly, FIG. 2 shows a capacitor C and inductors L1 and L2 inserted in the transmission line. Each of the transmission line parts 61 and 62 is configured to have a nonreciprocal phase shift characteristic of different forward and backward propagation constants. When considering the propagation constants in the present specification, the imaginary part of the propagation constants, i.e., the phase constant is used. As parameters indicative of the nonreciprocity of the transmission line part 61, $\beta_{p1}$ and $Z_{p1}$ denote a forward phase constant and a forward characteristic impedance ("forward" means a direction from a port P11 to a port P12), respectively, and $\beta_{m1}$ and $Z_{m1}$ denote a backward phase constant and a backward characteristic impedance ("backward" means a direction from the port P12 to the port P11), respectively. Similarly, as parameters indicative of the nonreciprocity of the transmission line part 62, $\beta_{p2}$ and $Z_{p2}$ denote a forward phase constant and a forward characteristic impedance, respectively, and $\beta_{m2}$ and $Z_{m2}$ denote a backward phase constant and a backward characteristic impedance, respectively. Each of the transmission lines of FIGS. 1 and 2 has asymmetric transmission line parts 61 and 62. On the other hand, each of the transmission lines of FIGS. 3 and 4 has symmetric transmission line parts 61 and 62, and satisfies: d1=d2=d/2, $\beta_{p1}=\beta_{p2}=\beta_p$, $\beta_{m1}=\beta_{m2}=\beta_m$, $Z_{p1}=Z_{p2}=Z_p$, $Z_{m1}=Z_{m2}=Z_m$. In addition, a transmission line of T-structure satisfy C1=C2=C, and a transmission line of π-structure satisfy L1=L2=L. Specifically, by imposing periodic boundary conditions to both ends of the unit cells 60A to 60D of the transmission lines of FIGS. 3 and 4, the following equation is obtained.

[Mathematical Expression 1]

$$\cos\left[\left(\beta - \frac{\Delta B}{2}\right) \cdot d\right] = \left(1 - \frac{1}{\omega^2 \cdot L \cdot C} \cdot \frac{Z_p \cdot Z_m}{(Z_p + Z_m)^2}\right) \cdot \cos(\bar{\beta} \cdot d) + \quad (1)$$

$$\frac{1}{Z_p + Z_m}\left(\frac{Z_p \cdot Z_m}{\omega \cdot L} + \frac{1}{\omega \cdot C}\right) \cdot \sin(\bar{\beta} \cdot d) - \frac{1}{2 \cdot \omega^2 \cdot L \cdot C} \cdot \frac{Z_p^2 + Z_m^2}{(Z_p + Z_m)^2}$$

Δβ and $\bar{\beta}$ [Mathematical Expression 2]

are given as follows.

$\Delta\beta = \beta_p - \beta_m$ [Mathematical Expression 3]

$$\bar{\beta} = \frac{\beta_p + \beta_m}{2} \quad \text{[Mathematical Expression 4]}$$

ω denotes the operating angular frequency, and β denotes the phase constant of an electromagnetic wave propagating along a periodic structure. The mathematical expression (1) denotes the relation between the operating angular frequency ω and the phase constant β, and therefore, it is an equation of dispersion (ω–β diagram).

If assuming the reciprocal characteristic ($\beta_p=\beta_m$, and $Z_p=Z_m$) In the mathematical formula (1), the transmission line becomes the same as the conventional reciprocal transmission line apparatus, and the mathematical formula (1) is simplified as follows.

[Mathematical Expression 5]

$$\cos(\beta \cdot d) = \quad (2)$$

$$\cos(\beta_p \cdot d) - \frac{1}{2 \cdot \omega^2 \cdot L \cdot C} \cdot \cos^2\frac{\beta_p \cdot d}{2} + \frac{j}{2} \cdot \left(\frac{Y}{Y_p} + \frac{Z}{Z_p}\right) \cdot \sin(\beta_p \cdot d)$$

It is assumed that in the mathematical formula (2), the admittance Y=1/jωL, and the impedance Z=1/jωC.

Figure 5:
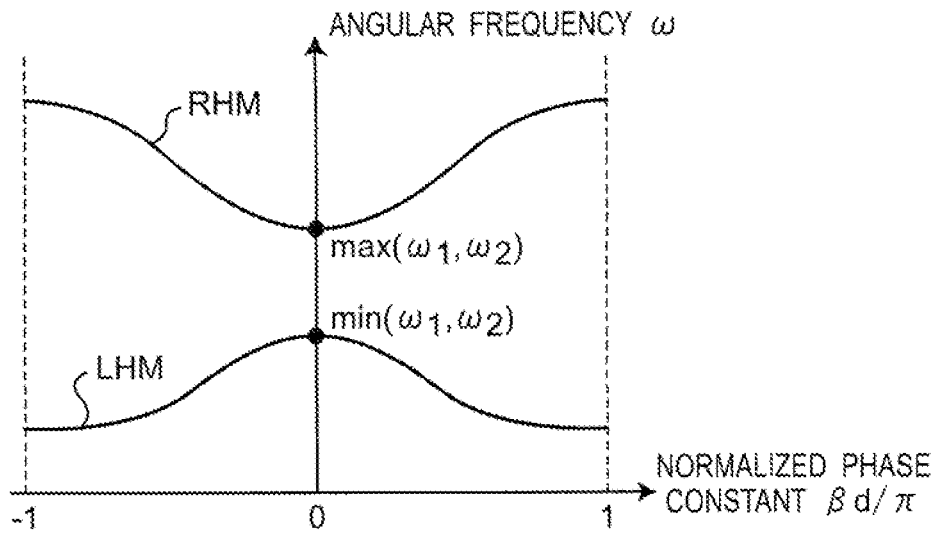
FIG. 5 is a graph showing dispersion curves of a conventional reciprocal transmission line apparatus in an unbalanced state.
Figure 6:
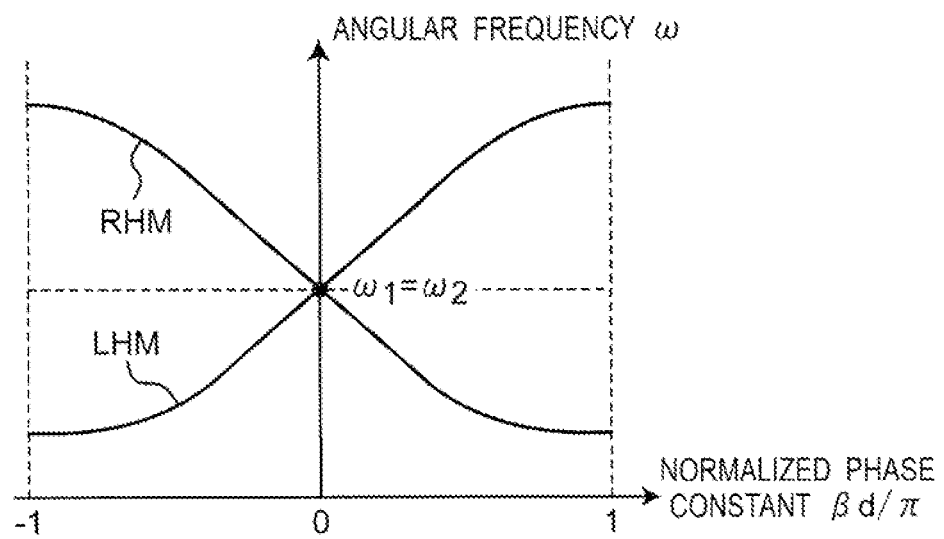
FIG. 6 is a graph showing dispersion curves of the conventional reciprocal transmission line apparatus in a balanced state.

FIG. 5 is a graph showing dispersion curves of a conventional reciprocal transmission line apparatus in a unbalanced state. FIG. 6 is a graph showing dispersion curves of the conventional reciprocal transmission line apparatus in a balanced state. The graphs of FIGS. 5 and 6 indicate characteristics of an angular frequency ω versus a normalized phase constant β×d/π. FIG. 5 shows typical dispersion curves in the case of the conventional transmission line apparatus denoted by the mathematical formula (2), and in general, a forbidden band appears between a band with the right-handed (RH) transmission characteristic and a band with the left-handed (LH) transmission characteristic. Frequencies at the upper limit of the left-handed transmission band at the lower limit of the right-handed transmission band are obtained as the solutions of a quadratic equation of the angular frequency $\omega^2$, by imposing the condition of the phase constant β=0 on the mathematical formula (2). As a result, the following two solutions are obtained.

[Mathematical Expression 6]

$$\omega_1 = \sqrt{\frac{1}{L \cdot \varepsilon_p \cdot d}} \quad (3)$$

-continued

[Mathematical Expression 7]

$$\omega_2 = \sqrt{\frac{1}{C \cdot \mu_p \cdot d}} \quad (4)$$

$\in_p$ and $\mu_p$ denote the effective permittivity and the effective permeability of the transmission line parts 61 and 62 in the unit cells 60A to 60D. Therefore, in order for the cutoff frequencies to satisfy $\omega_1 = \omega_2$ with no forbidden band, it is only necessary for the mathematical formula (2) to have a multiple root under the condition of the phase constant $\beta=0$, and as a result, the following equation is obtained.

[Mathematical Expression 8]

$$Z_p = \sqrt{\frac{\mu_p}{\varepsilon_p}} = \sqrt{\frac{L}{C}} \quad (5)$$

According to the result of the mathematical formula (5), no gap appears if an impedance $\sqrt{(L/C)}$ of the capacitor C and the inductor L is identical to the characteristic impedances $Z_p$ of the transmission line parts 61 and 62, where the capacitor C is the capacitive element inserted in the series branch circuit, and the inductor L is the inductive element inserted in the shunt branch circuit. The mathematical formula (5) is a kind of condition for impedance matching. FIG. 6 shows the dispersion curves of that case.

The dispersion curves of the nonreciprocal transmission line apparatus given by the mathematical formula (1) is described below. In the case of the reciprocal transmission line, it is shown according to the mathematical formula (2) that the dispersion curves are symmetric with respect to the axis of the phase constant $\beta=0$ (i.e., $\omega$ axis). On the other hand, in the case of the nonreciprocal transmission line apparatus, it is readily shown according to the left side of the mathematical formula (1) that the axis of symmetry of the dispersion curves is shifted with respect to $\beta$ in the positive direction from the axis of $\beta=0$ by:

[Mathematical Expression 9]

$$\frac{\Delta\beta}{2} = \frac{\beta_p - \beta_m}{2} \quad (6)$$

Figure 7:
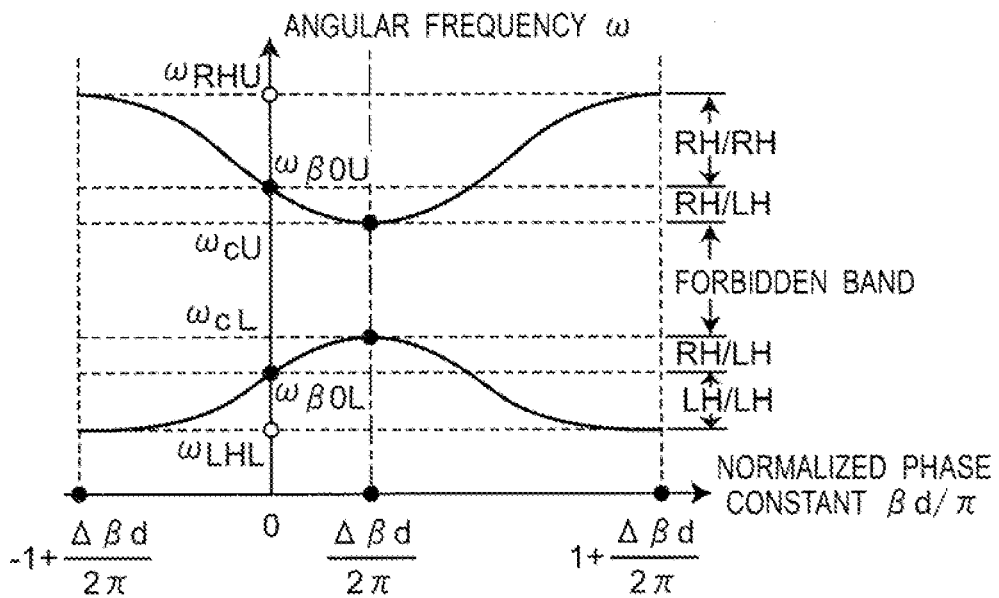
FIG. 7 is a graph showing dispersion curves of a nonreciprocal transmission line apparatus according to the first embodiment in an unbalanced state.

As a result, FIG. 7 is obtained corresponding to FIG. 5.

Figure 8:
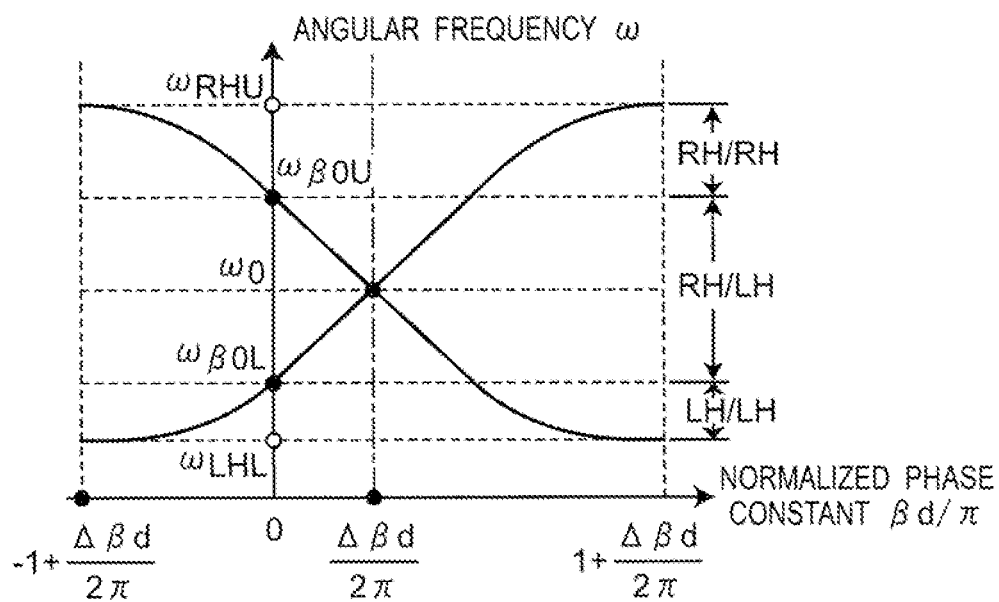
FIG. 8 is a graph showing dispersion curves of the nonreciprocal transmission line apparatus according to the first embodiment in a balanced state.

FIG. 7 is a graph showing dispersion curves of a nonreciprocal transmission line apparatus according to the first embodiment in an unbalanced state. FIG. 8 is a graph showing dispersion curves of the nonreciprocal transmission line apparatus according to the first embodiment in a balanced state.

As described above, the nonreciprocal transmission line apparatus is significantly different from the reciprocal transmission line apparatus in that the axis of symmetry of the dispersion curves is shifted from the $\omega$ axis in the right or left direction, because of the forward and backward phase constants satisfying $\beta_p \neq \beta_m$ (therefore, the forward and backward propagation constants are different from each other), i.e., the effect of a nonreciprocal phase shift. As a result, the transmission bands are classified into the following five transmission bands (A) to (E).

(A) Both the forward and backward propagations are done as the left-handed transmission. The magnitudes of the propagation constants are different from each other.

(B) The forward propagation is done as the left-handed transmission, and the backward propagation has zero propagation constant and infinite guide wavelength.

(C) The forward propagation is done as the right-handed transmission, and the backward propagation is done as the left-handed transmission.

(D) The forward propagation is done as the right-handed transmission, and the backward propagation has zero propagation constant and infinite guide wavelength.

(E) Both the forward and backward propagations are done as the right-handed transmission. The magnitudes of the propagation constants are different from each other.

In general, a stop band (forbidden band) appears at the center of the transmission band (C) as shown from FIG. 7. In particular, when using the transmission band indicated by RH/LH in FIGS. 7 and 8, there is an advantageous feature that even if supplying microwave signals to both the ports in both directions (the forward and backward directions), the flows of phase have an identical direction (left-handed transmission and right-handed transmission).

Considering the conventional reciprocal transmission line for the purpose of comparison, the two identical modes with positive and negative directions of the power transmission intersect each other without coupling between these two modes, when the matching condition of the mathematical formula (5) is satisfied, i.e., when the phase constant $\beta=0$ as shown in FIG. 6. Similarly, on the axis of symmetry $\beta=\Delta\beta/2$ of the dispersion curves of the mathematical formula (1), the mathematical formula (1) is a quadratic equation with respect to the angular frequency $\omega^2$. By imposing a condition of a multiple root in order to avoid a band gap, the following equation is obtained.

[Mathematical Expression 10]

$$Z_p = \sqrt{\frac{\mu_p}{\varepsilon_p}} = \sqrt{\frac{L}{C}}$$

or

[Mathematical Expression 11]

$$Z_m = \sqrt{\frac{\mu_m}{\varepsilon_m}} = \sqrt{\frac{L}{C}} \quad (7)$$

$\in_p$ and $\mu_p$ denote the forward effective permittivity and the forward effective permeability of the nonreciprocal transmission line parts 61 and 62 in the unit cells 60A to 60D, and $\in_m$ and $\mu_m$ denote their backward effective permittivity and the backward effective permeability. According to the mathematical formula (7), the condition for avoiding a gap near the intersection of the two modes is a condition for impedance matching, as similar to the case of the mathematical formula (5) of the reciprocal transmission line apparatus. In addition, it is only necessary to insert an inductor L and a capacitor C so that matching is made in either the forward direction or the backward direction, and there is an advantageous feature that a weaker condition of impedance matching is imposed than in the case of the reciprocal transmission line apparatus.

A more general case of two asymmetric transmission line parts 61 and 62 as shown in FIGS. 1 and 2 is described below. Even in such an asymmetric case, its fundamental operation depends on dispersion curves similar to those shown in FIGS.

7 and 8. The position of the axis of symmetry is modified as follows on the normalized phase constant β×d/π of the horizontal axes of FIGS. 7 and 8.

$$\frac{\beta \cdot d}{\pi} = \frac{(\beta_{p1} - \beta_{m1}) \cdot d_1}{2\pi} + \frac{(\beta_{p2} - \beta_{m2}) \cdot d_2}{2\pi} \quad \text{[Mathematical Expression 12]}$$

Moreover, when the two nonreciprocal transmission line parts 61 and 62 have an identical propagation characteristic, a matching condition for avoiding a band gap is the same as that of the mathematical formula (7). It is noted that the condition of FIG. 1 is:

$$\frac{1}{C} = \frac{1}{C1} + \frac{1}{C2} \quad \text{[Mathematical Expression 13]}$$

and the condition of FIG. 2 is:

$$\frac{1}{L} = \frac{1}{L1} + \frac{1}{L2} \quad \text{[Mathematical Expression 14]}$$

Figure 9:
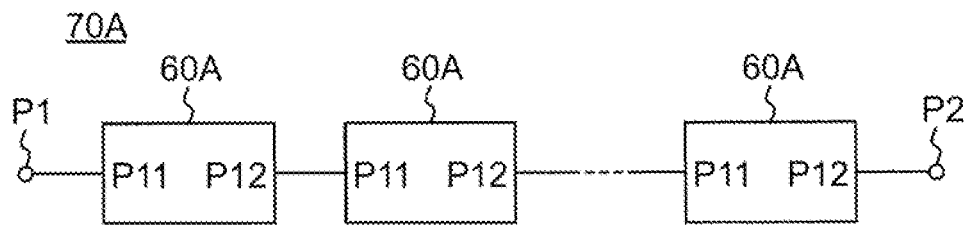
FIG. 9 is a block diagram showing a configuration of a nonreciprocal transmission line apparatus 70A including a cascade connection of a plurality of the unit cells 60A of FIG. 1.
Figure 10:
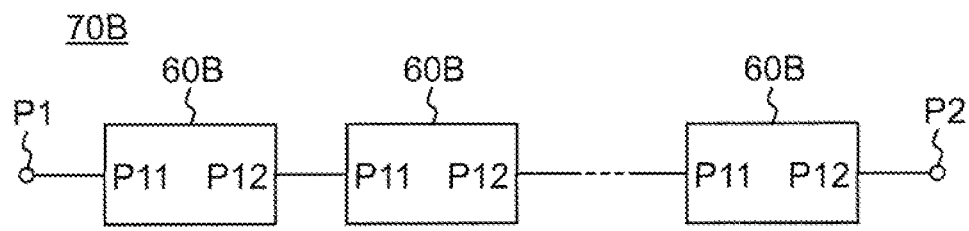
FIG. 10 is a block diagram showing a configuration of a nonreciprocal transmission line apparatus 70B including a cascade connection of a plurality of the unit cells 60B of FIG. 2.
Figure 11:
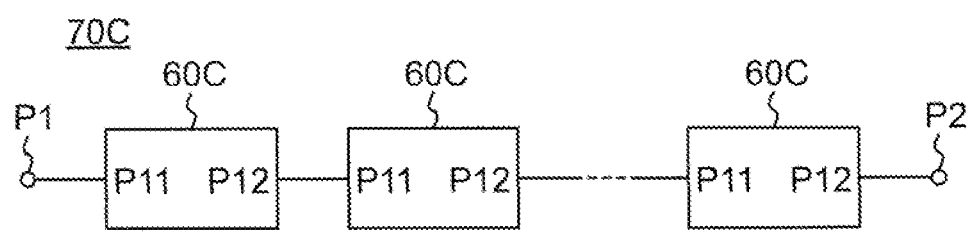
FIG. 11 is a block diagram showing a configuration of a nonreciprocal transmission line apparatus 70C including a cascade connection of a plurality of the unit cells 60C of FIG. 3.
Figure 12:
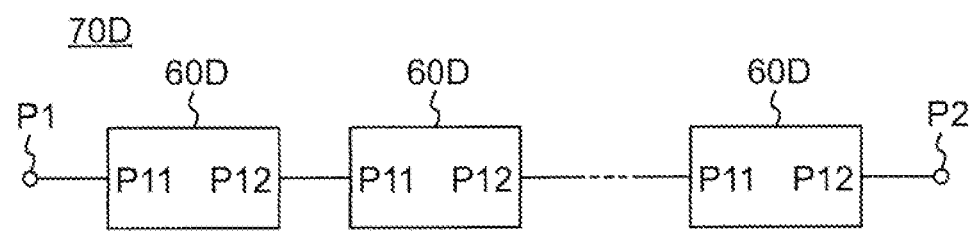
FIG. 12 is a block diagram showing a configuration of a nonreciprocal transmission line apparatus 70D including a cascade connection of a plurality of the unit cells 60D of FIG. 4.

As shown in FIGS. 9 to 12, an entire nonreciprocal transmission line apparatus according to an embodiment of the present invention is configured by including at least one or more of the plurality of unit cells 60A to 60D of FIGS. 1 to 4, and by cascade connecting them. FIG. 9 is a block diagram showing a configuration of a nonreciprocal transmission line apparatus 70A including a cascade connection of a plurality of the unit cells 60A of FIG. 1. Referring to FIG. 9, the nonreciprocal transmission line apparatus 70A is configured by cascade connecting the plurality of unit cells 60A between the port P1 and the port P2. FIG. 10 is a block diagram showing a configuration of a nonreciprocal transmission line apparatus 70B including a cascade connection of a plurality of the unit cells 60B of FIG. 2. Referring to FIG. 10, the nonreciprocal transmission line apparatus 70B is configured by cascade connecting the plurality of unit cells 60B between the port P1 and the port P2. FIG. 11 is a block diagram showing a configuration of a nonreciprocal transmission line apparatus 70C including a cascade connection of a plurality of the unit cells 60C of FIG. 3. Referring to FIG. 11, the nonreciprocal transmission line apparatus 70C is configured by cascade connecting the plurality of unit cells 60C between the port P1 and the port P2. FIG. 12 is a block diagram showing a configuration of a nonreciprocal transmission line apparatus 70D including a cascade connection of a plurality of the unit cells 60D of FIG. 4. Referring to FIG. 12, the nonreciprocal transmission line apparatus 70D is configured by cascade connecting the plurality of unit cells 60D between the port P1 and the port P2. Even when cascade connecting a plurality of unit cells 60A to 60D, it is not necessary to configure the nonreciprocal transmission line apparatus from only one type of the unit cells 60A to 60D, and it is possible to cascade connect a combination of different types of the unit cells 60A to 60D.

Nonreciprocal transmission line apparatuses with novel feature of the present invention will be described below.

Figure 13:
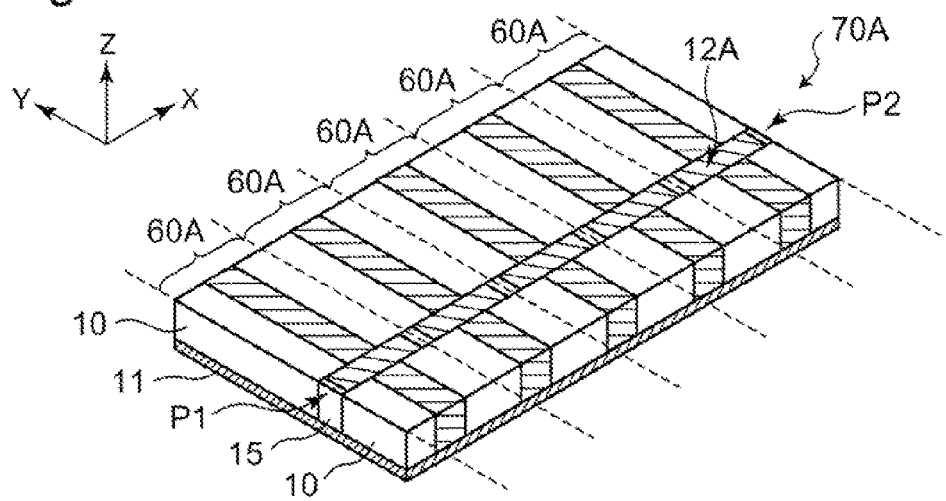
FIG. 13 is a perspective view showing a configuration of the nonreciprocal transmission line apparatus 70A according to the first embodiment of the present invention.
Figure 14:
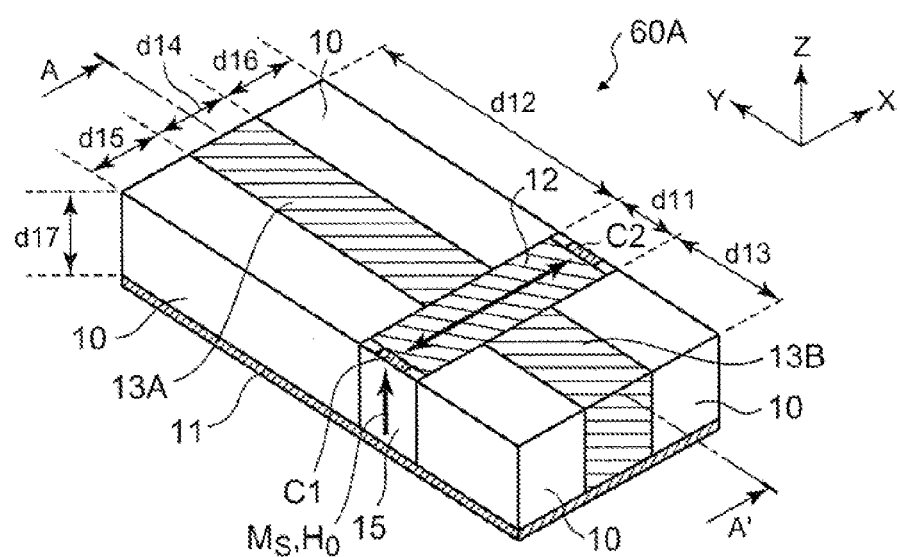
FIG. 14 is a perspective view showing a detailed configuration of a unit cell 60A of a transmission line in the nonreciprocal transmission line apparatus 70A of FIG. 13.
Figure 15:
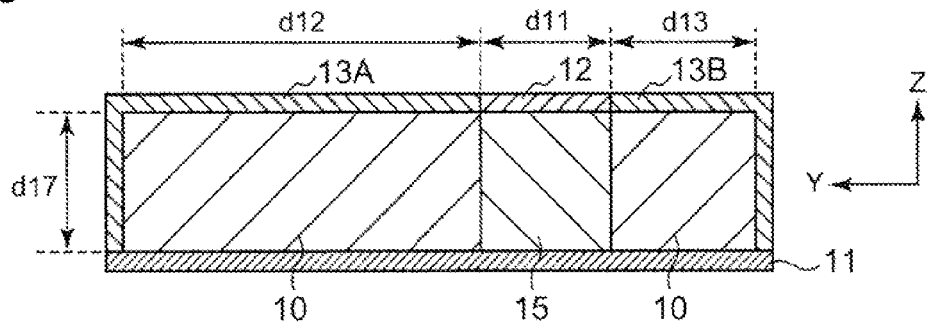
FIG. 15 is a sectional view along a line A-A' of FIG. 14.

FIG. 13 is a perspective view showing a configuration of the nonreciprocal transmission line apparatus 70A according to the first embodiment of the present invention. FIG. 14 is a perspective view showing a detailed configuration of a unit cell 60A of the transmission line in the nonreciprocal transmission line apparatus 70A of FIG. 13. FIG. 15 is a sectional view along a line A-A' of FIG. 14. For the purpose of explanation, XYZ coordinates in the drawings are used. Referring to FIG. 13, the nonreciprocal transmission line apparatus 70A includes: a ground conductor 11 provided parallel to the XY plane; a ferrite square rod 15 that extends along the X axis on the ground conductor 11; and a dielectric substrate 10 provided on both the +Y side and the −Y side of the ferrite square rod 15 on the ground conductor 11. The ferrite square rod 15 of the nonreciprocal transmission line apparatus 70A has spontaneous magnetization so as to have gyrotropy by being magnetized in a magnetization direction different from the propagation direction of electromagnetic waves. The magnetization direction is preferably a direction (+Z direction) orthogonal to the propagation direction of the electromagnetic waves (direction along the X axis). In place of the ferrite square rod 15 with the spontaneous magnetization, a ferrite square rod without spontaneous magnetization may be used, to which a magnetic field is applied by an external magnetic field generator, as described later. The nonreciprocal transmission line apparatus 70A is configured by cascade connecting the unit cells 60A of the transmission line, in a manner similar to that of FIG. 9. A microwave signal is supplied from either one of the ports P1 and P2.

One of the unit cells 60A of FIG. 13 is described with reference to FIGS. 14 and 15. A strip conductor 12 extending along the X axis is formed on the ferrite square rod 15. A capacitor C1 is connected to the −X side end of the strip conductor 12, and the capacitor C1 is further connected to the adjacent unit cell 60A on the −X side of the unit cell 60A of FIG. 14. Similarly, a capacitor C2 is connected to the +X side end of the strip conductor 12, and the capacitor C2 is further connected to the adjacent unit cell 60A on the +X side of the unit cell 60A of FIG. 14. The capacitors C1 and C2 of FIG. 14 correspond to the capacitors C1 and C2 of FIG. 1, respectively. A microstrip line 12A extending between the ports P1 and P2 along the X axis is formed from: the strip conductor 12 and the capacitors C1 and C2 of each unit cell 60A, the ground conductor 11, and the ferrite square rod 15. The capacitors C1 and C2 of FIG. 14 are inserted in series with the microstrip line 12A.

The unit cell 60A further includes a stub conductor 13A extending on the +Y side of the strip conductor 12, and a stub conductor 13B extending on the −Y side of the strip conductor 12. The stub conductors 13A and 13B are provided as two shunt branch circuits corresponding to the inductor L (shunt branch circuit) of FIG. 1, by being branched from the microstrip line 12A. In detail, the stub conductor 13A extends in the +Y direction along the Y axis on the dielectric substrate 10, with one end of the stub conductor 13A being connected to the strip conductor 12, and the other end of the stub conductor 13A being short-circuited to the ground conductor 11 at a +Y side end of the dielectric substrate 10 (short-circuited stub). Similarly, the stub conductor 13B extends in the −Y direction along the Y axis on the dielectric substrate 10, with one end of the stub conductor 13B being connected to the strip conductor 12, and the other end of the stub conductor 13B being short-circuited to the ground conductor 11 at a −Y side end of the dielectric substrate 10. As described above, the stub conductors 13A and 13B are formed on different sides with respect to a plane (XZ plane) composed of the propagation direction of the microstrip line 12A (e.g., +X direction or −X direction: indicated by an arrow on the strip conductor 12 in FIG. 14) and the magnetization direction (e.g., +Z direction: indicated by arrows of saturation magnetization $M_s$ and internal magnetic field $H_0$ of the ferrite square rod 15 in FIG. 14). The stub conductors 13A and 13B operate as inductive elements. The stub conductors 13A and 13B are configured so that the impedance of the stub conductor 13A seen from the microstrip line 12A is different from the impedance of the stub conductor 13B seen from the microstrip line 12A. The stub conductor 13A has a length of d12+d17, and the stub conductor 13B has a length of d13+d17. Therefore, the stub conductors 13A and 13B have different electrical lengths from each other, and therefore, have different impedances from each other. Preferably, the impedances of the stub conductors 13A and 13B are complex numbers having substantially no real part, and more preferably, a pure imaginary number. Although FIG. 14 shows the stub conductors 13A and 13B with an identical width d14, their widths may be different from each other.

Thus, the microstrip line 12A is inserted with capacitors periodically at intervals of a line length of the unit cell 60A, i.e., d=d15+d14+d16, and provided with stub conductors periodically at intervals of the line length d.

According to this configuration, when the stub conductors 13A and 13B have different impedances (i.e., different electrical lengths) from each other, the nonreciprocal transmission line apparatus 70A has an asymmetric structure with respect to the plane (XZ plane) composed of the propagation direction and the magnetization direction of the microstrip line 12A. A forward propagation constant (propagation constant for direction from port P1 to P2) and a backward propagation constant (propagation constant for direction from port P2 to P1) are different from each other, and as a result, it is possible to achieve both the forward propagation with the right-handed mode and the backward propagation with the left-handed mode. According to this configuration, it is possible to change the degree of nonreciprocity by adjusting the length of the stub conductors 13A and 13B, i.e., d12+d17 and d13+d17, respectively.

Although FIG. 13 shows the nonreciprocal transmission line apparatus 70A including five unit cells 60A, the number of unit cells is not limited thereto. Further, the capacitors C1 and C2 may be discrete capacitors connect between each pair of two adjacent strip conductors 12, or only stray capacitance formed between each pair of two adjacent strip conductors 12, depending on the frequency of the electromagnetic waves to be propagated. Alternatively, a series capacitor C may be used, made of such a stray capacitance and a capacitor connected in parallel with the stray capacitance. Moreover, instead of the stub conductors 13A and 13B as the distributed-parameter elements, lumped-parameter elements having different impedances may be provided on the +Y side and the −Y side of the strip conductor 12.

Next, the advantageous effects of the nonreciprocal transmission line apparatus 70A of FIG. 13 are described with reference to the simulation results of FIGS. 16 to 18. In this simulation, the dimensions used with respect to FIGS. 14 and 15 were: d11=0.8 mm, d14=d15=d16=1 mm, and d17=0.794 mm. In addition, capacitors with capacitances of C1=C2=0.5 pF were used.

Figure 16:
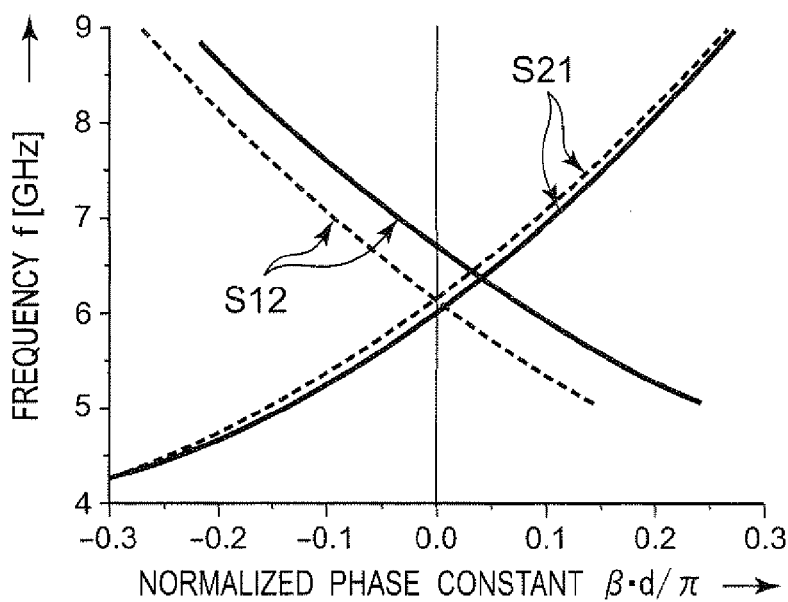
FIG. 16 is a graph showing dispersion curves of a transmission line apparatus of a comparative example in a balanced state.
Figure 17:
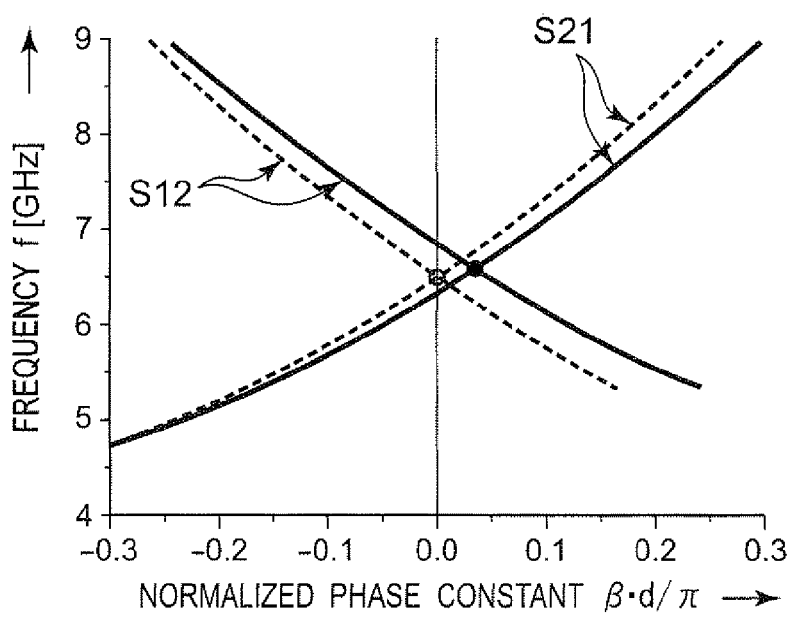
FIG. 17 is a graph showing dispersion curves of the nonreciprocal transmission line apparatus 70A of FIG. 13 in a balanced state.

FIG. 16 is a graph showing dispersion curves of a transmission line apparatus of a comparative example in a balanced state. FIG. 17 is a graph showing dispersion curves of the nonreciprocal transmission line apparatus 70A of FIG. 13 in a balanced state. The transmission line apparatus of FIG. 16 is provided with only the stub conductor 13B of FIG. 14 as an inductive element, without the stub conductor 13A of FIG. 14. Referring to FIG. 16, the dotted lines indicate a case where no magnetic field is applied and the ferrite square rod 15 can be regarded as a dielectric rod (the reciprocal case), and the solid lines indicate a case where there are the saturation magnetization $\mu_0 M_s$=175 mT in the +Z direction of FIG. 13 and the internal magnetic field $\mu_0 H_0$=50 mT in the +Z direction (the nonreciprocal case). Referring to FIG. 17, simulations are conducted for the nonreciprocal transmission line apparatus 70A of FIG. 13 under the conditions that there are the saturation magnetization $\mu_0 M_s$=175 mT in the +Z direction and the internal magnetic field $\mu_0 H_0$=50 mT in the +Z direction. The dotted lines indicate a case where the lengths of the stub conductors 13A and 13B are equal to each other (d12=d13=4.5 mm), and the solid lines indicate a case where the lengths of the stub conductors 13A and 13B are different from each other (d12=7.5 mm, d13=2.6 mm). With regard to each of these cases, a forward transmission coefficient $S_{21}$ from the port P1 to the port P2, and a backward transmission coefficient $S_{12}$ from the port P2 to the port P1 are indicated. According to FIG. 16, it is shown that when no magnetic field is applied, a reciprocal propagation characteristic of the forward propagation and the backward propagation is obtained, and on the other hand, when there are the saturation magnetization $\mu_0 M_s$=175 mT in the +Z direction and the internal magnetic field $\mu_0 H_0$=50 mT in the +Z direction, the axis of symmetry parallel to the vertical axis of the dispersion curves shifts to the right, and thus, a nonreciprocal propagation characteristic is obtained. According to FIG. 17, it is shown that when the lengths of the stub conductors 13A and 13B, i.e., d12+d17 and d13+d17, are equal to each other, a reciprocal propagation characteristic is obtained due to the symmetric structure of the nonreciprocal transmission line apparatus 70A with respect to the plane composed of the propagation direction and the magnetization direction of the microstrip line 12A, and on the other hand, when these two lengths are different from each other, the nonreciprocity is obtained. As described above, it was confirmed by numerical calculations that the degree of nonreciprocity can be changed not by changing the saturation magnetization nor by the applied magnetic field, but by changing the degree of asymmetry of the transmission line structure, and the degree of nonreciprocity can be changed by the same degrees as the case of changing the saturation magnetization or the applied magnetic field.

Figure 18:
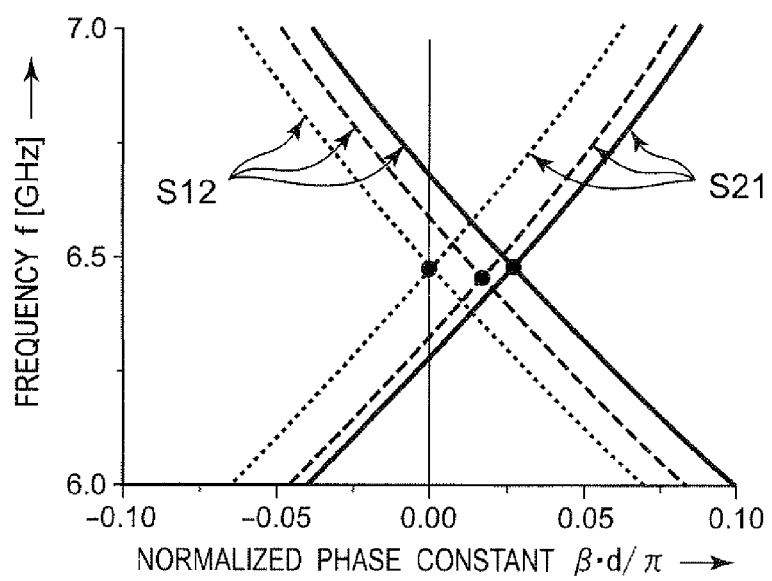
FIG. 18 is another graph showing dispersion curves of the nonreciprocal transmission line apparatus 70A of FIG. 13 in a balanced state.

FIG. 18 is another graph showing dispersion curves of the nonreciprocal transmission line apparatus 70A of FIG. 13 in a balanced state. Referring to FIG. 18, simulations are conducted for the nonreciprocal transmission line apparatus 70A of FIG. 13 under the conditions that there are the saturation magnetization $\mu_0 M_s$=175 mT in the +Z direction and the internal magnetic field $\mu_0 H_0$=50 mT in the +Z direction. The dotted lines indicate a case where the lengths of the stub conductors 13A and 13B are equal to each other (d12=d13=4.5 mm), the dashed lines indicate a case where the lengths of the stub conductors 13A and 13B are different from each other (d12=6.0 mm, d13=3.5 mm), and the solid lines indicate a case where the lengths of the stub conductors 13A and 13B are further different from each other (d12=7.0 mm, d13=3.0 mm). Referring to FIG. 18, it is shown that as the difference between the lengths of the stub conductors 13A and 13B, i.e., d12+d17 and d13+d17, increases, the degree of asymmetry of the structure of the nonreciprocal transmission line apparatus 70A increases, and therefore, the more the degree of nonreciprocity also increases.

The present embodiment including "changing the degree of asymmetry of the structure of the nonreciprocal transmission line apparatus 70A" in order to change the degree of nonreciprocity has the following advantage, as compared to "changing the applied magnetic field" according to the prior art (e.g., the invention of the Patent Literature 1). According to the prior art, as shown in FIG. 16, the intersection of two dispersion curves representing the forward propagation mode and the backward propagation mode is moved by changing the applied magnetic field. However, if changing the applied magnetic field, there is a problem that the operating frequency corresponding to the intersection significantly changes. On the other hand, according to the nonreciprocal transmission line apparatus 70A of the present embodiment, the intersection of the two dispersion curves is moved by changing the degree of asymmetry of the structure of the nonreciprocal transmission line apparatus 70A as shown in FIGS. 17 and 18, and the operating frequency corresponding to the intersection almost does not move. Therefore, according to the nonreciprocal transmission line apparatus 70A of the present embodiment, the problem of the prior art, i.e., unwanted changes in the operating frequency occurring when changing the degree of nonreciprocity, is solved.

When Δβ indicative of a nonreciprocal phase characteristic becomes almost zero by changing the strength and the direction of the magnetization in the gyrotropic material, the nonreciprocal transmission line apparatus of the present embodiment has the same characteristic as that of the conventional composite right/left-handed reciprocal transmission line. As described above, the nonreciprocal transmission line apparatus of the composite right/left-handed type according to the embodiment of the present invention achieves more general transmission operation, including the characteristics of the conventional composite right/left-handed reciprocal transmission line.

Figure 19:
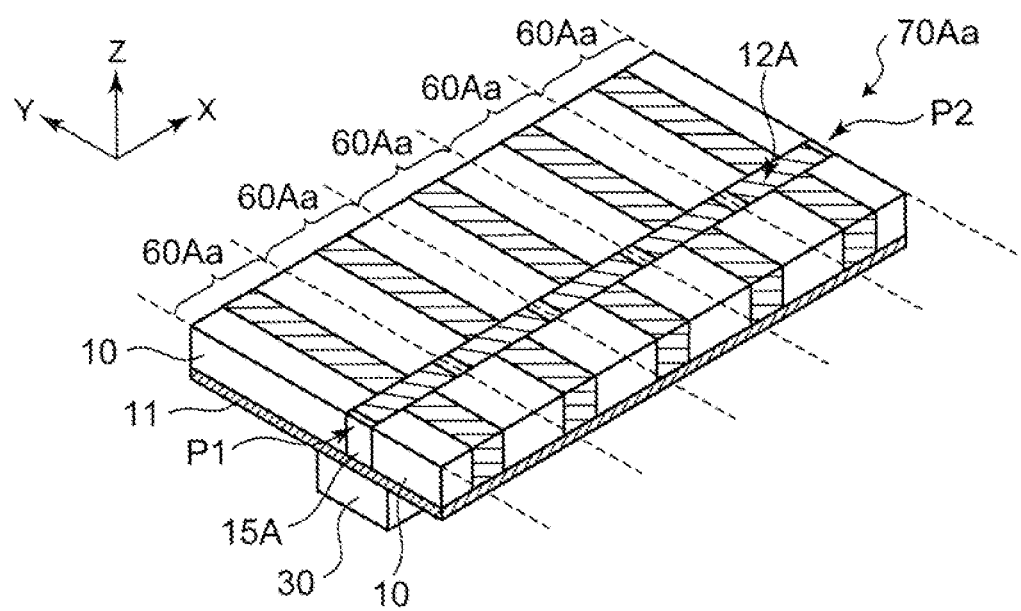
FIG. 19 is a perspective view showing a configuration of a nonreciprocal transmission line apparatus 70Aa according to the first modified embodiment of the first embodiment of the present invention.

FIG. 19 is a perspective view showing a configuration of a nonreciprocal transmission line apparatus 70Aa according to the first modified embodiment of the first embodiment of the present invention. In place of the ferrite square rod 15 of the nonreciprocal transmission line apparatus 70A of FIG. 13, having the spontaneous magnetization, a ferrite square rod 15A without spontaneous magnetization may be used. In this case, a magnetic field generator 30 for generating a magnetic field in the +Z direction is used in order to obtain magnetization in a magnetization direction different from the propagation direction of electromagnetic waves.

Figure 20:
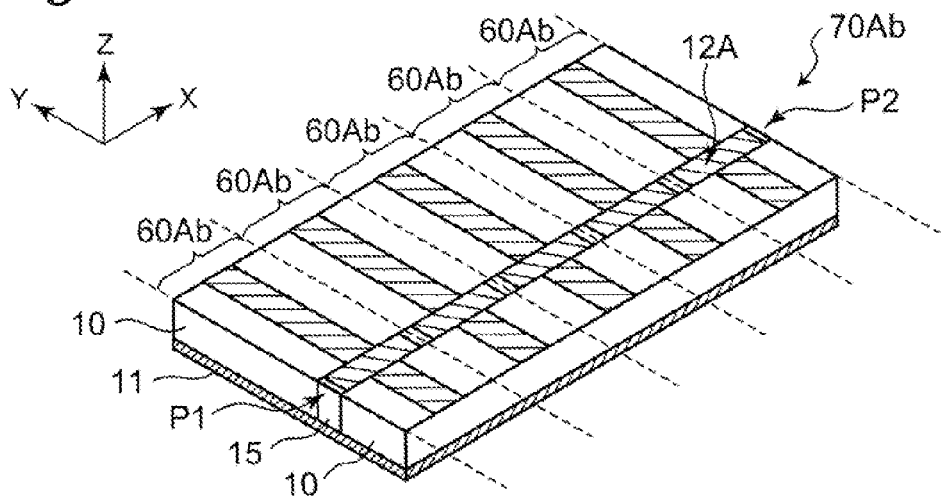
FIG. 20 is a perspective view showing a configuration of a nonreciprocal transmission line apparatus 70Ab according to the second modified embodiment of the first embodiment of the present invention.
Figure 21:
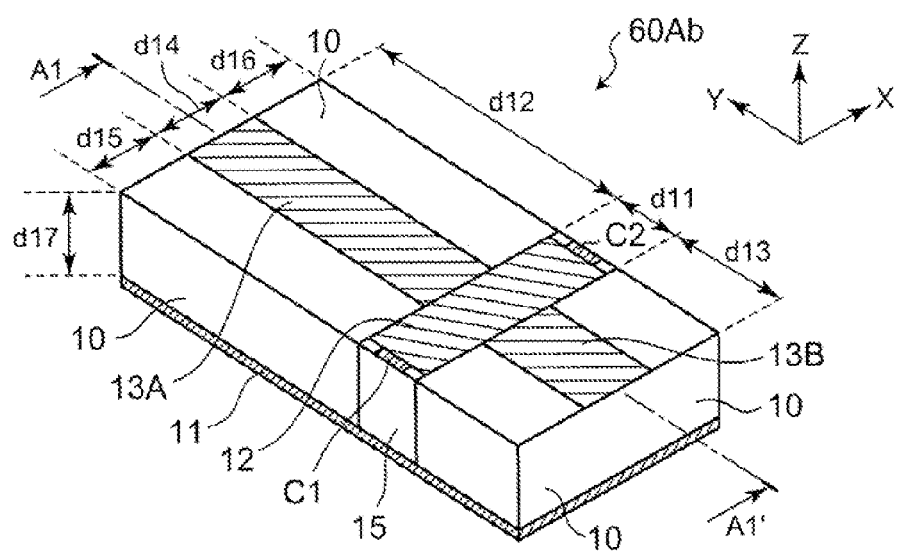
FIG. 21 is a perspective view showing a detailed configuration of a unit cell 60Ab of the transmission line in the nonreciprocal transmission line apparatus 70Ab of FIG. 20.
Figure 22:
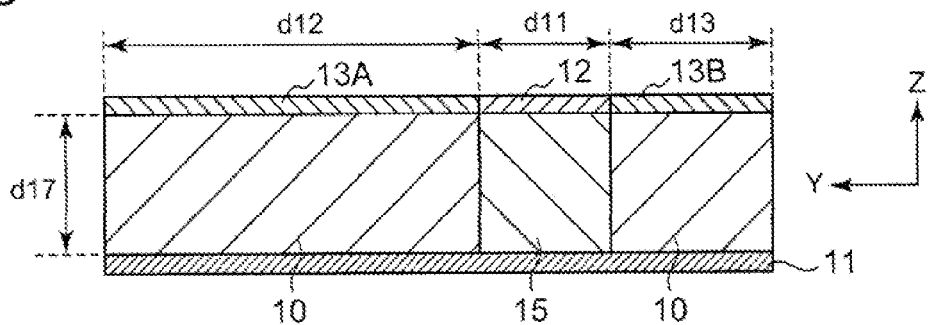
FIG. 22 is a sectional view along a line A1-A1' of FIG. 21.

FIG. 20 is a perspective view showing a configuration of a nonreciprocal transmission line apparatus 70Ab according to the second modified embodiment of the first embodiment of the present invention. FIG. 21 is a perspective view showing a detailed configuration of a unit cell 60Ab of the transmission line in the nonreciprocal transmission line apparatus 70Ab of FIG. 20. FIG. 22 is a sectional view along a line A1-A1' of FIG. 21. According to the configuration of FIGS. 13 to 15, the ends of the stub conductors 13A and 13B are short-circuited to the ground conductor 11. On the other hand, according to the configuration of the present modified embodiment, the ends of the stub conductors 13A and 13B are not short-circuited, but open (open stubs). Even when the stub conductors 13A and 13B have the open ends, it is possible to change the degree of nonreciprocity of the nonreciprocal transmission line apparatus 70Ab by adjusting the lengths of the stub conductors 13A and 13B, i.e., d12 and d13, respectively.

Figure 23:
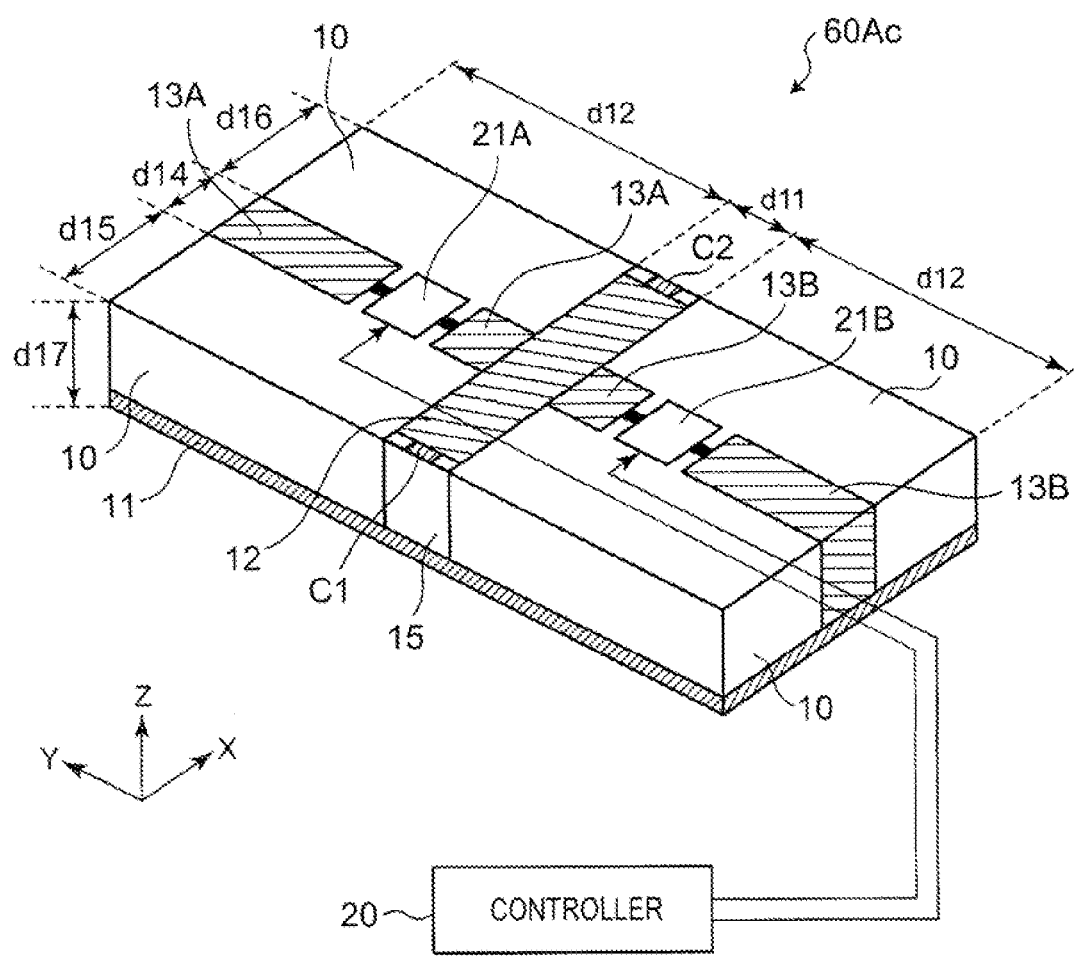
FIG. 23 is a perspective view showing a detailed configuration of a unit cell 60Ac of the transmission line in a nonreciprocal transmission line apparatus according to the third modified embodiment of the first embodiment of the present invention.

FIG. 23 is a perspective view showing a detailed configuration of a unit cell 60Ac of the transmission line in a nonreciprocal transmission line apparatus according to the third modified embodiment of the first embodiment of the present invention. According to the nonreciprocal transmission line apparatus of the present modified embodiment, instead of using the stub conductors 13A and 13B having the different lengths d12+d17 and d13+d17, the stub conductors 13A and 13B are provided with phase shifters 21A and 21B, respectively, and their amounts of phase shifts are changed, in order to obtain different impedances of the stub conductors 13A and 13B. The controller 20 controls the voltages applied to the phase shifters 21A and 21B to change the amounts of phase shift of the phase shifters 21A and 21B, and thus, it is possible to set the impedances of the stub conductors 13A and 13B to different values from each other. The short-circuited stub conductors of the other unit cells 60Ac are also provided with phase shifters in a similar manner, and their amounts of phase shift are controlled by the controller 20. According to the nonreciprocal transmission line apparatus of the present modified embodiment, it is possible to set the impedances of the stub conductors 13A and 13B to the different values depending on the required degree of the nonreciprocity, and achieve the asymmetric line structure by this difference in the impedance. The nonreciprocal transmission line apparatus of the present modified embodiment controls the asymmetry of the transmission line structure itself. According to this configuration, as compared to the case of controlling the gyrotropy by controlling the strength of magnetic field using mechanical moving means or an electromagnet, it is only necessary to control the voltages applied to the phase shifters 21A and 21B. Therefore, there are the advantageous effects of increased operating speed, reduced device size, and reduced power consumption, and so on. Although FIG. 23 shows the stub conductors 13A and 13B of the same lengths d12+d17 and d12+d17, these lengths may be different from each other.

Figure 24:
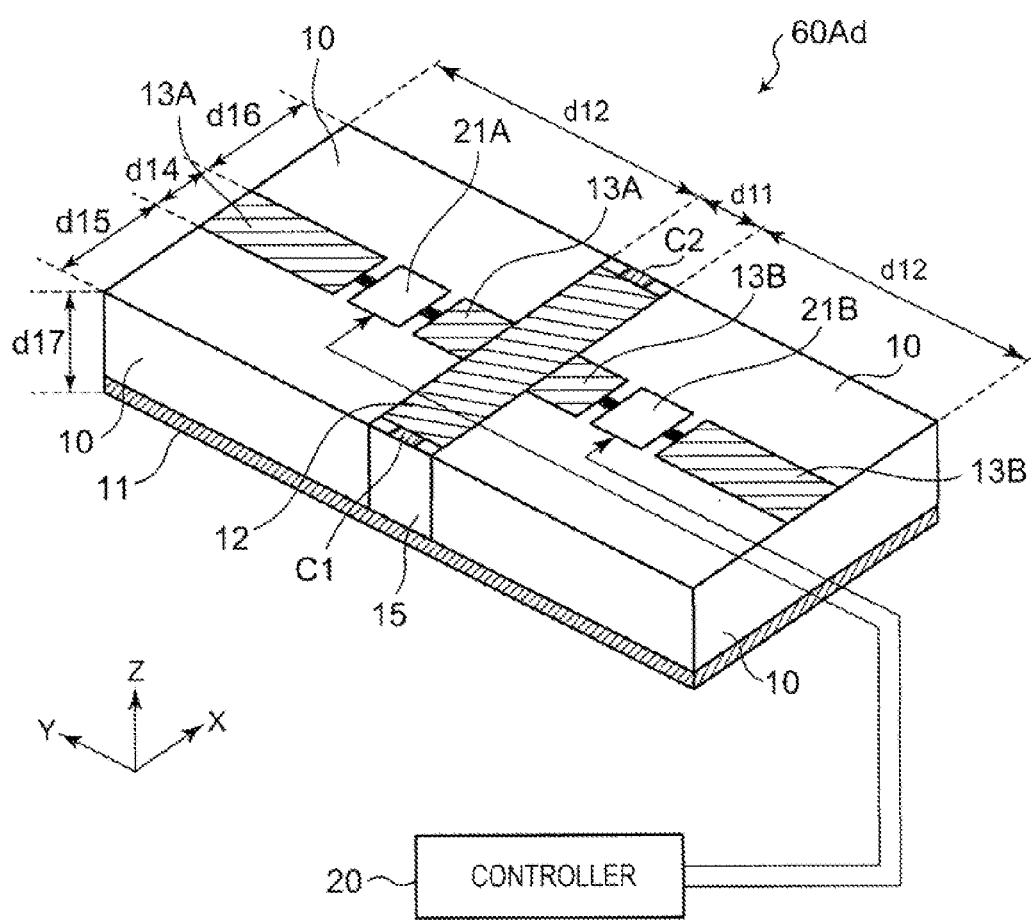
FIG. 24 is a perspective view showing a detailed configuration of a unit cell 60Ad of the transmission line in a nonreciprocal transmission line apparatus according to the fourth modified embodiment of the first embodiment of the present invention.

FIG. 24 is a perspective view showing a detailed configuration of a unit cell 60Ad of the transmission line in a nonreciprocal transmission line apparatus according to the fourth modified embodiment of the first embodiment of the present invention. According to the configuration of FIG. 23, the ends of the stub conductors 13A and 13B are short-circuited to the ground conductor 11. On the other hand, according to the configuration of the present modified embodiment, the ends of the stub conductors 13A and 13B are not short-circuited, but open. Even when the stub conductors 13A and 13B have the open ends, the controller 20 controls the voltages applied to the phase shifters 21A and 21B to change the amounts of phase shift of the phase shifters 21A and 21B, and thus, it is possible to set the impedances of the stub conductors 13A and 13B to different values from each other.

Figure 25:
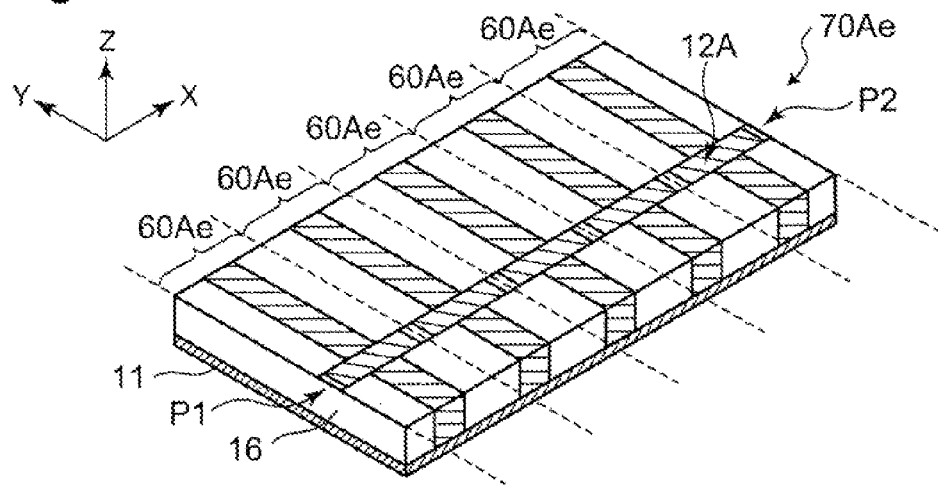
FIG. 25 is a perspective view showing a configuration of a nonreciprocal transmission line apparatus 70Ae according to the fifth modified embodiment of the first embodiment of the present invention.
Figure 26:
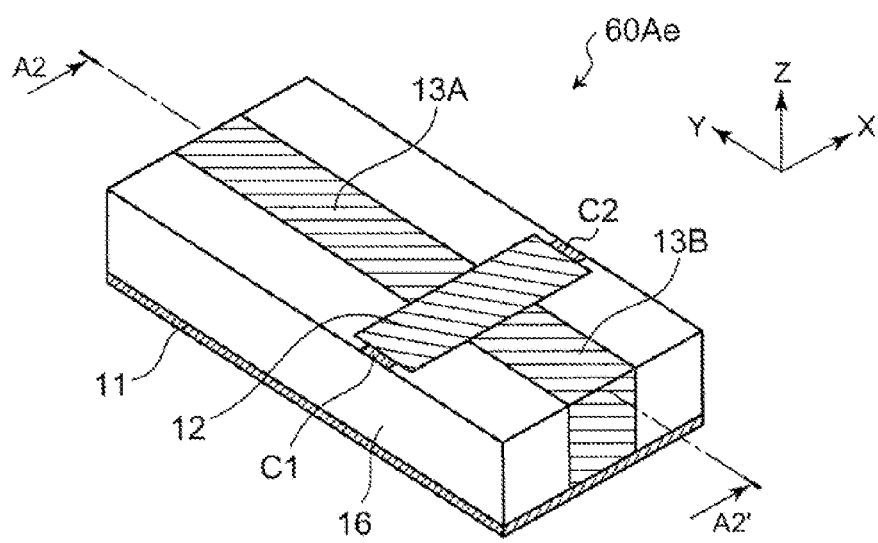
FIG. 26 is a perspective view showing a detailed configuration of a unit cell 60Ae of the transmission line in the nonreciprocal transmission line apparatus 70Ae of FIG. 25.
Figure 27:
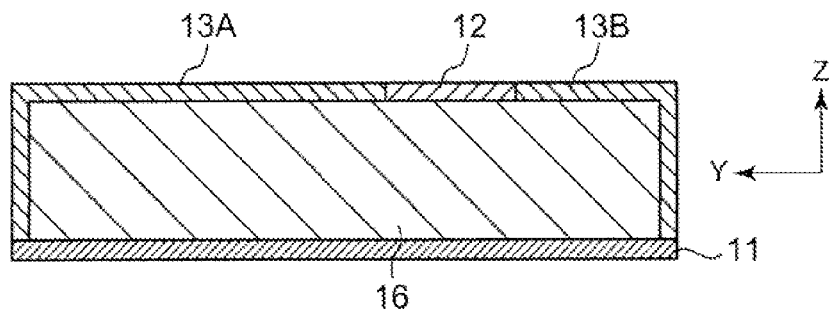
FIG. 27 is a sectional view along a line A2-A2' of FIG. 26.

FIG. 25 is a perspective view showing a configuration of a nonreciprocal transmission line apparatus 70Ae according to the fifth modified embodiment of the first embodiment of the present invention. FIG. 26 is a perspective view showing a detailed configuration of a unit cell 60Ae of the transmission line in the nonreciprocal transmission line apparatus 70Ae of FIG. 25. FIG. 27 is a sectional view along a line A2-A2' of FIG. 26. The nonreciprocal transmission line apparatus 70Ae of the present modified embodiment is provided with a single ferrite substrate 16 extending to the portions under the short-circuited stub conductors, in place of the ferrite square rod 15 and the dielectric substrate 10 of FIG. 13.

Figure 28:
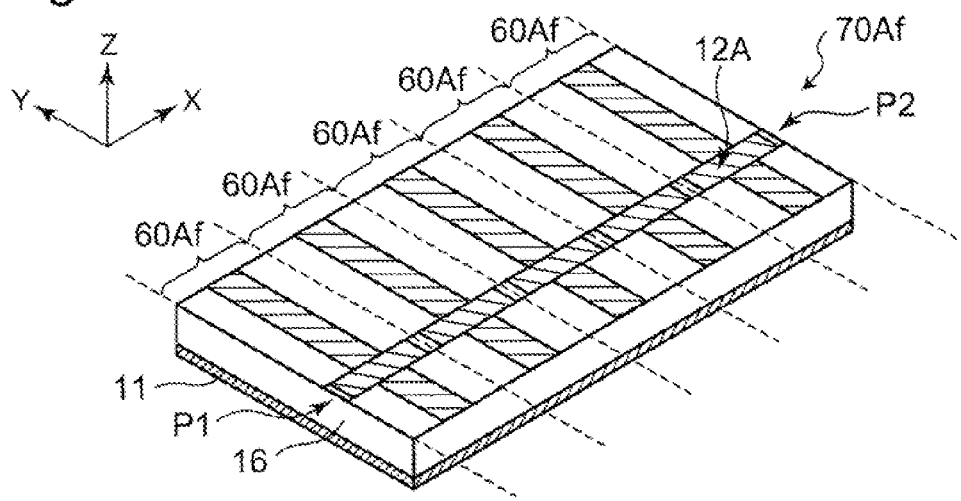
FIG. 28 is a perspective view showing a configuration of a nonreciprocal transmission line apparatus 70Af according to the sixth modified embodiment of the first embodiment of the present invention.
Figure 29:
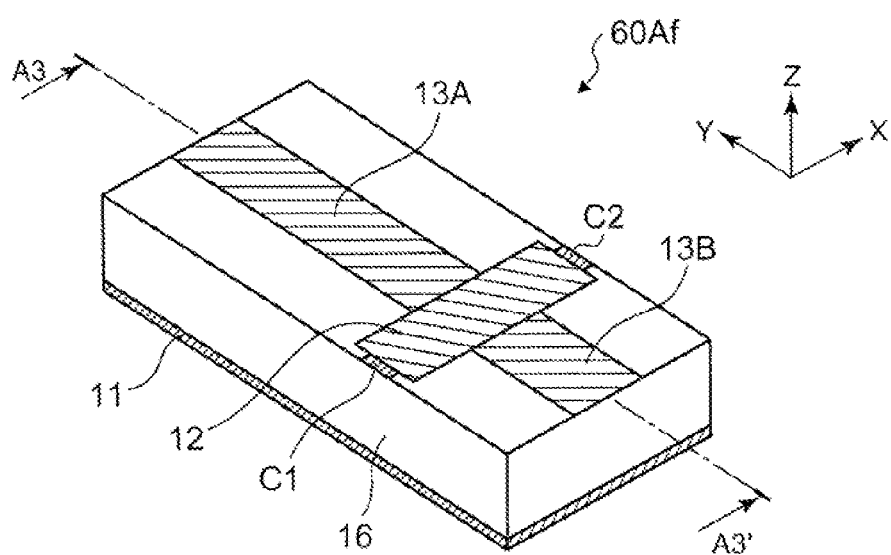
FIG. 29 is a perspective view showing a detailed configuration of a unit cell 60Af of the transmission line in the nonreciprocal transmission line apparatus 70Af of FIG. 28.
Figure 30:
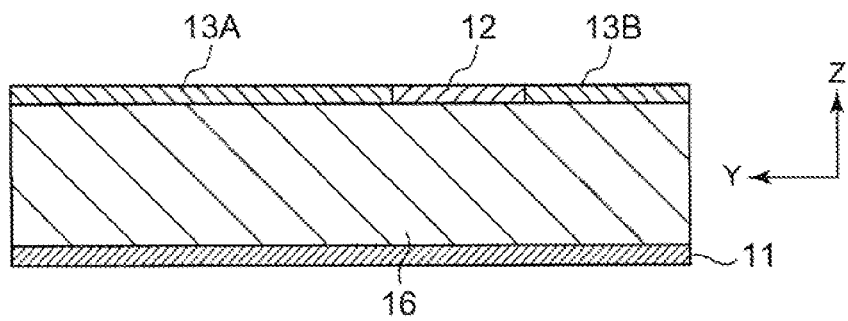
FIG. 30 is a sectional view along a line A3-A3' of FIG. 29.

FIG. 28 is a perspective view showing a configuration of a nonreciprocal transmission line apparatus 70Af according to the sixth modified embodiment of the first embodiment of the present invention. FIG. 29 is a perspective view showing a detailed configuration of a unit cell 60Af of the transmission line in the nonreciprocal transmission line apparatus 70Af of FIG. 28. FIG. 30 is a sectional view along a line A3-A3' of FIG. 29. According to the configuration of FIGS. 25 to 27, the ends of the stub conductors 13A and 13B are short-circuited to the ground conductor 11. On the other hand, according to the configuration of the present modified embodiment, the ends of the stub conductors 13A and 13B are not short-circuited, but open. Even when the stub conductors 13A and 13B have the open ends, it is possible to change the degree of nonreciprocity of the nonreciprocal transmission line apparatus 70Af by adjusting the lengths of the stub conductors 13A and 13B, respectively.

Figure 31:
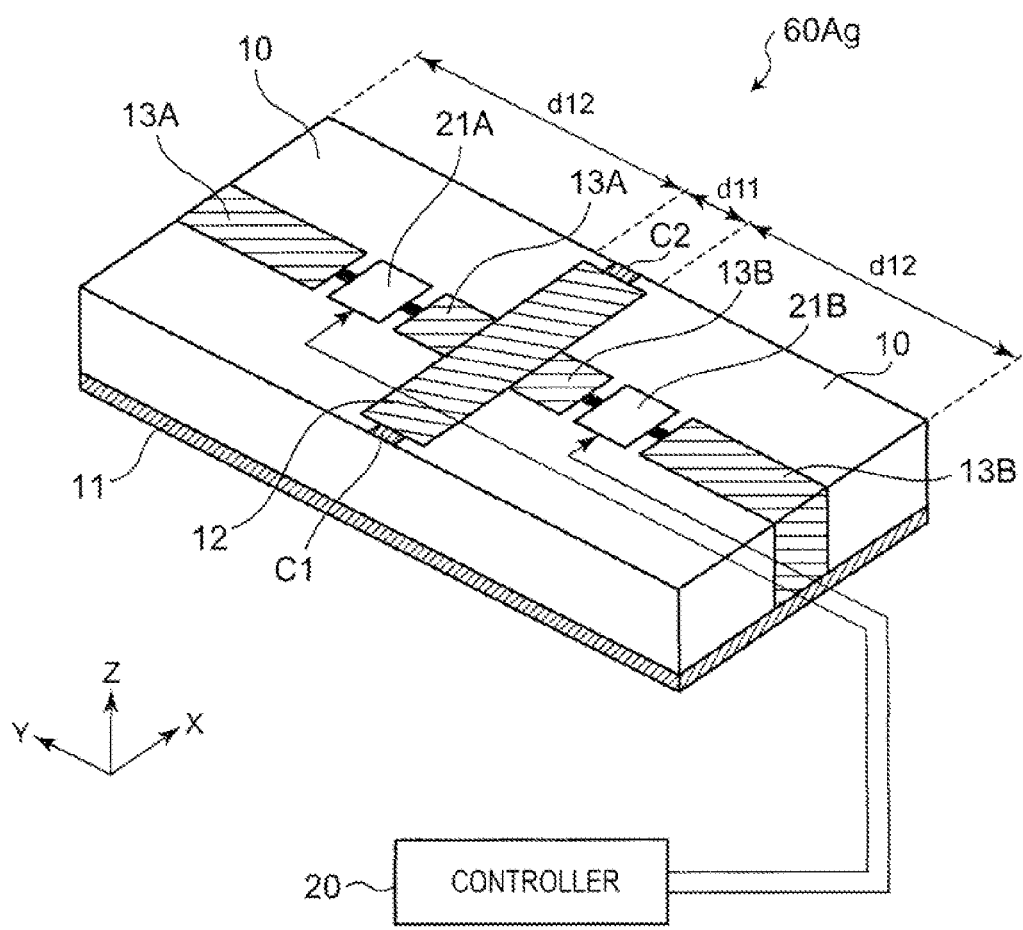
FIG. 31 is a perspective view showing a detailed configuration of a unit cell 60Ag of the transmission line in the nonreciprocal transmission line apparatus according to the seventh modified embodiment of the first embodiment of the present invention.

FIG. 31 is a perspective view showing a detailed configuration of a unit cell 60Ag of the transmission line in the nonreciprocal transmission line apparatus according to the seventh modified embodiment of the first embodiment of the present invention. According to the nonreciprocal transmission line apparatus of the present modified embodiment, the phase shifters 21A and 21B of the nonreciprocal transmission line apparatus of FIG. 25 are further provided with the stub conductors 13A and 13B, respectively, and their amounts of phase shift are changed, in a manner similar to as that of the nonreciprocal transmission line apparatus of FIG. 23. When controlling the gyrotropy by controlling the strength of magnetic field using mechanical moving means or an electromagnet in a manner similar to that of the prior art, the effective permeability of the ferrite changes depending on the strength of the magnetic field, and therefore, there is a problem that the input impedances of the stub conductors 13A and 13B formed on the ferrite substrate 16 are significantly changed by the magnetic field. On the other hand, since the nonreciprocal transmission line apparatus of the present modified embodiment is configured to control the voltages applied to the phase shifters 21A and 21B, it is not necessary to change the applied magnetic fields. Therefore, it is possible to form the stub conductors 13A and 13B on the ferrite substrate 16 as shown in FIG. 31, and simplify the configuration of the nonreciprocal transmission line apparatus.

Figure 32:
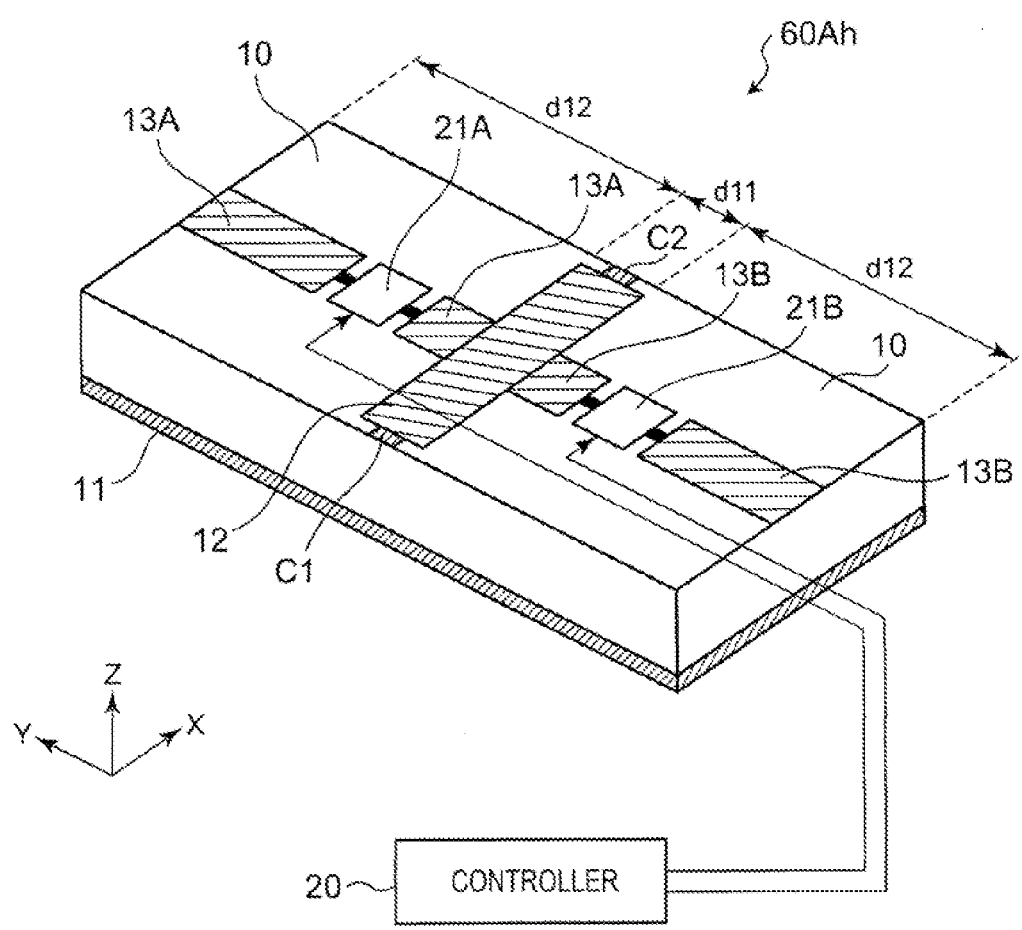
FIG. 32 is a perspective view showing a detailed configuration of a unit cell 60Ah of the transmission line in a nonreciprocal transmission line apparatus according to the eighth modified embodiment of the first embodiment of the present invention.

FIG. 32 is a perspective view showing a detailed configuration of a unit cell 60Ah of the transmission line in a nonreciprocal transmission line apparatus according to the eighth modified embodiment of the first embodiment of the present invention. According to the configuration of FIG. 31, the ends of the stub conductors 13A and 13B are short-circuited to the ground conductor 11. On the other hand, according to the configuration of the present modified embodiment, the ends of the stub conductors 13A and 13B are not short-circuited, but open. Even when the stub conductors 13A and 13B have the open ends, the controller 20 controls the voltages applied to the phase shifters 21A and 21B to change the amounts of phase shift of the phase shifters 21A and 21B, and thus, it is possible to set the impedances of the stub conductors 13A and 13B to different values from each other.

Figure 33:
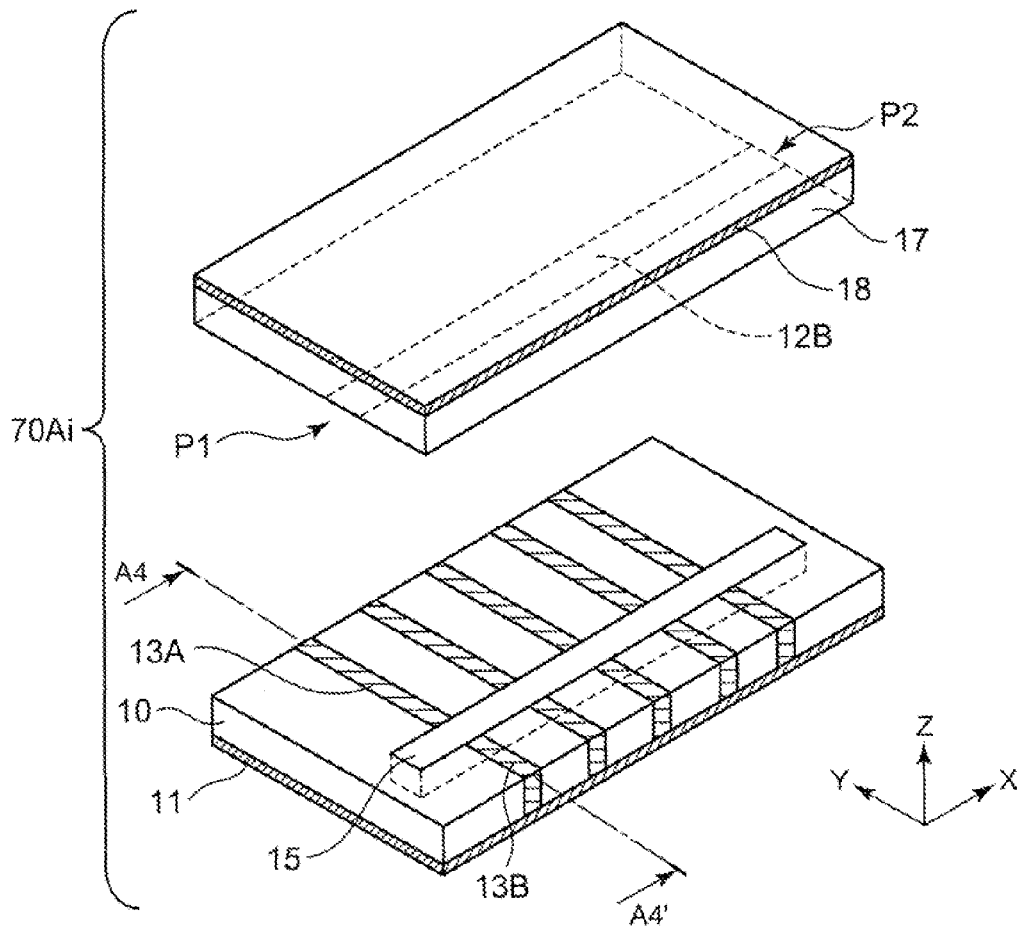
FIG. 33 is a perspective view showing an exploded configuration of a nonreciprocal transmission line apparatus 70Ai according to the ninth modified embodiment of the first embodiment of the present invention.
Figure 34:
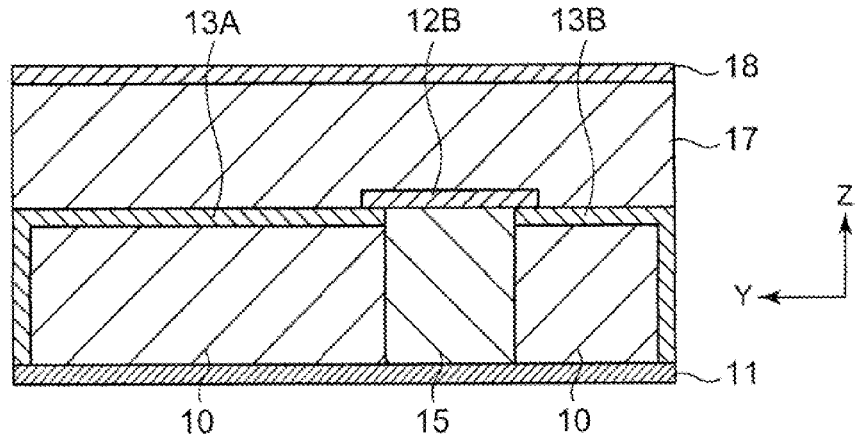
FIG. 34 is a sectional view of the nonreciprocal transmission line apparatus 70Ai of FIG. 33.

FIG. 33 is a perspective view showing an exploded configuration of a nonreciprocal transmission line apparatus 70Ai according to the ninth modified embodiment of the first embodiment of the present invention. FIG. 34 is a sectional view of the nonreciprocal transmission line apparatus 70Ai of FIG. 33. The nonreciprocal transmission line apparatus of the embodiment of the present invention is not limited to the microstrip line, and may be configured as a strip line. FIG. 33 shows the nonreciprocal transmission line apparatus 70Ai of the present modified embodiment separated in two parts. FIG. 34 shows a sectional view of the nonreciprocal transmission line apparatus 70Ai of the present modified embodiment in use (in the state in which the upper part and the lower part of FIG. 33 are assembled together), at the same position as that of the sectional view of FIG. 15 (i.e., the position along the line A4-A4' of FIG. 33). In the lower part of FIG. 33, the dielectric substrate 10, the ground conductor 11, the ferrite square rod 15, and the short-circuited stub conductor are configured in a manner similar to that of FIG. 13. In the upper part of FIG. 33, a ground conductor 18 is formed on the upper surface of the dielectric substrate 17 (surface on the +Z side), and a strip line 12B is formed on the lower surface of the dielectric substrate 17 (surface on the −Z side). The strip line 12B includes a strip conductor and a capacitor per every unit cell of the transmission line, in a manner similar to that of the microstrip line 12A of FIG. 13. As shown in FIG. 34, the strip line 12B is connected to the stub conductors 13A and 13B.

According to the nonreciprocal transmission line apparatus of the present embodiment, it is possible to obtain an asymmetric line structure based on a novel principle, and control the nonreciprocity with a small power consumption.

In the embodiments of the present invention, the nonreciprocal transmission line apparatuses of the modified embodiments shown in FIG. 19 and so on are configured in a manner similar to that of the nonreciprocal transmission line apparatus 70A of FIG. 9, and the unit cells of the modified embodiments shown in FIG. 19 and so on are configured in a manner similar to that of the unit cell 60A of FIG. 1. Moreover, in the embodiments of the present invention, any of the nonreciprocal transmission line apparatuses 70B to 70D of FIGS. 10 to 12 may be used in a manner similar to that of the nonreciprocal transmission line apparatus 70A of FIG. 9. In the embodiments of the present invention, any of the nonreciprocal transmission line apparatuses 70A to 70D of FIGS. 9 to 12 can be used unless specifically mentioned.

Second Embodiment

Figure 35:
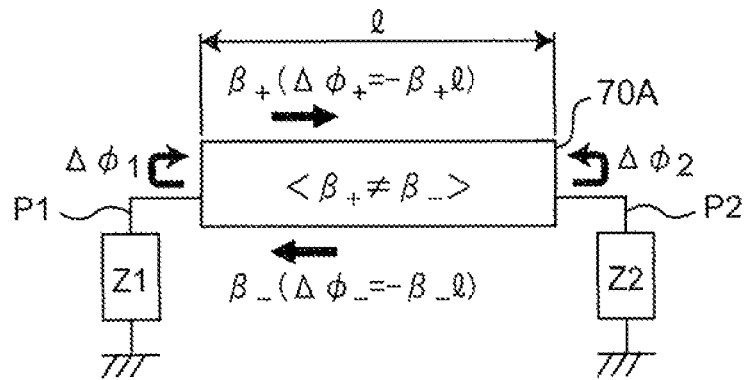
FIG. 35 is a block diagram showing a configuration of a transmission line resonator according to a second embodiment of the present invention.

FIG. 35 is a block diagram showing a configuration of a transmission line resonator according to the second embodiment of the present invention. The transmission line resonator of the present embodiment is characterized by including the nonreciprocal transmission line apparatus (indicated by the reference sign "70A") of the first embodiment.

FIG. 35 schematically shows a microwave resonator model provided with the nonreciprocal transmission line apparatus 70A having a line length of "l". The line length "l" is given by: l=N×d, where "d" denotes a length of a unit cell, and "N" denotes the number of unit cells included in the nonreciprocal transmission line apparatus 70A. When the ports P1 and P2 are located at both ends of the transmission line, "$\Delta\phi_+$" denotes a phase change in the dominant mode propagation from the port P1 to the port P2 due to the line length, "$\Delta\phi_-$" denotes a phase change in the backward dominant mode propagation, and $\Delta\phi_1$ and $\Delta\phi_2$ denote phase changes depending on the conditions of terminations at the ports P1 and P2, respectively. In this case, the resonance condition of the transmission line resonator of FIG. 35 is given as follows.

$$\Delta\phi = \Delta\phi_+ + \Delta\phi_- + \Delta\phi_1 + \Delta\phi_2 = 2n\pi \quad (8)$$

"n" is an integer.

In particular, when considering a case where both the ports P1 and P2 at the ends of the transmission lines are open or both the ports P1 and P2 are short-circuited, since $\Delta\phi_1 + \Delta\phi_2 = 2\pi$ or 0, the condition of the above mathematical formula is simplified as follows.

$$\Delta\phi = \Delta\phi_+ + \Delta\phi_- = 2n\pi \quad (9)$$

In addition, when the ports P1 and P2 are located at both ends of the transmission line, "$\beta_+$" denotes the phase constant of the dominant mode propagation from the port P1 to the port P2, and "$\beta_-$" denotes the phase constant of the backward dominant mode propagation. In this case, the mathematical formula (9) is written as follows.

$$\Delta\phi = \Delta\phi_+ + \Delta\phi_- = -(\beta_+ + \beta_-)l = 2n\pi \quad (10)$$

If the condition:

$$\beta_+ + \beta_- = 0 \quad (11)$$

is satisfied in the mathematical formula (10) for the resonance condition, then it is possible to obtain a microwave resonator, satisfying the resonance condition regardless of the line length "l", and having a resonance frequency not depending on the line length.

Figure 36:
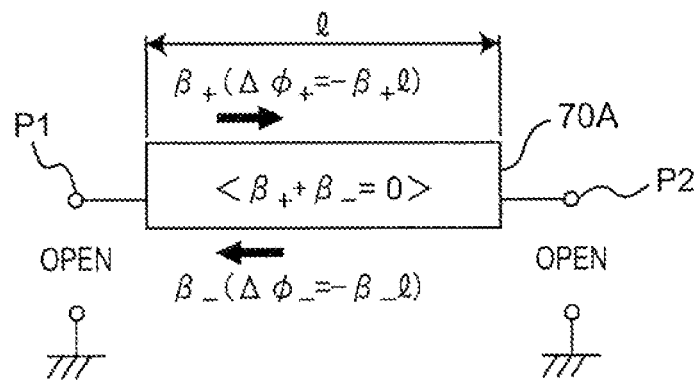
FIG. 36 is a block diagram of the transmission line resonator of FIG. 35 in the first states of its operation.
Figure 37:
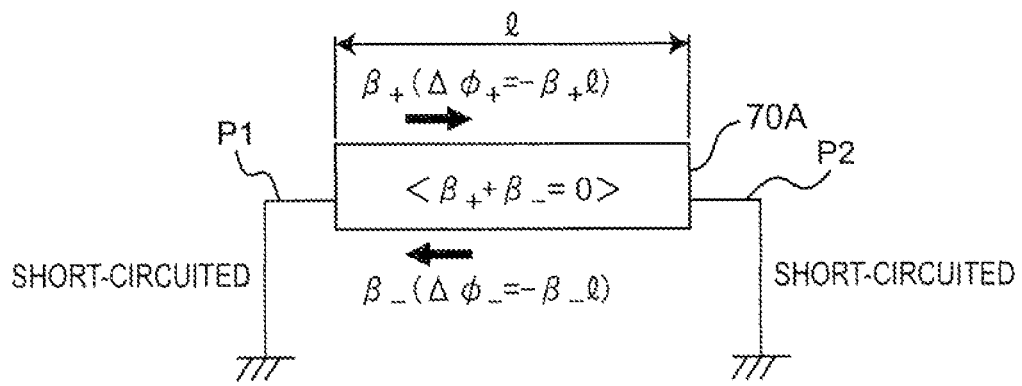
FIG. 37 is a block diagram of the transmission line resonator of FIG. 35 in the second states of its operation.

FIGS. 36 to 39 show block diagrams of the transmission line resonator of FIG. 35 in different states of its operation, respectively. FIG. 36 is a block diagram showing an operation of the transmission line resonator of FIG. 35 having an equal wave number vector regardless of the propagation direction, when both the ends of the transmission line resonator are open. FIG. 37 is a block diagram showing an operation of the transmission line resonator of FIG. 35 having an equal wave number vector regardless of the propagation direction, when both the ends of the transmission line resonator are short-circuited.

In the present embodiment, a microwave resonator including a nonreciprocal transmission line apparatus satisfying the relation:

$$\beta_+ = \beta_- \neq 0 \tag{12}$$

is proposed. The condition of the mathematical formula (12) is satisfied in a transmission line apparatus having the propagation characteristics in which the right-handed transmission occurs in one propagation direction (forward wave), and the left-handed transmission occurs in the other propagation direction (backward wave), and the magnitudes of the propagation constants are equal to each other. This is achieved particularly when magnitudes of the forward and backward propagation constants are equal to each other, in the nonreciprocal transmission line apparatus 70A of the first embodiment operating in the operating band of the transmission band (C) described above (See FIGS. 7 and 8).

The transmission line resonator satisfying the above conditions has the following advantageous features.

(I) the resonance frequency does not depend on the line length (number of cells);

(II) since the wave number vectors of the forward wave and the backward wave have the same direction with each other, no standing wave having nodes and antinodes occurs due to the superposition of a forward wave and a backward wave in a manner similar to that of the prior art, and the distribution of electromagnetic field strength is constant along the longitudinal direction of the transmission line; and (III) with respect to the phase distribution, a phase change appears on the transmission line depending on the wave number vector.

As described above, there are advantageous features of achieving a constant distribution of electromagnetic field strength over the transmission line in a manner similar to that of the zeroth-order resonator of the conventional reciprocal transmission line apparatus, and in addition, achieving a phase change along the transmission line.

Figure 38:
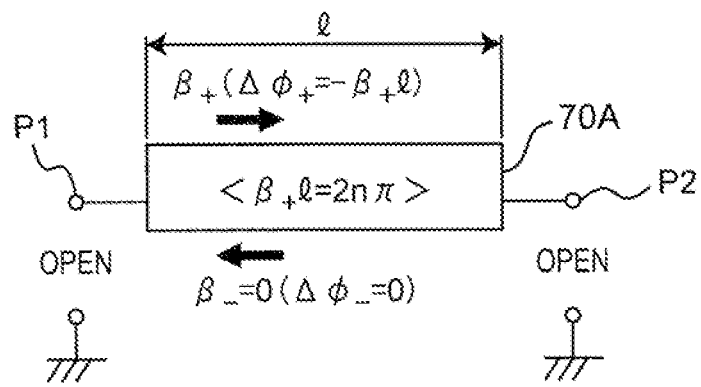
FIG. 38 is a block diagram of the transmission line resonator of FIG. 35 in the third states of its operation.
Figure 39:
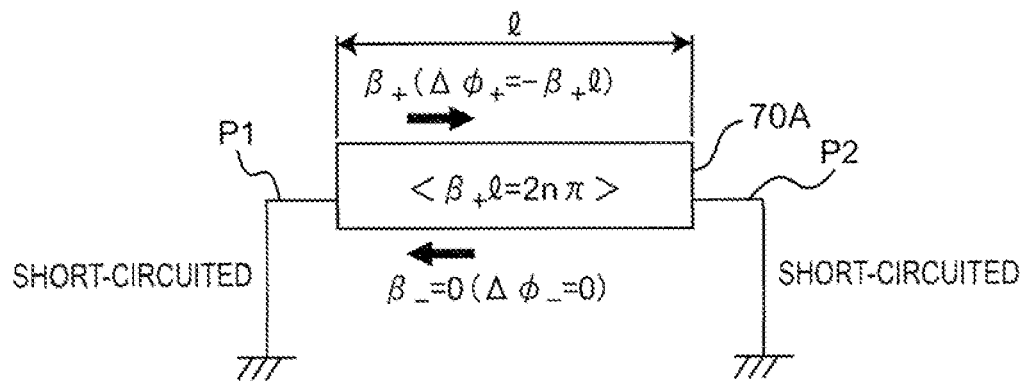
FIG. 39 is a block diagram of the transmission line resonator of FIG. 35 in the fourth states of its operation.

FIG. 38 is a block diagram showing an operation of the transmission line resonator of FIG. 35 having infinite guide wavelength in one propagation direction, when both the ends of the transmission line resonator are open. FIG. 39 is a block diagram showing an operation of the transmission line resonator of FIG. 35 having infinite guide wavelength in one propagation direction, when both the ends of the transmission line resonator are short-circuited.

In the nonreciprocal transmission line apparatus of the transmission bands (B) and (D) described above, the magnitude of one of the forward and backward propagation constants is zero. In this case, it is shown that the resonance frequency depends on the line length under both the resonance conditions of the mathematical formulas (8) and (10), in a manner similar to that of the case of the conventional transmission line resonator. However, even in this case, it is possible to configure a transmission line resonator having the following advantageous features, as similar to the case of the transmission line resonator of the present embodiment described above (See FIGS. 38 and 39).

(I) Since no phase change occurs in a wave propagating in one direction, no standing wave having nodes and antinodes occurs due to the superposition of a forward wave and a backward wave in a manner similar to that of the prior art, and the distribution of electromagnetic field strength is constant along the longitudinal direction of the transmission line.

(II) with respect to the phase distribution, a phase change appears on the transmission line depending on a non-zero wave number vector.

As described above, since the propagation constants of two modes of the forward and backward propagations are different from each other in the nonreciprocal transmission line apparatus 70A as the transmission line resonator, it is possible to remove the null point of the distribution of the electromagnetic field over the nonreciprocal transmission line apparatus 70A except for both ends. For example, when a null point of a current wave or a voltage wave on the resonator is not desired, it is possible to provide a configuration in which any null point is removed. In addition, as a special case, it is possible to configure resonators having the following advantageous features.

(a) A transmission line resonator provided with a nonreciprocal transmission line apparatus, in which a forward transmission occurs as a right-handed transmission at a frequency, and a backward transmission occurs with infinite effective wavelength and with no phase change between input and output at the same frequency. Its resonance frequency depends on the line length, its amplitude is constant over the transmission line, and its phase distribution has a slope.

(b) A transmission line resonator provided with a nonreciprocal transmission line apparatus, in which a forward transmission occurs as a left-handed transmission at a frequency, and a backward transmission occurs with infinite effective wavelength and with no phase change between input and output at the same frequency. Its resonance frequency depends on the line length, its amplitude is constant over the transmission line, and its phase distribution has a gradient.

(c) A transmission line resonator provided with a composite right/left handed nonreciprocal transmission line apparatus, in which the wave number vectors of the two modes of the forward and backward propagations are equal to each other at the same frequency with each other. Its resonance frequency does not depend on the line length, its amplitude is constant over the transmission line, and its phase distribution has a slope.

(d) In any of the cases of (a) to (c), it is possible to change the phase gradient on the transmission line as the resonator, by mechanically, electrically, magnetically, or optically changing the structural parameters.

(e) In general, it is possible to change the resonance frequency, by mechanically, electrically, magnetically, or optically changing the structural parameters.

FIGS. 38 and 39 particularly show configurations and resonance conditions in the case of (a) or (b), when both the ends are open, and when both the ends are short-circuited, respectively. As apparent from FIGS. 38 and 39, it is shown that this amplitude is constant over the transmission line as the resonator, its phase distribution has a slope, and its resonance conditions depend on the line length. On the other hand, FIGS. 36 and 37 show configurations of resonators in the case of (C), in which both the ends are open, and in which both the ends are short-circuited, respectively. According to the schematic views, it is shown that the wave number vectors of the forward and backward propagation modes are equal to each other regardless of the transmission direction, and the resonance conditions can be automatically satisfied regardless of the line length.

According to the transmission line resonator of the present embodiment, the resonance frequency does not depend on the line length "l" of the nonreciprocal transmission line apparatus 70A, but depends on the structure of unit cells. In addition, the distribution of an electromagnetic field over the transmission line resonator is similar to that of the traveling wave resonator. In other words, the distribution of an electromagnetic field amplitude is constant over the transmission line resonator, and the phase distribution varies linearly in space. The spatial gradient of the phase distribution is determined by a nonreciprocal phase constant of the nonreciprocal transmission line apparatus 70A.

The transmission line resonator of the second embodiment may be provided with any of the nonreciprocal transmission line apparatuses 70A of the first embodiment as shown in FIGS. 13 to 34.

Third Embodiment

Figure 40:
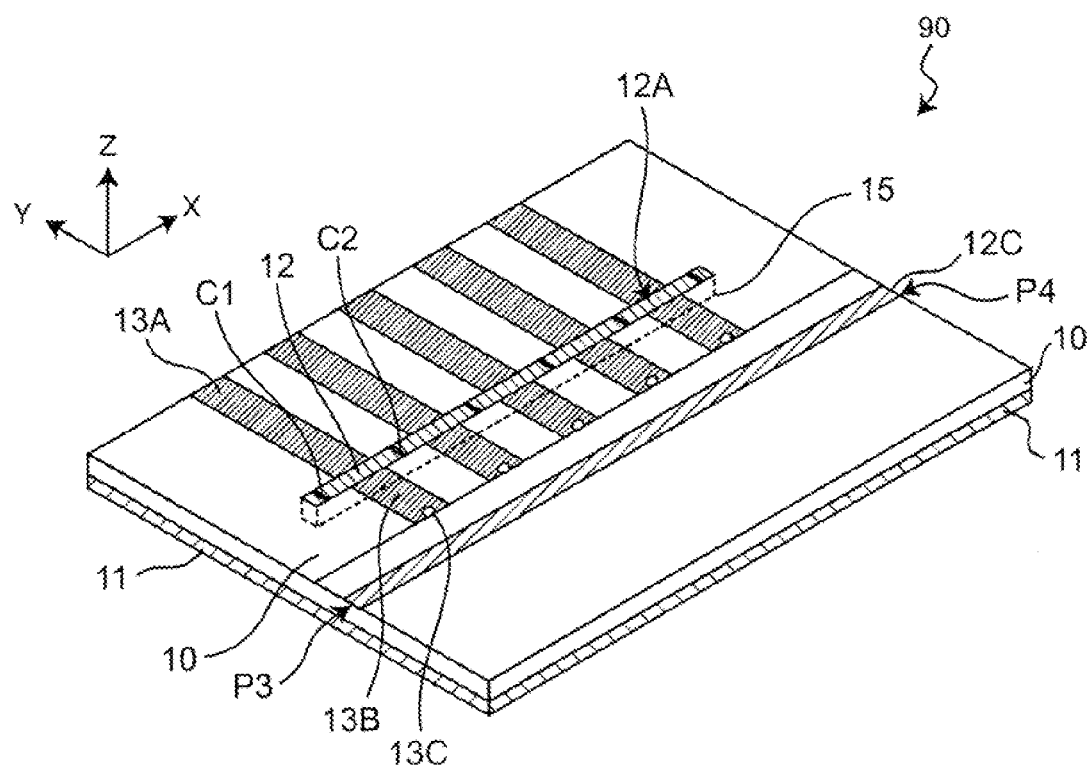
FIG. 40 is a perspective view showing a configuration of a bandstop filter 90 according to a third embodiment of the present invention.

FIG. 40 is a perspective view showing a configuration of a bandstop filter 90 according to a third embodiment of the present invention. The bandstop filter 90 of the present embodiment is characterized by including the nonreciprocal transmission line apparatus 70A of the first embodiment.

A filter may be configured by coupling a feeder transmission line, with at least one or more transmission line resonators provided with the nonreciprocal transmission line apparatus 70A of the first embodiment, the feeder transmission line and the transmission line resonators being coupled edge-to-edge or side-by-side in a manner similar to that of the conventional filter including the reciprocal transmission line apparatus. In this case, the following filters are obtained.

(i) A filter including a transmission line resonator provided with a nonreciprocal transmission line apparatus, in which a forward transmission occurs as a right-handed transmission at a frequency, and a backward transmission occurs with infinite effective wavelength and with no phase change between input and output at the same frequency.

(ii) A filter including a transmission line resonator provided with a nonreciprocal transmission line apparatus, in which a forward transmission occurs as a left-handed transmission at a frequency, and a backward transmission occurs with infinite effective wavelength and with no phase change between input and output at the same frequency.

(iii) A filter including a transmission line resonator provided with a composite right/left handed nonreciprocal transmission line apparatus, in which the wave number vectors of the two modes of the forward and backward propagations are equal to each other at the same frequency with each other.

According to these filters, an amplitude is constant over the transmission line resonator included in the filter, and although depending on the conditions of termination, there is no null point of current or voltage contrary to a conventional standing wave resonator with nodes and antinodes in its voltage or current distribution. Therefore, it is possible to achieve the configuration having a higher degree of freedom.

FIG. 40 shows an exemplary bandstop filter 90 provided with: a nonreciprocal transmission line apparatus similar to that of FIG. 13, and a feeder transmission line. In this case, the feeder transmission line is a microstrip line provided with: a dielectric substrate 10, a ground conductor formed on the bottom surface of the dielectric substrate 10, and a strip conductor 12C formed on the top surface of the dielectric substrate 10; and the microstrip line has two ports P3 and P4. A microwave signal is supplied to either one of the ports P3 and P4. The feeder transmission line is disposed on the side of stub conductors 13B of the nonreciprocal transmission line apparatus at a distance, so as to be electromagnetically coupled to the nonreciprocal transmission line apparatus side-by-side. Each stub conductor 13B is connected to the ground conductor 11 via a through-hole conductor 13C penetrating the dielectric substrate 10 in the thickness direction. The through-hole conductors 13C are not necessary when the stub conductors 13A and 13B are open. With the above configuration, it is possible to obtain the bandstop filter 90 having two ports P3 and P4.

Figure 41:
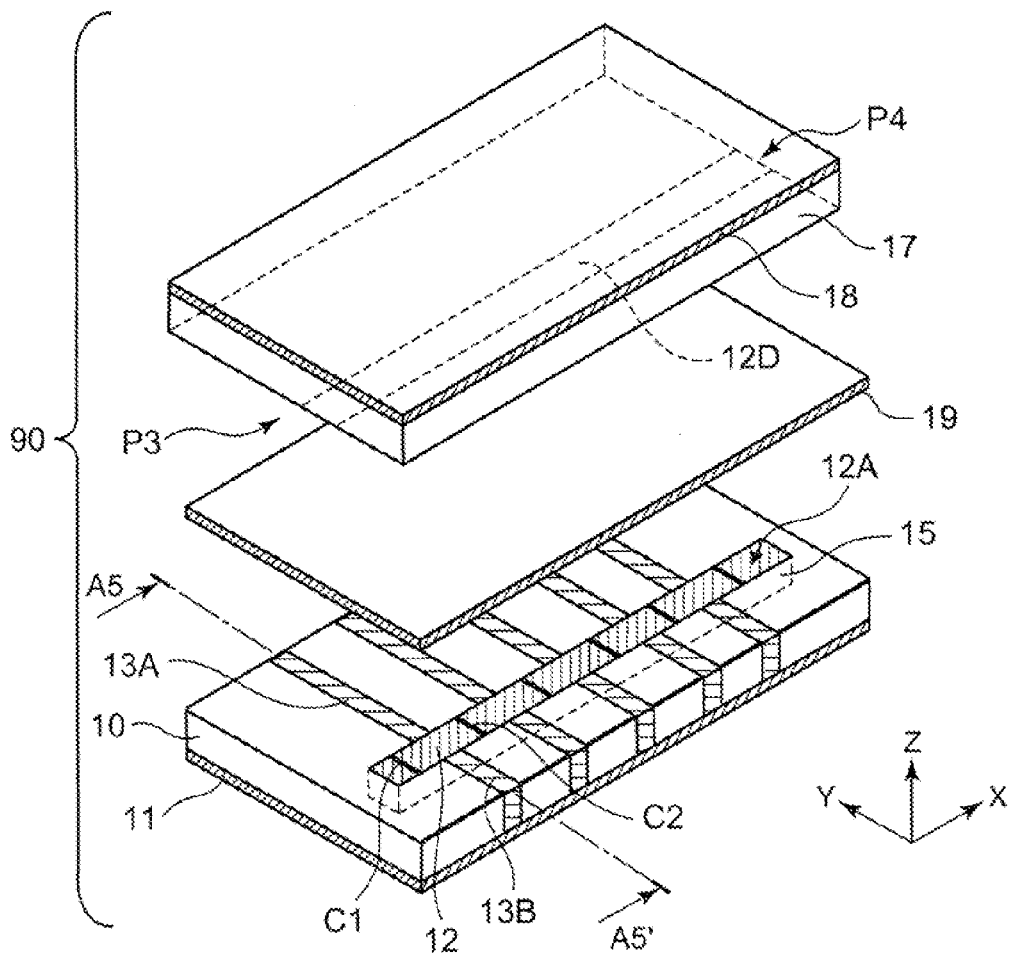
FIG. 41 is a perspective view showing a configuration of a bandstop filter 90 according to a first modified embodiment of the third embodiment of the present invention.
Figure 42:
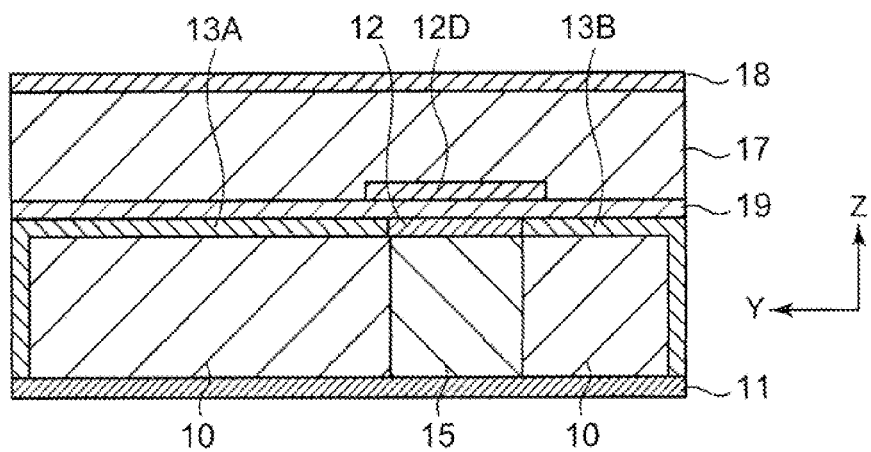
FIG. 42 is a sectional view of the bandstop filter 90 of FIG. 41.

FIG. 41 is a perspective view showing a configuration of a bandstop filter 90 according to the first modified embodiment of the third embodiment of the present invention. FIG. 42 is a sectional view of the bandstop filter 90 of FIG. 41. FIG. 42 shows a sectional view of the bandstop filter 90 of the present modified embodiment in use (in the state in which the parts of FIG. 41 are assembled together), at the same position as that of the sectional view of FIG. 34 (i.e., the position along the line A5-A5' of FIG. 41). In the filter of FIG. 40, the feeder transmission line and the nonreciprocal transmission line apparatus are electromagnetically coupled side-by-side. On the other hand, in the present modified embodiment, the feeder transmission line and the nonreciprocal transmission line apparatus are coupled along their broadside. Referring to FIGS. 41 and 42, a nonreciprocal transmission line apparatus similar to that of FIG. 13 is formed on the bottom dielectric substrate 10, and a microstrip line is formed on the top dielectric substrate 17, the microstrip line provided with: a ground conductor formed on the upper surface of the dielectric substrate 10, and a strip conductor 12D formed on the lower surface of the dielectric substrate 10, and the microstrip line having two ports P3 and P4. A dielectric layer 19 is provided between the lower nonreciprocal transmission line apparatus and the upper microstrip line, and the nonreciprocal transmission line apparatus and the microstrip line are electromagnetically coupled to each other. With the above configuration, it is possible to obtain the bandstop filter 90 having two ports P3 and P4.

Figure 43:
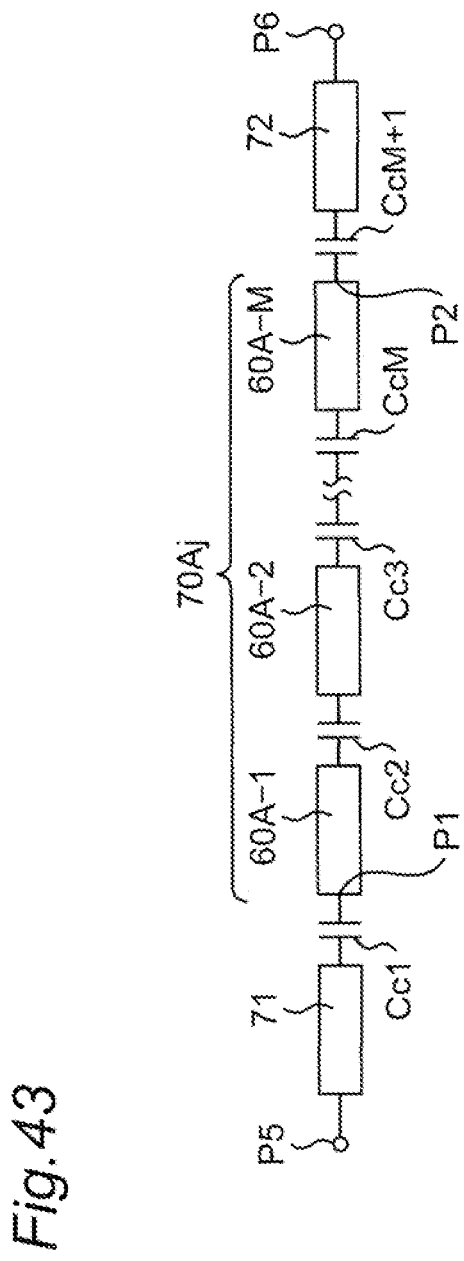
FIG. 43 is a block diagram showing a configuration of a bandpass filter according to a second modified embodiment of the third embodiment of the present invention.

FIG. 43 is a block diagram showing a configuration of a bandpass filter according to a second modified embodiment of the third embodiment of the present invention. The bandpass filter of the present embodiment is configured by including a nonreciprocal transmission line apparatus 70Aj according to the first embodiment, having edges to which other elements can be coupled. Referring to FIG. 43, the nonreciprocal transmission line 70Aj includes a cascade connection of unit cells 60A-1 to 60A-M of the transmission line via coupling capacitors Cc2 to CcM. A port P5 is connected to a port P6, through the transmission line 71, a coupling capacitor Cc1, a nonreciprocal transmission line 70Aj, a coupling capacitor CcM+1, and a transmission line 72, and thus, a bandpass filter is configured.

In the embodiments of FIGS. 40 and 43, the coupling capacitors as series capacitance may be used for the coupling between each pair of adjacent elements. On the other hand, when the transmission line has the unit cells of π-structure and is terminated by shunt inductive elements, a filter may be configured through magnetic coupling.

When the nonreciprocal transmission line apparatus included in the filter is of the nonreciprocal transmission line apparatus of the type (iii), the operating frequency does no significantly change even when changing the line length (size) of each nonreciprocal transmission line apparatus. On the other hand, it is possible to change the Q factor by changing the number of unit cells, i.e., the line length. For example, in the case of the bandpass filter of FIG. 43, it is possible to electrically change the positions of termination of the nonreciprocal transmission line apparatus included in the filter, by electrically changing the capacitance of the series coupling capacitors. Therefore, it is possible to change the total number of nonreciprocal transmission line apparatus included in the filter, or to change the number of unit cells included in each individual nonreciprocal transmission line apparatus. This makes it possible to change the passband and the bandwidth over time. The same also applies to the bandstop filter of FIG. 40. It is possible to change the operating band bandwidth over time not only by using the electrical method described above, but also by mechanically, electrically, magnetically, or optically changing structural parameters of the series capacitance element and other elements.

The filter of the third embodiment may be provided with any of the nonreciprocal transmission line apparatuses 70A of the first embodiment as shown in FIGS. 13 to 34.

Fourth Embodiment

Figure 44:
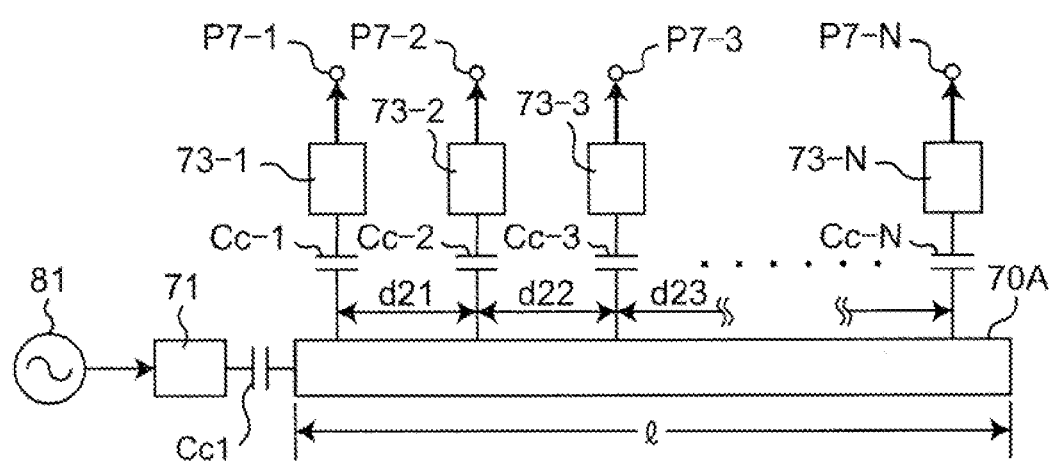
FIG. 44 is a block diagram showing a configuration of an equal power divider according to a fourth embodiment of the present invention.

FIG. 44 is a block diagram showing a configuration of an equal power divider according to a fourth embodiment of the present invention. The equal power divider according of the present embodiment is a kind of a coupler provided with the nonreciprocal transmission line apparatus 70A of the first embodiment as a transmission line resonator, and has a phase gradient.

Referring to FIG. 44, a microwave signal generated by a microwave signal generator 81 is inputted to the nonreciprocal transmission line apparatus 70A with a line length "l", through the transmission line 67 and the coupling capacitor Cc1. The transmission line apparatus 70A is connected with transmission lines 73-1 to 37-N through coupling capacitors Cc-1 to Cc-N with intervals of d21, d22, d23, . . . in the propagation direction, the transmission lines 73-1 to 37-N having output ports P7-1 to P7-N for outputting divided signals. According to the equal power divider provided with the nonreciprocal transmission line resonator as described above, it is possible to equally divide power to the output ports P7-1 to P7-N with a phase gradient. That is, according to the present embodiment, it is possible to configure the equal power divider with phase changes among the output ports P83-1 to P83-N.

Specifically, when the nonreciprocal transmission line apparatus of the first embodiment operates as one of the following transmission line resonators:

(i) a transmission line resonator provided with a nonreciprocal transmission line apparatus, in which a forward transmission occurs as a right-handed transmission at a frequency, and a backward transmission occurs with infinite effective wavelength and with no phase change between input and output at the same frequency, (ii) a transmission line resonator provided with a nonreciprocal transmission line apparatus, in which a forward transmission occurs as a left-handed transmission at a frequency, and a backward transmission occurs with infinite effective wavelength and with no phase change between input and output at the same frequency, and (iii) a transmission line resonator provided with a composite right/left handed nonreciprocal transmission line apparatus, having the same wave number vectors of the two modes of the forward and backward propagations at the same frequency, then the amplitude is constant over the transmission line, and therefore, the degree of electromagnetic coupling is also approximately constant regardless of positions at which the nonreciprocal transmission line apparatus 70 A is branched. Therefore, easy designing can be achieved.

Moreover, since there is a phase distribution over the nonreciprocal transmission line apparatus 70 A, it is possible to provide phase changes among the output ports P7-1 to P7-N by changing the positions at which the nonreciprocal transmission line apparatus 70 A is branched. Moreover, it is also possible to continuously change the phase differences among the output ports P7-1 to P7-N by mechanically, electrically, magnetically, or optically changing the structural parameters.

An exemplary applications of the equal power divider with a phase gradient is as follows. According to a conventional phased array antenna apparatus, It is necessity to steer the radiation beam by independently changing phases of phase shifters which are provided to feed lines for antenna elements of the array antenna, respectively. On the other hand, according to the equal power divider of the present embodiment, it is possible to continuously change the phase differences between the output ports by using a centralized control method to mechanically, electrically, magnetically, or optically change the structural parameters of the nonreciprocal transmission line apparatus as a transmission line resonator. Therefore, there are advantageous effects of achieving a steerable array antenna, and achieving a very simplified configuration as compared to the case of using a plurality of the conventional phase shifters.

The equal power divider of the fourth embodiment may be provided with any of the nonreciprocal transmission line apparatuses 70A of the first embodiment as shown in FIGS. 13 to 34.

Fifth Embodiment

Figure 45:
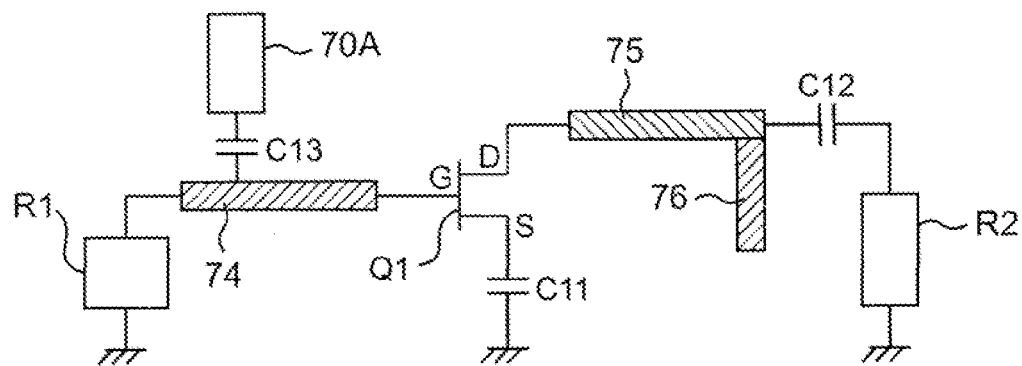
FIG. 45 is a block diagram showing a configuration of a series feedback oscillator according to a fifth embodiment of the present invention.

FIG. 45 is a block diagram showing a configuration of a series feedback oscillator according to a fifth embodiment of the present invention. The series feedback oscillator of the present embodiment is characterized by including the nonreciprocal transmission line apparatus of the first embodiment.

For the purposes of noise suppression and so on, a resonator of a high Q factor is often inserted to a oscillator for use in the microwave and millimeter wave bands. The nonreciprocal transmission line apparatus of the first embodiment can be used to serve as not only the transmission line resonator, but also a phase adjuster in a positive feedback loop, since the nonreciprocal transmission line apparatus provides a phase change over the transmission line. Moreover, it is also possible to finely adjust the Q factor and the amount of phase shift by mechanically, electrically, magnetically, or optically changing the structural parameters.

Referring to FIG. 45, the gate of a field-effect transistor (FET) Q1 as an active device is grounded through a transmission line 74 and a load resister R1 of 50 [Ω], and the transmission line 74 is connected with the transmission line apparatus 70A as a resonator, through a coupling capacitor C13. The source of the FET Q1 is grounded through a coupling capacitor C11, and its drain is grounded through a transmission line 75, a coupling capacitor C12 and a load resister R2 of a resistance value $R_L$. One end of the transmission line 75 is connected with a transmission line 76 having an open end. With the above arrangement, the series feedback oscillator is configured.

Figure 46:
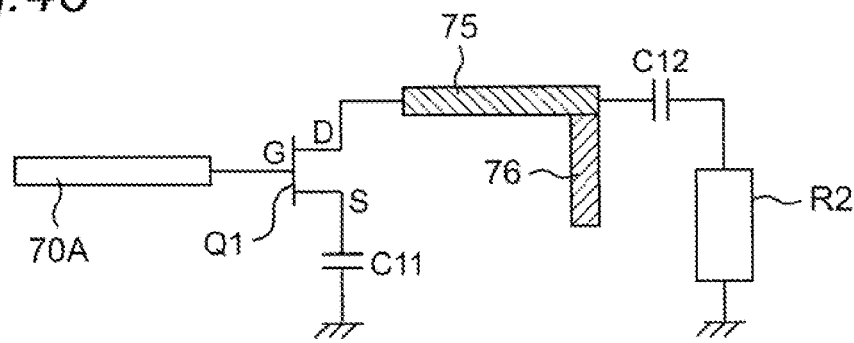
FIG. 46 is a block diagram showing a configuration of a series feedback oscillator according to a first modified embodiment of the fifth embodiment of the present invention.

FIG. 46 is a block diagram showing a configuration of a series feedback oscillator according to a first modified embodiment of the fifth embodiment of the present invention. According to the series feedback oscillator of the present modified embodiment, the gate of the FET Q1 is connected with only the transmission line apparatus 70A as the resonator, in place of the circuit as shown in FIG. 45. With the above arrangement, the series feedback oscillator is configured. Referring to FIGS. 45 and 46, the nonreciprocal transmission line apparatus 70A, or a combination of the nonreciprocal transmission line apparatus 70A and other transmission lines serves as a bandstop filter, and operates as a reflection resonator in the stop band of the bandstop filter. With the above arrangement, the series feedback oscillator is configured.

Figure 47:
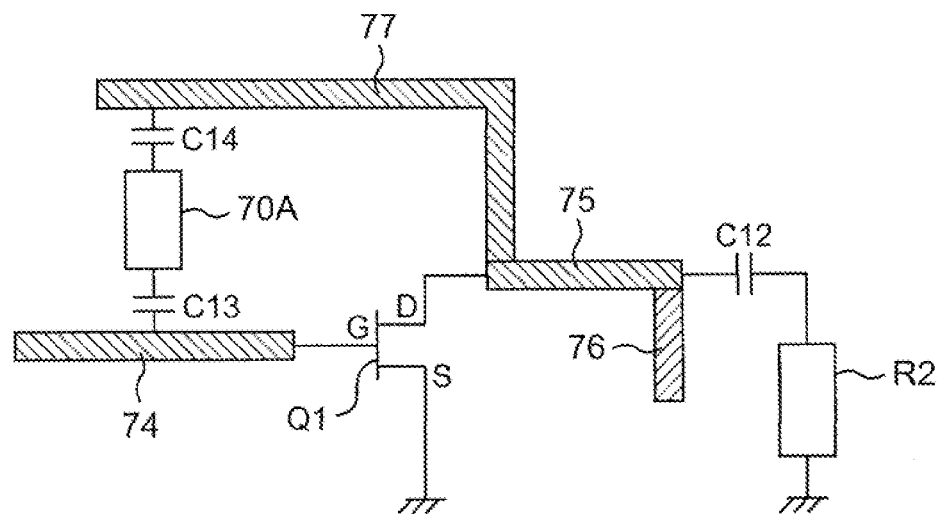
FIG. 47 is a block diagram showing a configuration of a parallel feedback oscillator according to a second modified embodiment of the fifth embodiment of the present invention.

FIG. 47 is a block diagram showing a configuration of a parallel feedback oscillator according to a second modified embodiment of the fifth embodiment of the present invention. The parallel feedback oscillator of the present modified embodiment is characterized by having a configuration similar to that of FIG. 45, and further including a feedback loop circuit as described below. The other end of the transmission line 75 is connected to the other end of the nonreciprocal transmission line apparatus 70A as a resonator, through a transmission line 77 and a coupling capacitor C14. With this arrangement, a parallel feedback circuit is configured by connecting the drain of the FET Q1 to the gate of the FET Q1, through the transmission line 77, the coupling capacitor C14, the nonreciprocal transmission line apparatus 70A as the resonator, the coupling capacitor C13, and the transmission line 74, and the parallel feedback circuit operates as a parallel feedback oscillator. Referring to FIG. 47, a combination of the nonreciprocal transmission line apparatus and the transmission lines serves as a bandpass filter, and operates as a positive feedback loop circuit for oscillation in the band of the bandpass filter.

The series feedback oscillator of the fifth embodiment may be provided with any of the nonreciprocal transmission line apparatuses 70A of the first embodiment as shown in FIGS. 13 to 34.

Sixth Embodiment

Figure 48:
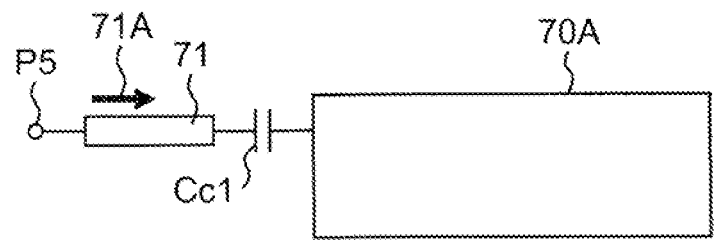
FIG. 48 is a block diagram showing a configuration of an antenna apparatus according to a sixth embodiment of the present invention.
Figure 49:
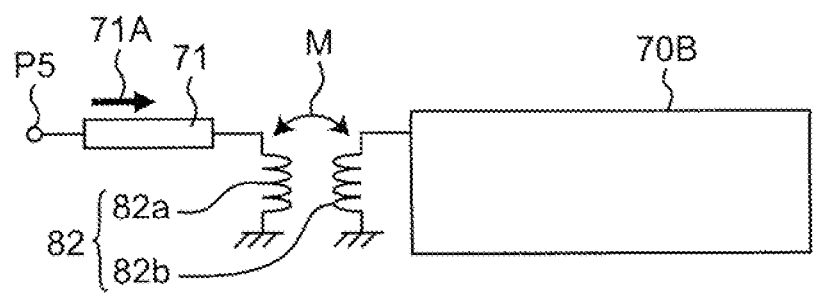
FIG. 49 is a block diagram showing a configuration of an antenna apparatus according to a first modified embodiment of the sixth embodiment of the present invention.

FIG. 48 is a block diagram showing a configuration of an antenna apparatus according to a sixth embodiment of the present invention. FIG. 49 is a block diagram showing a configuration of an antenna apparatus according to a first modified embodiment of the sixth embodiment of the present invention. Each of the antenna apparatuses of FIGS. 48 and 49 are characterized by including the nonreciprocal transmission line apparatus 70A or 70B of the first embodiment (configured as a microstrip line). FIG. 48 shows an exemplary case including unit cells of T-structure, and having series branch capacitors at both ends of the resonator. FIG. 49 shows an exemplary case including unit cells of π-structure, and having shunt inductance elements at both ends of the resonator. In FIGS. 48 and 39, "71A" denotes the direction of feeding a microwave signal.

Many of the conventional antenna apparatuses are configured by parts: including an antenna resonator, a feed line to the antenna resonator, and a matching circuit between them. Exemplary conventional antenna apparatuses also include: a patch antenna apparatus, a dielectric antenna apparatus, and so on. In the case of the antenna apparatus including such a resonator, a standing wave occurs in the resonator, nodes and antinodes exist in the electromagnetic field distribution, and they are almost in-phase. As a result, the antenna apparatus often has an omnidirectional pattern, or a pattern with a main lobe directed toward the broadside with respect to the antenna radiation plane. On the other hand, the antenna apparatus provided with the nonreciprocal transmission line apparatus 70A of the present embodiment has the following advantageous features.

(a) Since a constant amplitude distribution and a phase gradient can be achieved, it is possible to set the radiation beam in a desired direction, regardless of the fact that the antenna apparatus is a single resonator antenna apparatus.

(b) With respect to (a), it is possible to improve the gain and the directional pattern by increasing the line length of the resonator, due to the constant amplitude distribution.

(c) It is possible to steer the radiation beam by mechanically, electrically, magnetically, or optically changing the structural parameters, regardless of the fact that the antenna apparatus is a single resonator antenna apparatus.

Referring to FIG. 48, the port P5 is connected to the nonreciprocal transmission line apparatus 70A as a transmission line resonator antenna apparatus, through the transmission line 71 and the coupling capacitor Cc1. In this case, the nonreciprocal transmission line apparatus 70A as the transmission line resonator antenna apparatus resonates by feeding the port P5 with a microwave signal, and an electromagnetic wave of the microwave signal are radiated into a free space.

Figure 50:
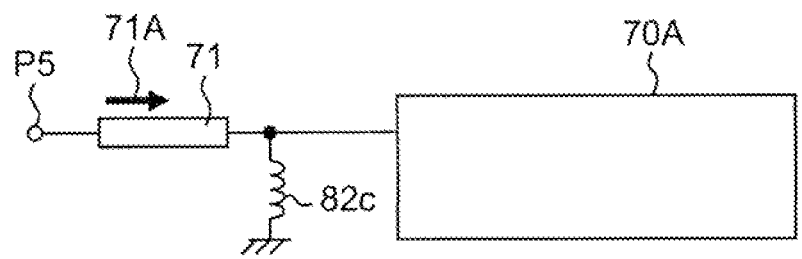
FIG. 50 is a block diagram showing a configuration of an antenna apparatus according to a second modified embodiment of the sixth embodiment of the present invention.

Referring to FIG. 49, the port P5 is connected to the nonreciprocal transmission line apparatus 70B as a transmission line resonator antenna apparatus, through the transmission line 71 and a transformer 82, the transformer 82 including a primary coil 82a and a secondary coil 82b having mutual electromagnetic coupling M. In this case, the nonreciprocal transmission line apparatus 70B as the transmission line resonator antenna apparatus resonates by feeding the port P5 with a microwave signal, and an electromagnetic wave of the microwave signal are radiated into a free space. Further, FIG. 49 is a block diagram showing a configuration of an antenna apparatus according to a second modified embodiment of the sixth embodiment of the present invention. FIG. 50 is characterized by inserting a shunt inductor 82c, in place of the transformer 82 for magnetic coupling.

A line operable as a conventional leaky wave antenna apparatus is a reciprocal transmission line, and when a leaky wave of forward signal transmission forms a forward radiation beam, a leaky wave of backward signal transmission also forms the same forward radiation beam. In addition, in this case, when a leaky wave of forward signal transmission forms a backward radiation beam, a leaky wave of backward signal transmission also forms the same backward radiation beam. By employing the nonreciprocal transmission line apparatus 70A of the present invention as a transmission line operable as a leaky wave antenna apparatus, the following configurations can be provided.

(i) A nonreciprocal leaky wave antenna apparatus, in which a leaky wave of a forward propagation signal in a transmission line forms a forward radiation beam at a frequency, and a leaky wave of a backward propagation signal in the transmission line forms a backward radiation beam at the same frequency.

(ii) A nonreciprocal leaky wave antenna apparatus, in which a leaky wave of a forward propagation signal in a transmission line forms a forward radiation beam at a frequency, and a leaky wave of a backward propagation signal in the transmission line forms a radiation beam on the broadside (hereinafter, referring to a direction orthogonal to the propagation direction) at the same frequency.

(iii) A nonreciprocal leaky wave antenna apparatus, in which a leaky wave of a forward propagation signal in a transmission line forms a backward radiation beam at a frequency, and a leaky wave of a backward propagation signal in the transmission line forms a radiation beam on the broadside at the same frequency.

(iv) A nonreciprocal leaky wave antenna apparatus as a special case of the nonreciprocal leaky wave antenna apparatus of (i), in which a leaky wave from a transmission line forms a radiation beam directed in the same direction at the same frequency regardless of the propagation direction of a signal.

(v) A nonreciprocal leaky wave antenna apparatus, in which a leaky wave forms the same forward radiation beam at the same frequency regardless of the propagation direction of a signal in a transmission line, with different radiation angles depending on the propagation direction.

(vi) A nonreciprocal leaky wave antenna apparatus, in which a leaky wave forms the same backward radiation beam at the same frequency regardless of the propagation direction of a signal in a transmission line, with different radiation angles depending on the propagation direction.

(vii) A nonreciprocal leaky wave antenna apparatus provided with a combination of at least two or more of (i) to (vi).

These nonreciprocal leaky wave antenna apparatuses have the following unique operations and advantageous effects.

(A) It is possible to steer a radiation beam and change polarization characteristics by selecting the transmission direction of a signal without changing the structural parameters of a transmission line.

Moreover, the conventional leaky wave antenna apparatus has a problem that a side lobe is formed as an unnecessary radiation beam in a direction opposite to that of the case of the forward propagation, due to the propagation of a reflected wave along the transmission line due to mismatching at an end of the transmission line operable as the antenna apparatus. Therefore, a microwave signal is assumed to propagate in one direction in the transmission line, and in addition, matching at both ends of the transmission line is important to circuit design. On the other hand, the nonreciprocal leaky wave antenna apparatus provided with the nonreciprocal transmission line apparatus 70A of the first embodiment can form a radiation beam in the same direction, regardless of the selection of the input terminals in the transmission line, and the propagation direction of the microwave signal. As a result, by optimally designing its configuration, it is possible to obtain the following unique operations and advantageous effects.

(B) It is possible to control the leaky wave radiation beam by using signals inputted from both ends of the nonreciprocal transmission line apparatus 70A of the antenna apparatus and simultaneously propagating in both directions, improve the antenna gain and the directional pattern, and reduce the size.

(C) It is possible to control the radiation main lobe by particularly using signals inputted from one end and reflected at the other end, improve the antenna gain and the directional pattern, and reduce the antenna size.

(D) It is possible to steer the radiation beam by mechanically, electrically, magnetically, or optically changing the structural parameters.

The antenna apparatus of the sixth embodiment may be provided with any of the nonreciprocal transmission line apparatuses 70A of the first embodiment as shown in FIGS. 13 to 32.

Seventh Embodiment

Figure 51:
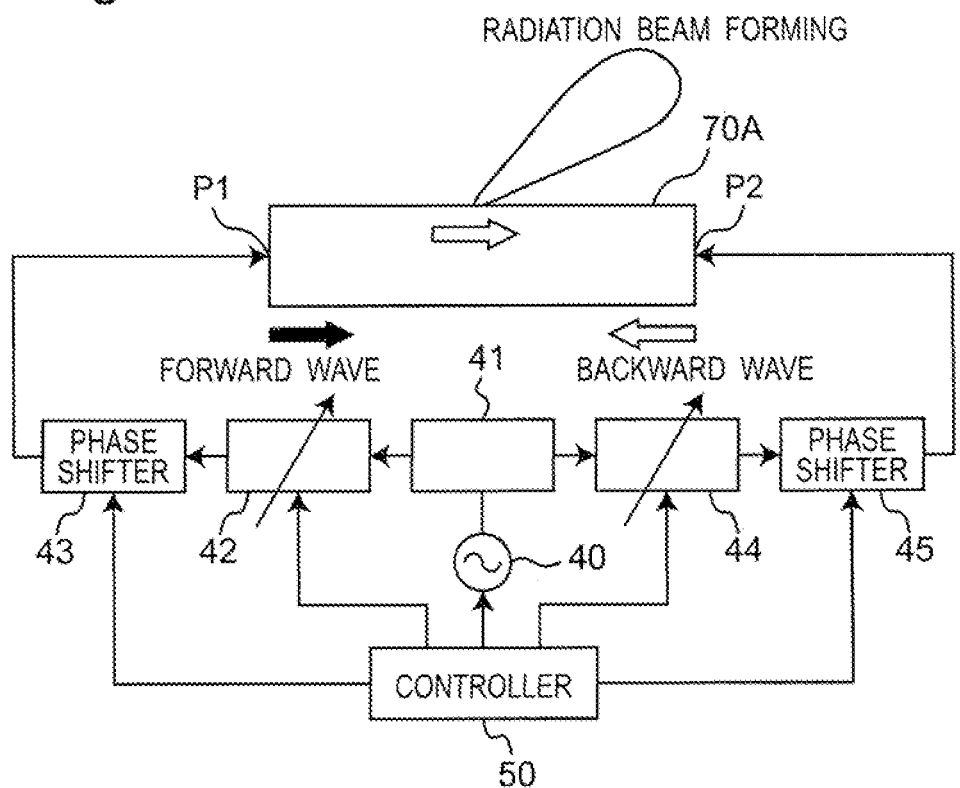
FIG. 51 is a block diagram showing a configuration of an antenna apparatus according to a seventh embodiment of the present invention.

FIG. 51 is a block diagram showing a configuration of an antenna apparatus according to a seventh embodiment of the present invention. The antenna apparatus of the present embodiment is characterized by including the nonreciprocal transmission line apparatus 70A of the first embodiment (configured as a microstrip line).

Figure 55:
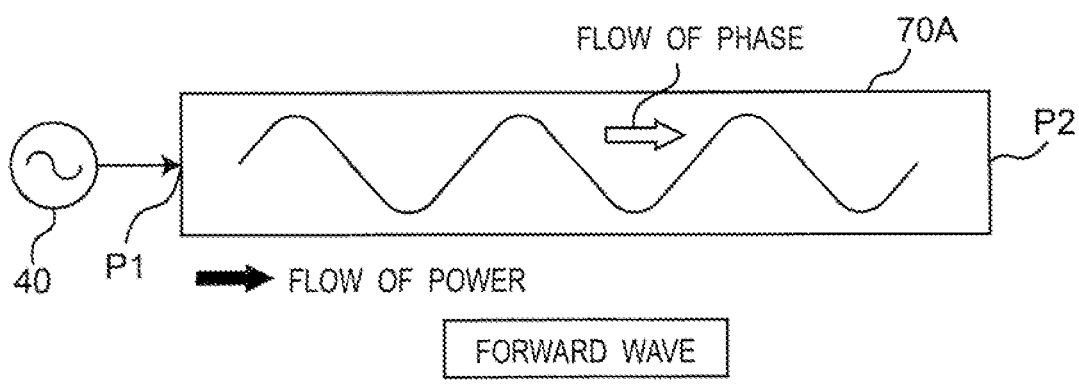
FIG. 55 is a schematic view showing a flow of phase and a flow of power of a forward wave along a right-handed transmission line when a microwave signal is inputted to the port P1 of antenna apparatuses of FIGS. 51 to 54.
Figure 56:
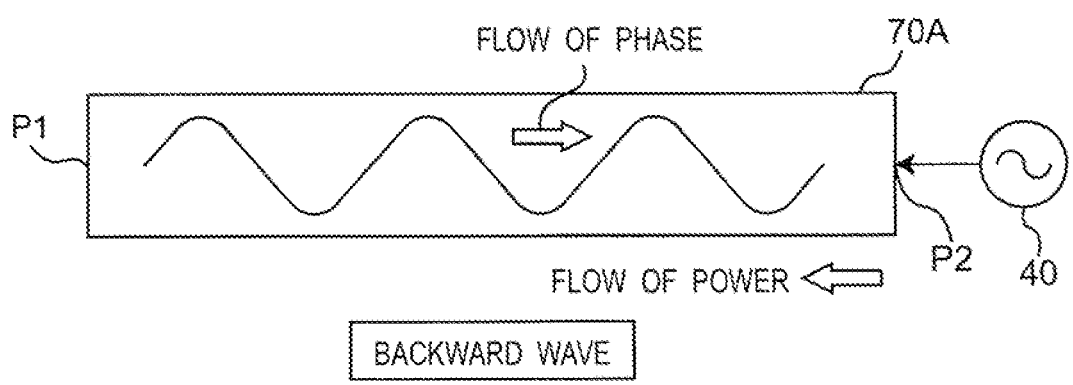
FIG. 56 is a schematic view showing a flow of phase and a flow of power of a backward wave along a left-handed transmission line when a microwave signal is inputted to the port P2 of the antenna apparatuses of FIGS. 51 to 54.

Referring to FIG. 51, a microwave signal (a microwave signal, etc.) from one microwave signal generator 40 is divided into two signals by a power divider 41, and the two divided signals are inputted to one nonreciprocal 70A through ports P1 and P2 at both ends in both directions of opposite forward and backward directions, and thus, a leaky wave is radiated. That is, one microwave signal from the power divider 41 is inputted into the nonreciprocal transmission line 70A through a variable attenuator 42, a phase shifter 43, and the port P1, and on the other hand, the other microwave signal from the power divider 41 is inputted into the nonreciprocal transmission line 70A through a variable attenuator 44, a phase shifter 45, and the port P2. FIG. 55 is a schematic view showing a flow of phase and a flow of power of a forward wave along a right-handed transmission line when a microwave signal is inputted to the port P1 of antenna apparatuses of FIGS. 51 to 54. FIG. 56 is a schematic view showing a flow of phase and a flow of power of a backward wave along a left-handed transmission line when a microwave signal is inputted to the port P2 of the antenna apparatuses of FIGS. 51 to 54. In this case, by changing the amounts of attenuation of the variable attenuators 42 and 44 and the amounts of phase shift of the phase shifters 43 and 45, it is possible to change the radiation pattern of the leaky wave radiated from the nonreciprocal transmission line 70A (including a direction of the main beam, and a directional radiation power). By optimally selecting and setting a ratio and initial phases of powers inputted to the input ports P1 and P2, it is possible to optimize the distribution of the electromagnetic field over the nonreciprocal transmission line 70A to improve the radiation characteristics of the leaky wave antenna. That is, it is possible to change the main beam direction, the beam width, and so on of the leaky wave from the nonreciprocal transmission line 70A, to the desired values.

Figure 52:
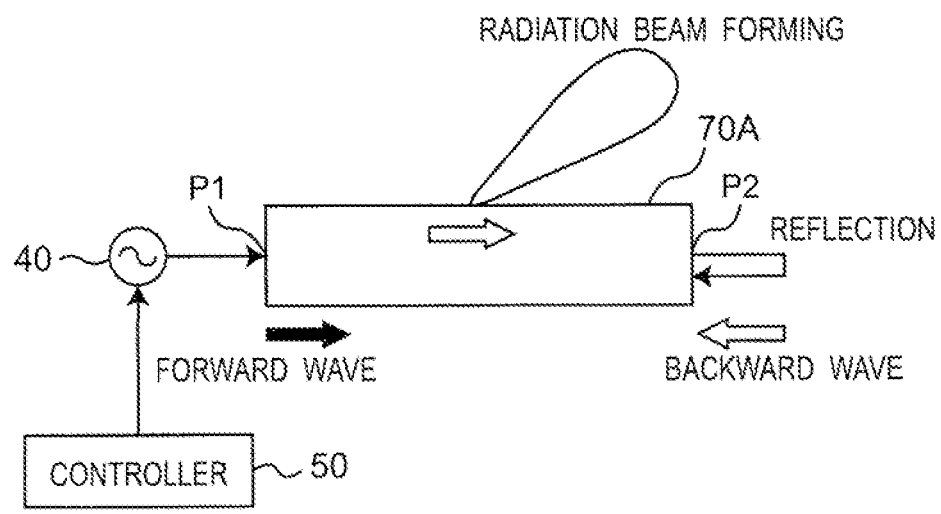
FIG. 52 is a block diagram showing a configuration of an antenna apparatus according to a first modified embodiment of the seventh embodiment of the present invention.

FIG. 52 is a block diagram showing a configuration of an antenna apparatus according to a first modified embodiment of the seventh embodiment of the present invention. FIG. 52 shows an antenna apparatus with a one-way input, in which only one port P1 is selected as an input port. In this case, it is not necessary to insert a special matching circuit at the other end (port P2) of the nonreciprocal transmission line 70A. That is, no matching is done at the end (port P2), and even if a reflected wave occurs, a leaky wave caused by the propagation of the reflected wave is also in the same direction as that of the input wave. Therefore, no side lobe due to the reflected wave occurs, in contrast to the leaky wave radiation of the conventional transmission line apparatus. It is possible to improve the leaky wave radiation characteristics, by rather optimally selecting the impedance at the end (port P2) (e.g., selecting a electrical length of the nonreciprocal transmission line 70A) to optimize the distribution of the electromagnetic field over the nonreciprocal transmission line 70A, from the viewpoint of improvement particularly based on the reflection characteristics. That is, it is possible to change the main beam direction, the beam width, and so on of the leaky wave from the nonreciprocal transmission line 70A, to the desired values.

Figure 53:
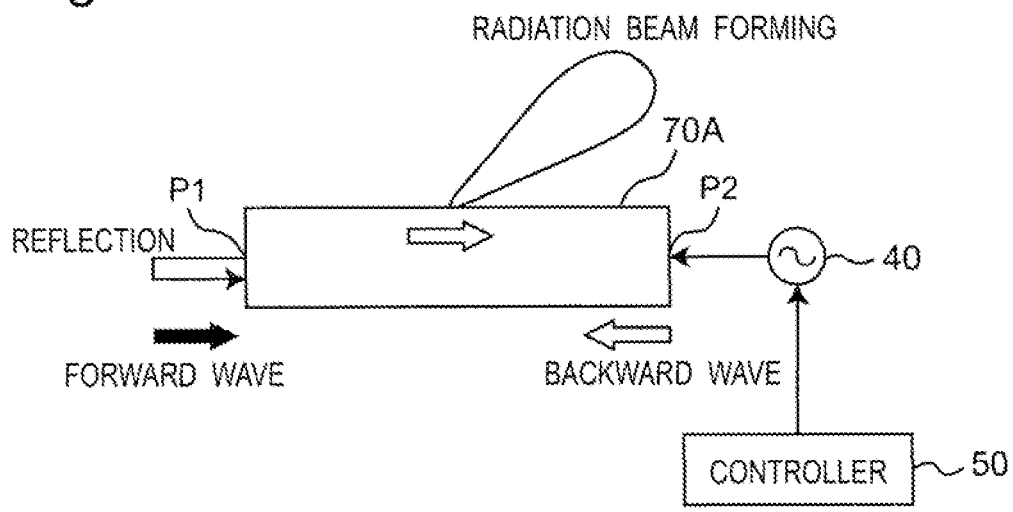
FIG. 53 is a block diagram showing a configuration of an antenna apparatus according to a second modified embodiment of the seventh embodiment of the present invention.

FIG. 53 is a block diagram showing a configuration of an antenna apparatus according to a second modified embodiment of the seventh embodiment of the present invention. FIG. 53 shows an antenna apparatus with a one-way input, in which only one port P2 is selected as an input port. In this case, it is not necessary to insert a special matching circuit at the other end (port P1) of the nonreciprocal transmission line 70A. That is, no matching is done at the end (port P1), and even if a reflected wave occurs, a leaky wave caused by the propagation of the reflected wave is also in the same direction as that of the input wave. Therefore, no side lobe due to the reflected wave occurs, in contrast to the leaky wave radiation of the conventional transmission line apparatus. It is possible to improve the leaky wave radiation characteristics, by rather optimally selecting the impedance at the end (port P1) (e.g., selecting a electrical length of the nonreciprocal transmission line 70A) to optimize the distribution of the electromagnetic field over the nonreciprocal transmission line 70A, from the viewpoint of improvement particularly based on the reflection characteristics. That is, it is possible to change the main beam direction, the beam width, and so on of the leaky wave from the nonreciprocal transmission line 70A, to the desired values.

Figure 54:
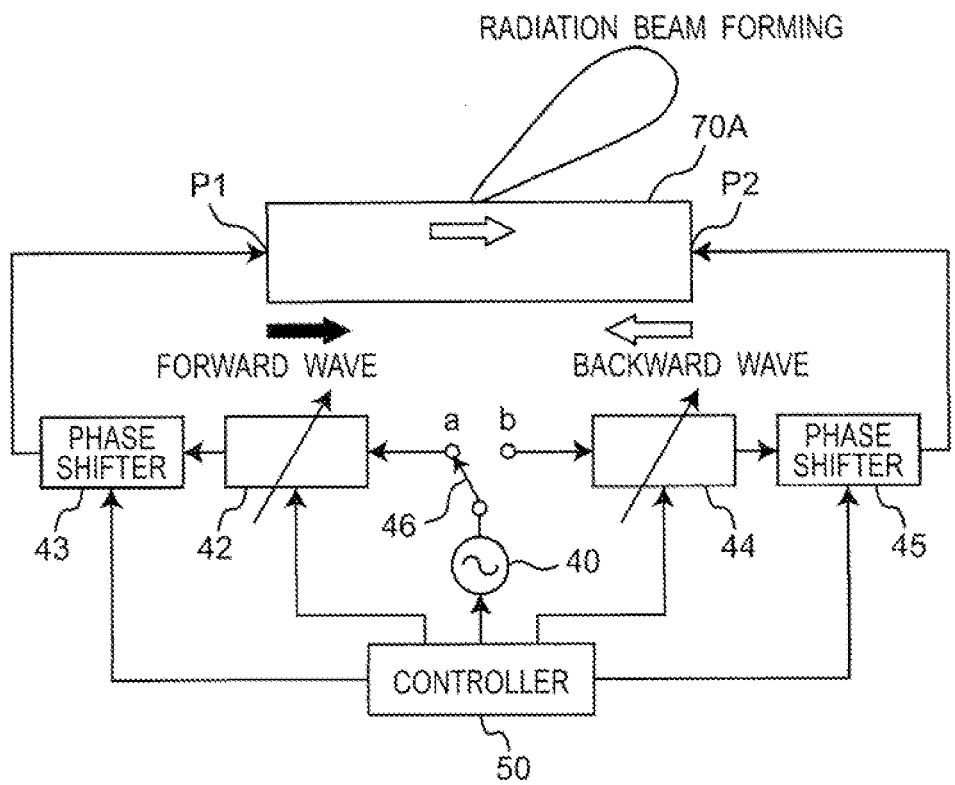
FIG. 54 is a block diagram showing a configuration of an antenna apparatus according to a third modified embodiment of the seventh embodiment of the present invention.

FIG. 54 is a block diagram showing a configuration of an antenna apparatus according to a third modified embodiment of the seventh embodiment of the present invention. FIG. 54 shows an antenna apparatus capable of changing the input direction by a switch 46. The antenna apparatus of FIG. 54 is characterized in that the switch 46 is inserted in place of the power divider 41 as compared to the antenna apparatus of FIG. 51. According to the antenna apparatus of FIG. 55, when the forward and backward propagation constants are the same with each other, the radiation direction is in the propagation direction regardless of the selection of the propagation direction, and therefore, in response to the change of the switch 46, the radiation wave changes only in the polarization characteristic. Therefore, it is possible to change the polarization characteristics through the switch, while maintaining a beam angle. With regard to another usage of the antenna apparatus of FIG. 54, it is possible to change the radiation beam direction by selecting an operating frequency having different forward and backward propagation constants and selecting a propagation direction. In addition, by changing the amounts of attenuation of the variable attenuators 42 and 44 and the amounts of phase shift of the phase shifters 43 and 45, it is possible to change the radiation pattern of the leaky wave radiated from the nonreciprocal transmission line 70A (including a direction of the main beam, and a directional radiation power).

According to the conventional leaky wave antenna, a microwave signal is inputted from one end of the transmission line operable as the antenna apparatus, and matching is done at the other end. Therefore, its fundamental operation is significantly different from that of the resonator antenna apparatus, and they have not been considered as the same with each other. Hereinbefore, the antenna apparatus is described as an exemplary application of the nonreciprocal transmission line apparatus 70A of the first embodiment, for the purpose of separately discussing the leaky wave antenna apparatus as described above and the resonator antenna apparatus. However, according to the leaky wave antenna apparatus described above, it is insisted that the antenna radiation characteristics are to be improved by particularly using the reflected wave at the end. Thus, when the reflected wave occurs in the transmission line of the leaky wave antenna apparatus due to the conditions of termination of the transmission line, the leaky wave antenna apparatus operates in a manner similar to that of the resonator antenna apparatus. In particular, when a total reflection condition is satisfied at an end, the transmission line can be regarded to operate as a resonator. Therefore, the antenna apparatus of the present embodiment is configured to be associated with both operations of the resonator antenna apparatus and the leaky wave antenna apparatus, depending on the conditions of reflection at the ends of the nonreciprocal transmission line apparatus 70A.

According to the nonreciprocal transmission line apparatus 70A, nonreciprocity depending on the transmission direction appears. The nonreciprocity of the transmission characteristic observed in the configuration handled in the present embodiment is categorized roughly into the following two cases. The first case is: the forward transmission from the port P1 to the port P2 occurs without attenuation, and attenuation occurs in the backward transmission from the port P2 to the port P1. In this case, the nonreciprocal transmission line apparatus 70A can be used as an isolator. Another case of nonreciprocity is: the nonreciprocal transmission line apparatus 70A has the amplitude characteristics with no difference, and has nonreciprocal phase characteristics. The nonreciprocal transmission line apparatus 70A operates as the right-handed (forward wave) transmission line (FIG. 55) in the forward direction, and as the left-handed (backward wave) transmission line (FIG. 56) in the backward direction. As described above, the phase characteristic significantly varies depending on selection of the transmission direction, and therefore, the transmission line can be used for transmission direction selective phase control.

In correspondence with the nonreciprocal transmission characteristics of the nonreciprocal transmission line apparatus 70A, the nonreciprocity observed in the leaky wave radiation from the nonreciprocal transmission line apparatus 70A is categorized roughly into the following two cases. A first case of nonreciprocity is: the forward transmission occurs without attenuation, and attenuation occurs in the backward transmission, and therefore, a leaky wave is radiated from the transmission only in one direction, and no leaky wave is radiated from the transmission in the other direction. Another case of nonreciprocity is: the forward transmission occurs as the forward wave propagation, and backward transmission occurs as the backward wave propagation, and accordingly, the leaky wave can be radiated in the same direction regardless of the transmission direction. By using the nonreciprocity as described above, it is possible to form a leaky wave radiation beam with a selective radiation direction.

Modifications

Further, it is possible to apply the nonreciprocal transmission line apparatus 70A of the first embodiment to a nonreciprocal phase shifter as follows. By inserting a nonreciprocal transmission line apparatus 70A between two terminals, it is possible to provide a desired phase difference between the one terminal and the other terminal regardless of the propagation direction of a signal. In addition, it is also possible to electrically change the phase difference by electrically changing the structural parameters.

The conventional phase shifter is mainly made of a reciprocal transmission line, and has the same phase advance and same phase delay for both the forward and backward transmissions. Even when made of a nonreciprocal transmission line, it is configured to have different phase delays or different phase advances. The nonreciprocal transmission line apparatus 70A of the first embodiment can be used for any of the following configurations.

(i) A nonreciprocal phase shifter, having a phase delay when a forward transmission occurs as a right-handed transmission line, and having a phase advance when a backward transmission occurs as a left-handed transmission line.

(ii) A nonreciprocal phase shifter, having a phase delay when a forward transmission occurs as a right-handed transmission line, and having no phase shift between an input and an output when a backward transmission occurs.

(iii) A nonreciprocal phase shifter, having a phase advance when a forward transmission occurs as a left-handed transmission line, and having no phase shift between an input and an output when a backward transmission occurs.

(iv) A nonreciprocal phase shifter, in which forward and backward transmissions occur as the same right-handed transmission at the same frequency, while having different phase shifts.

(v) A nonreciprocal phase shifter, in which forward and backward transmissions occur as the same left-handed transmission at the same frequency, while having different phase shifts.

(vi) A nonreciprocal phase shifter provided with a combination of at least two of (i) to (v).

With reference to FIG. 7, the operation of the nonreciprocal phase shifter will be described below. In general, the gradient of the dispersion curve indicates a group velocity, i.e., the direction of transmitted power. Therefore, the case in which the gradient $\partial\omega/\partial\beta$ is positive is referred to as a forward power transmission, and the case in which the gradient $\partial\omega/\partial\beta$ is negative is referred to as a backward power transmission.

(a) In the case of the nonreciprocal transmission line apparatus 70A having an operating frequency within a range of $\omega_{LHL}<\omega<\omega_{\beta OL}$, the phase constant $\beta$ of the forward power transmission is negative, and the phase constant $\beta$ of the backward power transmission is positive. Therefore, the nonreciprocal transmission line apparatus 70A operates as the left-handed transmission line in both the forward and backward transmissions. Therefore, the nonreciprocal transmission line apparatus 70A operates as the phase shifter of (v).

(b) In the case of the nonreciprocal transmission line apparatus 70A having an operating frequency $\omega=\omega_{\beta OL}$, the nonreciprocal transmission line apparatus 70A has zero phase constant and infinite guide wavelength for the forward power transmission. On the other hand, for the backward power transmission, the nonreciprocal transmission line apparatus 70A has a positive phase constant and operates as the left-handed transmission line. Therefore, the nonreciprocal transmission line apparatus 70A operates as the phase shifter of (iii).

(c) In the case of the nonreciprocal transmission line apparatus 70A having an operating frequency within a range of $\omega_{\beta OL}<\omega<\omega_{cL}$, or a range of $\omega_{cU}<\omega<\omega_{\beta OU}$, the phase constant $\beta$ of the forward power transmission is positive, and the phase constant $\beta$ of the backward power transmission is positive. Therefore, the nonreciprocal transmission line apparatus 70A operates as the right-handed transmission line in the forward transmission, and operates as the left-handed transmission line in the backward transmission. Therefore, the nonreciprocal transmission line apparatus 70A operates as the phase shifter of (i).

(d) In the case of the nonreciprocal transmission line apparatus 70A having an operating frequency $\omega=\omega_{\beta OU}$, the nonreciprocal transmission line apparatus 70A has zero phase constant and infinite guide wavelength for the backward power transmission. On the other hand, for the forward power transmission, the nonreciprocal transmission line apparatus 70A has a positive phase constant and operates as the right-handed transmission line. Therefore, the nonreciprocal transmission line apparatus 70A operates as the phase shifter of (ii).

(e) In the case of the nonreciprocal transmission line apparatus 70A having an operating frequency within a range of $\omega_{\beta OU}<\omega<\omega_{RHU}$, the phase constant $\beta$ of the forward power transmission is positive, and the phase constant $\beta$ of the backward power transmission is negative. Therefore, the nonreciprocal transmission line apparatus 70A operates as the right-handed transmission line in both the forward and backward transmissions. Therefore, the nonreciprocal transmission line apparatus 70A operates as the phase shifter of (iv).

By mechanically, electrically, magnetically, or optically changing the structural parameters of the nonreciprocal transmission line apparatus 70A of the present invention, it is possible to continuously change the phase characteristic of the phase shifter having any characteristics of (i) to (v), without changing frequency. Further, it is also possible to configure a phase shifter by combining at least two or more of (i) to (v), operable in the same frequency.

Next, decoupling between different kinds of modes, corresponding to opposite forward and backward power transmissions and having the same operating frequency and the same wave number vector, is described below.

If adjacently arranging two independent transmission lines that support same or different kinds of modes having almost the same coupling frequency and almost the same propagation constant, then in general, coupling between their eigenmodes occurs, and it often results in orthogonal modes of the entire system near the coupling frequency, characterized by either one of the following two cases:

(A) having two different wave number vectors corresponding to a symmetric mode and an asymmetric mode, or (B) having no waveguide mode, but having a stop band (e.g., Bragg reflection in the periodic configuration).

In particular, in the case of (B), there may be a problem blocking of signal transmission due to the coupling. On the other hand, by using the nonreciprocal transmission line apparatus 70A of the first embodiment, it is possible to configure a single transmission line that supports different kinds of modes corresponding to opposite forward and backward power transmissions and having the same operating frequency and the same wave number vector, without coupling of these modes, in a manner similar to that of the operation at $\omega=\omega_0$ of FIG. 8. It is also possible to obtain coupling between the two modes and form a stop band by changing the structural parameters of the nonreciprocal transmission line apparatus 70A. Therefore, it is possible to change between coupling and decoupling of the two different kinds of modes corresponding to opposite forward and backward power transmissions and having the same frequency and the same wave number vector, by mechanically, electrically, magnetically, or optically changing the structural parameters of the composite right/left handed nonreciprocal transmission line apparatus 70A of the present invention.

The antenna apparatus of the seventh embodiment may be provided with any of the nonreciprocal transmission line apparatuses 70A of the first embodiment as shown in FIGS. 13 to 32.

The nonreciprocal transmission line apparatuses according to the embodiments of the present invention can be applied to the following variety of apparatuses.

(A) Nonreciprocal Transmission Line (1) The configuration of a right/left-handed nonreciprocal transmission line, in which a forward transmission occurs as a right-handed transmission (forward pave propagation) at a frequency, and a backward transmission occurs as a left-handed transmission (backward wave propagation) at the same frequency. The transmission characteristics for the forward and backward transmissions may be reversed.

(2) The configuration of a nonreciprocal transmission line, in which a forward transmission occurs as a right-handed transmission at a frequency, and a backward transmission occurs with infinite effective wavelength and with no phase change between input and output at the same frequency. The transmission characteristics for the forward and backward transmissions may be reversed.

(3) The configuration of a nonreciprocal transmission line, in which a forward transmission occurs as a left-handed transmission at a frequency, and a backward transmission occurs with infinite effective wavelength and with no phase change between input and output at the same frequency. The transmission characteristics for the forward and backward transmissions may be reversed.

(4) The configuration of a nonreciprocal transmission line, in which forward and backward transmissions occur as the same right-handed transmission at the same frequency, while having different phase shifts.

(5) The configuration of a nonreciprocal transmission line, in which forward and backward transmissions occur as the same left-handed transmission at the same frequency, while having different phase shifts.

(6) A nonreciprocal transmission line capable of including a combination of at least two or more of (1) to (5).

(7) The configuration of a composite right/left-handed nonreciprocal transmission line, having the same wave number vectors of the two modes of the forward and backward propagations at the same frequency. The configuration of a transmission line, capable of propagation in two modes corresponding to opposite forward and backward power transmissions and having the same operating frequency and the same wave number vector, the two modes being degenerated (i.e., without coupling of these two modes).

(8) It is applicable to degeneration, decoupling, and orthogonalization of different kinds of modes corresponding to opposite forward and backward power transmissions and having the same operating frequency and the same wave number vector.

(B) Nonreciprocal Phase Shifter (9) Application to a nonreciprocal phase shifter provided with any of the nonreciprocal transmission lines (1) to (6).

(C) Nonreciprocal Leaky Wave Antenna

(10) A nonreciprocal leaky wave antenna apparatus, in which a leaky wave of a forward propagation signal in a transmission line forms a forward radiation beam at a frequency, and a leaky wave of a backward propagation signal in the transmission line forms a backward radiation beam at the same frequency.

(11) A nonreciprocal leaky wave antenna apparatus, in which a leaky wave of a forward propagation signal in a transmission line forms a forward radiation beam at a frequency, and a leaky wave of a backward propagation signal in the transmission line forms a radiation beam on the broadside at the same frequency.

(12) A nonreciprocal leaky wave antenna apparatus, in which a leaky wave of a forward propagation signal in a transmission line forms a backward radiation beam at a frequency, and a leaky wave of a backward propagation signal in the transmission line forms a radiation beam on the broadside at the same frequency.

(13) A nonreciprocal leaky wave antenna apparatus as a special case of the nonreciprocal leaky wave antenna apparatus of (10), in which a leaky wave from a transmission line forms a radiation beam directed in the same direction at the same frequency regardless of the propagation direction of a signal.

(14) A nonreciprocal leaky wave antenna apparatus, in which a leaky wave forms the same forward radiation beam at the same frequency regardless of the propagation direction of a signal in a transmission line, with different radiation angles depending on the propagation direction.

(15) A nonreciprocal leaky wave antenna apparatus, in which a leaky wave forms the same backward radiation beam at the same frequency regardless of the propagation direction of a signal in a transmission line, with different radiation angles depending on the propagation direction.

(16) A nonreciprocal leaky wave antenna apparatus capable of including a combination of at least two or more of (10) to (15).

(17) It is possible to improve antenna gain and directional pattern and reduce size by using a composite right/left-handed nonreciprocal transmission line as a transmission line of the leaky wave antenna.

(D) Nonreciprocal Transmission Line Resonator

(18) The configuration of a nonreciprocal transmission line resonator provided with the nonreciprocal transmission line of (1) to (6).

(19) By using the nonreciprocal transmission line of (2) or (3), it is possible to configure a transmission line resonator, having a resonance frequency depending on the line length, having an almost constant signal amplitude over the transmission line, and operable with a phase gradient.

(20) By using the right/left-handed nonreciprocal transmission line of (7) as a special case of (1), it is possible to configure a transmission line resonator, having a resonance frequency not depending on the line length, having an almost constant signal amplitude over the transmission line, and operable with a phase gradient. Since the resonance frequency does not depend on the line length, it is possible to arbitrarily select its size at a fixed resonance frequency. In addition, since the Q factor of an unloaded resonator changes depending on the line length, it is possible to arbitrarily select the Q factor.

(E) Filter Provided with Nonreciprocal Transmission Line Resonator

(21) The configuration of a bandstop filter provided with: the nonreciprocal transmission line of (1) to (6) as a resonator, a feed line, and coupling elements.

(22) The configuration of a bandpass filter provided with: the nonreciprocal transmission line of (1) to (6) as a resonator, a feed line, and coupling elements.

(23) A bandstop filter and a bandpass filter provided with a resonator(s) of (19) or (20) or both of them. Since the amplitude is constant over each transmission line operable as a resonator, the resonators have a degree of freedom in arrangement between them.

(24) A bandstop filter and a bandpass filter provided with the nonreciprocal transmission line resonator of (20). Since the resonance frequency of each resonator operable as a filter does not depend on the line length, it is possible to arbitrarily design its size. In addition, since the Q factor of an unloaded resonator can be changed by the line length, the filter has a degree of freedom in its design.

(F) Antenna Provided with Nonreciprocal Transmission Line Resonator

(25) An directional antenna provided with the nonreciprocal transmission line resonator of (19), an feed line, and coupling parts. The operating frequency of the antenna depends on the antenna size.

(26) An directional antenna provided with the nonreciprocal transmission line resonator of (20), an feed line, and coupling parts. The operating frequency of the antenna does not depend on the antenna size.

(G) Coupler Provided with Nonreciprocal Transmission Line Resonator

(27) An power divider provided with the nonreciprocal transmission line resonator of (19) or (20) and operable with a phase gradient.

(H) Oscillator Provided with Nonreciprocal Transmission Line Resonator

(28) The configuration of a parallel feedback oscillator provided with a nonreciprocal transmission line resonator.

(29) The configuration of a series feedback oscillator provided with a nonreciprocal transmission line resonator.

Eighth Embodiment

Next, transmission line resonators according to an eight embodiment of the present invention, and antenna apparatuses provided with the transmission line resonators are described below with reference to FIGS. 57 to 70. In the present embodiment, a further modified embodiment of the transmission line resonator of the second embodiment is provided.

First, the basic concept of the transmission line resonator of the present embodiment is described. Reference is made again to the model of the microwave resonator of FIG. 35. It is assumed that the relations of the mathematical formulas (10) to (11) described in the second embodiment are satisfied as the resonance conditions of the transmission line resonator.

In the conditions of a reciprocal transmission line, parameters $\beta_+$ and $\beta_-$ are identical to each other. Therefore, when "n" is an integer and "l" denotes the line length, the resonance conditions concerning the phase constant of the transmission line are determined by the length of the resonator, and given as follows.

$$\beta = \beta_+ = \beta_- = n\pi/l \quad (13)$$

When n=1 in the mathematical formula (13), the line length "l" satisfies l=λg/2 with respect to the guide wavelength "λg". This condition defines the operation of the half-wavelength resonator. When n=0 in the mathematical formula (13), the resonance condition is independent from the line length, and $\beta=0$. The zero phase constant means infinite wavelength, and corresponds to the operation of a zeroth-order resonator having a resonance frequency not depending on the resonator's size (for example, see Non-Patent Literature 4).

On the other hand, we consider a case of a nonreciprocal transmission line satisfying the relation of the following mathematical formula (for example, see Non-Patent Literature 5).

$$\beta_+ + \beta_- = 0 \quad (14)$$

In this case, the resonance condition of the mathematical formula (10) is automatically satisfied without imposing any requirements on the length of the resonator, i.e., n=0. The nonreciprocal resonance condition of the mathematical formula (6) means that the transmission line must support a right-handed principal mode for power transmission in one direction, and support a left-handed principal mode for power transmission in the opposite direction, in order to achieve nonreciprocal resonance. In addition, both phase constants of these different two modes must have the same absolute value with each other. Such a nonreciprocal transmission characteristic can be achieved by using the nonreciprocal transmission line apparatus 70A (for example, see Non-Patent Literature 1).

A voltage wave V and a current wave I along the transmission line resonator of the present embodiment (e.g., along the X axis of FIG. 65) can be written using nonreciprocal intrinsic impedances $Z_+$ and $Z_-$ as follows.

$$V = V_+ \times \exp(-j \times \beta_+ \times x) + V_- \times \exp(j \times \beta_- \times x) \quad (15)$$
$$= Z_+ \times I_+ \times \exp(-j \times \beta_+ \times x) + Z_- \times I_- \times \exp(j \times \beta_- \times x)$$

$$I = I_+ \times \exp(-j \times \beta_+ \times x) - I_- \times \exp(j \times \beta_- \times x) \quad (16)$$

The parameters $I_+$ and $I_-$ in the mathematical formulas (15) and (16) denote the amplitudes of current waves propagating from the port P1 to the port P2 and propagating reversely, respectively. When $\beta_+ + \beta_- = 0$, the mathematical formulas (15) and (16) are written as follows.

$$V = (V_+ + V_-) \times \exp(-j \times \beta_+ \times x) \quad (17)$$
$$= (Z_+ \times I_+ + Z_- \times I_-) \times \exp(-j \times \beta_+ \times x)$$

$$I = (I_+ - I_-) \times \exp(-j \times \beta_+ \times x) \quad (18)$$

In this case, a ratio V/I as a function with respect to the position on the X axis has a fixed value as follows.

[Mathematical Expression 15]

$$\frac{V}{I} = Z_{0N} = \frac{V_+ + V_-}{I_+ - I_-} = \frac{Z_+ I_+ + Z_- I_-}{I_+ - I_-} \quad (19)$$

If both the ports P1 and P2 of the transmission line resonator of FIG. 35 are short-circuited and Z1=Z2=0, then the current wave I is dominant. In this case, $V_+ + V_- = 0$ and $Z_{0N} = 0$ are satisfied in the mathematical formula (19), and the amplitude of the voltage wave V is a minimum in the mathematical formulas (17) and (18). If both the ports P1 and P2 are open and Z1=Z2=+∞, then the voltage wave V is dominant. In this case, $I_+ = I_-$ and $Z_{0N} = +\infty$ are satisfied in the mathematical formula (19), and the amplitude of the current wave I is a minimum. According to the mathematical formulas (17) and (18), it can be understood that the proposed transmission line resonator provides a distribution of the electromagnetic field over the transmission line resonator, having a uniform magnitude, and having a phase linearly changing in space by a factor of $\exp(-j \times \beta_+ \times x)$, whether either the current wave I or the voltage wave V is dominant.

In the transmission line resonator of the present embodiment, the resonance conditions imposed on load impedances Z1 and Z2 of reflective elements at both ends (see FIG. 35) include:

$$1/Z1 = 1/Z2 = 0 \quad (20)$$

for the case in which both the end are open, and $$Z1 = Z2 = 0 \quad (21)$$

for the case in which both the end are short-circuited. In the ninth embodiment described later, a case where the conditions of Z1=jB and Z2=−jB are imposed is also described. As a specific implementation of a condition in which both ends are open or a condition in which both ends are short-circuited, from now on, we consider a configuration provided with a transmission line of a finite length.

Figure 57:
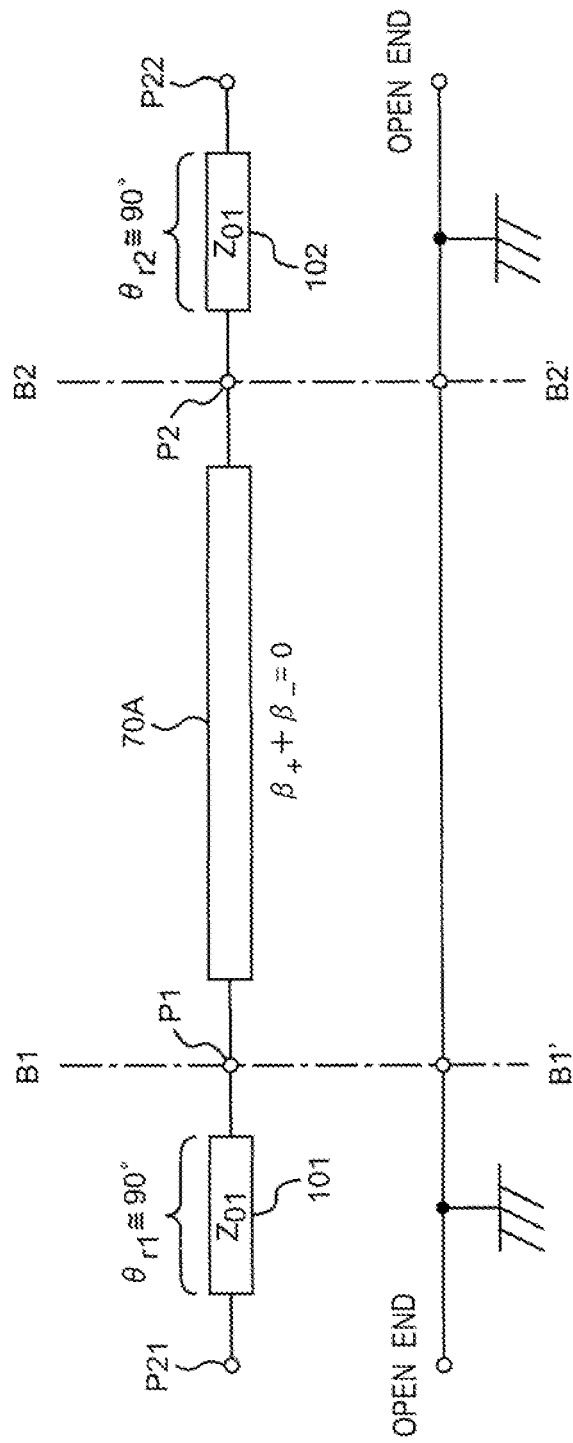
FIG. 57 is a block diagram showing a configuration of a transmission line resonator according to the eighth embodiment of the present invention.

FIG. 57 is a block diagram showing a configuration of a transmission line resonator according to the eighth embodiment of the present invention. The transmission line resonator of the present embodiment is also characterized as a microwave resonator provided with a nonreciprocal transmission line apparatus of the first embodiment (denoted by the reference sign 70A). In order to satisfy the resonance conditions of the short-circuit-ended resonator, the transmission line resonator of FIG. 57 is characterized in that an open-ended transmission line 101 having a line length substantially equal to the quarter wavelength (electrical length $\theta_{r1}$=90 degrees) is connected at a port P1 (B1-B1') of the nonreciprocal transmission line apparatus 70A, and an open-ended transmission line 102 having a line length substantially equal to the quarter wavelength (electrical length $\theta_{r2}$=90 degrees) is connected at a port P2 (B2-B2'). In this case, the load impedance of the left transmission line 101 seen from the port P1 is zero, and the load impedance of the right transmission line 102 seen from the port P2 is also zero, and therefore, short-circuit conditions are satisfied at both ends of the nonreciprocal transmission line apparatus 70A of FIG. 57.

Figure 58:
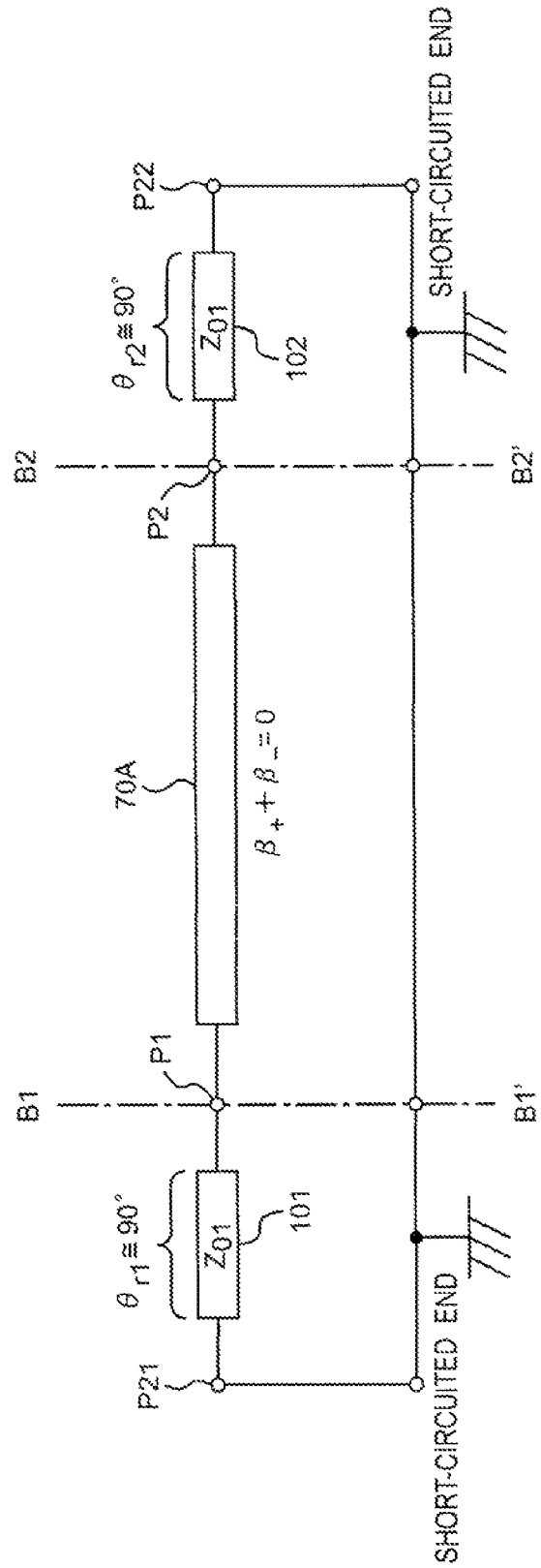
FIG. 58 is a block diagram showing a configuration of a transmission line resonator according to a first modified embodiment of the eighth embodiment of the present invention.

FIG. 58 is a block diagram showing a configuration of a transmission line resonator according to a first modified embodiment of the eighth embodiment of the present invention. In order to satisfy the resonance conditions of the open-ended resonator, the transmission line resonator of FIG. 58 is characterized in that a short-circuit-ended transmission line 101 having a line length substantially equal to the quarter wavelength (electrical length $\theta_{r1}$=90 degrees) is connected at a port P1 (B1-B1') of the nonreciprocal transmission line apparatus 70A, and a short-circuit-ended transmission line 102 having a line length substantially equal to the quarter wavelength (electrical length $\theta_{r2}$=90 degrees) is connected at a port P2 (B2-B2'). In this case, the load impedance of the left transmission line 101 seen from the port P1 is infinite, and the load impedance of the right transmission line 102 seen from the port P2 is also infinite, and therefore, the open conditions are satisfied at both the ports P1 and P2 of the nonreciprocal transmission line apparatus 70A of FIG. 58.

Figure 59:
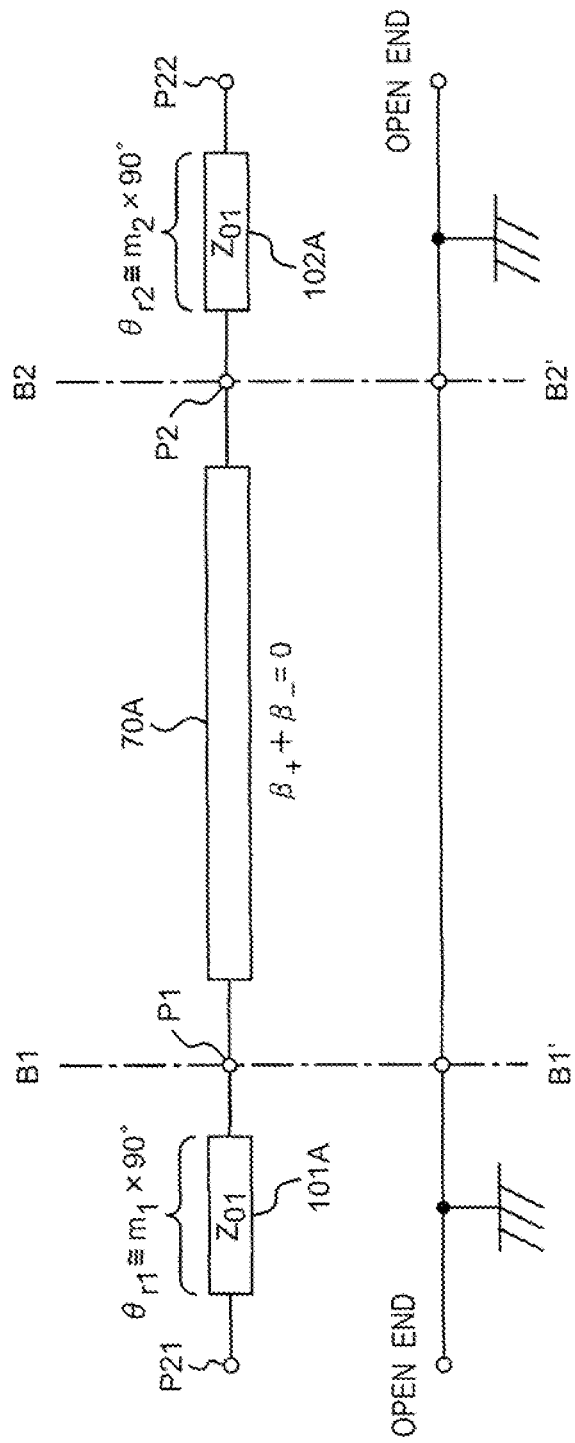
FIG. 59 is a block diagram showing a configuration of a transmission line resonator according to a second modified embodiment of the eighth embodiment of the present invention.

FIG. 59 is a block diagram showing a configuration of a transmission line resonator according to a second modified embodiment of the eighth embodiment of the present invention. In order to satisfy the resonance conditions as a short-circuit-ended resonator or an open-ended resonator, the transmission line resonator of FIG. 59 is characterized in that an open-ended transmission line 101A having a line length substantially equal to $|m_1|$-times the quarter wavelength (electrical length $\theta_{r1} \cong m_1 \times 90$ degrees; where $m_1$ is an integer) is connected at a port P1 (B1-B1') of the nonreciprocal transmission line apparatus 70A, and an open-ended transmission line 102A having a line length substantially equal to $|m_2|$-times the quarter wavelength (electrical length $\theta_{r2} \cong m_2 \times 90$ degrees; where $m_2$ is an integer) is connected at a port P2 (B2-B2'). In this case, it is required to set either condition in which both ends are short-circuited or condition in which both ends are open, and the setting corresponds to whether the integers $m_1$ and $m_2$ are both odd numbers or both even numbers. If the integer "mi" (i=1, 2) is zero, it is treated as an even number. In addition, the sign of the integer "mi" may be negative according to the phase delay and the phase advance in the transmission line. In this case, the negative integer "mi" corresponds to a case where the transmission line 101A or 102A as a reflective element is operating as a left-handed transmission line.

Figure 60:
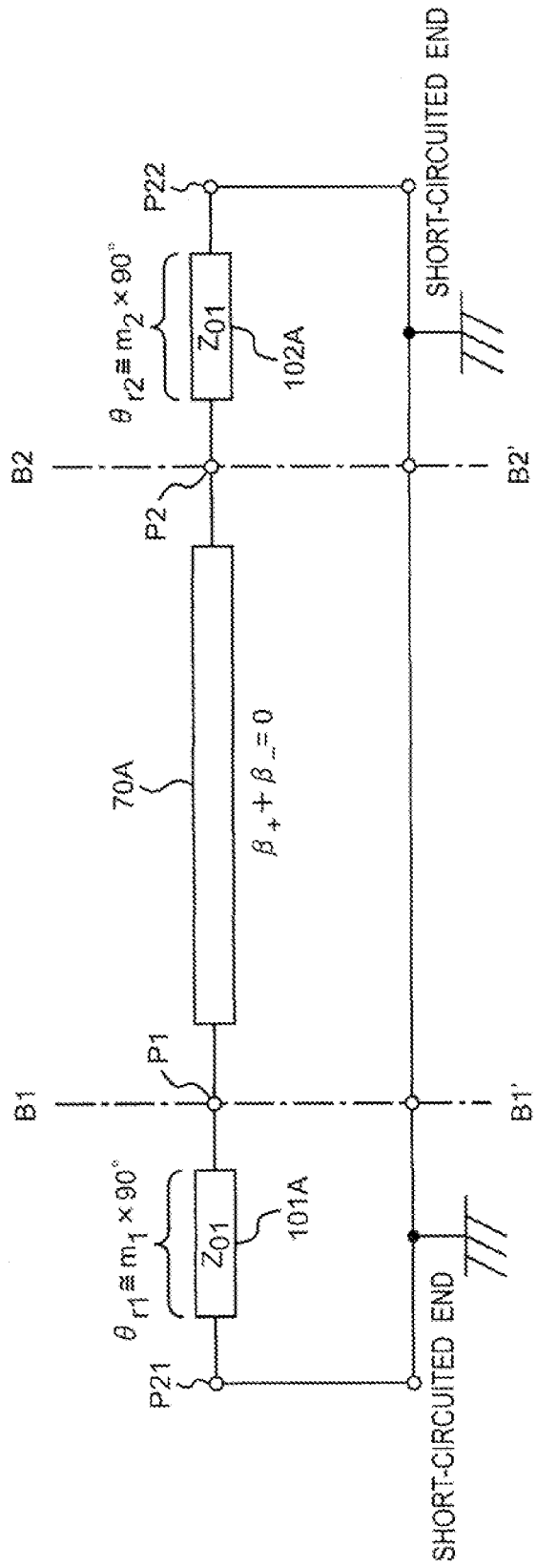
FIG. 60 is a block diagram showing a configuration of a transmission line resonator according to a third modified embodiment of the eighth embodiment of the present invention.

FIG. 60 is a block diagram showing a configuration of a transmission line resonator according to a third modified embodiment of the eighth embodiment of the present invention. In order to satisfy the resonance conditions as a short-circuit-ended resonator or an open-ended resonator, the transmission line resonator of FIG. 60 is characterized in that a short-circuit-ended transmission line 101A having a line length substantially equal to $|m_1|$-times the quarter wavelength (electrical length $\theta_{r1} \cong m_1 \times 90$ degrees; where $m_1$ is a non-zero integer) is connected at a port P1 (B1-B1') of the nonreciprocal transmission line apparatus 70A, and a short-circuit-ended transmission line 102A having a line length substantially equal to $|m_2|$-times the quarter wavelength (electrical length $\theta_{r2} \cong m_2 \times 90$ degrees; where $m_2$ is an integer) is connected at a port P2 (B2-B2'). In this case, it is required to set either condition in which both ends are short-circuited or condition in which both ends are open, and the setting corresponds to whether the integers $m_1$ and $m_2$ are both odd numbers or both even numbers. If the integer "mi" (i=1, 2) is zero, it is treated as an even number. In addition, the sign of the integer "mi" may be negative according to the phase delay and the phase advance in the transmission line. In this case, the negative integer "mi" corresponds to a case where the transmission line 101A or 102A as a reflective element is operating as a left-handed transmission line.

The transmission lines 101, 102, 101A, and 102A of finite lengths for the short-circuited terminations and the open terminations as shown in FIGS. 57 to 60 serve not only as a reflective element at an end, but also as an impedance matching circuit for feeding a signal, since the ratio of the voltage to the current changes from zero to infinite along the transmission line.

The transmission line resonators of FIGS. 57 to 60 are operable as an antenna apparatus.

A leaky wave is radiated from the transmission line, when $\beta < \beta_0$, where "$\beta$" denotes a phase constant in the transmission line, and $\beta_0 = \omega/c$ denotes a reciprocal of a wavelength in a free space. "c" denotes the velocity of light in a vacuum. In this case, a radiation beam formed of the leaky wave is approximately in the direction of:

[Mathematical Expression 16]

$$\theta = \sin^{-1} \frac{\beta}{\beta_0} \quad (22)$$

when the line length of the transmission as the antenna apparatus is almost equal to or larger than the wavelength. The radiation angle $\theta$ indicates an angle with reference to the broadside direction of the transmission line (direction perpendicular to the propagation direction), the angle measured from the reference direction as zero and increasing in a direction having a positive phase constant $\beta$. When the line length is sufficiently smaller than the wavelength, i.e., when the line length decreases, the deviation of the radiation direction of the leaky wave increases from the direction of the mathematical formula (22).

As shown in FIG. 8, when the operating angular frequency $\omega$ satisfies $\omega = \omega_0$, the phase constant $\beta$ of the electromagnetic waves propagating along the nonreciprocal transmission line apparatus 70A is the same regardless of the direction of power transmission in the transmission line. In this case, the phase constant $\beta$ satisfies $\beta = \Delta\beta/2$. When the aforementioned radiation conditions are satisfied also at this operating point, the radiation beam direction $\theta$ due to the leaky wave is about in the direction of:

[Mathematical Expression 17]

$$\theta = \sin^{-1} \frac{\Delta\beta}{2\beta_0} \quad (23)$$

regardless of the direction of power transmission in the transmission line. The mathematical formula (23) indicates that it is possible to obtain the same radiation direction of the leaky wave from the nonreciprocal transmission line apparatus 70A regardless of the direction of power transmission in the transmission line, and change its radiation beam direction, by changing the value of $\Delta\beta$ indicative of the nonreciprocal phase characteristic under the aforementioned radiation conditions.

Operations of the antenna apparatus of the present embodiment are described on the basis of the unit cell 60A of the nonreciprocal transmission line apparatus 70A. Each unit cell 60A of the nonreciprocal transmission line apparatus 70A has a configuration in which the capacitor is inserted in the series branch and the inductor is inserted in the shunt branch, as described with reference to FIGS. 1 to 4. When the impedances of the transmission lines 101 and 102 connected to the ports P1 and P2 of the nonreciprocal transmission line apparatus 70A are zero (short-circuited condition), large currents flow from the nonreciprocal transmission line apparatus 70A to the transmission lines 101 and 102, and therefore, the series resonance operation in which the series branch of each unit cell has an impedance of zero is dominant.

On the other hand, when the impedances of the transmission lines 101 and 102 are infinite (open condition), the current is zero and the voltage is maximized at a connection point between the nonreciprocal transmission line apparatus 70A and the transmission lines 101 and 102. Therefore, the shunt resonance operation in which the shunt branch has an impedance of almost infinite is dominant. As described above, the resonance state dominant for the characteristics of the nonreciprocal transmission line apparatus 70A is largely changed in response to the changes in the impedances of the transmission lines 101 and 102. As a result, the co-polarization direction of the leaky wave radiated from the nonreciprocal transmission line apparatus 70A is changed in response to the changes in the impedances of the transmission lines 101 and 102. When the impedances of the transmission lines 101 and 102 are zero, the series resonance operation is dominant in each unit cell, and a large current flows through the microstrip line 12A at the center of the nonreciprocal transmission line apparatus 70A, and the co-polarization direction of the radiated leaky wave is in the ZX plane including the microstrip line 12A. When the impedances of the transmission lines 101 and 102 are infinite, the shunt resonance operation is dominant in each unit cell, and as a result, a large current flows through the stub conductors 13A and 13B, and the co-polarization direction of the leaky wave radiation is in the longitudinal direction of the stub conductors 13A and 13B, i.e., the direction of the Y-axis.

Figure 61:
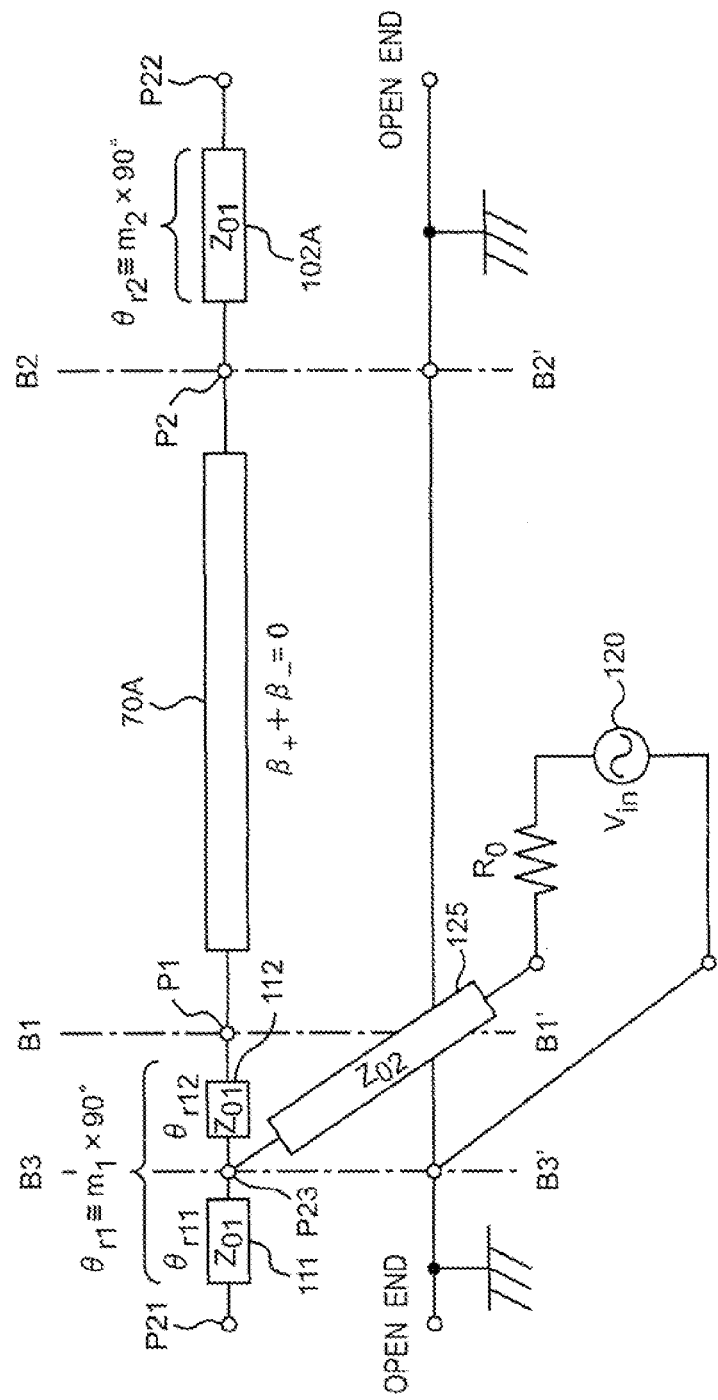
FIG. 61 is a block diagram showing a configuration of an antenna apparatus provided with a transmission line resonator according to the eighth embodiment of the present invention.

FIG. 61 is a block diagram showing a configuration of an antenna apparatus provided with a transmission line resonator according to the eighth embodiment of the present invention. The antenna apparatus of FIG. 61 is characterized by further adding a feeder circuit to the transmission line resonator of FIG. 59. One of the transmission line connected to the side of the port P1 of the nonreciprocal transmission line apparatus 70A (the transmission line 101 of FIG. 59), and the transmission line connected to the side of the port P2 of the nonreciprocal transmission line apparatus 70A (the transmission line 102 of FIG. 59) can be selected as a position to which a feeder circuit is connected. According to the antenna apparatus of FIG. 61, as a example, the feed circuit is connected to the transmission line on the side of the port P1, and the port P1 is connected to the port P21 through the transmission lines 112 and 111, and the transmission lines 111 and 112 serve as the transmission line 101 (FIG. 59) having an electrical length $\theta_{r1}=m_1 \times 90$ degrees. The feeder circuit is provided with: a microwave signal generator 120 having an internal resister $R_0$ and generating a microwave signal, and a feedline 125. The integer $m_1$ must be nonzero in order to ensure a position for achieving impedance matching with the characteristic impedance $Z_{02}$ of the feedline 125 in the feeder circuit. In this case, since the ratio of the voltage to the current changes from zero to infinite along the transmission line 101 on the transmission line 101 (111, 112), the position for achieving impedance matching with the feedline 125 surely exists. The position is indicated as a port P23 (B3-B3') in FIG. 61.

Figure 62:
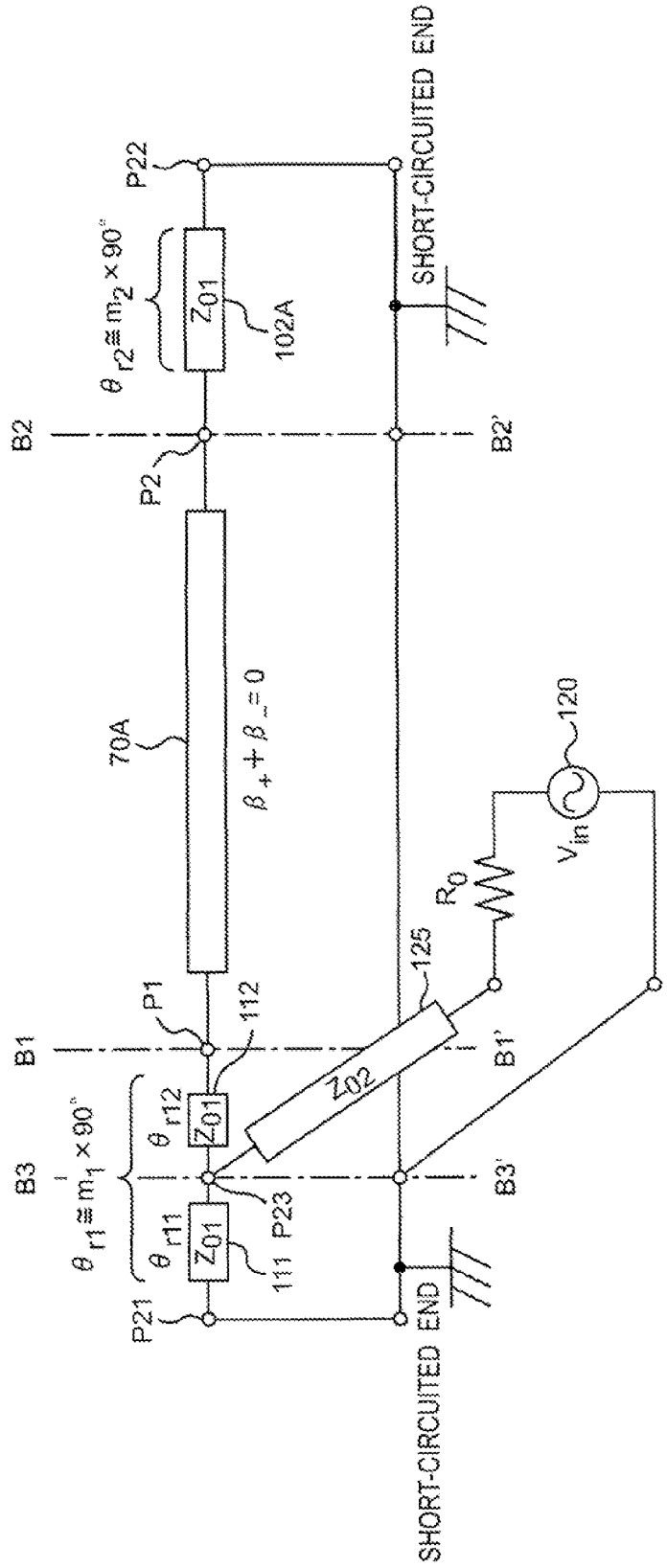
FIG. 62 is a block diagram showing a configuration of a first modified embodiment of the antenna apparatus provided with the transmission line resonator according to the eighth embodiment of the present invention.

FIG. 62 is a block diagram showing a configuration of a first modified embodiment of the antenna apparatus provided with the transmission line resonator according to the eighth embodiment of the present invention. The antenna apparatus of FIG. 62 is characterized by further adding a feeder circuit to the transmission line resonator of FIG. 60. The antenna apparatus of FIG. 62 is configured similarly to the antenna apparatus of FIG. 61 except that both ends are short-circuited.

By equivalently changing the conditions of terminations at both ends of the nonreciprocal transmission line apparatus 70A from the short-circuited to the open, it is possible to change from the state in which the series resonance operation is dominant, to the state in which the shunt resonance operation is dominant. Conversely, by changing from the open to the short-circuited, it is possible to change from the state in which the shunt resonance operation is dominant, to the state in which the series resonance operation is dominant. According to the antenna apparatus of the present embodiment, the polarization characteristic of the radiation waves is changed by changing of the conditions of terminations at both ends of the nonreciprocal transmission line apparatus 70A, mechanically, electrically, or by a combination of them.

In order to equivalently change the conditions of terminations at both ends of the nonreciprocal transmission line apparatus 70A from the short-circuited to the open, or from the open to the short-circuited, the line length of the transmission line as the reflective element is changed. For this purpose, a switch for changing the line length is inserted.

Figure 63:
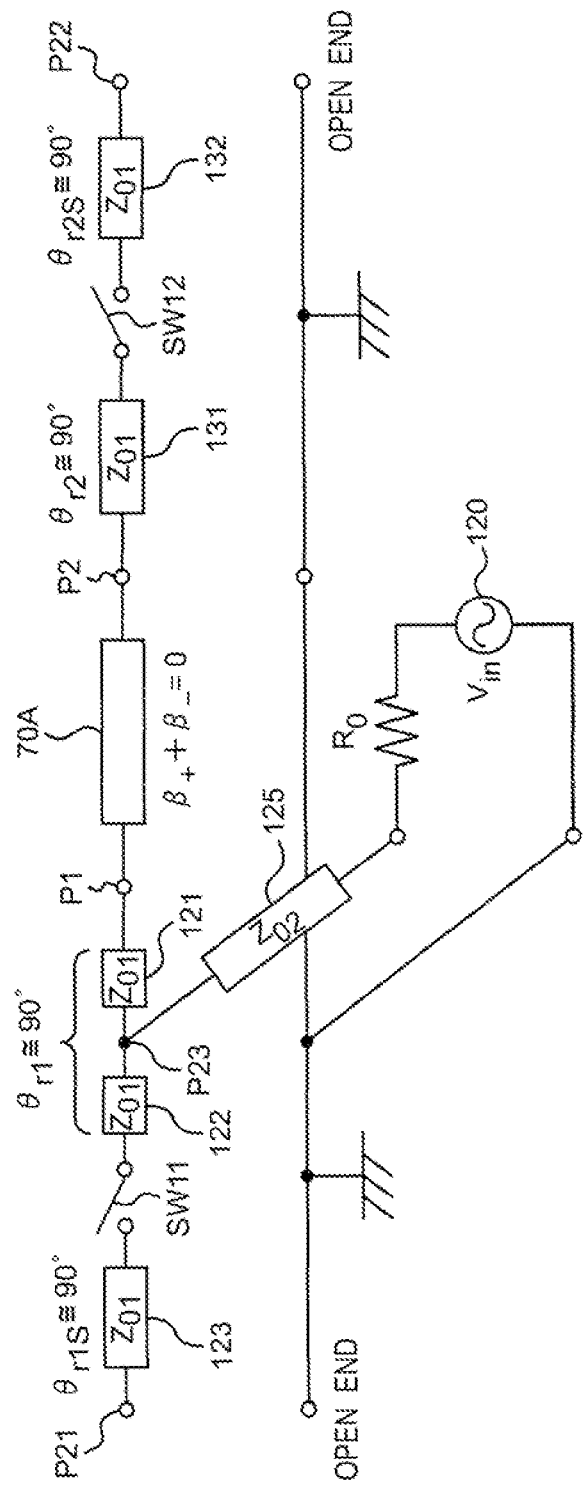
FIG. 63 is a block diagram showing a configuration of a second modified embodiment of the antenna apparatus provided with the transmission line resonator of the eighth embodiment of the present invention.

FIG. 63 is a block diagram showing a configuration of a second modified embodiment of the antenna apparatus provided with the transmission line resonator of the eighth embodiment of the present invention. The antenna apparatus of FIG. 63 is substantially characterized by further adding to the antenna apparatus of FIG. 61, additional transmission lines 123 and 132 connected by switches SW11 and SW12, respectively. The port P1 of the nonreciprocal transmission line apparatus 70A is connected to a port P21 through transmission lines 121 and 122, a switch SW11, and a transmission line 123. The port P2 of the nonreciprocal transmission line apparatus 70A is connected to a port P22 through a transmission line 131, a switch SW12, and a transmission line 132. In this case, the total electrical length $\theta_{r1}$ of the transmission lines 121 and 122 is 90 degrees, and the electrical length $\theta_{r1S}$ of the transmission line 123 is 90 degrees, the electrical length $\theta_{r2}$ of the transmission line 123 is 90 degrees, and the electrical length $\theta_{r2S}$ of the transmission line 132 is 90 degrees. Further, in general, the electrical lengths $\theta_{r1}$, $\theta_{r2}$, $\theta_{r1S}$ and $\theta_{r2S}$ may be given by: an electrical length $\theta_{r1} \cong m_1 \times 90$ degrees ($m_1$ is an integer), an electrical length $\theta_{r2} \cong m_2 \times 90$ degrees ($m_2$ is an integer), an electrical length $\theta_{r1S} \cong m_3 \times 90$ degrees ($m_3$ is an odd number), and an electrical length $\theta_{r2S} \cong m_4 \times 90$ degrees ($m_4$ is an odd number), respectively. $m_1$ and $m_2$ are both odd numbers or both even numbers. When $m_1$ and $m_2$ are both odd numbers, the antenna apparatus operates in a manner similar to that of FIG. 63. When $m_1$ and $m_2$ are both even numbers, the antenna apparatus operates in a manner similar to that of FIG. 63 except that on and off of the switches SW11 and SW12 are inverted. In addition, negative integers $m_i$ (i=1, 2, 3, 4) indicate that the transmission line is a left-handed transmission line.

When SW11 and SW12 of the antenna apparatus of FIG. 63 configured as above are turned off, both the ends of the nonreciprocal transmission line apparatus 70A are substantially short-circuited, and the series resonance operation is dominant. In this case, an $E_\theta$ component (component in the XZ plane) parallel to the center microstrip line 12A as the series branch is the co-polarized wave of the radiation waves. On the other hand, when the switches SW11 and SW12 are turned on, both the ends of the nonreciprocal transmission line apparatus 70A are substantially open, and the shunt resonance operation is dominant. In this case, an $E_\phi$ component (component in the YZ plane) parallel to the stub conductors 13A and 13B as the shunt branch is the co-polarized wave of the radiation waves. Therefore, by changing the switches SW11 and SW12 of the reflective element, it is possible to change the co-polarization direction of the radiation from the antenna apparatus.

Figure 64:
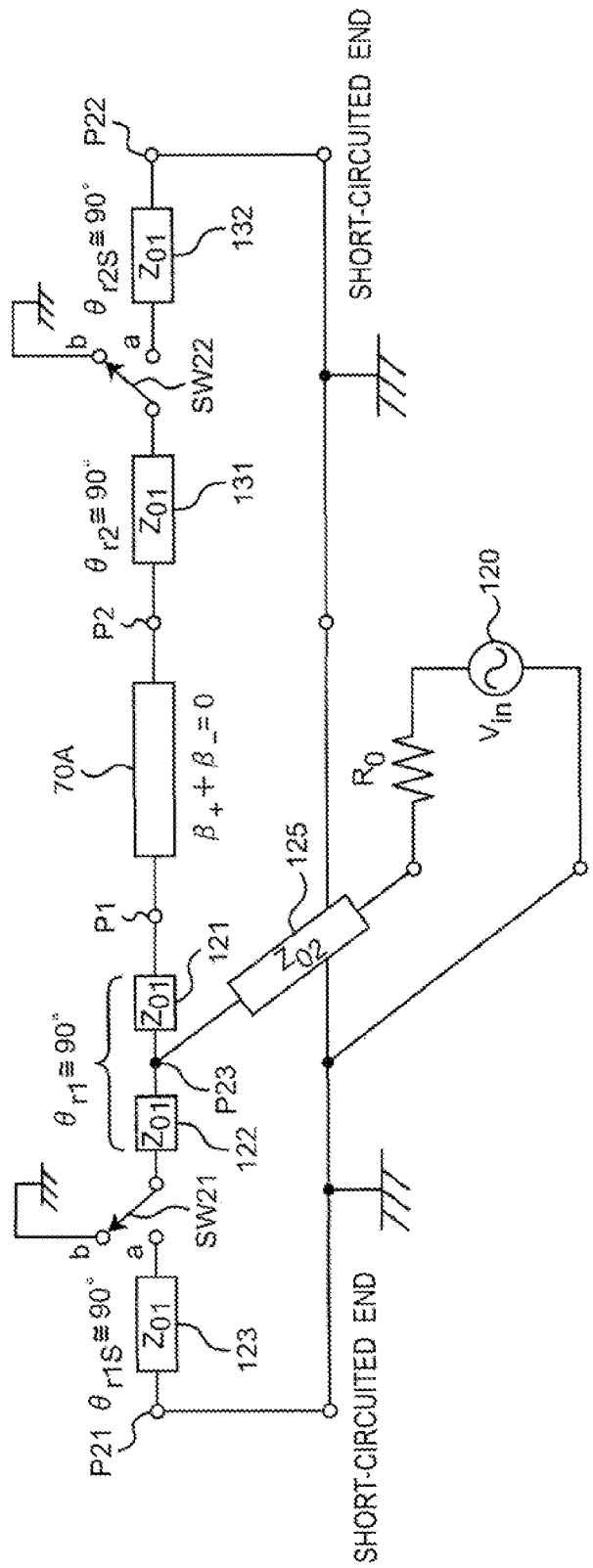
FIG. 64 is a block diagram showing a configuration of a third modified embodiment of the antenna apparatus provided with the transmission line resonator of the eighth embodiment of the present invention.

FIG. 64 is a block diagram showing a configuration of a third modified embodiment of the antenna apparatus provided with the transmission line resonator of the eighth embodiment of the present invention. The antenna apparatus of FIG. 64 is substantially characterized by further adding to the antenna apparatus of FIG. 62, additional transmission lines 123 and 132 connected by switches SW21 and SW22, respectively. The port P1 of the nonreciprocal transmission line apparatus 70A is connected to a port P21 through transmission lines 121 and 122, a common terminal and a contact "a" of the switch SW21, and a transmission line 123. The port P2 of the nonreciprocal transmission line apparatus 70A is connected to a port P22 through a transmission line 131, a common terminal and a contact "a" of the switch SW22, and a transmission line 132. Contacts "b" of the switches SW21 and SW22 are grounded, respectively. In this case, the total electrical length $\theta_{r1}$ of the transmission lines 121 and 122 is 90 degrees, and the electrical length $\theta_{r1S}$ of the transmission line 123 is 90 degrees, and the electrical length $\theta_{r2}$ of the transmission line 131 is 90 degrees, and the electrical length $\theta_{r2S}$ of the transmission line 132 is 90 degrees. Further, in general, the electrical lengths $\theta_{r1}$, $\theta_{r2}$, $\theta_{r1S}$ and $\theta_{r2S}$ may be given by: an electrical length $\theta_{r1} \cong m_1 \times 90$ degrees ($m_1$ is an integer), an electrical length $\theta_{r2} \cong m_2 \times 90$ degrees ($m_2$ is an integer), an electrical length $\theta_{r1S} \cong m_3 \times 90$ degrees ($m_3$ is an odd number), and an electrical length $\theta_{r2S} \cong m_4 \times 90$ degrees ($m_4$ is an odd number), respectively. $m_1$ and $m_2$ are both odd numbers or both even numbers. When $m_1$ and $m_2$ are both odd numbers, the antenna apparatus operates in a manner similar to that of FIG. 64. When $m_1$ and $m_2$ are both even numbers, the antenna apparatus operates in a manner similar to that of FIG. 64 except that the contacts "a" and "b" of the switches SW21 and SW22 are inverted. In addition, negative integers $m_i$ (i=1, 2, 3, 4) indicate that the transmission line is a left-handed transmission line.

When both the switches SW21 and SW22 of the antenna apparatus of FIG. 64 configured as above are connected to the contacts "a", both the ends of the nonreciprocal transmission line apparatus 70A are substantially short-circuited, and the series resonance operation is dominant. In this case, an $E_\theta$ component parallel to the center microstrip line 12A as the series branch is the co-polarized wave of the radiation waves. On the other hand, when both the switches SW21 and SW22 are connected to the contact "b", both the ends of the nonreciprocal transmission line apparatus 70A are substantially open, and the shunt resonance operation is dominant. In this case, an $E_\phi$ component parallel to the stub conductors 13A and 13B as the shunt branch is the co-polarized wave of the radiation waves. Therefore, by changing the switches SW21 and SW22 of the reflective element, it is possible to change the co-polarization direction of the radiation from the antenna apparatus.

Figure 65:
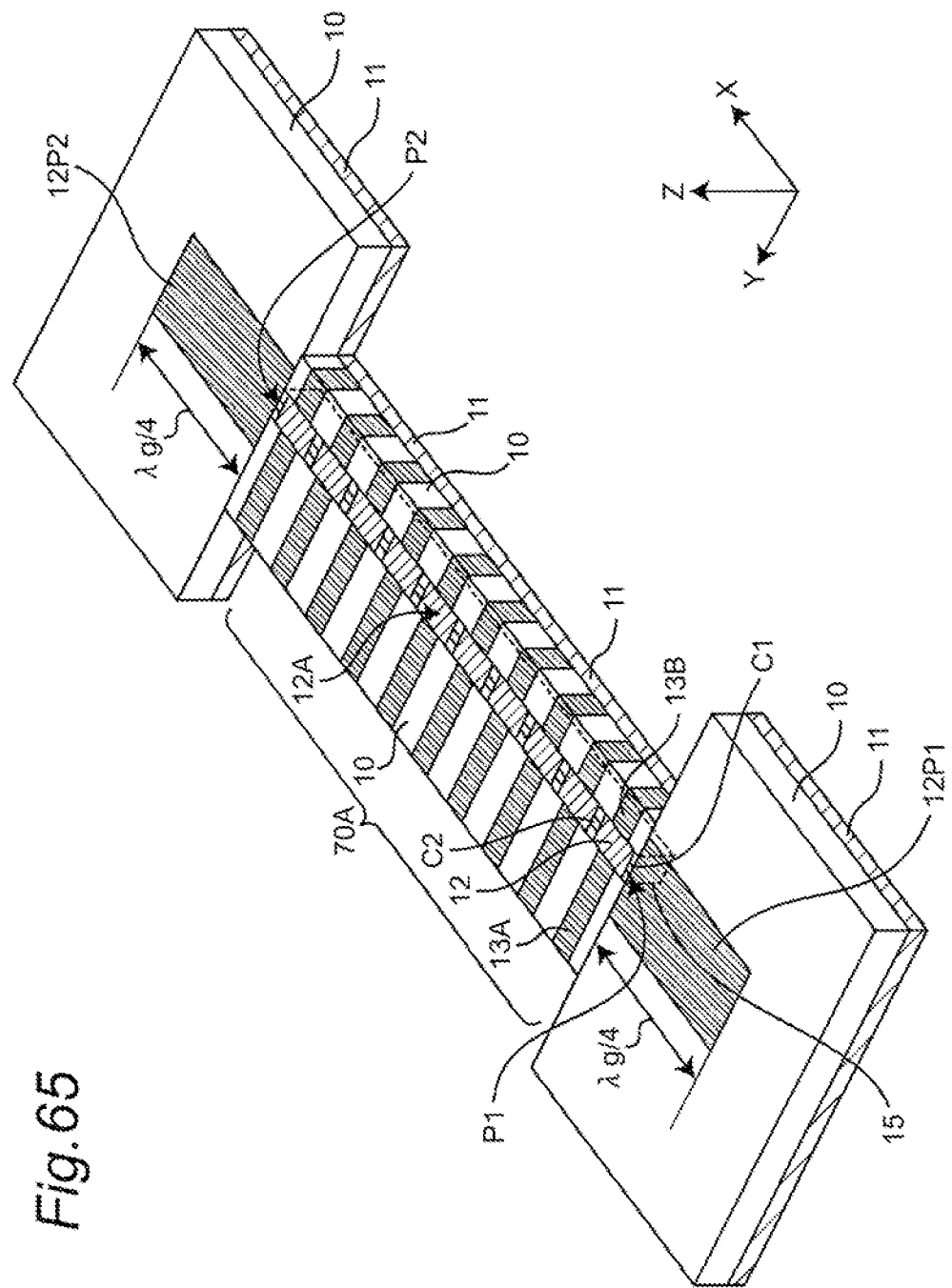
FIG. 65 is a perspective view showing a configuration of a transmission line resonator according to a first implementation example of the eighth embodiment of the present invention.

FIG. 65 is a perspective view showing a configuration of a transmission line resonator according to a first implementation example of the eighth embodiment of the present invention. FIG. 65 shows an implementation example of the transmission line resonator of FIG. 57. The transmission line resonator of FIG. 65 is characterized by including microstrip lines (provided with strip conductors 12P1 and 12P2 between which a dielectric substrate 10 is disposed, and a ground conductor 11) connected to both ends of the nonreciprocal transmission line apparatus 70A configured in a manner similar to that of FIG. 13, the microstrip lines being open at both ends and having finite lengths. In this case, the line length of the reflective element is set to one-fourth of the guide wavelength $\lambda g$ at the operating frequency. As a result, the conditions of short-circuited terminations at both ends of the nonreciprocal transmission line apparatus 70A are satisfied, and when the nonreciprocal transmission line apparatus 70A is in a resonance state, the series resonances of the series branches of the nonreciprocal transmission line apparatus 70A, i.e., the current wave is dominant, thus exhibiting an electromagnetic field distribution similar to a traveling wave resonator.

Figure 66:
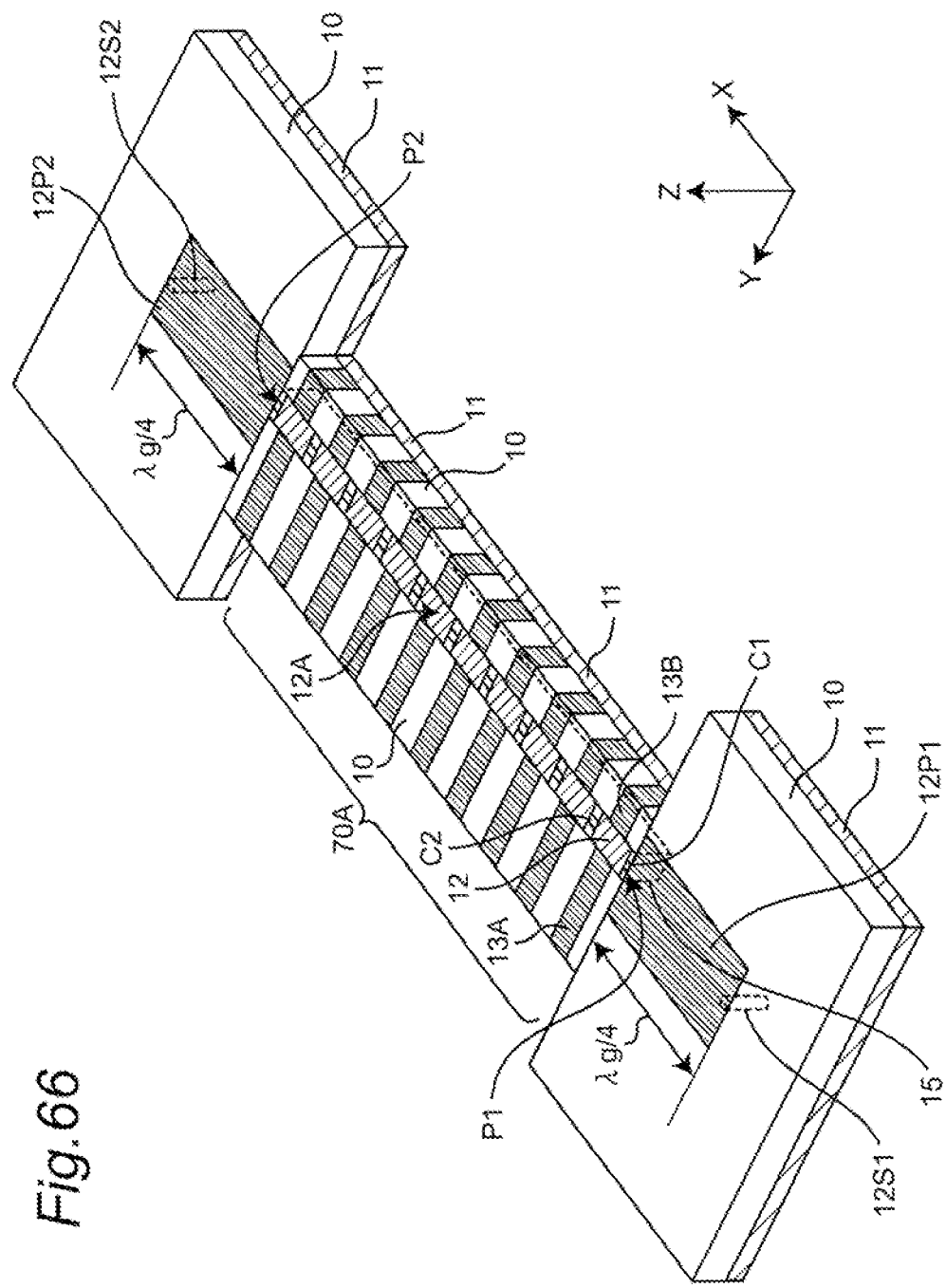
FIG. 66 is a perspective view showing a configuration of a transmission line resonator according to a second implementation example of the eighth embodiment of the present invention.

FIG. 66 is a perspective view showing a configuration of a transmission line resonator according to a second implementation example of the eighth embodiment of the present invention. FIG. 66 shows an implementation example of the transmission line resonator of FIG. 58. The transmission line resonator of FIG. 66 is characterized by including microstrip lines (provided with strip conductors 12P1 and 12P2 between which a dielectric substrate 10 is disposed, and a ground conductor 11) connected to both ends of the nonreciprocal transmission line apparatus 70A configured in a manner similar to that of FIG. 13, the microstrip lines being short-circuited at both ends and having finite lengths. In this case, the line length of the reflective element is set to one-fourth of the guide wavelength $\lambda g$ at the operating frequency. As a result, the conditions of open terminations at both ends of the nonreciprocal transmission line apparatus 70A are satisfied, and when the nonreciprocal transmission line apparatus 70A is in a resonance state, the shunt resonances of the shunt branches of the nonreciprocal transmission line apparatus 70A, i.e., the voltage wave is dominant, thus exhibiting an electromagnetic field distribution similar to a traveling wave resonator.

Figure 67:
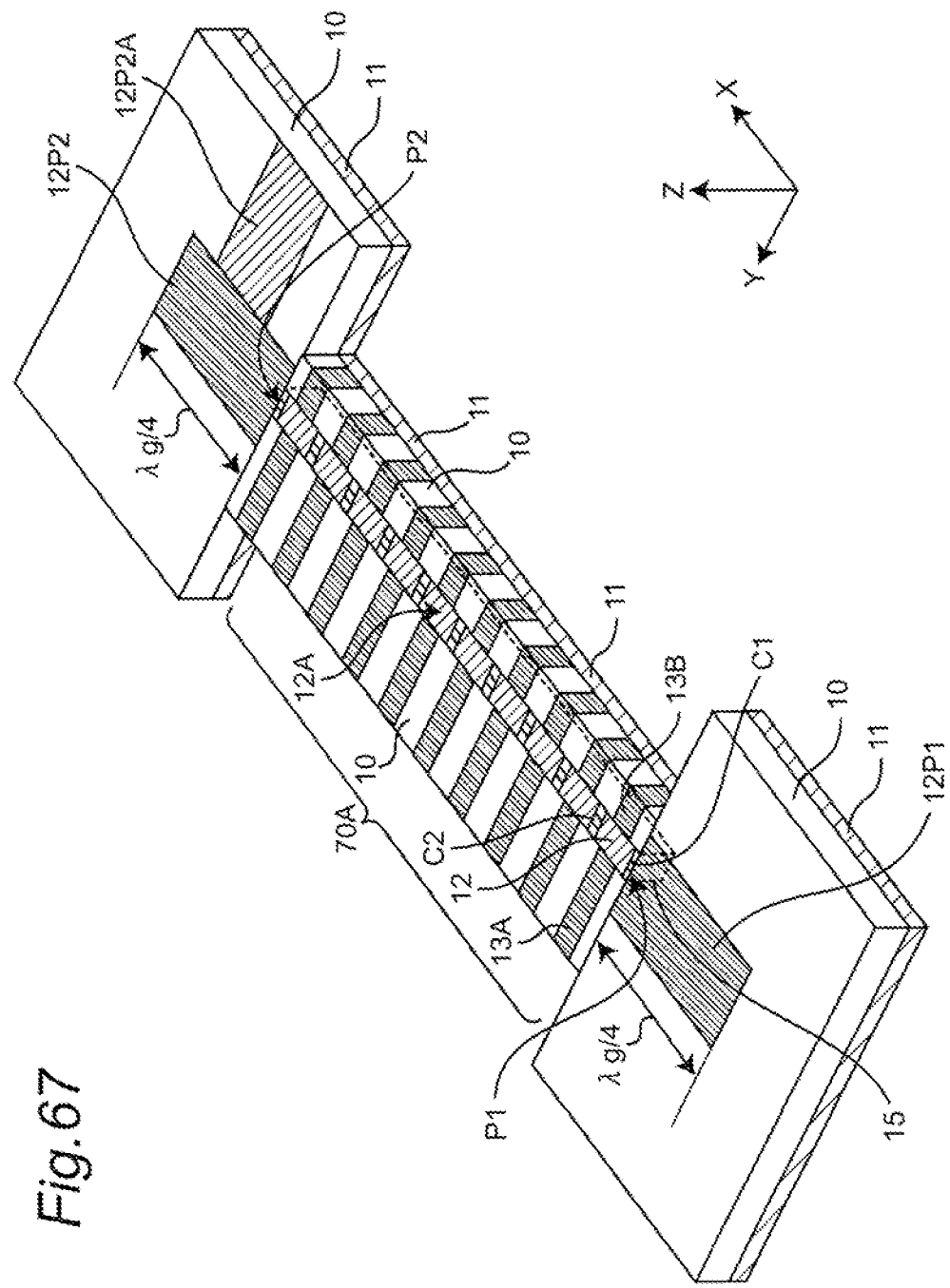
FIG. 67 is a perspective view showing a configuration of an antenna apparatus according to a third implementation example of the eighth embodiment of the present invention.

FIG. 67 is a perspective view showing a configuration of an antenna apparatus according to a third implementation example of the eighth embodiment of the present invention. FIG. 67 shows an implementation example of an antenna apparatus further provided with a signal input port on the side of the port P2 of the transmission line resonator of FIG. 65. That is, the antenna apparatus of FIG. 67 is a specific implementation of a short-circuit-ended resonator of the antenna apparatus of FIG. 61, which satisfies: $m_1=m_2=1$. Although the feedline 125 of FIG. 61 is inserted to the transmission lines 111 and 112 as the reflective element on the side of the port P1, a feedline of FIG. 67 (a feed lines configured as a microstrip line provided with a strip conductor 12P2A and a ground conductor 11 between which a dielectric substrate 10 is disposed) is inserted to the transmission line as the reflective element on side of the port P2.

Figure 68:
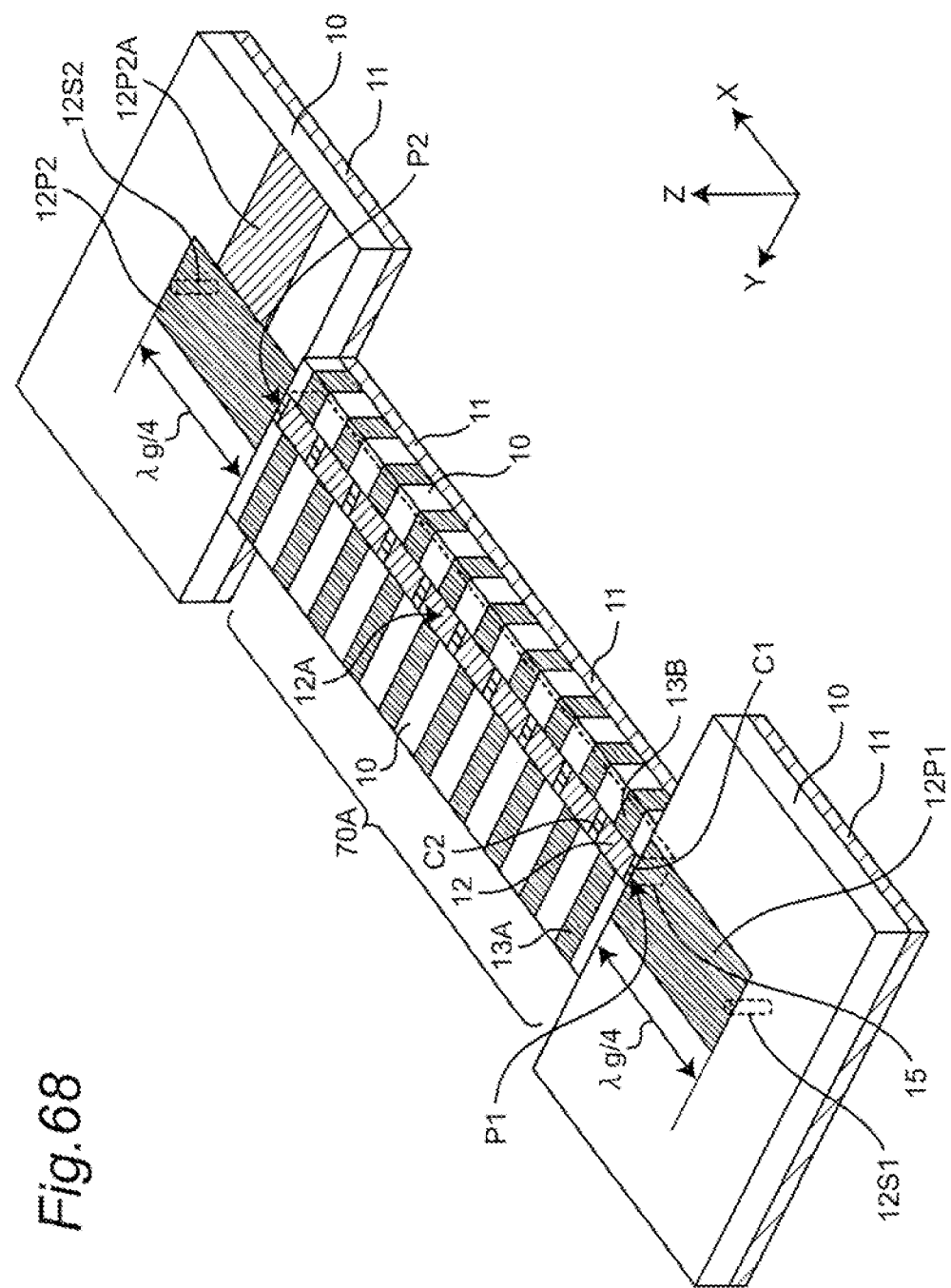
FIG. 68 is a perspective view showing a configuration of an antenna apparatus according to a fourth implementation example of the eighth embodiment of the present invention.

FIG. 68 is a perspective view showing a configuration of an antenna apparatus according to a fourth implementation example of the eighth embodiment of the present invention. FIG. 68 shows an implementation example of an antenna apparatus further provided with a signal input port on the side of the port P2 of the transmission line resonator of FIG. 66. That is, the antenna apparatus of FIG. 68 is a specific implementation of an open-ended resonator of the antenna apparatus of FIG. 62, which satisfies: $m_1=m_2=1$. Although the feedline 125 of FIG. 62 is inserted to the transmission lines 111 and 112 as the reflective element on the side of the port P1, a feedline of FIG. 68 (a feed lines configured as a microstrip line provided with a strip conductor 12P2A and a ground conductor 11 between which a dielectric substrate 10 is disposed) is inserted to the transmission line as the reflective element on side of the port P2.

Figure 69:
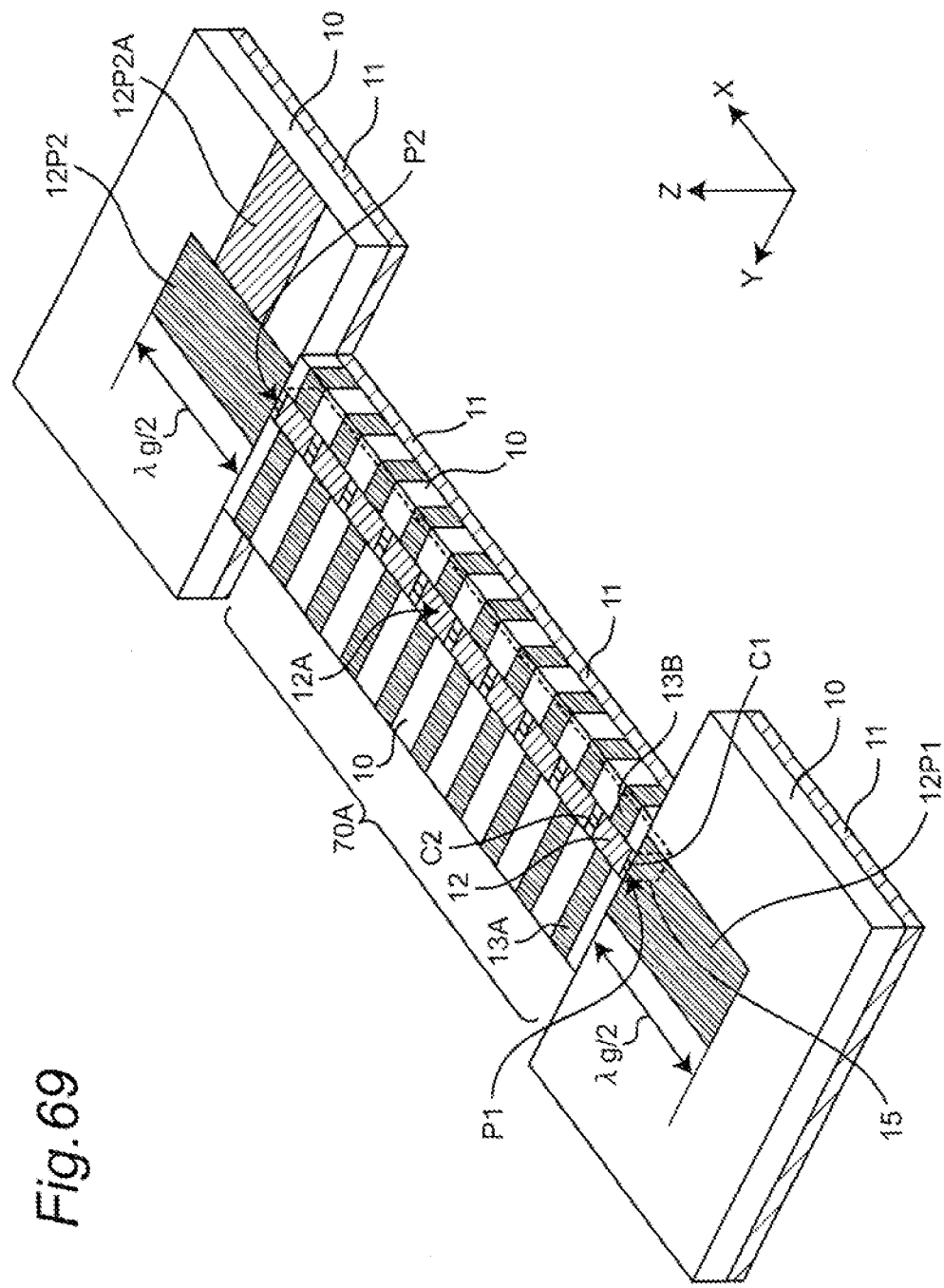
FIG. 69 is a perspective view showing a configuration of an antenna apparatus according to a fifth implementation example of the eighth embodiment of the present invention.

FIG. 69 is a perspective view showing a configuration of an antenna apparatus according to a fifth implementation example of the eighth embodiment of the present invention. FIG. 69 shows an implementation example of an antenna apparatus in which the line length of the open-ended transmission line of the antenna apparatus of FIG. 67 is changed to a half-wave length. The antenna apparatus of FIG. 69 is a specific implementation of an open-ended resonator of the antenna apparatus of FIG. 61, which satisfies: $m_1=m_2=1$.

Figure 70:
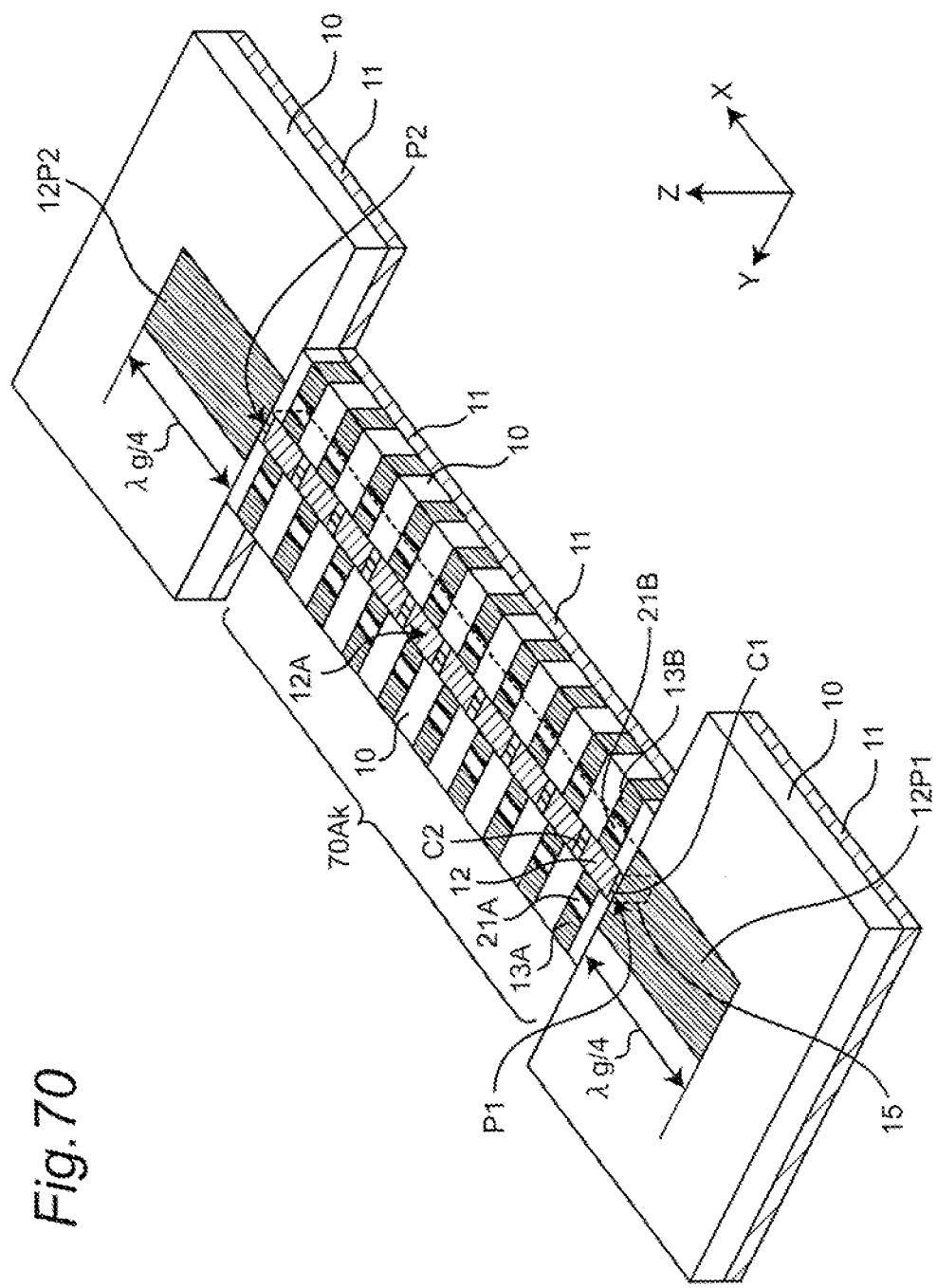
FIG. 70 is a perspective view showing a configuration of a transmission line resonator according to a sixth implementation example of the eighth embodiment of the present invention.

FIG. 70 is a perspective view showing a configuration of a transmission line resonator according to a sixth implementation example of the eighth embodiment of the present invention. The transmission line resonator of FIG. 70 is characterized by further including microstrip lines (provided with strip conductors 12P1 and 12P2 between which a dielectric substrate 10 is disposed, and a ground conductor 11) connected to both ends of a nonreciprocal transmission line apparatus 70Ak including the unit cells 60Ac configured in a manner similar to that of FIG. 23, the microstrip lines being open and having a finite length. In this case, the line length of the reflective element is set to one-fourth of the guide wavelength λg at the operating frequency. As a result, the conditions of short-circuited terminations at both ends of the nonreciprocal transmission line apparatus 70Ak are satisfied, and when the nonreciprocal transmission line apparatus 70Ak is in a resonance state, the series resonances of the series branches of the nonreciprocal transmission line apparatus 70Ak, i.e., the current wave is dominant, thus exhibiting an electromagnetic field distribution similar to a traveling wave resonator. According to the nonreciprocal transmission line apparatus 70Ak of the transmission line resonator of FIG. 70, in a manner similar to that of the nonreciprocal transmission line apparatus of FIG. 23, the controller (not shown) controls the voltages applied to the phase shifters 21A and 21B to change the amounts of phase shift of the phase shifters 21A and 21B, and thus, it is possible to set the impedances of the stub conductors 13A and 13B to different values from each other. According to the transmission line resonator of the present implementation example, it is possible to set the impedances of the stub conductors 13A and 13B to the different values depending on the required degree of the nonreciprocity, and achieve the asymmetric line structure by this difference in the impedance. The transmission line resonator of the present implementation example controls the asymmetry of the line structure itself. According to the mathematical formula (23), it is possible to provide a steerable antenna apparatus having a variable radiation angle θ, by changing the value of Δβ indicative of the nonreciprocal phase characteristics. As a result, when the nonreciprocal transmission line apparatus 70Ak operates as a traveling wave microwave resonator, it is possible to continuously or discretely change the spatial gradient of the phase distribution as a function of time. Therefore, when this nonreciprocal transmission line apparatus 70Ak is applied to an antenna apparatus, it is possible to change the direction of a beam radiated from the nonreciprocal transmission line apparatus 70Ak. That is, the antenna apparatus operates as a beam steerable antenna.

Although the transmission line is used as the reflective element connected to both ends of the transmission line resonator in the above description, a lumped-parameter circuit may be used to equivalently achieve short-circuited termination or open termination. Further, it is possible to insert switches and change their states.

When the ferrite square rod 15 of the nonreciprocal transmission line apparatus is made of soft magnetic material, the ferrite square rod 15 serves as dielectric unless an external magnetic field is applied. In this case, the nonreciprocal transmission line apparatus operates as a zeroth-order resonator, and the phase distribution is uniform over the nonreciprocal transmission line apparatus. In this case, when the nonreciprocal transmission line apparatus is applied as an antenna apparatus, the radiation direction is in the broadside direction.

Although the electromagnetic waves are radiated in the resonance state of the transmission line resonator of the antenna apparatus of the eighth embodiment, the antenna apparatus may be configured as a leaky wave antenna apparatus by changing its settings so as to partially leak electromagnetic waves.

The transmission line resonator of the eighth embodiment may be provided with any of the nonreciprocal transmission line apparatuses of the first embodiment as shown in FIGS. 13 to 34. The antenna apparatus of the eighth embodiment may be provided with any of the nonreciprocal transmission line apparatuses of the first embodiment as shown in FIGS. 13 to 32.

As described above, according to the transmission line resonator of the eighth embodiment, the distribution of an electromagnetic field over the transmission line resonator is similar to that of the conventional traveling wave resonator. In other words, the distribution of an electromagnetic field amplitude is constant along the longitudinal direction of the transmission line resonator, and the phase distribution varies linearly in space. Moreover, according to the antenna apparatus provided with this transmission line resonator, it is possible to improve the directional pattern and the gain of the antenna apparatus, and in addition, change the polarization direction by connecting the transmission lines as the reflective elements to both ends of the nonreciprocal transmission line apparatus 70A, and changing the electrical length of the transmission line (impedances of the reflective elements), as shown in FIGS. 63 and 64. On the other hand, it is possible to change the value of Δβ indicative of the nonreciprocal phase characteristics by controlling the voltages applied to the phase shifters 21A and 21B of FIG. 70, and therefore, provide a steerable antenna apparatus having a variable radiation angle θ. It should be emphasized that the gradient of phase distribution can be continuously controlled by changing the degree of nonreciprocity of the transmission line resonator, i.e., by controlling the voltages applied to the phase shifters 21A and 21B of FIG. 70. Moreover, according to the transmission line resonator of the present embodiment, it is possible to arbitrarily change size of the apparatus without depending on the operating wavelength, and provide a microwave resonator, for example, having a reduced size. Therefore, it is considered that the proposed transmission line resonator will create new applications to a microwave tunable filter, a power divider, and a beam steerable antenna.

Now, supplementary notice is provided with respect to the operating frequency indicated on the dispersion curves. In general, the dispersion curves of the nonreciprocal transmission line apparatus 70A are shown in FIG. 7. Referring to FIG. 7, the band of interest is $\omega_{\beta OL}<\omega<\omega_{\beta OU}$. It is noted that the gradient of a tangent line of the dispersion curve, i.e., $\partial\omega/\partial\beta$ indicates the direction of power transmission in each propagation mode. In this case, a part of the dispersion curve, having a positive slope of the tangent line at the operating point and having a positive phase constant β, corresponds to a right-handed mode propagation such that the direction of power transmission and the direction of wave number vector (direction of a flow of equiphase surface) are the same with each other. On the other hand, another part of the dispersion curve, having a negative slope of the tangent line at the operating point and having a positive phase constant β, corresponds to a left-handed mode propagation such that the direction of power transmission and the direction of wave number vector are opposite to each other. Therefore, if the direction from a port P1 to a port P2 along a transmission line of a finite length having the ports P1 and P2 at both ends is defined as the positive direction, then within the band of $\omega_{\beta OL}<\omega<\omega_{\beta OU}$, right-handed mode propagation occurs when a signal is inputted from the port P1, and conversely, left-handed mode propagation occurs when a signal is inputted from the port P2.

Particularly, at the operating frequencies at $\omega=\omega_{cL}$ and $\omega=\omega_{cU}$, the phase constants of the right-handed mode and the left-handed mode are the same with each other. Therefore, the flow of equiphase surface is in the positive direction regardless of the direction of power transmission.

As described above, the traveling wave microwave resonator can be configured by imposing boundary conditions on both ends of the nonreciprocal transmission line apparatus 70A. There are the following two cases: a case in which both ends are short-circuited, and a case in which both ends are open. In the case in which both ends are short-circuited, the nonreciprocal transmission line apparatus 70A is in a series resonance state in which the impedances of the series branches of the nonreciprocal transmission line apparatus 70A are almost zero, and the current wave is dominant. Let $\omega_{se}$ be the operating frequency in this case. In the case in which both ends are open, the nonreciprocal transmission line apparatus 70A is in a shunt resonance state in which the admittances of the shunt branches of the nonreciprocal transmission line apparatus 70A are almost zero, and the voltage wave is dominant. Let $\omega_{sh}$ be the operating frequency in this case. In general, the operating frequencies in the case in which both ends are short-circuited and in the case in which both ends are open are different from each other. It can be seen from the difference between the lower cutoff frequency $\omega_{cL}$ and the upper cutoff frequency $\omega_{cU}$ of the stopband in FIG. 7. In fact, the larger one of the two resonance frequencies $\omega_{sc}$ and $\omega_{sh}$ is $\omega_{cU}$, and the smaller one is $\omega_{cL}$.

FIG. 8 shows a specific case of FIG. 7 where $\omega_{cL}=\omega_{cU}=\omega_0$, and the stopband as shown in FIG. 7 is disappeared. That is, FIG. 8 shows a condition that the two operating frequencies of the open-ended traveling wave resonance and the short-circuit-ended traveling wave resonance, each operable depending on the boundary conditions at both ends of the transmission line, are degenerated.

Most of the implementation examples described above correspond to the special case of FIG. 8. However, even in a case as shown in FIG. 7 where the two types of resonance states are not degenerated, the nonreciprocal transmission line apparatus is operable as the traveling wave microwave resonator. In this case, of course, the operating frequencies of the open-ended resonance and the short-circuit-ended resonance are different from each other.

Ninth Embodiment

The present embodiment is characterized by using a transmission line resonator provided with the nonreciprocal transmission line apparatus 70A, the transmission line resonator operable as a zeroth-order traveling wave resonator. The transmission line resonator of the present embodiment is a zeroth-order traveling wave resonator operable in "zeroth-order resonance", i.e., the resonance state in which the resonance frequency does not depend on the size of the resonator (see, for example, the Non-Patent Literature 4), and achieve a traveling wave resonator operable in a mixed state of a series resonance state and a shunt resonance state.

1. Basic Configuration of Nonreciprocal Transmission Line Apparatus

Figure 71:
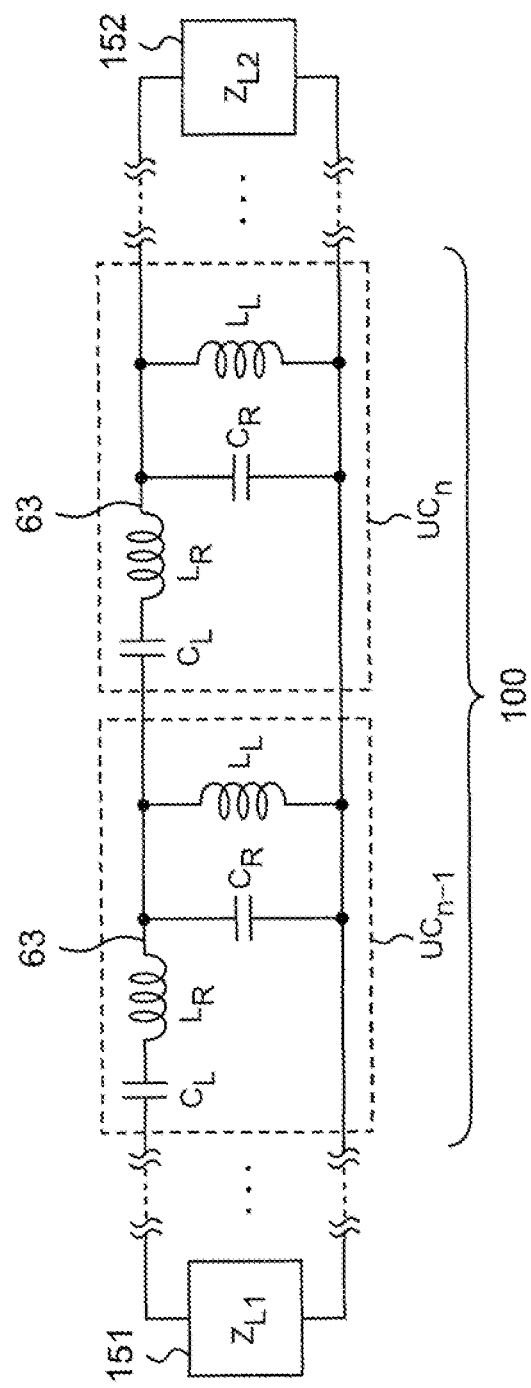
FIG. 71 is a circuit diagram showing an equivalent circuit model of a conventional transmission line resonator provided with a basic composite right/left-handed transmission line 100.
Figure 72:
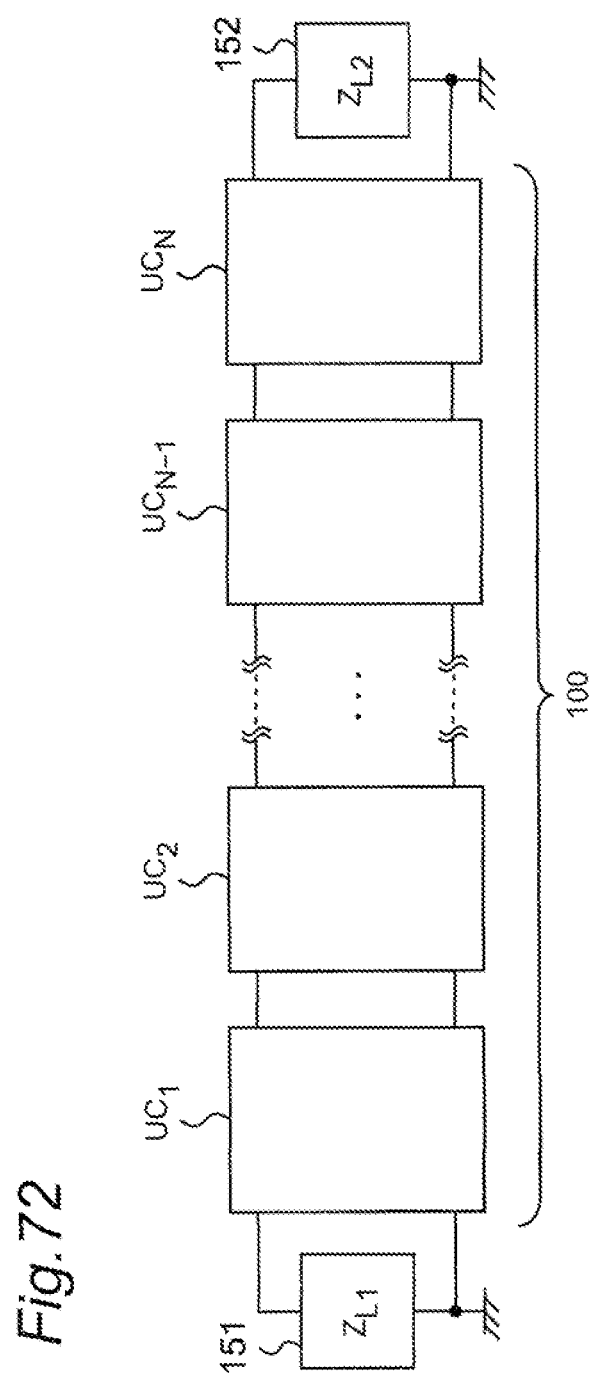
FIG. 72 is a circuit diagram showing an equivalent circuit model of the conventional transmission line resonator, in which the unit cells $UC_n$ (n=1, 2, ..., N) of FIG. 71 are simplified.

At first, for the purpose of explanation of the nonreciprocal transmission line apparatus of the present embodiment, a model of the conventional nonreciprocal transmission line apparatus is schematically described below with reference to FIGS. 71 to 74. FIG. 71 is a circuit diagram showing an equivalent circuit model of a conventional transmission line resonator provided with a basic composite right/left-handed transmission line 100. FIG. 72 is a circuit diagram showing an equivalent circuit model of the conventional transmission line resonator, in which the unit cells $UC_n$ (n=1, 2, . . . , N) of FIG. 71 are simplified. The transmission line microwave resonator of FIG. 71 is provided with: a composite right/left-handed transmission line 100 having a finite length, and terminating loads 151 and 152 connected to both ends of the composite right/left-handed transmission line 100 for reflecting a transmission signal. Further, the configuration of the composite right/left-handed transmission line 100 has a ladder transmission line structure including a cascade connection of a plurality N of unit cells $UC_1$, $UC_2$, . . . , $UC_N$, each having a size sufficiently smaller than the wavelength of the transmission signal. In this case, one unit cell $UC_n$ is a micro element of two-terminal pair network as shown in FIGS. 71 and 72.

Further, as shown in FIG. 71, the unit cell $UC_n$ is configured such that a series resonator circuit including a capacitive element having a capacitance $C_L$ and an inductive element having an inductance $L_R$ is equivalently inserted in a series branch of a transmission line part 63 of the composite right/left-handed transmission line 100, and a parallel resonator circuit including a capacitive element having a capacitance $C_R$ and an inductive element having an inductance $L_L$ is equivalently inserted in its shunt branch. In this case, the inductive element having the inductance $L_R$ and the capacitive element having the capacitance $C_R$ correspond to the series branch inductive element and the shunt branch capacitive element, respectively, which are inherently owned by or inserted to the right-handed transmission line. On the other hand, the capacitive element having the capacitance $C_L$ corresponds to the capacitive element inserted in the series branch to obtain a negative effective permeability of an electromagnetic wave mode of propagation through the composite right/left-handed transmission line 100, and the inductive element having the inductance $L_L$ corresponds to the inductive element inserted in the shunt branch to obtain a negative effective permittivity of the electromagnetic wave mode of propagation through the composite right/left-handed transmission line 100.

Figure 73:
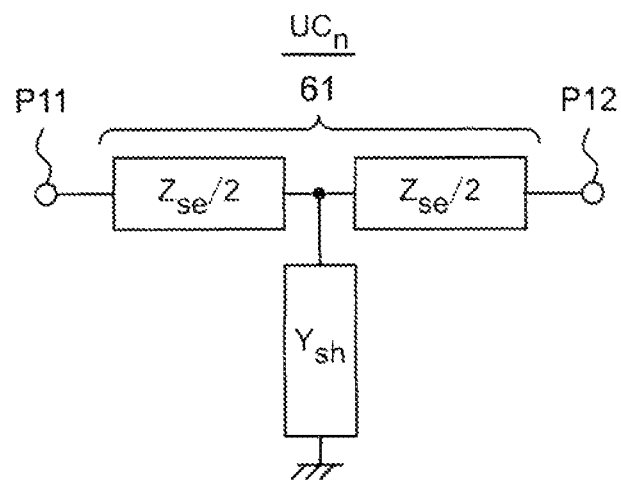
FIG. 73 is a circuit diagram showing an exemplary unit cell $UC_n$ of FIG. 71 having a symmetric T-structure.
Figure 74:
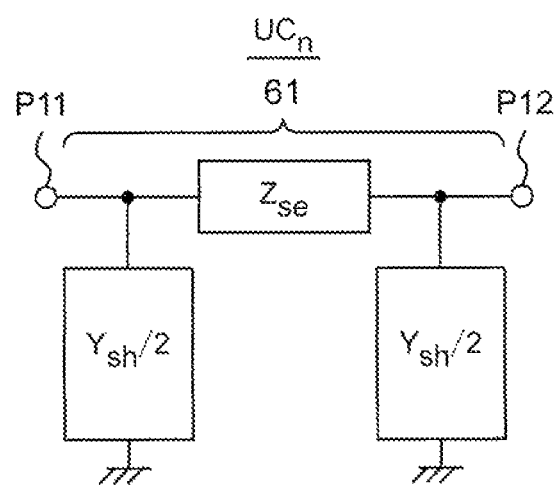
FIG. 74 is circuit diagram showing an exemplary unit cell $UC_n$ of FIG. 71 having a symmetric π-structure.

FIG. 73 is a circuit diagram showing an exemplary unit cell $UC_n$ of FIG. 71 having a symmetric T-structure. FIG. 74 is circuit diagram showing an exemplary unit cell $UC_n$ of FIG. 71 having a symmetric π-structure. With respect to FIGS. 73 and 74, the parameter $Z_{se}$ denotes the impedance of the series branch of the transmission line part 63, and the parameter $Y_{sh}$ denotes the admittance of the shunt branch, and these parameters are given as follows.

$$Z_{se} = j \cdot \omega \cdot L_R + \frac{1}{j \cdot \omega \cdot C_L} = \quad \text{[Mathematical Expression 18]}$$
$$j \cdot \omega \cdot L_R \cdot \left\{1 - \left(\frac{\omega_{se}}{\omega}\right)^2\right\}$$

$$Y_{sh} = j \cdot \omega \cdot C_R + \frac{1}{j \cdot \omega \cdot L_L} = \quad \text{[Mathematical Expression 19]}$$
$$j \cdot \omega \cdot C_R \cdot \left\{1 - \left(\frac{\omega_{sh}}{\omega}\right)^2\right\}$$

$\omega_{se}$ is the series resonance angular frequency of the series branch, and given as follows.

$$\omega_{se}=1/\sqrt{L_R C_L} \quad \text{[Mathematical Expression 20]}$$

$\omega_{sh}$ is the shunt resonance angular frequency of the shunt branch, and given as follows.

$$\omega_{sh} = 1/\sqrt{L_L C_R} \qquad \text{[Mathematical Expression 21]}$$

Hereinafter, in principle, it is assumed that the line length (i.e., period length) "d" of the unit cell $UC_n$ is sufficiently smaller than the wavelength. Therefore, it is emphasized that essentially similar results are obtained even when the unit cell has T-structure, π-structure, or L-structure, and the line length d of the unit cell $UC_n$ with respect to the wavelength does not restrict the basic operation described herein.

In addition, a composite right/left-handed transmission line 100 having a reciprocal phase characteristic in which a forward phase constant and a backward phase constant are the same with each other is referred to as a composite right/left-handed reciprocal transmission line or a composite right/left-handed reversible transmission line (or simply referred to as a reciprocal transmission line). A composite right/left-handed transmission line 100 having a nonreciprocal phase characteristic in which a forward phase constant and a backward phase constant (in particular, a forward phase constant $\beta_+$ and a backward phase constant $\beta_-$) are different from each other is referred to as an composite right/left-handed nonreciprocal transmission line or an composite right/left-handed irreversible transmission line (or simply referred to as a nonreciprocal transmission line).

The propagation characteristics of the composite right/left-handed transmission line 100 having the periodic structure as the cascade connection of the plurality of unit cells $UC_n$ as shown in FIGS. 71 and 72 are obtained as dispersion curves indicative of a relation between the operating frequency and the phase constant of the propagating electromagnetic waves. FIGS. 5 and 6 show dispersion curves of the conventional composite right/left-handed reciprocal transmission line in an unbalanced state and in a balanced state, respectively.

In general, the slope of the tangent of the dispersion curve, $\partial\omega/\partial\beta$ has a dimension of velocity and indicates the direction of the power transmission of electromagnetic waves (Poynting vector), and on the other hand, $\omega/\beta$ indicates a phase velocity (a direction of the flow of equiphase surface).

In the unbalanced state as shown in FIG. 5, it is shown that the series resonance angular frequency $\omega_{se}$ and the shunt resonance angular frequency $\omega_{sh}$ are different from each other, and the dispersion curves are separated into a lower frequency band an upper frequency band. In the lower frequency band, it is possible to propagate backward waves (left-handed mode) in which the direction of the power transmission (direction of group velocity) and the direction of phase velocity of electromagnetic waves are opposite to each other. In the upper frequency band, it is possible to propagate forward waves (right-handed mode) in which the direction of group velocity and the direction of phase velocity are the same with each other. In addition, no dispersion curve exists between the band of the right-handed (RH) mode and the band of the left-handed (LH) mode, and there is a forbidden band (band-gap) in which the wave propagation is not permitted.

On the other hand, in the balanced state as shown in FIG. 6, the series resonance angular frequency $\omega_{se}$ and the shunt resonance angular frequency $\omega_{sh}$ are the same with each other, and the right-handed (RH) transmission characteristic and the left-handed (LH) transmission characteristic are continuously connected, and the forbidden band disappears.

As described above, the composite right/left-handed transmission line 100 is a microwave transmission line provided with a cascade connection of at least one unit cells $UC_1$, $UC_2$, ..., $UC_N$. In this case, each unit cell $UC_n$ is provided with: the capacitive element having the capacitance $C_L$ and inserted in the series branch to obtain a negative effective permeability for the electromagnetic wave mode of propagation through the composite right/left-handed transmission line 100; the inductive element having the inductance $L_L$ and inserted in the series branch to obtain a negative effective permittivity for the electromagnetic wave mode of propagation through the composite right/left-handed transmission line 100; and the transmission line part 63 of an nonreciprocal transmission line part or a reciprocal transmission line part. In addition, each unit cell $UC_n$ has such a circuit configuration that the composite right/left-handed transmission line 100 has a phase constant in the dispersion curves indicative of the relation between the operating frequency of the microwave signal inputted to the composite right/left-handed transmission line 100 and the phase constant of the composite right/left-handed transmission line 100.

In this case, the series resonance angular frequency of the series branch, $\omega_{se}$, corresponds to $\omega_2$ of the mathematical expression (4), and the shunt resonance angular frequency of the shunt branch, $\omega_{sh}$, corresponds to $\omega_1$ of the mathematical expression (3) (see FIG. 5). Therefore, it is shown that the series resonance angular frequency $\omega_{se}$ and the shunt resonance angular frequency $\omega_{sh}$ are angular frequencies at the phase constant $\beta=0$, i.e., positioned on intersections of the dispersion curves and the axis of symmetry, ω axis. On the other hand, we consider the relationship between the dispersion curves of the reciprocal transmission line of FIGS. 5 and 6 and the dispersion curves of the nonreciprocal transmission line of FIGS. 7 and 8. In this case, as obvious from comparison between the dispersion relation (1) of reciprocal transmission line and the dispersion relation (2) of nonreciprocal transmission line, the series resonance angular frequency of the series branch, $\omega_{se}$, and the shunt resonance angular frequency of the shunt branch, $\omega_{sh}$, are positioned on intersections of the dispersion curves and the axis of symmetry, $\beta=\Delta\beta/2$, in the dispersion curves of nonreciprocal transmission line as shown in FIG. 7. That is, the larger one of the series resonance angular frequency $\omega_{se}$ and the shunt resonance angular frequency $\omega_{sh}$ is $\omega_{cU}$, and the smaller one is $\omega_{cL}$. In addition, when $\omega_{cL}=\omega_{cU}$ is satisfied in FIG. 7, and the forbidden band between them is disappeared as shown in FIG. 8. In this case, the series resonance angular frequency $\omega_{se}$ of the series branch and the shunt resonance angular frequency $\omega_{sh}$ of the shunt branch are the same with each other, and $\omega_{se}=\omega_{sh}=\omega_0$ is satisfied.

2. Resonance Conditions of Transmission Line Resonator of Embodiment

Figure 75:
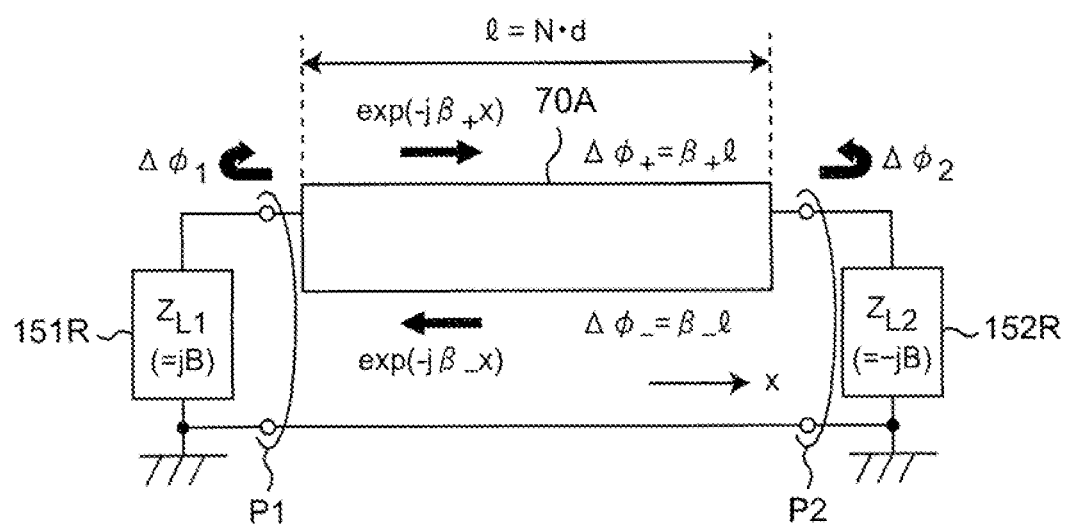
FIG. 75 is a block diagram showing a configuration of a transmission line resonator according to a ninth embodiment of the present invention.

Next, with reference to FIGS. 75 to 78, the resonance conditions of the transmission line resonator of the present embodiment is described. FIG. 75 is a block diagram showing a configuration of a transmission line resonator according to a ninth embodiment of the present invention. As described above, the transmission line resonator of the present embodiment operates as the zeroth-order traveling wave resonator. FIG. 75 shows an equivalent circuit model of the zeroth-order traveling wave resonator. Referring to FIG. 75, the transmission line resonator of the present embodiment is provided with: the nonreciprocal transmission line apparatus 70A of the first embodiment, a reflective element 151R connected to the port P1 of the nonreciprocal transmission line apparatus 70A, and a reflective element 152R connected to the port P2 of the nonreciprocal transmission line apparatus 70A. The nonreciprocal transmission line apparatus 70A includes a plurality N of unit cells $UC_1$, $UC_2$, ..., $UC_N$, each having the length "d", and has a finite overall length $l=N\times d$. In this case, the reflective element 151R operates so that its impedance seen from the port P1 is $Z_{L1}$ at the operating frequency, and the reflective element 152R operates so that its impedance seen from the port P2 is $Z_{L2}$ at the operating frequency. Referring to FIG. 75, the parameters $\beta_+$ and $\Delta\phi_+$ denote the phase constant and the phase delay of the transmission line of power transmission from the port P1 to the port P2, the parameters $\beta_-$ and $\Delta\phi_-$ denote the phase constant and the phase delay of the transmission line of power transmission from the port P2 to the port P1, and "x" denotes the position in the longitudinal direction of the nonreciprocal transmission line apparatus 70A. In addition, the amounts of phase shift due to reflections at the ports P1 and P2 are $\Delta\phi_1$ and $\Delta\phi_2$, respectively. In the present case, the resonance conditions are satisfied when the following phase relations are satisfied.

[Mathematical Expression 22]

$$\Delta\phi=\Delta\phi_+ + \Delta\phi_- + \Delta\phi_1 + \Delta\phi_2 = 2m\pi \quad (24)$$

$\Delta\phi_+ = \beta_+ \times 1$, and $\Delta\phi_- = \beta_- \times 1$, and "m" is an integer. At first, we assume reciprocity, $\beta_+ = \beta_- = \beta$, for ease of explanation, and the nonreciprocal transmission line apparatus 70A is assumed to be a reciprocal transmission line apparatus. In this case, when both the ports P1 and P2 are open, or when both the ports P1 and P2 are short-circuited, the value of $\Delta\phi_1 + \Delta\phi_2$ is $2\pi$ or zero in either case of voltage waves or current waves, and therefore, the mathematical formula (24) is written as follows.

[Mathematical Expression 23]

$$\Delta\phi=\Delta\phi_+ + \Delta\phi_- = 2\beta l = 2m\pi \quad (25)$$

Therefore, the resonance condition concerning the phase constant $\beta$ of the transmission line is determined by the length l of the reciprocal transmission line apparatus, and given as follows.

[Mathematical Expression 24]

$$\beta = m\pi/l \quad (26)$$

Since the phase constant $\beta$ is a function of frequency, it can be said that the mathematical formula (26) indicates the dependency of the resonance frequency on the line length. When m=1 is substituted in the mathematical formula (26), the line length l is given by l=$\lambda$g/2. The parameter $\lambda$g is a guide wavelength. This condition defines the operation of the typical half-wavelength resonator. When m=0 is substituted in the mathematical formula (26), the resonance condition is independent of the line length l, and written as $\beta$=0. The zero phase constant $\beta$ means an infinite wavelength, in which the guide wavelength $\lambda$g is +∞, and the signal amplitude and the phase are uniform over the reciprocal transmission line apparatus. Thus, it is possible to achieve the zeroth-order traveling wave resonator having the resonance frequency not depending on the size of the resonator.

On the other hand, in the case of nonreciprocal transmission line apparatus, the mathematical formula (25) is written as follows.

[Mathematical Expression 25]

$$\Delta\phi=\Delta\phi_+ + \Delta\phi_- = (\beta_+ + \beta_-)l = 2m\pi \quad (27)$$

Since the phase constants $\beta_+$ and $\beta_-$ of the nonreciprocal transmission line apparatus are also functions of frequency as similar to the case of the conventional reciprocal transmission line apparatus, the mathematical formula (27) indicates the dependency of the resonance frequency on the line length, when m≠0. When m=1 is substituted, this condition defines the operation of the typical half-wavelength resonator in a manner similar to that of the reciprocal case. When m=0 is substituted in the mathematical formula (27), the resonance condition is independent of the line length l, and given as follows.

[Mathematical Expression 26]

$$\beta_+ + \beta_- = 0 \quad (28)$$

The mathematical formula (28) indicates the case in which the forward propagation with the right-handed mode and the backward propagation with the left-handed mode occur, and the phase constants of two modes of the opposite forward and backward propagation have the same absolute value, as described above. This condition corresponds to a case of FIG. 7 in which the operating frequency is at $\omega=\omega_{cL}$ or $\omega=\omega_{cU}$, and corresponds to a case of FIG. 8 in which the operating frequency is at $\omega=\omega_0$. The distribution of electromagnetic field at this resonance state has a uniform signal amplitude, and a phase distribution having a constant slope, over the nonreciprocal transmission line apparatus 70A. Therefore, the transmission line resonator provided with the nonreciprocal transmission line apparatus 70A satisfying these resonance conditions is characterized by the same distribution of electromagnetic field as that of the traveling wave resonator. Thus, it is possible to achieve the traveling wave resonator having the resonance frequency not depending on the size of the resonator.

Figure 79:
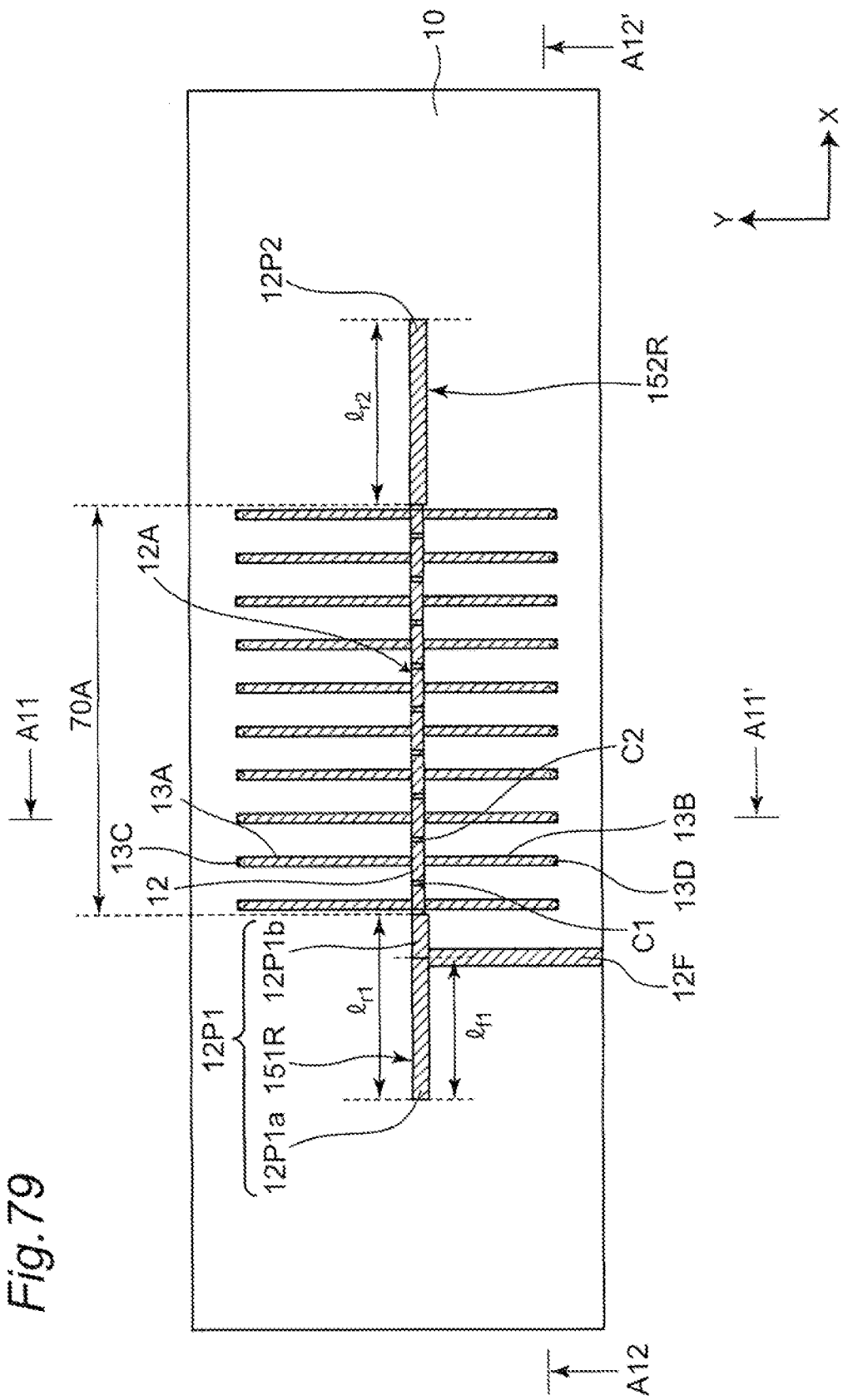
FIG. 79 is a top view showing a configuration of a transmission line resonator according to a first implementation example of the ninth embodiment of the present invention.

Referring to FIG. 75, if the ports P1 and P2 are short-circuited and $Z_{L1}=Z_{L2}=0$ is satisfied, then a large current flows from the nonreciprocal transmission line apparatus 70A to the reflective elements 151R and 152R. Therefore, a series resonance operation with a zero impedance $Z_{se}$ of the series branch of each unit cell $UC_n$ is dominant. At this time, the radiation waves are linearly polarized, and the direction of co-polarization is parallel to the longitudinal direction of the nonreciprocal transmission line apparatus 70A. On the other hand, if the ports P1 and P2 are open and $Z_{L1}=Z_{L2}=+\infty$ is satisfied, then the current becomes zero and the voltage becomes maximized at the connection point of the composite right/left-handed transmission line 100 and the reflective elements 151R and 152R. Therefore, a shunt resonance operation with a zero admittance $Y_{sh}$ of the shunt branch is dominant. In this case, the direction of co-polarization of the radiation waves is parallel to the shunt branch. Therefore, for example, when the stub conductors 13A and 13B as the shunt branches are formed to be perpendicular to the longitudinal direction of the nonreciprocal transmission line apparatus 70A as shown in FIG. 79, the direction of co-polarization of the radiation waves is perpendicular to the longitudinal direction of the nonreciprocal transmission line apparatus 70A.

According to the prior art, the zeroth-order resonator is obtained by providing short-circuited ends or open ends at both the ports P1 and P2 as described above. However, in order to obtain the mathematical formula (24), it is enough for the phase condition on reflections at both the ends to only satisfy the following relation.

[Mathematical Expression 27]

$$\Delta\phi_1 + \Delta\phi_2 = 2m_L\pi \quad (29)$$

$m_L$ is an integer. In addition, the resonance conditions on the reflection at both the ends includes not only this phase condition, but also a condition for substantially total reflection (i.e., the absolute value of reflection coefficient is one). Therefore, according to the mathematical formula (29) and its subsequent explanation, a reflection coefficient $\Gamma_1$ at the port P1 and a reflection coefficient $\Gamma_2$ at the port P2 are given as follows.

[Mathematical Expression 28]

$$\Gamma_1 = \exp(j \cdot \Delta\phi_1) \quad (30)$$

[Mathematical Expression 29]

$$\Gamma_2 = \exp(j \cdot \Delta\phi_2) = \exp(-j \cdot \Delta\phi_1) \quad (31)$$

When the nonreciprocity of the nonreciprocal transmission line apparatus 70A mainly appears as an amount of phase shift, and the characteristic impedances has a small degree of nonreciprocity, i.e., when $\Delta Z = Z_p - Z_m$ of the mathematical formula (1) is almost zero, Bloch impedance of the nonreciprocal transmission line apparatus 70A having a periodic structure does not depend on the propagation direction and is almost reciprocal. These conditions are assumed hereinafter.

The phase relation of the mathematical formula (29) can be achieved by connecting to the port P1 a reflective element 151R having an impedance jB of a pure imaginary number at the operating frequency, and connecting to the port P2 a reflective element 152R having an impedance −jB conjugate with the impedance jB at the operating frequency. In this case, by using Bloch impedance $Z_{CRLHTL}$ of the nonreciprocal transmission line apparatus 70A operable as the traveling wave resonator, a reflection coefficient $\Gamma_{1B}$ at the port P1 and a reflection coefficient $\Gamma_{2B}$ at the port P2 are given as follows.

[Mathematical Expression 30]

$$\Gamma_{1B} = \frac{Z_{L1} - Z_{CRLHTL}}{Z_{L1} + Z_{CRLHTL}} = \frac{j \cdot B - Z_{CRLHTL}}{j \cdot B + Z_{CRLHTL}} = -\exp\left(-j \cdot 2 \cdot \tan^{-1} \frac{B}{Z_{CRLHTL}}\right) \quad (32)$$

[Mathematical Expression 31]

$$\Gamma_{2B} = \frac{Z_{L2} - Z_{CRLHTL}}{Z_{L2} + Z_{CRLHTL}} = \frac{-j \cdot B - Z_{CRLHTL}}{-j \cdot B + Z_{CRLHTL}} = -\exp\left(j \cdot 2 \cdot \tan^{-1} \frac{B}{Z_{CRLHTL}}\right) \quad (33)$$

In particular, when the composite right/left-handed transmission line 100 is in the resonance state while maintaining the balanced state, the Bloch impedance $Z_{CRLHTL}$ is irrelevant to the unit cell structure, and simplified as follows.

[Mathematical Expression 32]

When $\omega =$ (34)

$$\omega_{sh} = \omega_{se}: Z_{CRLHTL} = \sqrt{\frac{L_R\left(1 - \left(\frac{\omega_{se}}{\omega}\right)^2\right)}{C_R\left(1 - \left(\frac{\omega_{sh}}{\omega}\right)^2\right)}} = \sqrt{\frac{L_R}{C_R}}$$

The relation for the reflection coefficients $\Gamma_{1B}$ and $\Gamma_{2B}$ of the mathematical formulas (32) and (33) satisfy the relation for the reflection coefficients $\Gamma_1$ and $\Gamma_2$ of the mathematical formulas (30) and (31). Therefore, it is possible to achieve a variety of zeroth-order resonators in accordance with the reactance B of the reflective element 151R of FIG. 75.

2-1. Operation with Use of Balanced Nonreciprocal Transmission Line Apparatus 70A

Figure 76:
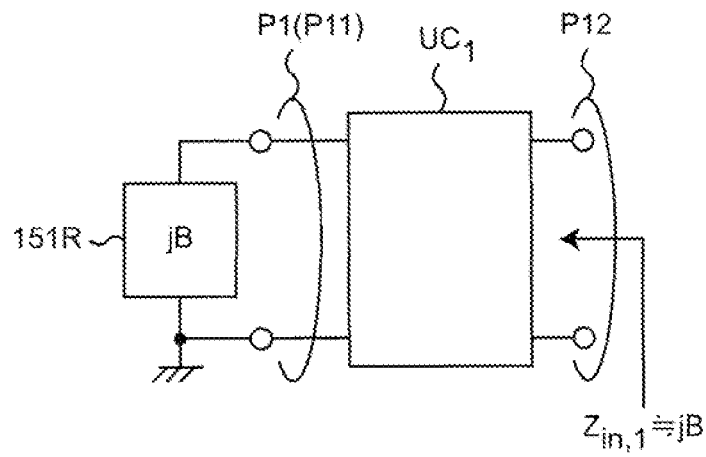
FIG. 76 is a block diagram showing an input impedance $Z_{in,1}$ seen from the port P12 of the unit cell $UC_1$, when the port P1 of the nonreciprocal transmission line apparatus 70A of FIG. 75 is terminated by the reflective element 151R having the impedance jB.
Figure 77:
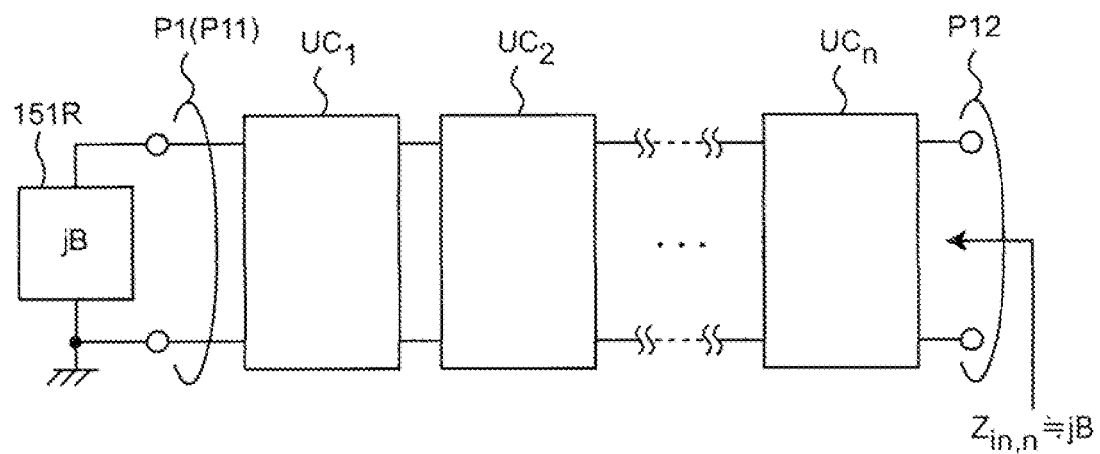
FIG. 77 is a block diagram showing an input impedance $Z_{in,1}$ seen from the port P12 of the unit cell $UC_n$, when the port P1 of the nonreciprocal transmission line apparatus 70A of FIG. 75 is terminated by the reflective element 151R having the impedance jB.
Figure 78:
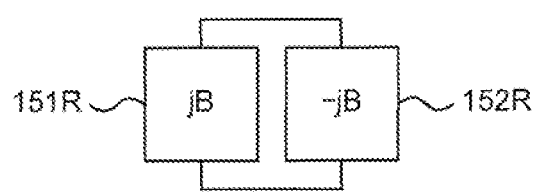
FIG. 78 is a block diagram showing a closed-loop circuit as a lumped-parameter circuit including the reflective elements 151R and 152R of FIG. 75.

Next, with reference to FIGS. 76 to 78, the operation of the transmission line resonator provided with the nonreciprocal transmission line apparatus 70A in the balanced state is described.

The impedance $Z_{se}$ of the series branch and the admittance $Y_{sh}$ of the shunt branch near the zeroth-order resonance frequency are substantially zero. The ABCD matrix $F_T$ of the unit cell $UC_n$ having a symmetric T-structure (See FIG. 73) and the ABCD matrix $F_\Pi$ of the unit cell $UC_n$ having a symmetric π-structure (See FIG. 74) are given as follows.

[Mathematical Expression 33]

$$F_T \approx F_\Pi \approx e^{j\Delta\beta d/2}\begin{pmatrix} 1 & \overline{Z}_{se} \\ \overline{Y}_{sh} & 1 \end{pmatrix} \quad (35)$$

It is noted that $\overline{Z}_{se}$  [Mathematical Expression 34]

and $\overline{Y}_{sh}$  [Mathematical Expression 35]

indicate impedances of the series branch and the shunt branch in the case in which the nonreciprocal transmission line part 61 and 62 have reciprocal phase constants $\beta_p$ and $\beta_m$, and the phase constants are substituted by $\overline{\beta} = (\beta_p + \beta_m)/2$  [Mathematical Expression 36]

When each unit cell $UC_n$ has a symmetric T-structure, and the port P1 of the nonreciprocal transmission line apparatus 70A of FIG. 75 (one port P11 of the unit cell $UC_1$) is terminated by the reflective element 151R having the impedance jB, an input impedance $Z_{in,1}$ seen from the other port P12 of the unit cell $UC_1$ is approximately given as follows.

[Mathematical Expression 37]

$$Z_{in,1} = \frac{V}{I} \quad (36)$$
$$= \frac{A_T V_{L1} + B_T I_{L1}}{C_T V_{L1} + D_T I_{L1}}$$
$$= \frac{A_T Z_{L1} + B_T}{C_T Z_{L1} + D_T}$$
$$\approx \frac{jB + Z_{se}}{jBY_{sh} + 1}$$
$$\approx jB$$

Also when the unit cell $UC_n$ has the symmetric π-structure, the input impedance $Z_{in,1}$ seen from the other port P12 of the unit cell $UC_1$ is likewise given by the mathematical formula (36). FIG. 76 is a block diagram showing an input impedance $Z_{in,1}$ seen from the port P12 of the unit cell $UC_1$, when the port P1 of the nonreciprocal transmission line apparatus 70A of FIG. 75 is terminated by the reflective element 151R having the impedance jB. Thus, it is shown that the input impedance $Z_{in,n}$ seen from the port P12 of each unit cell $UC_n$ is always jB, even in the case of a plurality N of the unit cells $UC_n$. That is, it can be easily understood that, when the reflective element 151R having the impedance jB is connected to one port P1 of the nonreciprocal transmission line apparatus 70A of a finite length in the balanced state and in the zeroth-order resonance state, an input impedance seen from the other port P2 is always identical to the impedance jB at the terminating element of the port P1 (i.e., reflective element 151R), regardless of the line length l. FIG. 77 is a block diagram showing an input impedance $Z_{in,1}$ seen from the port P12 of the unit cell $UC_n$, when the port P1 of the nonreciprocal transmission line apparatus 70A of FIG. 75 is terminated by the reflective element 151R having the impedance jB.

When the reflective element 151R having an impedance jB, which is a complex number having substantially no real part at the operating frequency, preferably a pure imaginary number, is connected to the one port P1 of the nonreciprocal transmission line apparatus 70A, it is necessary to connect to the other port P2 the reflective element 152R having the impedance −jB, which is substantially conjugate with the impedance of the reflective element 151R at the operating frequency, preferably a pure imaginary number conjugate with the impedance jB of the pure imaginary number, in order to achieve zeroth-order resonance of the nonreciprocal transmission line apparatus 70A in the balanced state.

FIG. 78 is a block diagram showing a closed-loop circuit as a lumped-parameter circuit including the reflective elements 151R and 152R of FIG. 75. As described above, it is shown that the nonreciprocal transmission line apparatus 70A of the finite length in the balanced state, whose both ends are terminated by the reflective element 151R having the impedance jB and the reflective element 152R having the impedance −jB, automatically satisfies the resonance conditions, in a manner similar to that of the closed-loop of two elements having the lumped-parameters jB and −jB (see FIG. 78).

It is noted that a ratio (impedance) between voltage waves and current waves propagating along the nonreciprocal transmission line apparatus 70A in the zeroth-order resonance state corresponds to the input impedance jB as described above.

According to the conventional zeroth-order resonator, both the ports P1 and P2 of the composite right/left-handed transmission line 100 are short-circuited, or both the ports P1 and P2 are open. In this case, the series resonance is dominant in the composite right/left-handed transmission line 100 when the ports P1 and P2 of the composite right/left-handed transmission line 100 are short-circuited, and the shunt resonance is dominant in the composite right/left-handed transmission line 100 when the ports P1 and P2 of the composite right/left-handed transmission line 100 are open. Therefore, when the conventional zeroth-order resonator is used as a radiator of an antenna apparatus, the direction available as the direction of co-polarization of radiation waves is only in the direction parallel to the longitudinal direction of the composite right/left-handed transmission line 100 (when the series resonance is dominant) or the direction perpendicular to the longitudinal direction of the composite right/left-handed transmission line 100 (when the shunt resonance is dominant). The same also applies to the traveling wave resonator provided with the nonreciprocal transmission line. On the other hand, according to the present invention, since the reactance B of the reflective element 151R may be an arbitrary value, it is possible to achieve a zeroth-order traveling wave resonator in an intermediate state between the state in which the series resonance is dominant (reactance B is zero) and the state in which the shunt resonance is dominant (reactance B is infinite). That is, when the nonreciprocal transmission line apparatus 70A of the present embodiment operable as the zeroth-order traveling wave resonator is used as the radiator of an antenna apparatus, it is possible to change the direction of co-polarization of radiation waves from the direction parallel to the nonreciprocal transmission line apparatus 70A to the direction perpendicular to the nonreciprocal transmission line apparatus 70A, by changing the reactance B from zero to +∞. In this case, an energy distribution over the nonreciprocal transmission line apparatus 70A changes from a state in which the energy concentrates on the series branch, to a state in which the energy concentrates on the shunt branches. Further, the resonance energy in the nonreciprocal transmission line apparatus 70A changes from a state of only the series resonance energy to a state of only the shunt resonance energy.

2-2. Operation with Use of Unbalanced Nonreciprocal Transmission Line Apparatus 70A Next, the operation of the transmission line resonator provided with the nonreciprocal transmission line apparatus 70A in the unbalanced state is described. When the phase constant $\beta$ is $\Delta\beta/2$, one of a series resonance angular frequency $\omega_{se}$ and a shunt resonance angular frequency $\omega_{sh}$ is an angular frequency at which an effective permeability $\mu_{eff}$ is zero, and the other is an angular frequency at which an effective permittivity $\in_{eff}$ is zero. In addition, a region between these two angular frequencies is a forbidden band in which the propagation of electromagnetic waves along the nonreciprocal transmission line apparatus 70A is not permitted, as shown in FIG. 7. Since only one of the effective permittivity $\in_{eff}$ and the effective permeability $\mu_{eff}$ is negative, the characteristic impedance of the nonreciprocal transmission line apparatus 70A (precisely speaking, Bloch impedance $Z_{CRLHTL}$ of the periodic structure) $Z_0 = (\mu_{eff}/\in_{eff})^{1/2}$ is a pure imaginary number. Therefore, there is a frequency at which the reflective element 151R having a reactance jB connected to the port P1 of the nonreciprocal transmission line apparatus 70A operates as a load for impedance matching. That is, in the forbidden band between the series resonance angular frequency $\omega_{se}$ and the shunt resonance angular frequency $\omega_{sh}$, surely there is an angular frequency at which the characteristic impedance $Z_0$ of the nonreciprocal transmission line apparatus 70A is equal to the impedance jB. In this case, an input impedance Zin when the element 151R (load impedance) is seen from the other port P2 of the nonreciprocal transmission line apparatus 70A is always jB, regardless of the line length l. Therefore, the resonance conditions are automatically satisfied by connecting to the port P2 the reflective element 152R having the impedance −jB.

According to the nonreciprocal transmission line apparatus 70A in the unbalanced state, there is no mode of propagation along the transmission line in the frequency band between the series resonance angular frequency $\omega_{se}$ and the shunt resonance angular frequency $\omega_{sh}$. According to the prior art, there has been no report of proposal of a transmission line resonator, operable in the forbidden band between the series resonance angular frequency $\omega_{se}$ and the shunt resonance angular frequency $\omega_{sh}$, and having the resonance angular frequency not depending on the line length l. On the other hand, according to the transmission line resonator provided with the nonreciprocal transmission line apparatus 70A of the present embodiment in the unbalanced state, it is possible to change the resonance angular frequency from the series resonance angular frequency $\omega_{se}$ to the shunt resonance angular frequency $\omega_{sh}$, by changing the reactance B from zero to +∞, while maintaining the zeroth-order resonance state having the resonance frequency not depending on the length l of the line. In this case, in a manner similar to that of the nonreciprocal transmission line apparatus 70A in the balanced state, the direction of co-polarization of radiation waves changes from the direction parallel to the longitudinal direction of the nonreciprocal transmission line apparatus 70A, to the directional perpendicular to the longitudinal direction of the nonreciprocal transmission line apparatus 70A (direction parallel to the shunt branch), and the energy distribution over the nonreciprocal transmission line apparatus 70A changes from a state in which the energy concentrates on the series branch, to a state in which the energy concentrates on the shunt branches. Therefore, according to the transmission line resonator provided with the nonreciprocal transmission line apparatus 70A of the present embodiment in the unbalanced state, it is possible to achieve a tunable resonator capable of continuously changing the operating frequency from the series resonance angular frequency to the shunt resonance angular frequency.

3. Specific Configuration of Transmission Line Resonator of Embodiment

Figure 80:
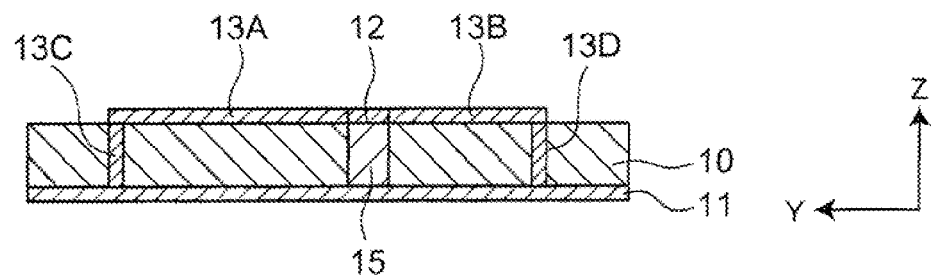
FIG. 80 is a sectional view across the line A11-A11' of FIG. 79.
Figure 81:
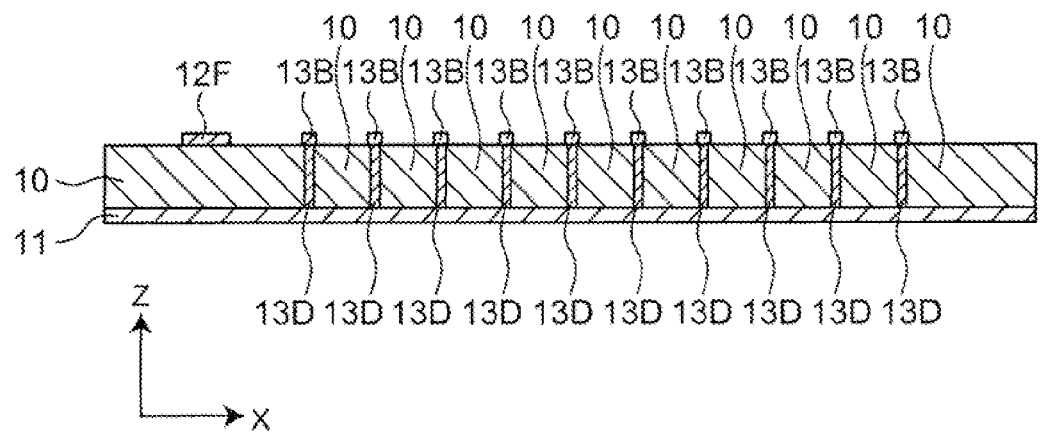
FIG. 81 is a sectional view across the line A12-A12' of FIG. 79.
Figure 82:
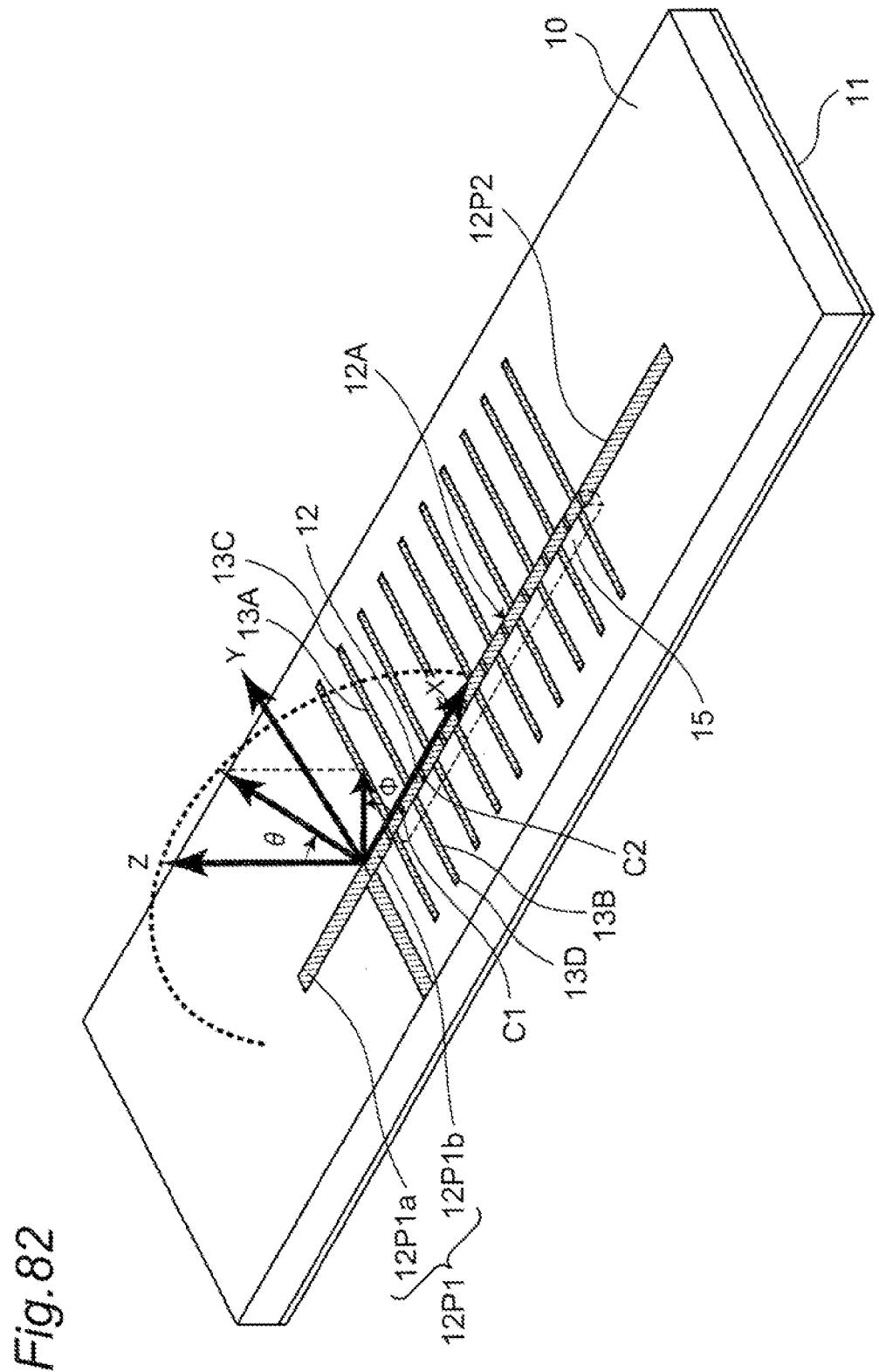
FIG. 82 shows a perspective view of the transmission line resonator of FIG. 79.

Next, with reference to FIGS. 79 to 82, specific configurations of the transmission lines resonator of FIG. 75 are described. FIG. 79 is a top view showing a configuration of a transmission line resonator according to a first implementation example of the ninth embodiment of the present invention. FIG. 79 shows a transmission line resonator configured as a zeroth-order traveling wave resonator provided with the nonreciprocal transmission line apparatus 70A including ten unit cells. FIG. 80 is a sectional view across the line A11-A11' of FIG. 79. FIG. 81 is a sectional view across the line A12-A12' of FIG. 79. FIG. 82 shows a perspective view of the transmission line resonator of FIG. 79. In FIG. 82, radiation angles θ and φ are defined.

Referring to FIGS. 79 to 82, the transmission line resonator of the present embodiment is provided with:

(a) a nonreciprocal transmission line apparatus 70A configured in a manner similar to that of the first embodiment;

(b) a reflective element 151R provided with an open-ended microstrip line having length $l_{r1}$, the reflective element 151R connected to one end of the nonreciprocal transmission line apparatus 70A; and (c) a reflective element 152R provided with an open-ended microstrip line having length $l_{r2}$, the reflective element 151R connected to the other end of the nonreciprocal transmission line apparatus 70A.

In this case, the nonreciprocal transmission line apparatus 70A is provided with:

(a) a ground conductor 11 provided parallel to the XY plane; a ferrite square rod 15 extending along the X axis on the ground conductor 11 (having spontaneous magnetization or being applied with an external DC magnetic field, along Z axis); and a dielectric substrate 10 provided on both the +Y side and the −Y side of the ferrite square rod 15 on the ground conductor 11;

(b) a microstrip line 12A provided with: a plurality of strip conductors 12 formed on a surface of the ferrite square rod 15, the ground conductor 11, and the ferrite square rod 15;

(c) a plurality of capacitors C1 and C2, each connecting a pair of adjacent strip conductors 12 of a plurality of strip conductors 12 (see FIG. 14);

(d) a plurality of stub conductors 13A, each extending from one strip conductor 12 of the microstrip line 12A in +Y direction, and each connected to the ground conductor 11 via a through-hole conductor 13C at an +Y-side edge; and (e) a plurality of stub conductors 13C, each extending from one strip conductor 12 of the microstrip line 12A in −Y direction, and each connected to the ground conductor 11 via a through-hole conductor 13D at an −Y-side edge. The through-hole conductors 13C and 13D are not necessary when the stub conductors 13A and 13B are open.

In addition, the open-ended microstrip line having the length $l_{r1}$ as the reflective element 151R is provided with: the dielectric substrate 10 with the ground conductor 11 on its backside, and a strip conductor 12P1 having the length $l_{r1}$. In addition, the open-ended microstrip line having the length $l_{r2}$ as the reflective element 152R is provided with: the dielectric substrate 10 with the ground conductor 11 on its backside, and a strip conductor 12P2 having the length $l_{r2}$.

Further, in FIG. 79, the strip conductor 12P1 is provided with: a strip conductor 12P1b on the side of the nonreciprocal transmission line apparatus 70A, and a remaining strip conductor 12P1a; and a feed line conductor 12F as a feed line for feeding the transmission line resonator is inserted and connected to a connection point between the strip conductors 12P1a and 12P1b. In this case, the feed line is provided with: the feed line conductor 12F, and the dielectric substrate 10 with the ground conductor 11 on its backside. In addition, the length $l_{f1}$ of the strip conductor 12P1a is set so that a voltage-to-current ratio (impedance) is matched with the characteristic impedance (50[Ω]) of the feed line, the voltage-to-current ratio spatially varying due to standing waves occurring on the microstrip line of the reflective element 151R.

According to the nonreciprocal transmission line apparatus 70A, a lumped-parameter circuit transmission line including ten unit cells is formed. The capacitances of capacitors provided between each end of the nonreciprocal transmission line apparatus 70A and the reflective element 151R or 152R is twice the capacitance of the other capacitors provided between unit cells. These capacitors may be discrete capacitors connect between each pair of two adjacent strip conductors 12, or only stray capacitors formed between each pair of two adjacent strip conductors 12, depending on the frequency of a inputted microwave signal (e.g., microwave signal). Alternatively, a series capacitor may be used, made of such a stray capacitor and a capacitor connected in parallel with the stray capacitor. In addition, an interval of forming the stub conductors 13A and 13B along X-axis is identical to the unit cell line length (i.e., periodic length) d [mm].

Referring to FIG. 79, when the characteristic impedances and the phase constants of the open-ended microstrip line conductors 12P1 and 12P2 are equal to the characteristic impedance $Z_0$ and the phase constant β of the nonreciprocal transmission line apparatus 70A, the impedance $Z_{L1}$ of the reflective element 151R and the impedance $Z_{L2}$ of the reflective element 152R are given as follows.

$Z_{L1} = Z_0/j \tan(\beta \cdot l_{r1})$     [Mathematical Expression 38]

$Z_{L2} = Z_0/j \tan(\beta \cdot l_{r2})$     [Mathematical Expression 39]

Now, the configurations of the reflective elements 151R and 152R, in which the mathematical formulas (30) and (31) is satisfied when changing the lengths $l_{r1}$ and $l_{r2}$ of the microstrip lines connected to both the ends of the nonreciprocal transmission line apparatus 70A so as to satisfy $l_{r1}+l_{r2}=\lambda g/2$, are described.

When both the lengths $l_{r1}$ and $l_{r2}$ of the microstrip lines connected to both the ends of the nonreciprocal transmission line apparatus 70A are are $\lambda g/4$ ($l_{r1}=l_{r2}=\lambda g/4$), the impedance $Z_{L1}$ of the reflective element 151R and the impedance $Z_{L2}$ of the reflective element 152R are given as follows.

$Z_{L1} = Z_0/j \tan(\beta \cdot l_{r1}) = Z_0/j \tan(\beta \cdot \lambda_g/4) = 0$     [Mathematical Expression 40]

$Z_{L2} = Z_0/j \tan(\beta \cdot l_{r2}) = Z_0/j \tan(\beta \cdot \lambda_g/4) = 0$     [Mathematical Expression 41]

Therefore, since the short-circuit-ended condition in which both the ends of the nonreciprocal transmission line apparatus 70A are short-circuited is satisfied, the series resonance of the series branch of the zeroth-order traveling wave resonator of FIG. 79 is dominant.

When the lengths $l_{r1}$ and $l_{r2}$ of the microstrip lines connected to both the ends of the nonreciprocal transmission line apparatus 70A are are $\lambda g/2$ and zero ($l_{r1}=\lambda g/2$ and $l_{r2}=0$), the impedance $Z_{L1}$ of the reflective element 151R and the impedance $Z_{L2}$ of the reflective element 152R are given as follows.

$Z_{L1} = Z_0/j \tan(\beta \cdot l_{r1}) = Z_0/j \tan(\beta \cdot \lambda_g/2) = +\infty$     [Mathematical Expression 42]

$Z_{L2} = Z_0/j \tan(\beta \cdot l_{r2}) = Z_0/j \tan(0) = +\infty$     [Mathematical Expression 43]

Therefore, since the open termination condition in which both the ends of the nonreciprocal transmission line apparatus 70A are open is satisfied, the shunt resonance of the shunt branches of the zeroth-order traveling wave resonator of FIG. 79 is dominant.

Further, when continuously changing the lengths $l_{r1}$ and $l_{r2}$ of the microstrip lines connected to both the ends of the nonreciprocal transmission line apparatus 70A, from the lengths for the short-circuited ends to the lengths for the open ends, so as to satisfy $l_{r1}+l_{r2}=\lambda g/2$, the impedance $Z_{L1}$ of the reflective element 151R and the impedance $Z_{L2}$ of the reflective element 152R are given as follows.

$$Z_{L1}=Z_0/j\tan(\beta l_{r1})=jB \quad \text{[Mathematical Expression 44]}$$

$$\begin{aligned}Z_{L2} &= Z_0/j\tan(\beta \cdot l_{r2}) \\ &= Z_0/j\tan(\pi - \beta \cdot l_{r1}) \\ &= -Z_0/j\tan(\beta \cdot l_{r1}) \\ &= -jB\end{aligned} \quad \text{[Mathematical Expression 45]}$$

Therefore, the impedances $Z_{L1}$ and $Z_{L2}$ automatically satisfy the relations of the mathematical formulas (32) and (33).

Figure 83:
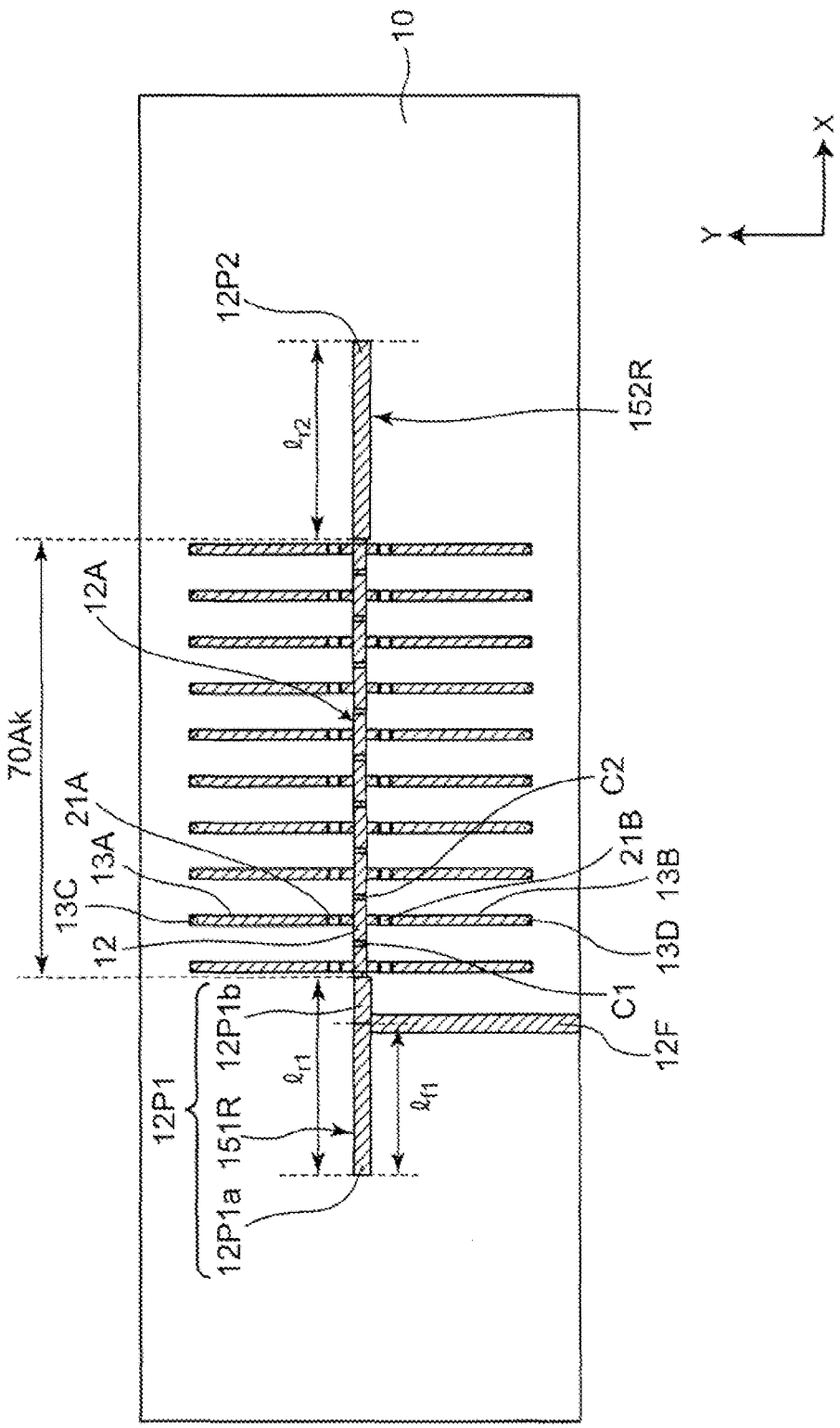
FIG. 83 is a top view showing a configuration of a transmission line resonator according to a second implementation example of the ninth embodiment of the present invention.

FIG. 83 is a top view showing a configuration of a transmission line resonator according to a second implementation example of the ninth embodiment of the present invention. The transmission line resonator of FIG. 83 is characterized by including the nonreciprocal transmission line apparatus 70Ak including unit cells 60Ac configured in a manner similar to that of FIG. 23, in place of the nonreciprocal transmission line apparatus 70A of the transmission line resonator of FIG. 79. According to the nonreciprocal transmission line apparatus 70Ak of the transmission line resonator of FIG. 83, in a manner similar to that of the nonreciprocal transmission line apparatus of FIG. 23, the controller (not shown) controls the voltages applied to the phase shifters 21A and 21B to change the amounts of phase shift of the phase shifters 21A and 21B, and thus, it is possible to set the impedances of the stub conductors 13A and 13B to different values from each other. According to the transmission line resonator of the present implementation example, it is possible to set the impedances of the stub conductors 13A and 13B to the different values depending on the required degree of the nonreciprocity, and achieve the asymmetric line structure by this difference in the impedance. The transmission line resonator of the present implementation example controls the asymmetry of the transmission line structure itself.

4. Configuration of Antenna Apparatus Provided with Transmission Line Resonator of Embodiment As described above, it is possible to change the resonance state from a state in which the series branch is dominant, to a state in which the shunt branch is dominant, by equivalently changing the conditions of termination at both the ends of the transmission line resonator of the present embodiment (see FIG. 75) from the short-circuited to the open. Conversely, it is possible to change the resonance state from a state in which the shunt branch is dominant, to a state in which the series branch is dominant, by equivalently changing the conditions of termination from the open to the short-circuited. By using the transmission line resonator as an antenna apparatus and changing the condition of termination of the resonator, mechanically, electrically, or by a combination of them, the polarization characteristics of radiation waves or received radio waves are changed.

Figure 84:
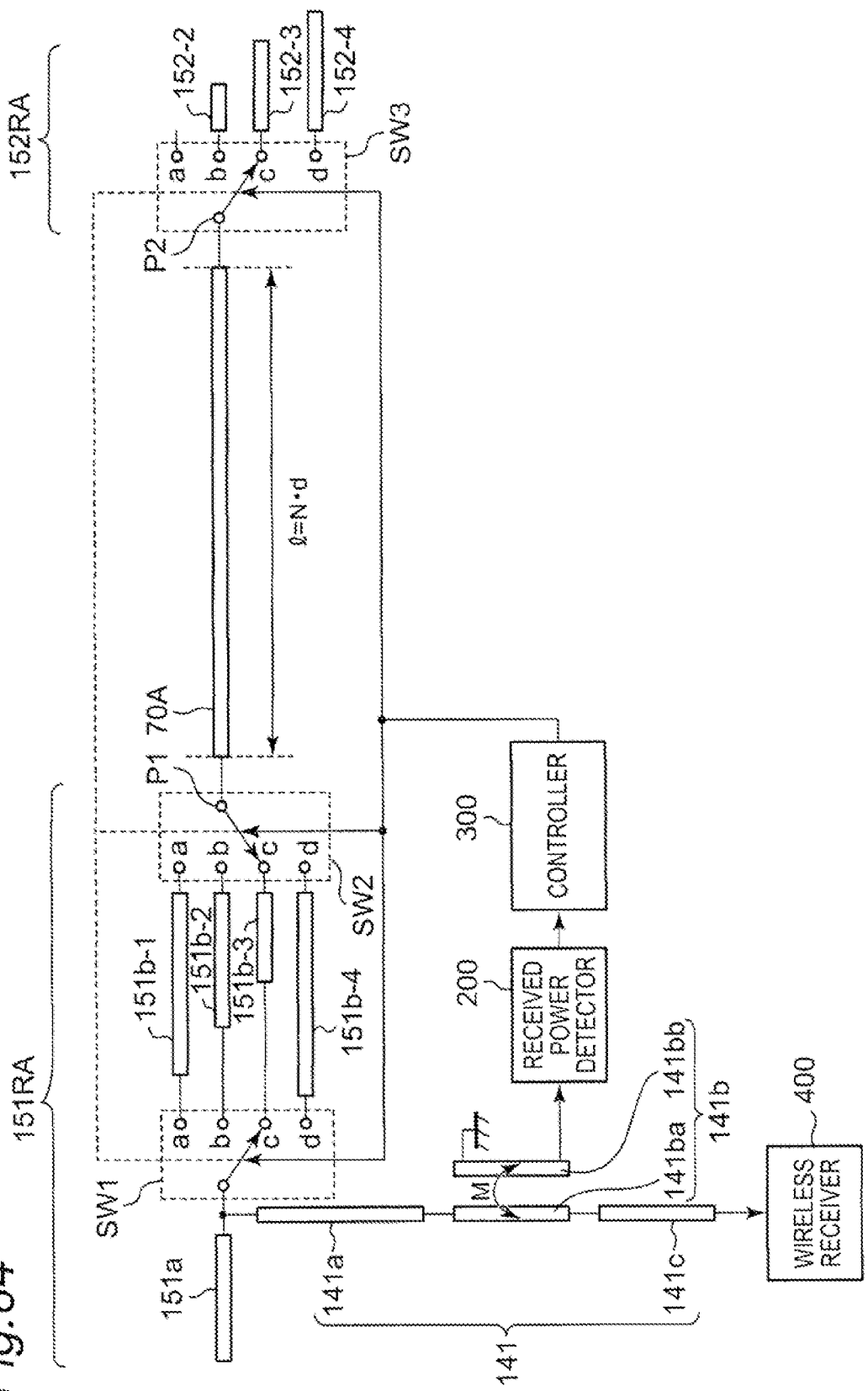
FIG. 84 is a block diagram showing a configuration of an antenna apparatus according to a third implementation example of the ninth embodiment of the present invention.

FIG. 84 is a block diagram showing a configuration of an antenna apparatus according to a third implementation example of the ninth embodiment of the present invention. The antenna apparatus of FIG. 84 is provided with the transmission line resonator of FIG. 75 (zeroth-order traveling wave resonator). The antenna apparatus of FIG. 84 is provided with:

(a) a zeroth-order traveling wave resonator provided with: a nonreciprocal transmission line apparatus 70A having ports P1 and P2, a reflective circuit 151RA connected to the port P1, and a reflective circuit 152RA connected to the port P2;

(b) a feed line 141 (feeding circuit) provided with microstrip lines 141a and 141c, and outputting a microwave signal received by the zeroth-order traveling wave resonator;

(c) a directional coupler 141b provided with: a microstrip line 141ba connected between the microstrip lines 141a and 141c, and a microstrip line 141bb disposed close to and electromagnetically coupled to the microstrip line 141ba;

(d) a received power detector 200 detecting part of the power of the received microwave signal flowing through the microstrip line 141ba, by using the directional coupler 141b;

(e) a wireless receiver 400 receiving an input of the received microwave signal outputted from the microstrip line 141c; and (f) a controller 300B.

The reflective circuit 151RA is provided with: switches SW1 and SW2, and microstrip lines 151a, 151b-1, 151b-2, 151b-3, and 151b-4. The reflective circuit 152RA is provided with: a switch SW3, and microstrip lines 152-2, 152-3, and 152-4. The length of the microstrip line 151b-1 is set so that the sum of the length of the microstrip line 151a and the length of the microstrip line 151b-1 is $\lambda g/2$, the length of the microstrip line 151b-2 is set so that the sum of the length of the microstrip line 151a and the length of the microstrip line 151b-2 is $3\lambda g/8$, and the length of the microstrip line 151b-3 is set so that the sum of the length of the microstrip line 151a and the length of the microstrip line 151b-3 is $\lambda g/4$. In addition, the length of the microstrip line 152-2 is set to $\lambda g/8$, and the length of the microstrip line 152-3 is set to $\lambda g/4$. The length of the microstrip line 151b-4 is set so that the sum of the length of the microstrip line 151a and the length of the microstrip line 151b-4 becomes $5\lambda g/8$, and the length of the microstrip line 152-4 is set to $3\lambda g/8$. The length of the microstrip line 151a is set so that a voltage-to-current ratio (impedance) spatially changed by standing waves occurring in the reflective circuit 151RA of the microstrip line is matched with the characteristic impedance of the feed line 141. The switches SW1 and SW2, and the switch SW3 are impedance changing means of the reflective circuits 151RA and 152RA.

Referring to FIG. 84, the switches SW1, SW2, and SW3 are controlled by the controller 300 in an interlocking manner. When each of the switches SW1, SW2, and SW3 is connected to a contact point "a", the microstrip line 151b-1 is connected between the microstrip line 151a and the port P1, and the port P2 becomes open. It results in an $+\infty$ impedances of the reflective circuits 151RA and 152RA, and the polarization direction of received radio waves is in a direction perpendicular to the longitudinal direction of the nonreciprocal transmission line apparatus 70A. When each of the switches SW1, SW2, and SW3 is connected to a contact point "b", the microstrip line 151b-2 is connected between the microstrip line 151b-1 and the port P1, and the microstrip line 152-2 is connected to the port P2. It results in a 50j [Ω] impedance of the reflective impedance circuit 151RA and a −50j [Ω] impedance of the reflective circuit 152RA, and the polarization direction of the received radio waves is in a direction at an angle between the direction parallel to and the direction perpendicular to the longitudinal direction of the nonreciprocal transmission line apparatus 70A (i.e., at 45 degrees). Further, when each of the switches SW1, SW2, and SW3 is connected to a contact point "c", the microstrip line 151b-3 is connected between the microstrip line 151b-1 and the port P1, and the microstrip line 152-3 is connected to the port P2. It results in a zero impedances of the reflective circuits 151RA and 152RA, and the polarization direction of received radio waves is in a direction parallel to the longitudinal direction of the nonreciprocal transmission line apparatus 70A. In addition, when each of the switches SW1, SW2, and SW3 is connected to a contact point "d", the microstrip line 151b-4 is connected between the microstrip line 151a and the port P1, and the microstrip line 152-4 is connected to the port P2. It results in a −50j [Ω] impedance of the reflective impedance circuit 151RA and a 50j [Ω] impedance of the reflective impedance circuit 152RA. The polarization direction of the received radio waves is in a direction at an angle between the direction parallel to and the direction perpendicular to the longitudinal direction of the nonreciprocal transmission line apparatus 70A (i.e., at 45 degrees), the direction perpendicular to the direction when each of the switches SW1, SW2, and SW3 is connected to the contact point "b".

The controller 300 controls the switches SW1, SW2, and SW3 so that the received power detected by the received power detector 200 is maximized. Therefore, according to the antenna apparatus of FIG. 84, the polarization direction can be changed to the optimal polarization direction in which the received power is maximized.

Figure 85:
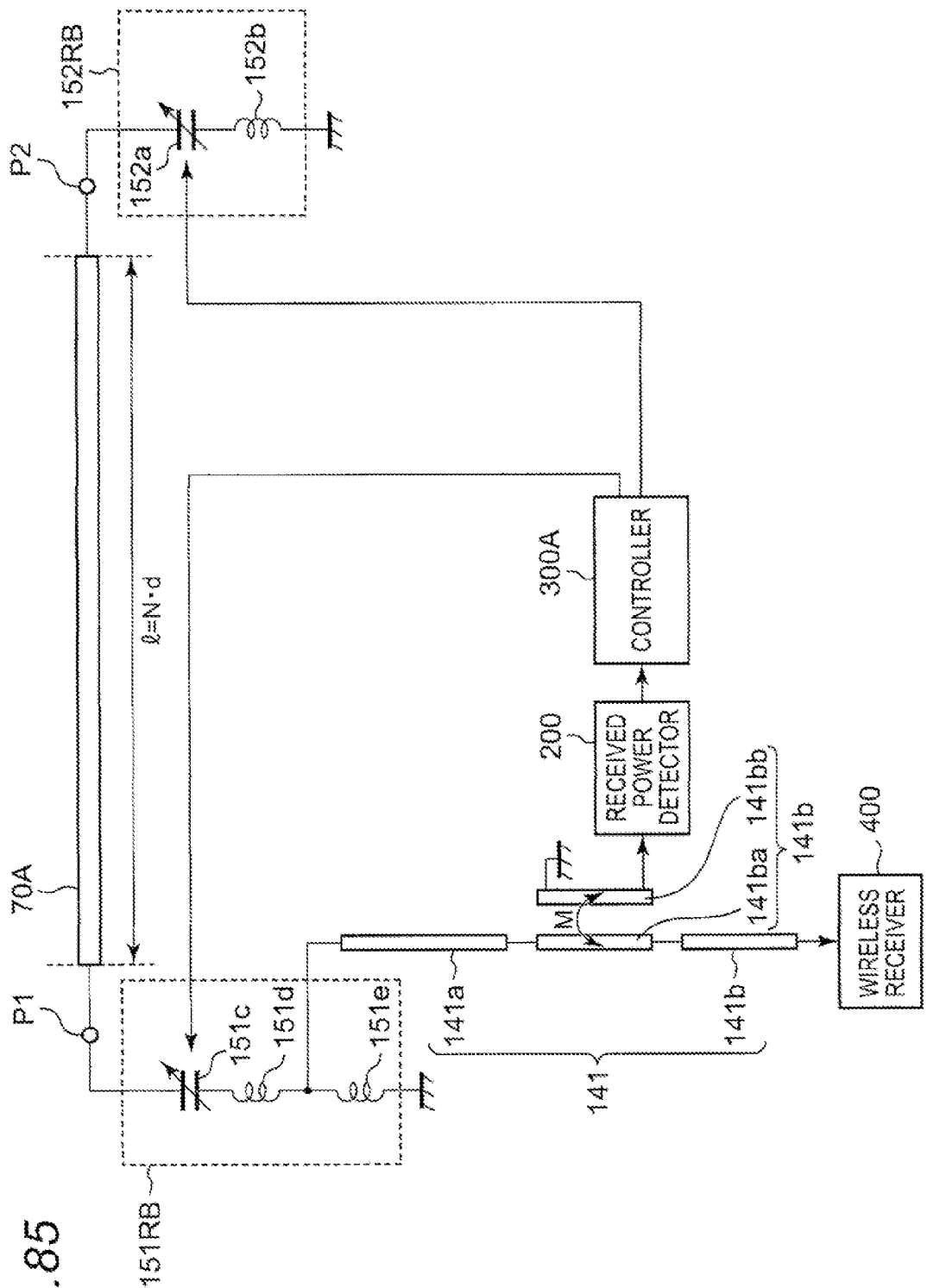
FIG. 85 is a block diagram showing a configuration of an antenna apparatus according to a fourth implementation example of the ninth embodiment of the present invention.

FIG. 85 is a block diagram showing a configuration of an antenna apparatus according to a fourth implementation example of the ninth embodiment of the present invention. The antenna apparatus of FIG. 85 is provided with the transmission line resonator of FIG. 75 (zeroth-order traveling wave resonator). The antenna apparatus of FIG. 85 is provided with:

(a) a zeroth-order traveling wave resonator provided with: a nonreciprocal transmission line apparatus 70A having ports P1 and P2, a reflective circuit 151RB connected to the port P1, and a reflective circuit 152RB connected to the port P2;

(b) a feed line 141 (feeding circuit) provided with microstrip lines 141a and 141c, and outputting a microwave signal received by the zeroth-order traveling wave resonator;

(c) a directional coupler 141b provided with: a microstrip line 141ba connected between the microstrip lines 141a and 141c, and a microstrip line 141bb disposed close to and electromagnetically coupled to the microstrip line 141ba;

(d) a received power detector 200 detecting part of the power of the received microwave signal flowing through the microstrip line 141ba, by using the directional coupler 141b;

(e) a wireless receiver 400 receiving an input of the received microwave signal outputted from the microstrip line 141c; and (f) a controller 300A.

The reflective circuit 151RB is provided with a varactor diode 151c and inductors 151d and 151e, which are connected in series between the port P1 and the ground potential. One end of the strip conductor 12Fa as a feed line is connected to a connection point of the inductors 151d and 151e. The reflective circuit 152RB is provided with a varactor diode 152a and an inductor 152b, which are connected in series between the port P2 and the ground potential. In addition, the element values of the inductors 151d and 151e are set so that the impedance of the zeroth-order traveling wave resonator is matched with the characteristic impedance of the feed line 141. The varactor diodes 151c and 152a are impedance changing means of the reflective circuits 151RB and 152RB, respectively.

The controller 300A changes reverse bias voltages applied to the varactor diodes 151c and 152a, so that the impedance of the reflective circuit 151RB is a complex number having substantially no real part, preferably a pure imaginary number, and the impedance of the reflective circuit 152RB is a complex number substantially conjugate with the impedance of the reflective circuit 151RB, preferably a conjugate pure imaginary number, and so that the received power detected by the received power detector 200 is maximized. Therefore, according to the antenna apparatus of FIG. 85, the polarization direction can be changed to the optimal polarization direction in which the received power is maximized. In addition, the antenna apparatus of FIG. 84 selects the polarization direction from the three directions. On the other hand, according to the present implementation example, it is possible to continuously change the polarization direction in an arbitrary direction between the direction parallel to and the direction perpendicular to the longitudinal direction of the nonreciprocal transmission line apparatus 70A.

Referring to FIG. 85, variable-reactance elements may be used in place of the varactor diodes 151c and 152a.

Figure 86:
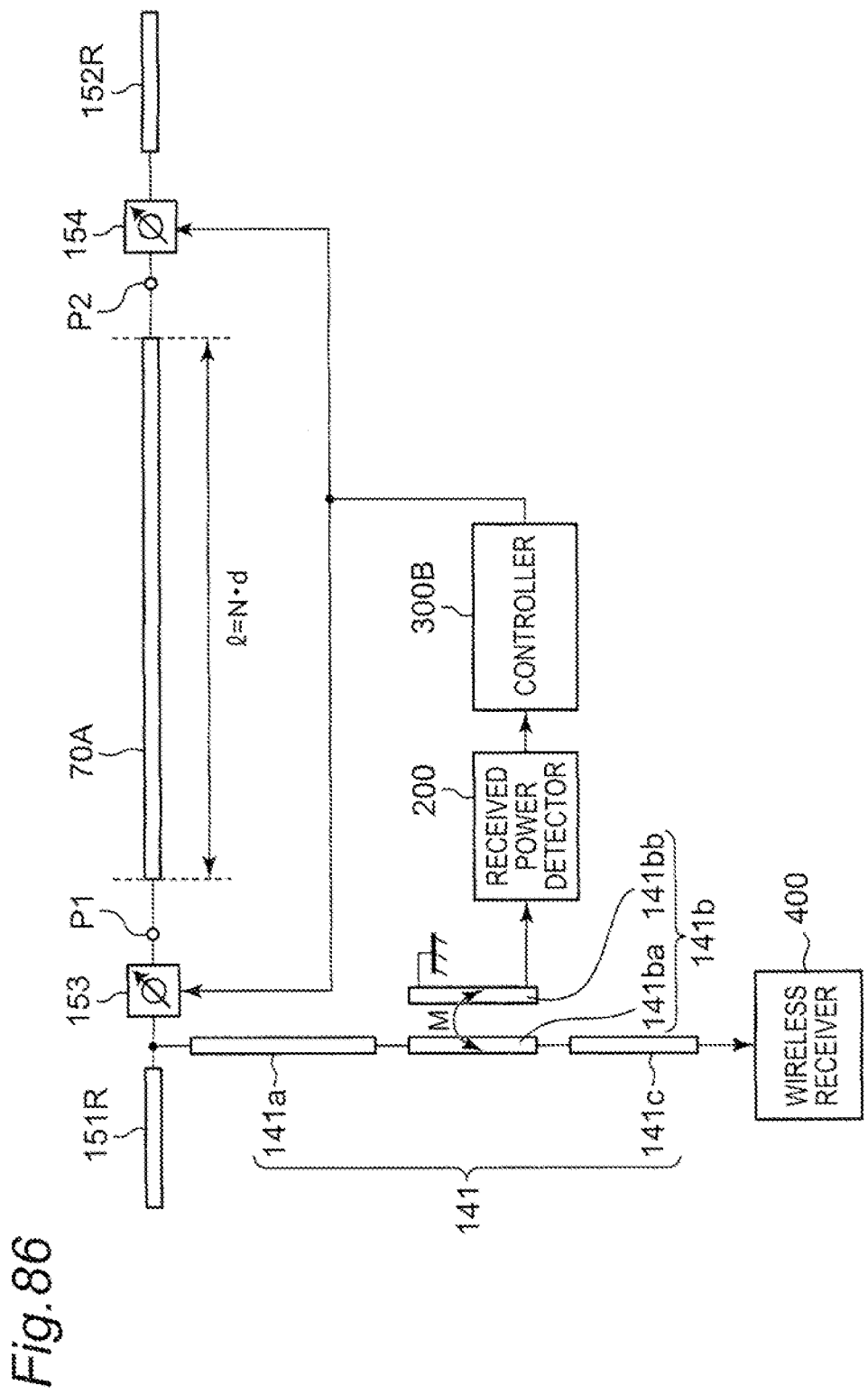
FIG. 86 is a block diagram showing a configuration of an antenna apparatus according to a fifth implementation example of the ninth embodiment of the present invention.

FIG. 86 is a block diagram showing a configuration of an antenna apparatus according to a fifth implementation example of the ninth embodiment of the present invention. The antenna apparatus of FIG. 86 is provided with the transmission line resonator of FIG. 75 (zeroth-order traveling wave resonator). The antenna apparatus of FIG. 86 is provided with:

(a) a zeroth-order traveling wave resonator provided with: a nonreciprocal transmission line apparatus 70A having ports P1 and P2, a phase shifter 153 and a reflective circuit 151RA connected to the port P1, and a phase shifter 154 and a reflective circuit 152RA connected to the port P2;

(b) a feed line 141 (feeding circuit) provided with microstrip lines 141a and 141c, and outputting a microwave signal received by the zeroth-order traveling wave resonator;

(c) a directional coupler 141b provided with: a microstrip line 141ba connected between the microstrip lines 141a and 141c, and a microstrip line 141bb disposed close to and electromagnetically coupled to the microstrip line 141ba;

(d) a received power detector 200 detecting part of the power of the received microwave signal flowing through the microstrip line 141ba, by using the directional coupler 141b;

(e) a wireless receiver 400 receiving an input of the received microwave signal outputted from the microstrip line 141c; and (f) a controller 300B.

The antenna apparatus of the present implementation example is provided with the phase shifter 153 between the port P1 and the reflective element 151R to change the impedance of the reflective element 151R seen from the port P1, and provided with the phase shifter 154 between the port P2 and the reflective element 152R to change the impedance of the reflective element 152R seen from the port P2.

The controller 300B changes in the amount of phase shift of the phase shifters 153 and 154 by changing the voltages applied to the phase shifters 153 and 154 in an interlocking manner, so that the impedance of the reflective circuit 151R is a complex number having substantially no real part, preferably a pure imaginary number, and the impedance of the reflective circuit 152R is a complex number substantially conjugate with the impedance of the reflective circuit 151R, preferably a conjugate pure imaginary number, and so that the received power detected by the received power detector 200 is maximized. Therefore, according to the antenna apparatus of FIG. 86, the polarization direction can be changed to the optimal polarization direction in which the received power is maximized. In addition, the antenna apparatus of FIG. 84 selects the polarization direction from the three directions. On the other hand, according to the present implementation example, it is possible to continuously change the polarization direction in an arbitrary direction between the direction parallel to and the direction perpendicular to the longitudinal direction of the nonreciprocal transmission line apparatus 70A.

Figure 87:
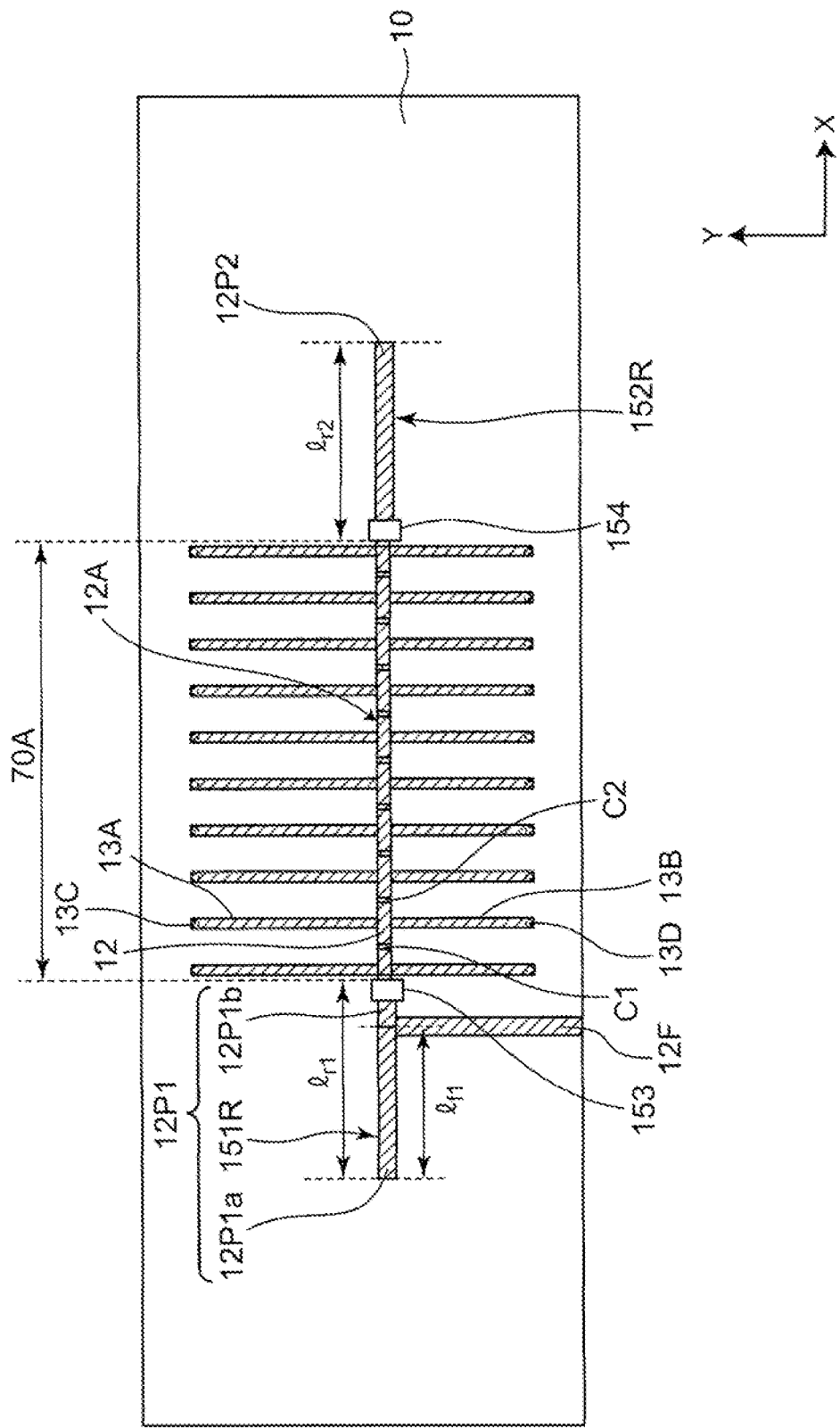
FIG. 87 is a top view showing a configuration of the antenna apparatus of FIG. 86.

FIG. 87 is a top view showing a configuration of the antenna apparatus of FIG. 86. The antenna apparatus of FIG. 87 is characterized by further adding phase shifters 153 and 154 to the antenna apparatus of FIG. 79.

Figure 88:
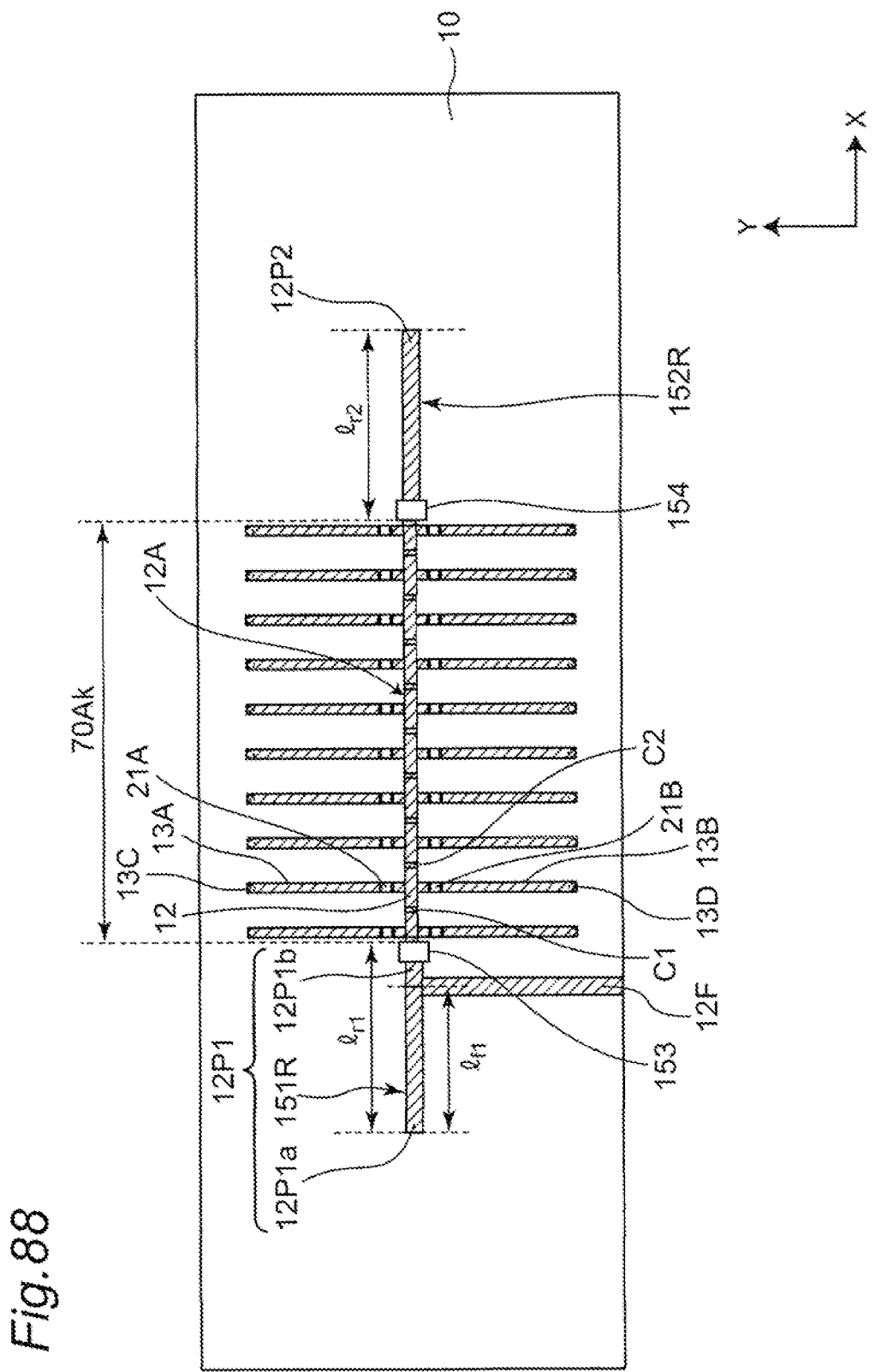
FIG. 88 is a top view showing the configuration of an antenna apparatus according to a fifth implementation example of the ninth embodiment of the present invention.

FIG. 88 is a top view showing the configuration of an antenna apparatus according to a fifth implementation example of the ninth embodiment of the present invention. The antenna apparatus of FIG. 88 is characterized by further adding phase shifters 153 and 154 to the antenna apparatus of FIG. 83. A controller 300B (not shown; see FIG. 86) changes the amounts of phase shift of the phase shifters 153 and 154, and further independently controls the amounts of phase shift of phase shifters 21A and 21B in order to control the degree of nonreciprocity of the nonreciprocal transmission line apparatus 70Ak.

In addition, although the feedline of FIGS. 84 to 86 is provided on the side of the reflective circuits 151RA side and 151RB, the present invention is not limited thereto, and the feedline may be provided on the side of the reflective circuits 152RA side and 152RB.

Moreover, with reference to FIGS. 84 to 86, the exemplary applications of the zeroth-order traveling wave resonator of FIG. 75 of the present invention to the receiving antenna apparatus are described. However, the present invention is not limited thereto, and it is possible to obtain a transmitting antenna apparatus provided with the zeroth-order traveling wave resonator of FIG. 75, and a feeder circuit connected to the reflective element 151R or 152R and feeding the zeroth-order traveling wave resonator with a microwave signal.

According to the mathematical formula (23), it is possible to steer the radiation angle θ by changing the value of Δβ indicative of the nonreciprocal phase characteristics, when using the transmission line resonator of FIG. 83 as an antenna apparatus. As a result, when using the transmission line resonator of FIG. 83 as an antenna apparatus, it is possible to continuously or discretely change, as a function over time, the spatial gradient of the phase distribution in a case where the nonreciprocal transmission line apparatus 70Ak operates as a traveling wave microwave resonator. Therefore, when applying the transmission line resonator of FIG. 83 to an antenna apparatus, it is possible to change the direction of beam radiated from the transmission line resonator. That is, the antenna apparatus operates as a beam steerable antenna.

According to the simulations done by the inventors of the present application, it is expected that the transmission line resonator of the present embodiment operates as follows. Even when changing the line lengths $l_{r1}$ and $l_{r2}$ of the reflective elements 151R and 152R to change the reactance B, the resonance frequency is almost constant. By continuously changing the line lengths $l_{r1}$ and $l_{r2}$ of the reflective elements 151R and 152R, it is possible to continuously change a ratio of the strength of the magnetic field distributed along the series branch to the strength of the magnetic field distributed along the stub. Since the amplitude distribution of the electromagnetic field is uniform over the nonreciprocal transmission line apparatus, the direction of the radiation beam is in the direction:

$$\theta=\sin^{-1}(\Delta\beta/2\beta_0)$$ [Mathematical Expression 46]

not depending on the value of the reactance B, but depending on the amount of nonreciprocal phase shift Δβ of the transmission line. $\beta_0$ denotes the phase constant of the free space.

The θ-direction component and the φ-direction component of the radiation waves are almost in-phase, and therefore, it is possible to rotate the polarization direction while maintaining linear polarization. In addition, it has been confirmed that it is possible to continuously change the co-polarization direction of the radiation waves from the direction parallel to the longitudinal direction of the nonreciprocal transmission line apparatus, to the direction parallel to the longitudinal direction of the stub conductors 13A and 13B (i.e., the direction orthogonal to the longitudinal direction of the nonreciprocal transmission line apparatus), by changing the line lengths $l_{r1}$ and $l_{r2}$ of the reflective elements 151R and 152R to continuously change the reactance B from zero to +∞. Even when the nonreciprocal transmission line apparatus is not strictly balanced, but is unbalanced and has a small forbidden band between the left-handed mode transmission band the right-handed mode transmission band, it is possible to continuously change the co-polarized wave of the radiation waves since the resonator is operable in a mixed state of the series resonance state and the shunt resonance state.

5. Summary of Ninth Embodiment

As described above, the transmission line resonator of the present embodiment is provided with the reflective elements 151R connected to the ports P1 and P2 of the nonreciprocal transmission line apparatus, the impedance of the reflective element 151R seen from the P1 is a complex number substantially having no real part (preferably a pure imaginary number jB), and the impedance of the reflective element 152R seen from the port P2 is its substantially conjugate complex number (preferably a pure imaginary number -jB). Therefore, it is possible to provide a novel zeroth-order traveling wave resonator capable of achieving a series resonance state and a shunt resonance state, and further achieving their mixed state.

In particular, when using a nonreciprocal transmission line apparatus in a balanced state, it is possible to continuously change the ratio of the series resonance energy and the shunt resonance energy, from the state in which only the series resonance of the series branch is dominant, to the state in which only the shunt resonance of the shunt branch is dominant, without changing the resonance frequency, by continuously changing the reactance B of the reflective element 151R.

In addition, when using the nonreciprocal transmission line apparatus in an unbalanced state in which the series resonance angular frequency of the series branch and the shunt resonance angular frequency of the shunt branch are different from each other, the forbidden band without a mode of propagation along the transmission line appears in the band between these two different resonance angular frequencies. In this case, it is possible to achieve a traveling wave resonator having an exponential distribution of the electromagnetic field over the transmission line, but having the resonance frequency not depending on the line length. In this case, by continuously changing the reactance B of the reflective element 151R, it is possible to continuously change the resonance frequency between the series resonance angular frequency and the shunt resonance angular frequency.

Further, according to the antenna apparatus provided with the transmission line resonator of the present embodiment, it is possible to change the polarization direction of the microwave signal radiated from or received by the antenna apparatus, by changing the reactance B of the reflective element 151R.

In the above description, for ease of explanation, it is assumed that the forward propagation constant $\beta_+$ and the backward propagation constant $\alpha_-$ have the same value β. It would be readily understood to extend the above description to a case of $\beta_+ \neq \beta_-$, with reference to the description of the first embodiment and so on.

The transmission line resonator of the ninth embodiment may be provided with any of the nonreciprocal transmission line apparatuses of the first embodiment as shown in FIGS. 13 to 34. The antenna apparatus of the ninth embodiment may be provided with any of the nonreciprocal transmission line apparatuses of the first embodiment as shown in FIGS. 13 to 32.

Tenth Embodiment

Figure 89:
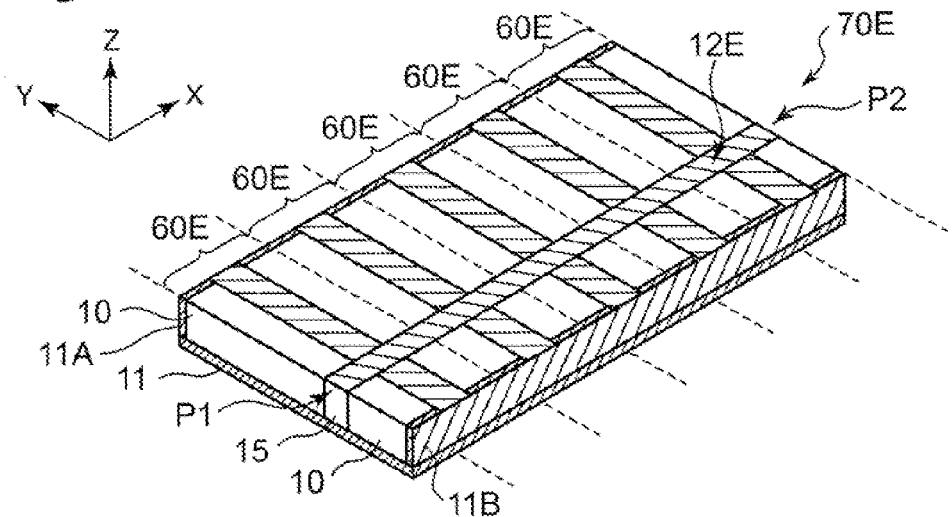
FIG. 89 is a perspective view showing a configuration of a nonreciprocal transmission line apparatus 70E according to a tenth embodiment of the present invention.
Figure 90:
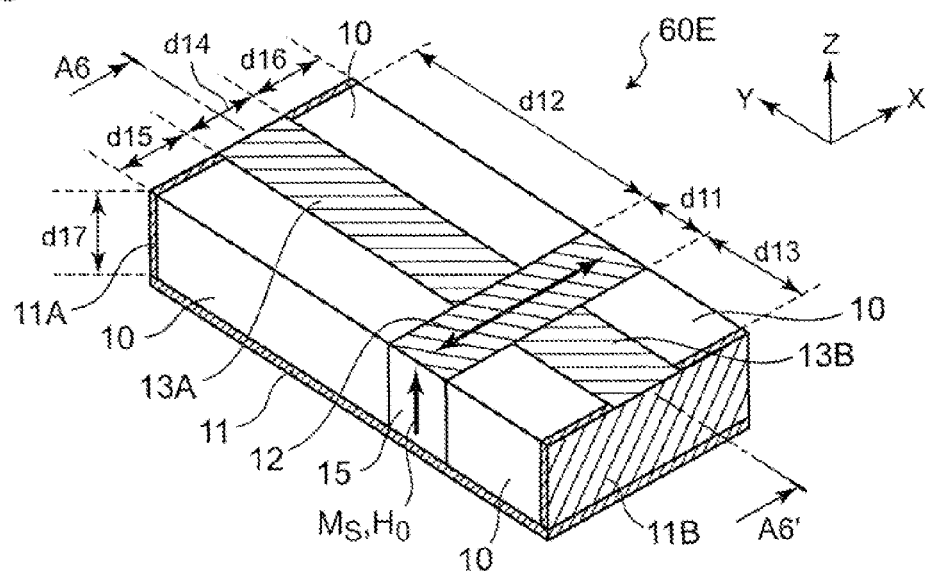
FIG. 90 is a perspective view showing a detailed configuration of the unit cell 60E of the transmission line in the nonreciprocal transmission line apparatus 70E of FIG. 89.
Figure 91:
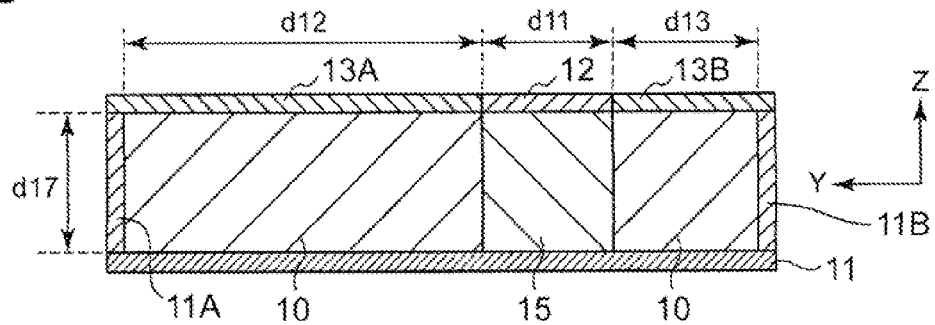
FIG. 91 is a sectional view along a line A6-A6' of FIG. 90.

FIG. 89 is a perspective view showing a configuration of a nonreciprocal transmission line apparatus 70E according to a tenth embodiment of the present invention. FIG. 90 is a perspective view showing a detailed configuration of the unit cell 60E of the transmission line in the nonreciprocal transmission line apparatus 70E of FIG. 89. FIG. 91 is a sectional view along a line A6-A6' of FIG. 90. According to the nonreciprocal transmission line apparatus of the first embodiment, the capacitors C1 and C2 are inserted in series in the microstrip line 12A, and the stub conductors 13A and 13B are branched from the microstrip line 12A. The nonreciprocity of the nonreciprocal transmission line apparatus mainly depends on the lengths of the stub conductors 13A and 13B, and the capacitors C1 and C2 themselves do not contribute to the nonreciprocity. Therefore, even when removing the capacitors C1 and C2 from the nonreciprocal transmission line apparatus of the first embodiment, it is possible to achieve similar effects as those of the first embodiment.

Referring to FIGS. 89 to 91, the nonreciprocal transmission line apparatus 70E is configured by cascade connecting unit cells 60E of the transmission line. The microstrip line 12E is formed as a single strip conductor on the ferrite square rod 15 without capacitors inserted thereto. The ground conductor 11 extends to the +Y side surface of the dielectric substrate 10 (indicated as a ground conductor 11A), and is connected to a stub conductor 13A (short-circuited stub). Similarly, the ground conductor 11 extends to the -Y side surface of the dielectric substrate 10 (indicated as a ground conductor 11B), and is connected to a stub conductor 13B (short-circuited stub). The other portions are configured in a manner similar to that of the nonreciprocal transmission line apparatus 70A of FIG. 13. In the nonreciprocal transmission line apparatus 70E of FIG. 89, the stub conductors 13A and 13B may be connected to the ground conductor 11 as shown in FIG. 13, without providing the ground conductors 11A and 11B. Moreover, the stub conductors 13A and 13B may be configured as open stubs as shown in FIG. 20, without providing the ground conductors 11A and 11B.

Figure 92:
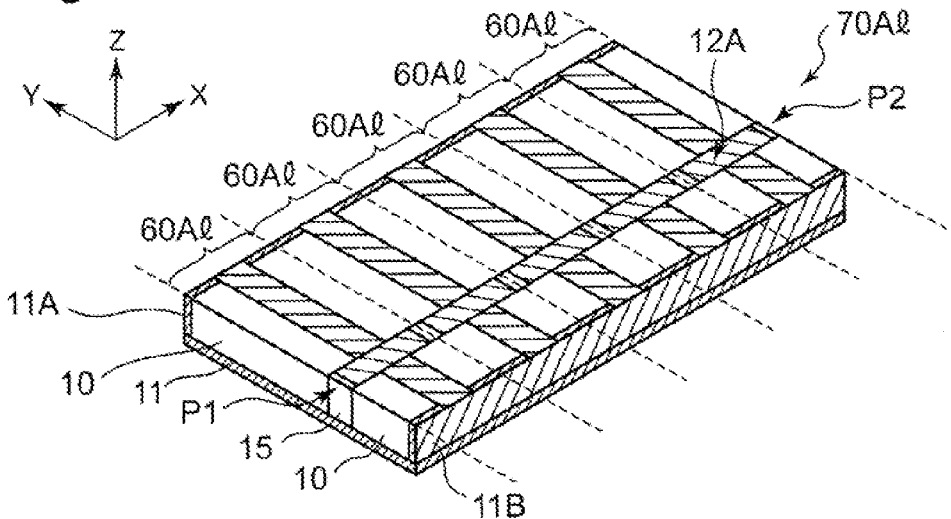
FIG. 92 is a perspective view showing a configuration of a nonreciprocal transmission line apparatus 70Al according to a tenth modified embodiment of the first embodiment of the present invention.
Figure 93:
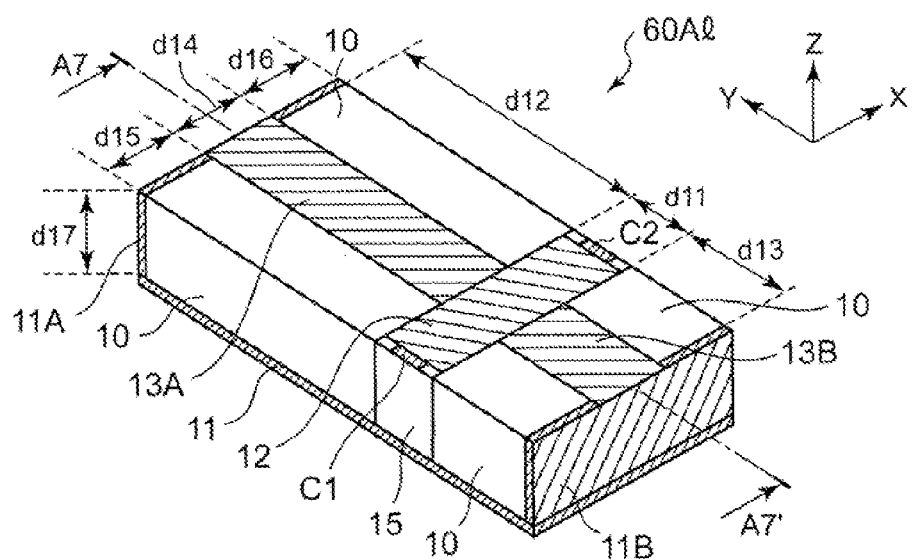
FIG. 93 is a perspective view showing a detailed configuration of the unit cell 60Al of the transmission line in the nonreciprocal transmission line apparatus 70Al of FIG. 92.
Figure 94:
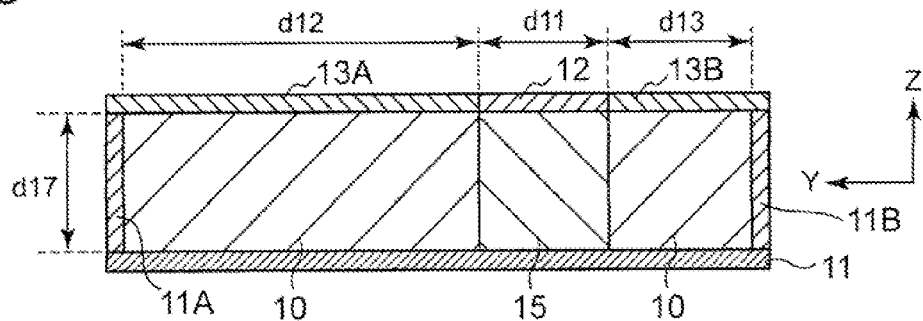
FIG. 94 is a sectional view along a line A7-A7' of FIG. 93.

For the purpose of comparison, FIGS. 92 to 94 show a nonreciprocal transmission line apparatus 70Al according to the tenth modified embodiment of the first embodiment of the present invention. FIG. 92 is a perspective view showing a configuration of a nonreciprocal transmission line apparatus 70Al according to the tenth modified embodiment of the first embodiment of the present invention. FIG. 93 is a perspective view showing a detailed configuration of the unit cell 60Al of the transmission line in the nonreciprocal transmission line apparatus 70Al of FIG. 92. FIG. 94 is a sectional view along a line A7-A7' of FIG. 93. The nonreciprocal transmission line apparatus 70Al of FIG. 92 is configured in a manner similar to that of the nonreciprocal transmission line apparatus 70A of FIG. 13, except that ground conductors 11A and 11B are provided on the +Y side and the -Y side of the dielectric substrate 10, respectively.

Figure 95:
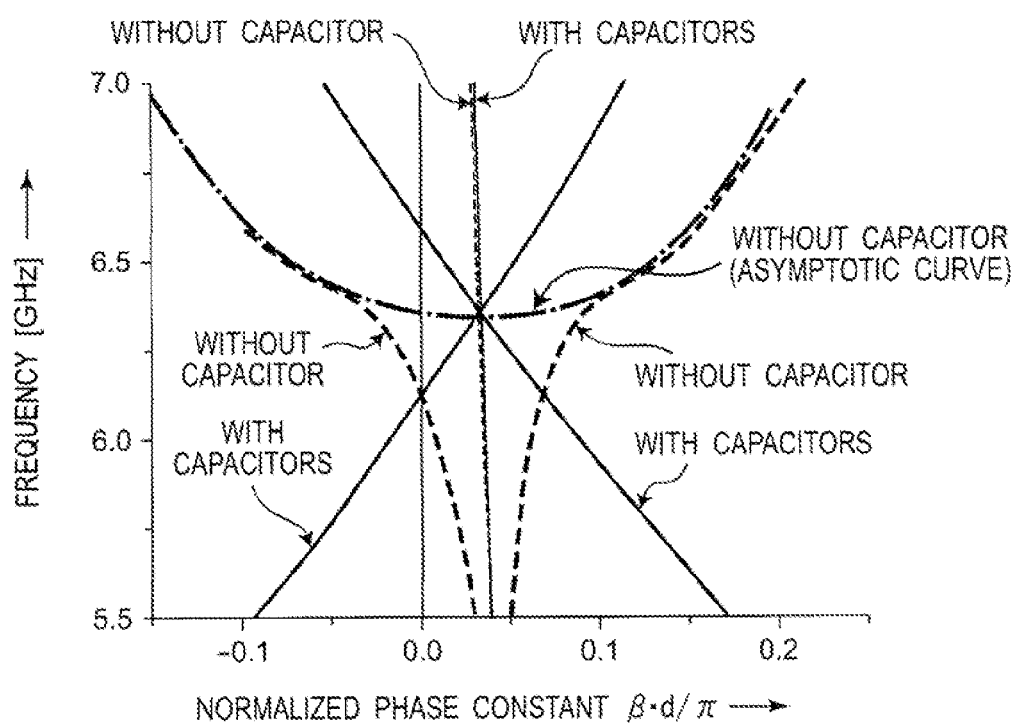
FIG. 95 is a graph showing dispersion curves for the nonreciprocal transmission line apparatus 70E of FIG. 89 (without capacitor) and the nonreciprocal transmission line apparatus 70Al of and FIG. 92 (with capacitors)

FIG. 95 is a graph showing dispersion curves for the nonreciprocal transmission line apparatus 70E of FIG. 89 (without capacitor) and the nonreciprocal transmission line apparatus 70Al of and FIG. 92 (with capacitors). With reference to this graph, we show that the nonreciprocity can be achieved whether or not the capacitors C1 and C2 are provided.

In the simulations of FIG. 95, the following common dimensions for FIGS. 90 and 93 were used: d11=0.8 mm, d12=8.1 mm, d13=2.8 mm, d14=d15=d16=1 mm (therefore, the unit cells 60E and 60Al have a line length d=3 mm), and d17=0.8 mm. The ferrite square rod 15 had relative permittivity 15, saturation magnetization $\mu_0 M_s$=175 mT in the +Z direction, and internal magnetic field $\mu_0 H_0$=50 mT in the +Z direction. A relative permittivity of 2.62 was set for the dielectric substrate 10. The ten unit cells 60E and the ten unit cells 60Al were cascade connected, respectively.

The dispersion curves of FIG. 95 were obtained by converting the phase characteristics of the S parameters in the nonreciprocal transmission line apparatus 70E of FIG. 89 and the nonreciprocal transmission line apparatus 70Al of FIG. 92. The thick dashed lines of FIG. 95 indicate the dispersion curves of the nonreciprocal transmission line apparatus 70E of FIG. 89 (without capacitor), and the thick solid lines of FIG. 95 indicate the dispersion curves of the nonreciprocal transmission line apparatus 70Al of FIG. 92 (with capacitors). Referring to FIG. 95, when the capacitors are provided, the dispersion curves intersect at the frequency 6.4 GHz, and on the other hand, when no capacitor is provided, a cutoff occurs near the same frequency. When no capacitor is provided, an damping mode occurs at and below 6.4 GHz, and it becomes difficult to observe the phase characteristic on the output side. Therefore, the outline of the dispersion curves is shown by a asymptotic curve (long and short chain line) to the thick dashed line.

The thin dashed line of FIG. 95 indicates the average value of the values of two curves indicative of the normalized phase constant $\beta \times d/\pi$ with respect to the frequency, for the dispersion curves obtained when no capacitor is provided (thick dashed line). The thin solid line of FIG. 95 indicates the average value of the values of two curves indicative of the normalized phase constant $\beta \times d/\pi$ with respect to the frequency, for the dispersion curves obtained when the capacitors are provided (thick solid line). A distance from the vertical line of the normalized phase constant $\beta \times d/\pi$=0 to the curves indicative of the average value of the normalized phase constant $\beta \times d/\pi$ (thin dashed line and the thin solid line) indicates the degree of nonreciprocity. Referring to FIG. 95, it is shown that a degree of nonreciprocity is achieved in both the cases without capacitor and with capacitors over the frequency band of the simulations, and both the cases have almost the same degree of nonreciprocity. That is, the nonreciprocity of the nonreciprocal transmission line apparatus 70E of FIG. 89 and the nonreciprocal transmission line apparatus 70Al of FIG. 92 is almost not affected by whether or not the capacitors are inserted in series with the microstrip line.

The nonreciprocal transmission line apparatus 70E of FIG. 89 operates as a left-handed mode transmission line within a range between the vertical line of the normalized phase constant $\beta \times d/\pi$=0 and the curve indicative of the average value of the normalized phase constant $\beta \times d/\pi$ (thin dashed line) in the asymptotic line for the case without capacitor (long and short chain line).

Next, with reference to FIGS. 96 to 100, we show the influences of the combination of the lengths of the stub conductors 13A and 13B of the nonreciprocal transmission line apparatus 70E of FIG. 89, on the nonreciprocity. When determining the combination of the lengths of the stub conductors 13A and 13B, at first, the length of one stub conductor is determined, and then, the length of the other stub conductor is selected so as not to change but continuously maintain almost constant the cutoff frequency corresponding to the shunt resonance of the shunt branch circuit of the nonreciprocal transmission line apparatus 70E (i.e., the frequency corresponding to a zero effective permittivity). In the simulations, the length d12 of the stub conductor 13A was obtained by numerical calculations so that the cutoff frequency was a constant value of 6.4 GHz while changing the length d13 of the stub conductor 13B.

Figure 96:
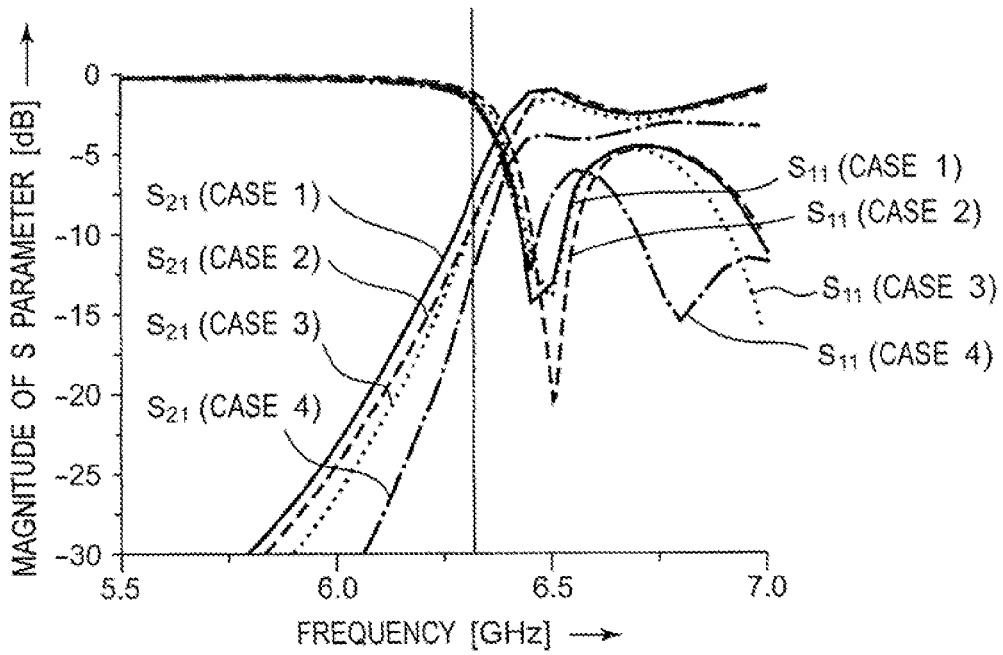
FIG. 96 is a graph showing the frequency characteristics of the S parameter in the nonreciprocal transmission line apparatus 70E of FIG. 89.
Figure 97:
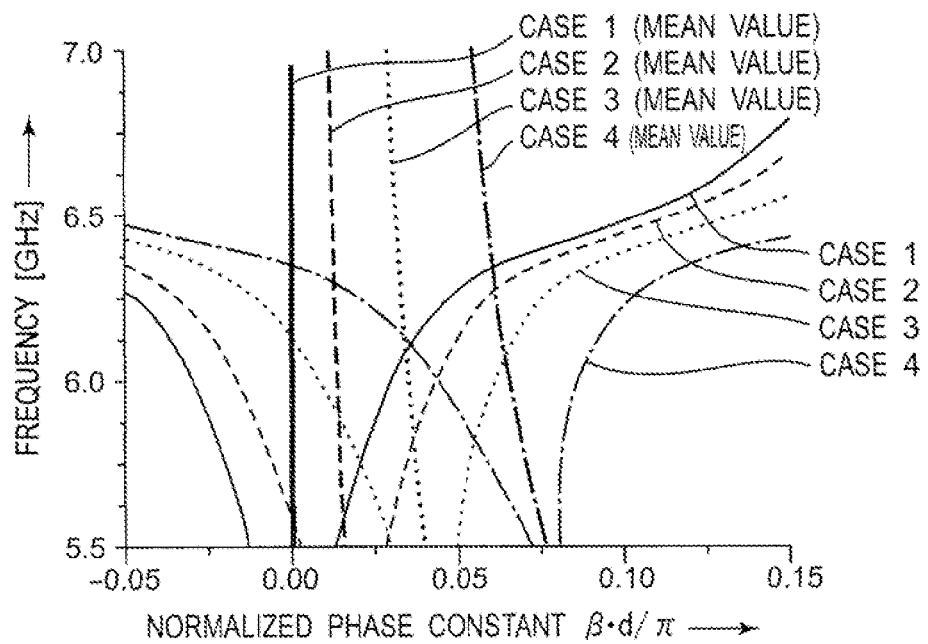
FIG. 97 is a graph showing dispersion curves in the nonreciprocal transmission line apparatus 70E of FIG. 89.

FIG. 96 is a graph showing the frequency characteristics of the S parameter in the nonreciprocal transmission line apparatus 70E of FIG. 89. FIG. 97 is a graph showing dispersion curves in the nonreciprocal transmission line apparatus 70E of FIG. 89. The parameters used in the simulations of FIGS. 96 and 97 are the same as those used in the simulations of FIG. 95, except for the lengths d12 and d13 of the stub conductors 13A and 13B. As the combinations of the lengths d12 and d13 of the stub conductors 13A and 13B, the values in the following cases 1 to 4 were used.

TABLE 1

| Case 1: d12 = 4.7 mm, d13 = 4.7 mm |
| Case 2: d12 = 5.8 mm, d13 = 3.8 mm |
| Case 3: d12 = 8.1 mm, d13 = 2.8 mm |
| Case 4: d12 = 11.2 mm, d13 = 1.9 mm |

As shown in FIG. 96, the nonreciprocal transmission line apparatus 70E has a high-pass characteristic. FIG. 97 shows the dispersion curves, and also shows the average value of the values of two curves indicative of the normalized phase constant $\beta \times d/\pi$ with respect to the frequency, for each of the cases 1 to 4, in a manner similar to that of FIG. 95.

In the case 1, no nonreciprocity appears, because the nonreciprocal transmission line apparatus 70E has a symmetric structure with respect to the plane (XZ plane) composed of the propagation direction and the magnetization direction of the microstrip line 12E. In this case, the dispersion curves are also symmetric with respect to the vertical line of the normalized phase constant $\beta \times d/\pi = 0$.

In addition, in order to fix the cutoff frequency in the nonreciprocal transmission line apparatus 70E having the high pass characteristic, it is necessary to maintain a constant inductance Ltotal as the sum of the inductance La of the stub conductor 13A and the inductance Lb of the stub conductor 13B at this frequency. Since the stub conductors 13A and 13B are connected in parallel, unless the boundary conditions, the electromagnetic field distribution, and the propagation characteristic of the edge guide mode does not significantly change due to changes in their lengths, it is expected that the total inductance Ltotal of the stub conductors 13A and 13B almost satisfies the following relation.

$$1/L\text{total} = 1/La + 1/Lb \quad (37)$$

On the other hand, when a difference between the lengths d12 and d13 of the stub conductors 13A and 13B increases, in general, the inductances La and Lb are significantly different from each other, and the symmetry of the line structure is lost, thus increasing the degree of nonreciprocity of the transmission characteristic. FIG. 96 shows that the cutoff frequency is maintained almost constant even when changing the combinations of the lengths d12 and d13 of the stub conductors 13A and 13B, and on the other hand, FIG. 97 shows that the nonreciprocity is significantly changed.

Figure 98:
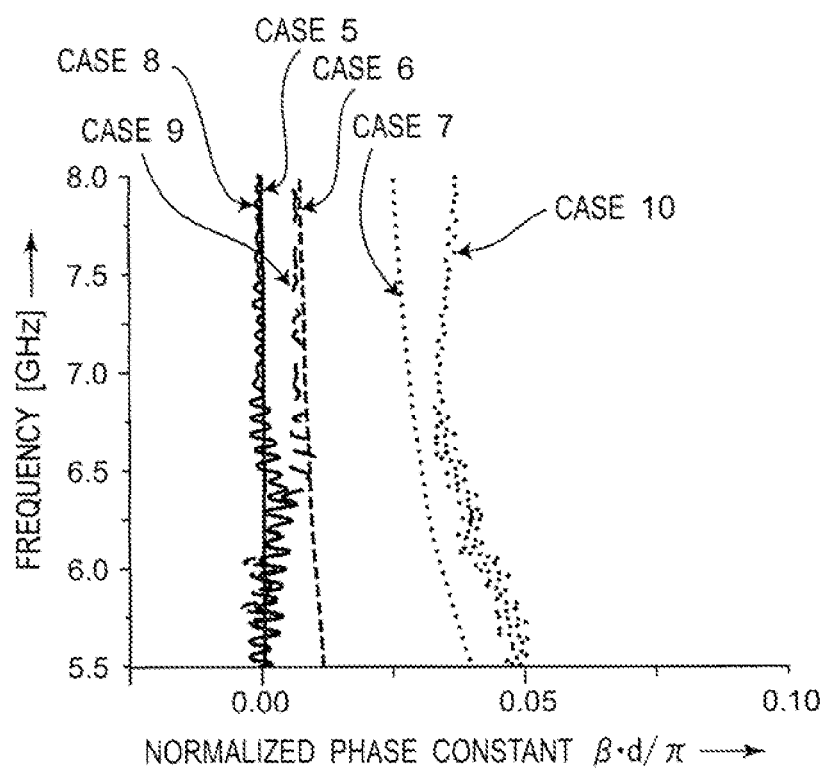
FIG. 98 is a graph showing the average value of the normalized phase constants obtained by simulations and measurements, for the dispersion curves in the nonreciprocal transmission line apparatus 70E of FIG. 89.

FIG. 98 is a graph showing the average value of the normalized phase constants obtained by simulations and measurements, for the dispersion curves in the nonreciprocal transmission line apparatus 70E of FIG. 89. In order to experimentally confirm the simulation results of FIGS. 96 and 97 obtained by numerical calculations, the nonreciprocal transmission line apparatuses 70E each having one of three combinations of the lengths d12 and d13 of the stub conductors 13A and 13B were made as a trial production, and the nonreciprocity of the transmission characteristics was measured. According to the simulations and measurements of FIG. 98, ten unit cells 60E having dimensions of d11=0.8 mm, d14=d15=d16=1 mm, and d17=0.8 mm were cascade connected as the nonreciprocal transmission line apparatus 70E. Polycrystalline yttrium iron garnet (YIG) of a soft magnetic material having dimensions of 0.8 mm×0.8 mm×30 mm was used as a ferrite square rod 15, the ferrite square rod 15 had saturation magnetization $\mu_0 M_s=175$ mT in the +Z direction, and was applied with an external magnetic field $B_{ex}=135$ mT in the +Z direction. As the combinations of the lengths d12 and d13 of the stub conductors 13A and 13B, the values of the following cases 5 to 7 were used in the simulations, and the values of the following cases 8 to 10 were used in the measurements of the trial production.

TABLE 2

| Case 5: d12 = 5.1 mm, d13 = 5.1 mm |
| Case 6: d12 = 5.6 mm, d13 = 4.0 mm |
| Case 7: d12 = 8.1 mm, d13 = 2.9 mm |

TABLE 3

| Case 8: d12 = 5.16 mm, d13 = 5.16 mm |
| Case 9: d12 = 5.57 mm, d13 = 4.03 mm |
| Case 10: d12 = 8.44 mm, d13 = 3.01 mm |

According to FIG. 98, it can be experimentally confirmed that the more the asymmetry of the line structure increases, the more the degree of nonreciprocity appearing in the phase of the transmission characteristic increases. In addition, the simulation results well coincide with the measurement results.

Figure 99:
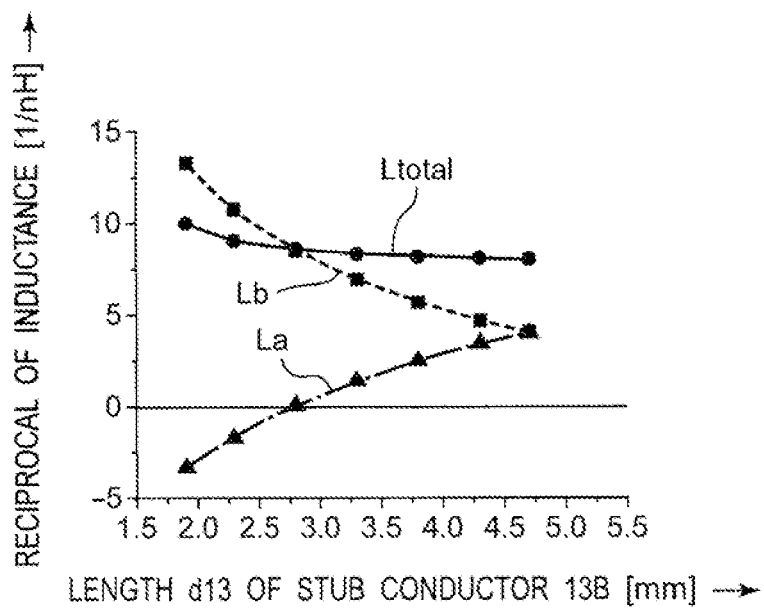
FIG. 99 is a graph showing the simulation results of inductance with respect to the lengths of the stub conductors 13A and 13B in the nonreciprocal transmission line apparatus 70E of FIG. 89.
Figure 100:
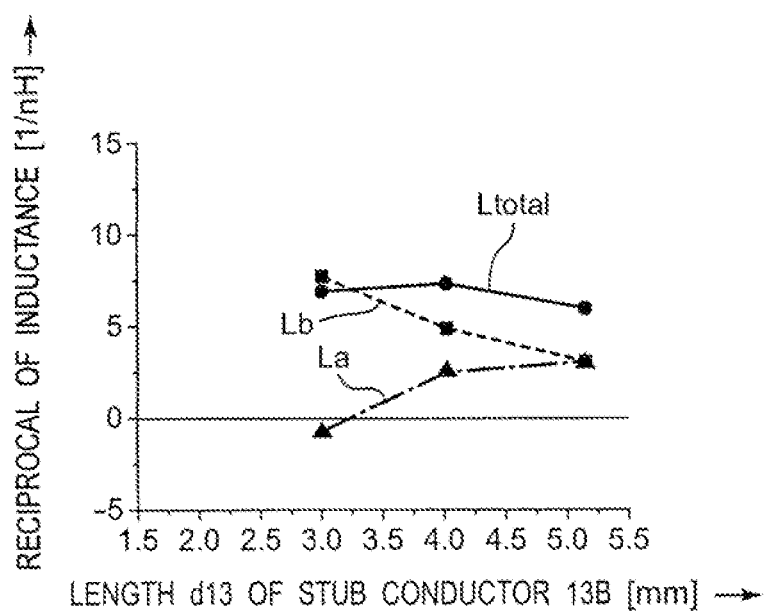
FIG. 100 is a graph showing the measurement results of inductance with respect to the lengths of the stub conductors 13A and 13B in the nonreciprocal transmission line apparatus 70E of FIG. 89.

FIG. 99 is a graph showing the simulation results of inductance with respect to the lengths of the stub conductors 13A and 13B in the nonreciprocal transmission line apparatus 70E of FIG. 89. FIG. 100 is a graph showing the measurement results of inductance with respect to the lengths of the stub conductors 13A and 13B in the nonreciprocal transmission line apparatus 70E of FIG. 89. The graphs of FIGS. 99 and 100 express the inductance La of the stub conductor 13A, the inductance Lb of the stub conductor 13B, and the total inductance Ltotal of the stub conductors 13A and 13B, at the cutoff frequency, as a function of the length d13 of the stub conductor 13B. In the measurement of FIG. 100, the values of the cases 8 to 10 were used, and in the simulations of FIG. 99, the following values were used.

TABLE 4

| d12 = 4.7 mm, d13 = 4.7 mm |
| d12 = 5.1 mm, d13 = 4.3 mm |
| d12 = 5.8 mm, d13 = 3.8 mm |
| d12 = 6.8 mm, d13 = 3.3 mm |
| d12 = 8.1 mm, d13 = 2.8 mm |
| d12 = 9.3 mm, d13 = 2.3 mm |
| d12 = 11.2 mm, d13 = 1.9 mm |

According to the simulation results of FIG. 99, it is shown that the relation of the mathematical formula (37) is almost satisfied. In addition, according to the measurement results of FIG. 100, it is shown that the results exhibit almost the same tendency as those of the simulation results, and satisfies the mathematical formula (37). According to FIG. 99, the inductance Lb of the stub conductor 13B is always positive, and the stub conductor 13B operates as an inductive element. On the other hand, the inductance La of the stub conductor 13A decreases from a positive value to zero, as the length d12 of the stub conductor 13A increases (in FIG. 99, as the length d13 of the stub conductor 13B decreases). Further in a case where d12>8.1 mm (in FIG. 99, in a case where d13<2.8 mm), the length d12 exceeds a half of the guide wavelength, the inductance La changes to a negative value, and the stub conductor 13A operates as a capacitive element.

Referring to FIG. 97 again, the degree of nonreciprocity is larger in the case of using the stub conductors 13A and 13B having lengths d12 and d13 such that one inductance La is negative (i.e., operating as a capacitive element), than in the case of using the stub conductors 13A and 13B having lengths d12 and d13 such that both the inductances La and Lb are positive. This suggests a method for configuring a line structure for increasing the degree of nonreciprocity, and a combination of an inductive stub and a capacitive stub may be used as a candidate line structure. This can be explained also from an analytical results described later.

Figure 101:
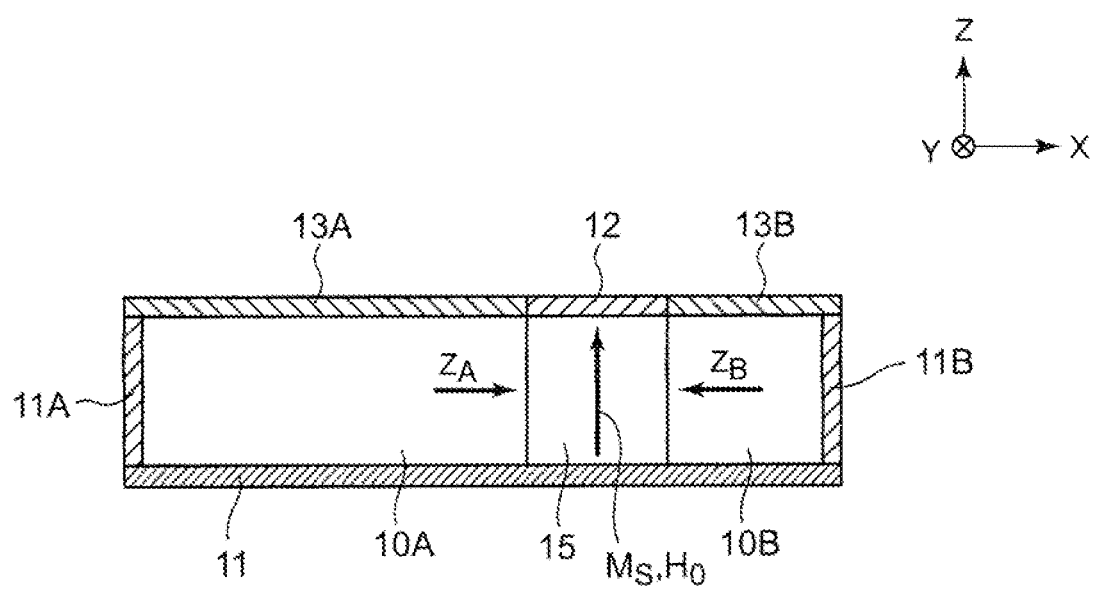
FIG. 101 is a diagram for explaining the boundary conditions of the ferrite square rod 15 of the nonreciprocal transmission line apparatus 70E of FIG. 91.
Figure 102:
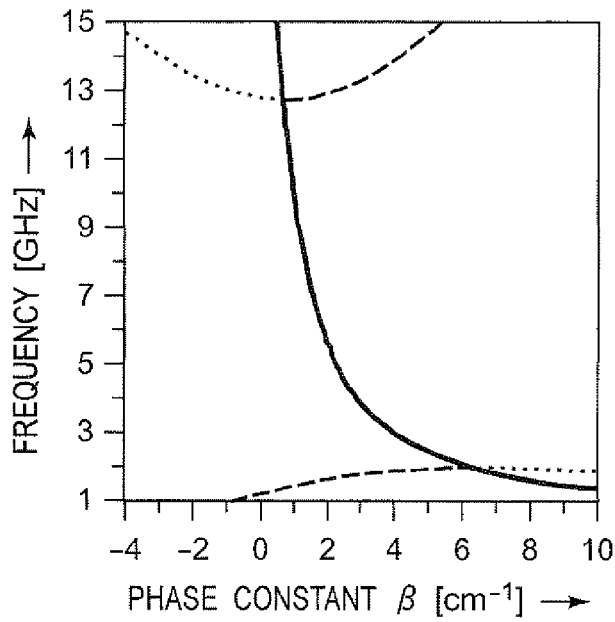
FIG. 102 is a graph showing dispersion curves and the average value of the phase constant obtained by a formulated model of the nonreciprocal transmission line apparatus of FIG. 101.
Figure 103:
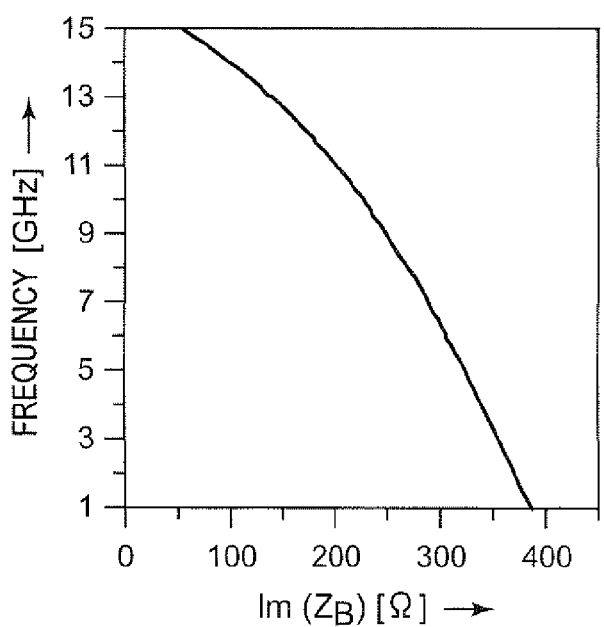
FIG. 103 is a graph showing a frequency characteristic with respect to the impedance $Z_B$ in the nonreciprocal transmission line apparatus of FIG. 101.

Next, with reference to FIGS. 101 to 103, we give a quantitative representation of the degree of nonreciprocity of the nonreciprocal transmission line apparatus 70E of FIG. 89. In FIGS. 95 to 100, the degree of nonreciprocity of the nonreciprocal transmission line apparatus 70E of FIG. 89 was obtained by simulations and measurements. However, it is also possible to approximately formulate the degree of nonreciprocity by using an electromagnetic analysis and an equivalent circuit model.

FIG. 101 is a diagram for explaining the boundary conditions of the ferrite square rod 15 of the nonreciprocal transmission line apparatus 70E of FIG. 91. In FIGS. 101 to 103, for the purpose of explanation, reference is made to a coordinate system different from those used in FIG. 89 and so on. Referring to FIG. 101, reference signs 10A and 10B denote dielectric substrates in the −X direction and the +X direction with respect to the ferrite square rod 15. The nonreciprocity appears because the stub conductors 13A and 13B are asymmetrically inserted with respect to the microstrip line, that is, because the eigenmode exhibits the nonreciprocity as a consequence of asymmetric boundary conditions of the +X side surface and the −X side surface of the ferrite square rod 15 of the microstrip line of FIG. 101 (i.e., asymmetric boundary conditions of the waveguide). Insertion of the stub conductors 13A and 13B having different lengths d12 and d13, or removal of one of the stub conductors 13A and 13B corresponds to giving different impedances $Z_A$ and $Z_B$ as the boundary conditions of the +X side surface and the −X side surface of the ferrite square rod 15 of FIG. 101. An analysis of the nonreciprocal transmission line apparatus 70E of FIG. 91 is summarized as follows.

The permeability tensor of the ferrite square rod 15 having saturation magnetization $M_s$ in the +Z direction and a DC magnetic field $H_0$ in the +Z direction is given as follows.

[Mathematical Expression 47]

$$\hat{\mu} = \mu_o \begin{bmatrix} \mu & j\mu_a & 0 \\ -j\mu_a & \mu & 0 \\ 0 & 0 & 1 \end{bmatrix} \quad (38)$$

$\mu_0$ is the magnetic permeability of vacuum.

It is assumed that "W" denotes the width of the ferrite square rod 15 of FIG. 101 in the X direction, and $Z_A$ and $Z_B$ denote the impedances on the +X side surface and the −X side surface of the ferrite square rod 15 obtained when the dielectric substrates 10A and 10B are seen from the ferrite square rod 15, respectively. The origin is placed on the +X side surface of the ferrite square rod 15, and the microstrip line is formulated as follows.

[Mathematical Expression 48]

$$\begin{cases} x = 0 : E_z = Z_A H_y \\ x = W : E_z = -Z_B H_y \end{cases} \quad (39)$$

The dispersion curve of the eigenmode of propagation along this microstrip line is given as follows.

[Mathematical Expression 49]

$$j \cot(Wk_x) = \frac{-Z_A Z_B (\gamma^2 \mu_a^2 - k_x^2 \mu^2) + \mu^2 \mu_e^2 \mu_o^2 \omega^2}{k_x \mu^2 \mu_e \mu_o \omega (Z_A + Z_B)} - \frac{\gamma \mu_a (Z_A - Z_B)}{k_x \mu (Z_A + Z_B)} \quad (40)$$

$\gamma = \alpha + j\beta$ is a propagation constant of the eigenmode, the real part $\alpha$ of $\gamma$ is an attenuation constant, and the imaginary part $\beta$ of $\gamma$ is a phase constant. In addition, the following notations are used in the mathematical formula (40).

$$k_x^2 = \omega^2 \mu_e \mu_o \varepsilon + \gamma^2 = \omega^2 \mu_e \frac{\varepsilon_r}{c^2} + \gamma^2 \quad \text{[Mathematical Expression 50]}$$

$$\mu_e = (\mu^2 - \mu_a^2)/\mu \quad \text{[Mathematical Expression 51]}$$

$\in_r$ is the relative permittivity of the ferrite square rod 15, and c is the speed of light in vacuum.

In particular, considering a case where no stub conductor is connected to the microstrip line, the electromagnetic wave propagation along the microstrip line can be written under the assumption that magnetic walls are provided on the +X side surface and the −X side surface of the ferrite square rod 15, i.e., $Z_A = Z_B = +\infty$ in Equation (40). In this case, a well-known conventional edge guide mode is written as follows.

[Mathematical Expression 52]

$$\gamma = \pm j \frac{\omega}{c} \sqrt{\mu \varepsilon_r} \quad (41)$$

FIG. 102 is a graph showing dispersion curves and the average value of the phase constant obtained by a formulated model of the nonreciprocal transmission line apparatus of FIG. 101. FIG. 103 is a graph showing a frequency characteristic with respect to the impedance $Z_B$ in the nonreciprocal transmission line apparatus of FIG. 101. The dotted lines and the dashed lines of FIG. 102 indicate the simulated dispersion curves of the eigenmode obtained by numerical calculations using the mathematical formula (40). In the simulations of FIG. 102, it is assumed that a magnetic wall was provided on the −X side surface of the ferrite square rod 15, and the stub conductor 13B (whose end is short-circuited to the ground conductor 11B) as an inductive element was connected to the +X side of the microstrip line, and $Z_A=+\infty$ is substituted in the mathematical formula (40). Due to the asymmetric boundary conditions of the +X side surface and the −X side surface of the ferrite square rod 15, it can be confirmed that the larger degree of nonreciprocity appears in either one of the guided wave mode region and the damping mode region.

In general, it is important to quantitatively formulate the degree of nonreciprocity (i.e., average value of the values of two curves indicative of the phase constants with respect to the frequency, as described above) for design of the nonreciprocal transmission line apparatus. Although derivation is omitted herein, an approximate mathematical formula of the degree of nonreciprocity $\Delta\gamma$ was obtained as follows.

[Mathematical Expression 53]

$$\Delta\gamma = \frac{-\mu_a\left(\frac{1}{Z_A} - \frac{1}{Z_B}\right)}{-\frac{1}{Z_B Z_A}\frac{\mu^2\mu_o\omega}{k_o^2} + \frac{1}{\mu_o\omega} + j\frac{W\mu\left(\frac{1}{Z_A} + \frac{1}{Z_B}\right)}{\sin^2(Wk_o)}} \quad (42)$$

$k_O$ denotes the phase constant of free space. In particular, when a magnetic wall is provided on the −X side surface of the ferrite square rod 15, and $Z_A=+\infty$, the mathematical formula (42) is simplified as follows.

[Mathematical Expression 54]

$$\Delta\gamma = \frac{-j\mu_a\mu_o\omega}{-jZ_B + \mu\mu_o\omega\frac{W}{\sin^2\sqrt{\frac{2W\mu\mu_o\omega}{-2jZ_B + W\mu\mu_o\omega}}}} \quad (43)$$

The solid line of FIG. 102 indicates the degree of the nonreciprocity $\Delta\gamma$ obtained by using the mathematical formula (43). According to FIG. 102, within a frequency range of about 2 GHz to about 13 GHz, the solid line overlaps with the average value of two phase constants expressed by the dotted lines and the dashed lines. Therefore, according to FIG. 102, it is shown that the mathematical formula (43) indicative of the degree of nonreciprocity well coincides with the exact solution directly obtained by numerical calculations from the mathematical formula (40) that is the transcendental equation.

Next, with reference to FIGS. 104 to 108, the nonreciprocity of the nonreciprocal transmission line apparatus is quantitatively formulated in consideration of the periodic structure of the nonreciprocal transmission line apparatus. In the above explanation with reference to FIGS. 101 to 103, the eigenmode analysis and its results are described under the assumption of a uniform structure in the traveling direction of electromagnetic waves. The embodiments of the present invention are the nonreciprocal transmission line apparatuses configured by cascade connecting a plurality of unit cells, and often have a periodicity. Accordingly, a formulation to quantitatively handle the propagation characteristic and the nonreciprocity when the nonreciprocal transmission line apparatus has a periodic structure is summarized below.

Figure 104:
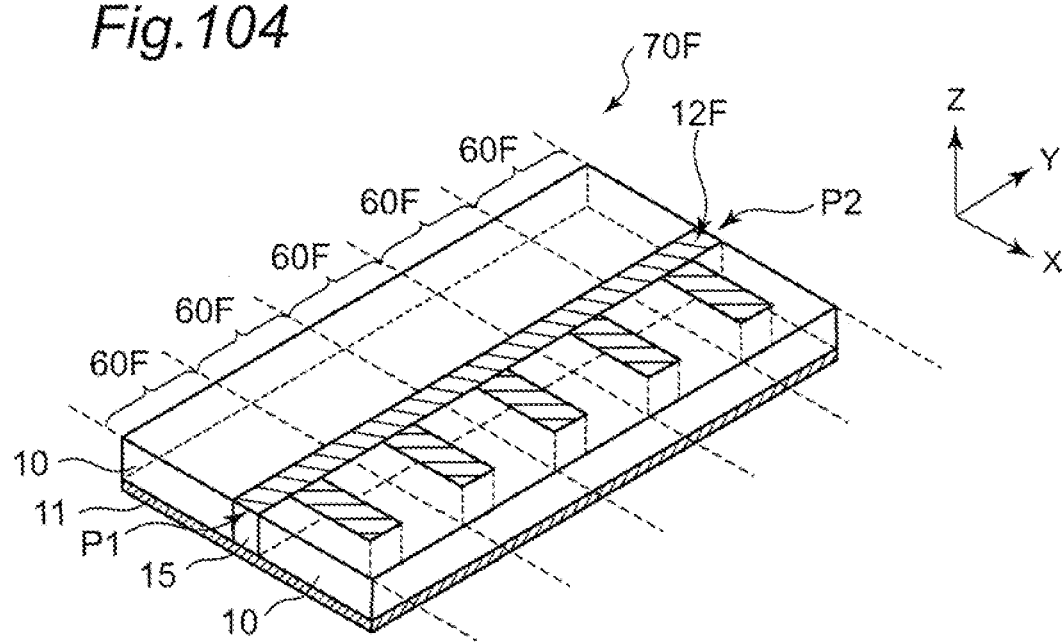
FIG. 104 is a perspective view showing a configuration of a nonreciprocal transmission line apparatus 70F according to a first modified embodiment of the tenth embodiment of the present invention.
Figure 105:
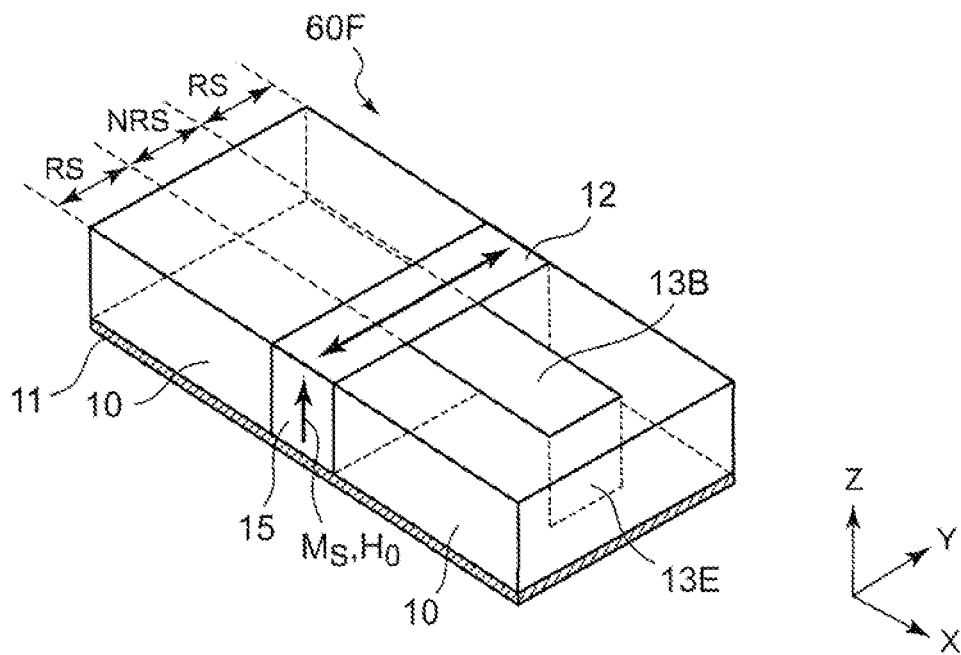
FIG. 105 is a perspective view showing a detailed configuration of the unit cell 60F of the transmission line in the nonreciprocal transmission line apparatus 70F of FIG. 104.

FIG. 104 is a perspective view showing a configuration of a nonreciprocal transmission line apparatus 70F according to a first modified embodiment of the tenth embodiment of the present invention. FIG. 105 is a perspective view showing a detailed configuration of the unit cell 60F of the transmission line in the nonreciprocal transmission line apparatus 70F of FIG. 104. Referring to FIG. 104, the nonreciprocal transmission line apparatus 70F is configured by cascade connecting the unit cells 60F of the transmission line. The microstrip line 12F is formed as a single strip conductor on the ferrite square rod 15 in which no capacitor is inserted, in a manner similar to that of the microstrip line 12E of FIG. 89. While no stub conductor is provided in the −X direction for the microstrip line 12F, stub conductors 13B are provided only in the +X direction for the microstrip line 12F. The stub conductor 13B is short-circuited to the ground conductor 11 by a through-hole conductor 13E penetrating the dielectric substrate 10. As shown in FIG. 105, each unit cell 60F includes a nonreciprocal section (NRS) and a reciprocal section (RS) along the propagation direction of electromagnetic waves (direction along the Y axis). In the nonreciprocal section, since the stub conductor 13B is provided only in the +X direction for the microstrip line 12F, the nonreciprocity transmission characteristic appears. On the other hand, in the reciprocal section, since no stub conductor is provided in both the −X direction and the +X direction of the microstrip line 12F, the transmission characteristic is reciprocal. Thus, the nonreciprocal transmission line apparatus 70F has a periodic structure including the nonreciprocal sections and the reciprocal sections.

Figure 106:
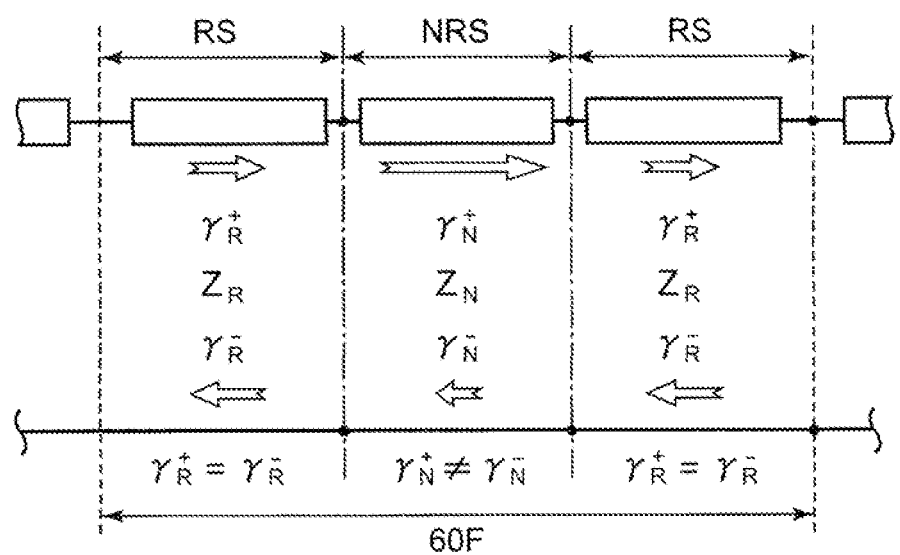
FIG. 106 is a diagram showing the equivalent circuit of the unit cell 60F of the transmission line in the nonreciprocal transmission line apparatus 70F of FIG. 104.

FIG. 106 is a diagram showing the equivalent circuit of the unit cell 60F of the transmission line in the nonreciprocal transmission line apparatus 70F of FIG. 104. $\gamma$ is a propagation constant ($\gamma=\alpha+j\beta$), superscripts of "+" and "−" indicate the forward direction and the backward direction, respectively, and the subscripts of "N" and "R" indicate the nonreciprocal section and the reciprocal section, respectively. In the nonreciprocal section, a forward propagation constant $\gamma_N^+$ and a backward propagation constant $\gamma_N^-$ are different from each other. In the reciprocal section, a forward propagation constant $\gamma_R^+$ and a backward propagation constant $\gamma_R^-$ are equal to each other. Moreover, $Z_R$ denotes the characteristic impedance of the reciprocal section, and $Z_N$ denotes the characteristic impedance of the nonreciprocal section.

The ABCD matrix of the nonreciprocal section is given as follows.

[Mathematical Expression 55]

$$F_{NRS} = e^{\frac{\Delta\gamma_N}{2}l_N}\begin{bmatrix} \cos(j\bar{\gamma}_N l_N) - j\frac{\Delta Z_N \sin(j\bar{\gamma}_N l_N)}{2\bar{Z}_N} & -j\bar{Z}_N\left(1 - \frac{\Delta Z_N^2}{4\bar{Z}_N^2}\right)\sin(j\gamma_N l_N) \\ -j\frac{\sin(j\gamma_N l_N)}{\bar{Z}_N} & \cos(j\gamma_N l_N) + j\frac{\Delta Z_N \sin(j\bar{\gamma}_N l_N)}{2\bar{Z}_N} \end{bmatrix} \quad (44)$$

$l_N$ denotes the length in the Y direction of the nonreciprocal section. Further, in the mathematical formula (44), the following notations are used together with the aforementioned subscripts "N" and "R".

$$\bar{\gamma} = \frac{\gamma^+ + \gamma^-}{2}$$ [Mathematical Expression 56]

$$\frac{\Delta\gamma}{2} = \left[\frac{\gamma^+ - \gamma^-}{2}\right]$$ [Mathematical Expression 57]

$$\bar{Z} = \frac{Z^+ + Z^-}{2}$$ [Mathematical Expression 58]

$$\Delta Z = Z^+ - Z^-$$ [Mathematical Expression 59]

$$\gamma^+ = \alpha^+ + j\beta^+$$ [Mathematical Expression 60]

$$\gamma^- = \alpha^- + j\beta^-$$ [Mathematical Expression 61]

On the other hand, the ABCD matrix of the reciprocal section is given as follows.

[Mathematical Expression 62]

$$F_{RS} = \begin{bmatrix} \cos(j\gamma_R l_R) & -jZ_R \sin(j\gamma_R l_R) \\ -j\frac{1}{Z_R}\sin(j\gamma_R l_R) & \cos(j\gamma_R l_R) \end{bmatrix} \quad (45)$$

$l_R$ denotes the length of the reciprocal section in the Y direction.

Therefore, the ABCD matrix of the whole unit cell 60F is given as follows.

[Mathematical Expression 63]

$$F_{Cell} = F_{RS} F_{NRS} F_{RS} = \begin{bmatrix} A_{Cell} & B_{Cell} \\ C_{Cell} & D_{Cell} \end{bmatrix} \quad (46)$$

Therefore, the dispersion curves of the whole of the nonreciprocal transmission line apparatus 70F is given as follows.

[Mathematical Expression 64]

$$\cosh\left(\gamma_a d - \frac{1}{2}\Delta\gamma_N l_N\right) = \cos m_N \cos m_R + R^+ \sin m_N \sin m_R \quad (47)$$

$\gamma_a$ denotes a propagation constant of the mode of propagation along the periodic structure, and "d" denotes the period length of the unit cell 60F. In addition, the following notations are used in the mathematical formula (47).

$$m_R = 2j\gamma_R l_R$$ [Mathematical Expression 65]

$$m_N = j\bar{\gamma}_N l_N$$ [Mathematical Expression 66]

$$R^+ = \frac{\Delta Z_N^2 - 4(\bar{Z}_N^2 + Z_R^2)}{8\bar{Z}_N Z_R}$$ [Mathematical Expression 67]

As readily understood from the mathematical formula (47), $\gamma_a \times d - \Delta\gamma_N \times l_N/2$ indicative of a deviation between the axis of symmetry of the dispersion curves and the ω axis means the nonreciprocity of the phase characteristic, and its magnitude indicates a product of a ratio of the nonreciprocal line section of the periodic structure and the magnitude.

Figure 107:
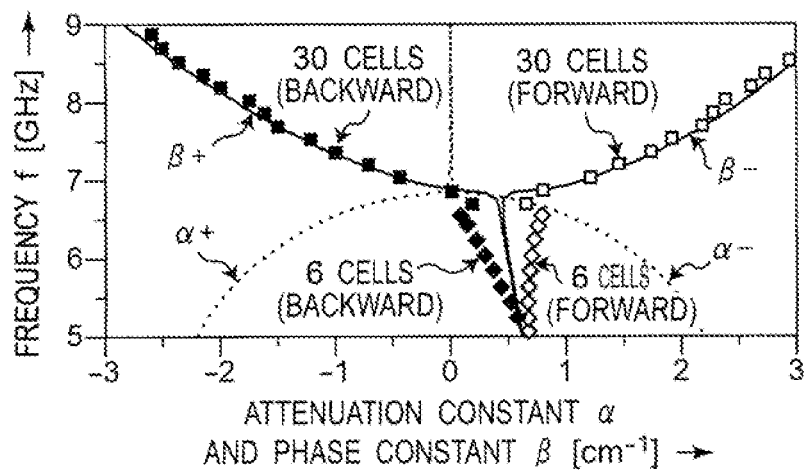
FIG. 107 is a graph showing the dispersion curves in the nonreciprocal transmission line apparatus 70F of FIG. 104.
Figure 108:
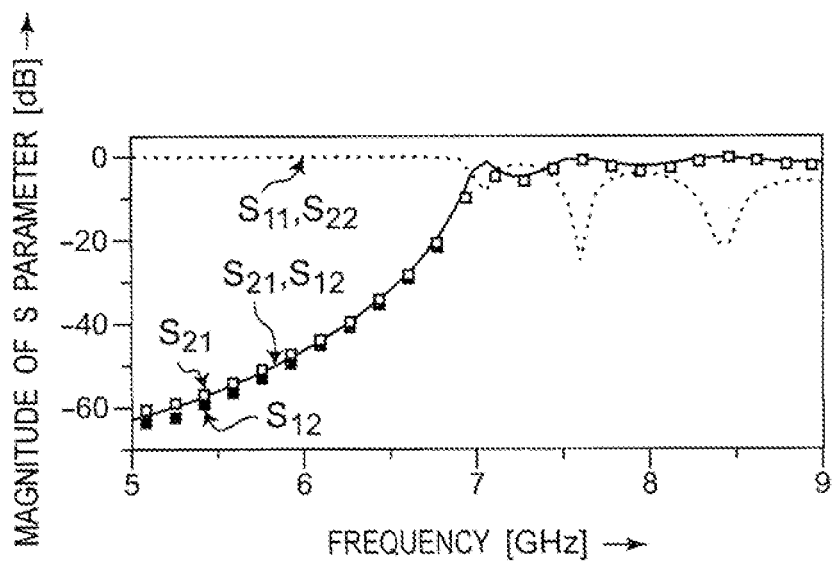
FIG. 108 is a graph showing the frequency characteristic of the S parameter in the nonreciprocal transmission line apparatus 70F of FIG. 104.

FIG. 107 is a graph showing the dispersion curves in the nonreciprocal transmission line apparatus 70F of FIG. 104. FIG. 108 is a graph showing the frequency characteristic of the S parameter in the nonreciprocal transmission line apparatus 70F of FIG. 104. The dotted line and the solid line of FIG. 107 indicate the simulation results of the dispersion curves obtained by numerical calculations using the mathematical formula (47). In FIG. 107, the dotted line indicates a forward attenuation constant $\alpha^+$ and a backward attenuation constant $\alpha^-$, and the solid line indicates a forward phase constant $\beta_+$ and a backward phase constant $\beta_-$. FIG. 107 also shows the results of electromagnetic field simulations using the finite element method, in order to indicate the effectiveness of the method for representing a circuit model by combinations of the aforementioned analytical solutions and the transmission line model. The electromagnetic field simulations using the finite element method are done for a case of six unit cells and a case of 30 unit cells. Referring to FIG. 107, white squares indicate the forward phase constants, and black squares indicate the backward phase constants. In addition, the dotted line and the solid line of FIG. 108 indicate the S parameters obtained by numerical calculations. The dotted line indicates the parameters $S_{11}$ and $S_{22}$ of the reflection coefficients, and the solid line indicates the parameters $S_{21}$ and $S_{12}$ of the transmission coefficients. FIG. 108 also shows the results of electromagnetic field simulations using the finite element method. Referring to FIG. 108, white squares indicate the parameter $S_{21}$ of the forward transmission coefficients, and black squares indicate the parameter $S_{12}$ of the backward transmission coefficients. According to FIGS. 107 and 108, it is shown that the circuit model of the combinations of the analytical solutions and the transmission line model well coincides with the results of the electromagnetic field simulations using the finite element method.

Figure 109:
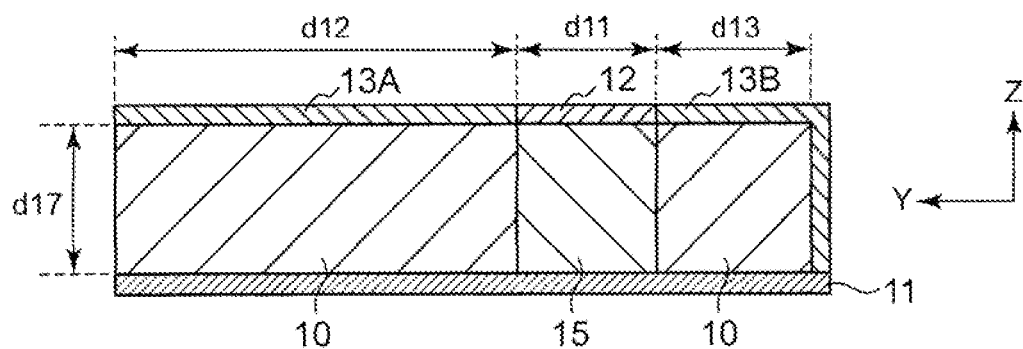
FIG. 109 is a sectional view showing a configuration of a nonreciprocal transmission line apparatus according to a second modified embodiment of the tenth embodiment of the present invention.

FIG. 109 is a sectional view showing a configuration of a nonreciprocal transmission line apparatus according to a second modified embodiment of the tenth embodiment of the present invention. As described above, the degree of nonreciprocity is larger in the case of using the stub conductors 13A and 13B having lengths d12 and d13 such that one inductance is negative (i.e., operating as a capacitive element), than in the case of using the stub conductors 13A and 13B having lengths d12 and d13 such that both the inductances are positive. Therefore, as shown in FIG. 109, one stub conductor 13A is operated as a capacitive element, by configuring one stub conductor 13A as an open stub, configuring the other stub conductor 13B as a short-circuited stub, setting the length d12 of the stub conductor 13A as the open stub longer than, for example, a half of the guide wavelength, and shortening the length d13+d17 of the stub conductor 13B as the short-circuited stub. By configuring the stub conductors 13A and 13B as shown in FIG. 109, it is possible to increase the degree of nonreciprocity of the nonreciprocal transmission line apparatus. The configuration of FIG. 109 is applicable to a nonreciprocal transmission line apparatus including the capacitors inserted in series in a manner similar to that of the first embodiment (FIG. 13), and also applicable to a nonreciprocal transmission line apparatus including no capacitor inserted in series in a manner similar to that of the tenth embodiment (FIG. 89).

Figure 110:
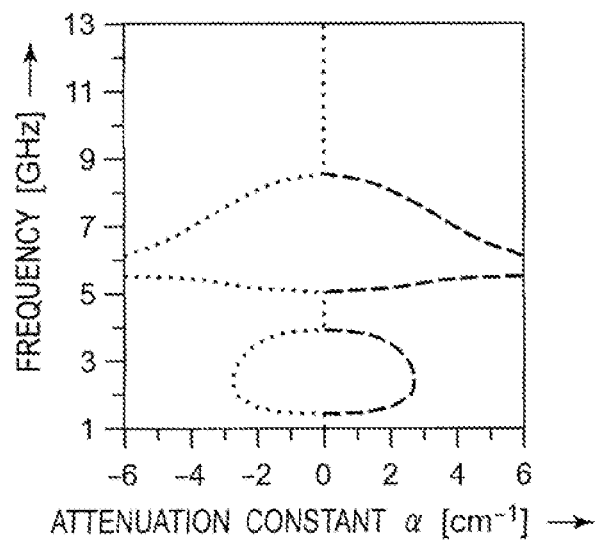
FIG. 110 is a graph showing the attenuation constant of the nonreciprocal transmission line apparatus of FIG. 109.
Figure 111:
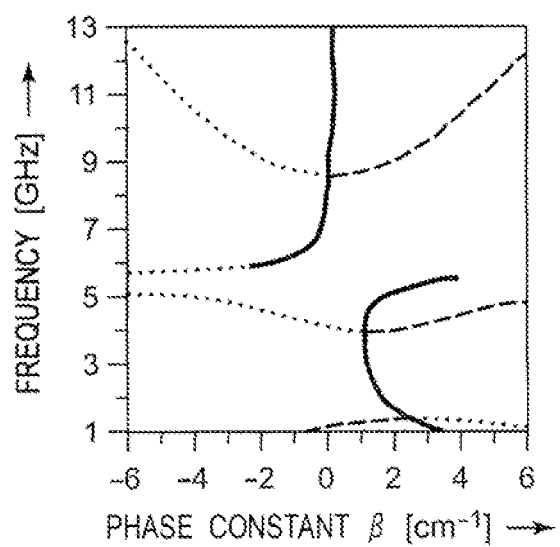
FIG. 111 is a graph showing the phase constant of the nonreciprocal transmission line apparatus of FIG. 109.
Figure 112:
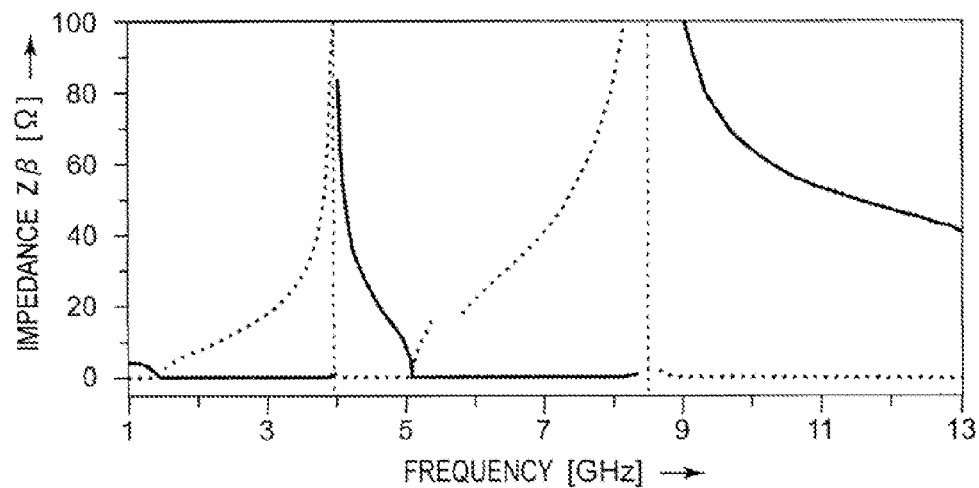
FIG. 112 is a graph showing the frequency characteristic of the Bloch impedance of the nonreciprocal transmission line apparatus of FIG. 109.
Figure 113:
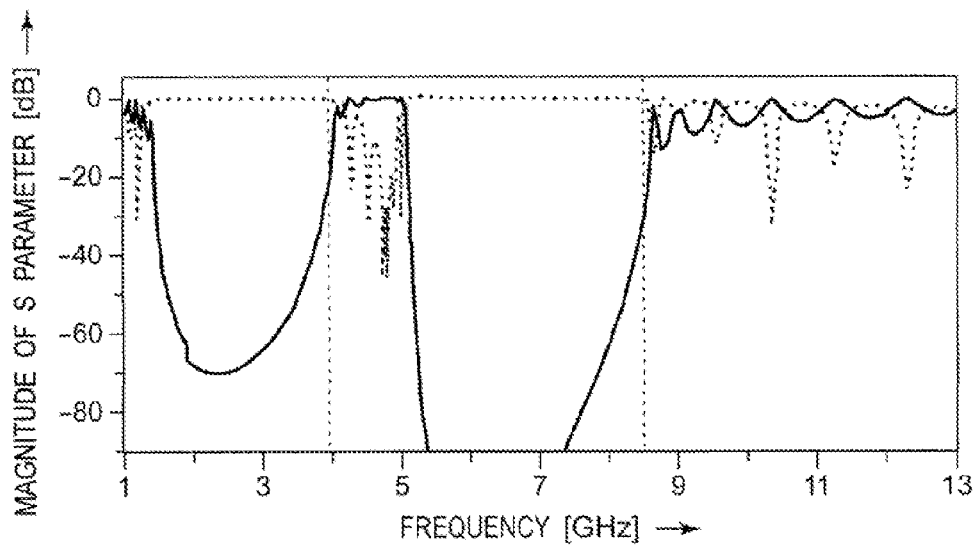
FIG. 113 is a graph showing the frequency characteristic of the S parameter of the nonreciprocal transmission line apparatus of FIG. 109.

FIG. 110 is a graph showing the attenuation constant of the nonreciprocal transmission line apparatus of FIG. 109. FIG. 111 is a graph showing the phase constant of the nonreciprocal transmission line apparatus of FIG. 109. FIG. 112 is a graph showing the frequency characteristic of the Bloch impedance of the nonreciprocal transmission line apparatus of FIG. 109. FIG. 113 is a graph showing the frequency characteristic of the S parameter of the nonreciprocal transmission line apparatus of FIG. 109. FIGS. 110 to 113 show the simulation results of an example configured so that one of the stub conductors 13A and 13B has a negative impedance (i.e., operating as a capacitive element). According to FIGS. 110 to 113, it is shown that the nonreciprocal transmission line apparatus of FIG. 109 has a large degree of nonreciprocity.

When capacitors are inserted in series to the nonreciprocal transmission line apparatus in a manner similar to that of the first embodiment, for example, when chip capacitors are mounted between the strip conductors, a variation due to the implementation may occur. Therefore, according to the nonreciprocal transmission line apparatus including no capacitor inserted in series in a manner similar to that of the tenth embodiment, it is possible to eliminate the variation due to the implementation, and simplify its manufacture.

Although the second to ninth embodiments are described with reference to the nonreciprocal transmission line apparatus of the first embodiment (i.e., the nonreciprocal transmission line apparatus including the capacitive elements in the series branch), the nonreciprocal transmission line apparatus of the tenth embodiment may be combined with the second to ninth embodiments.

Eleventh Embodiment

Figure 114:
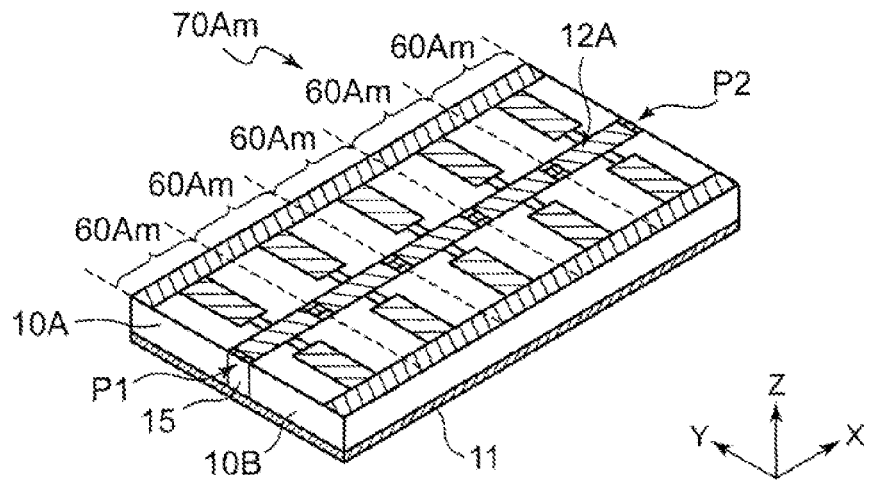
FIG. 114 is a perspective view showing a configuration of a nonreciprocal transmission line apparatus 70Am according to an eleventh embodiment of the present invention.
Figure 115:
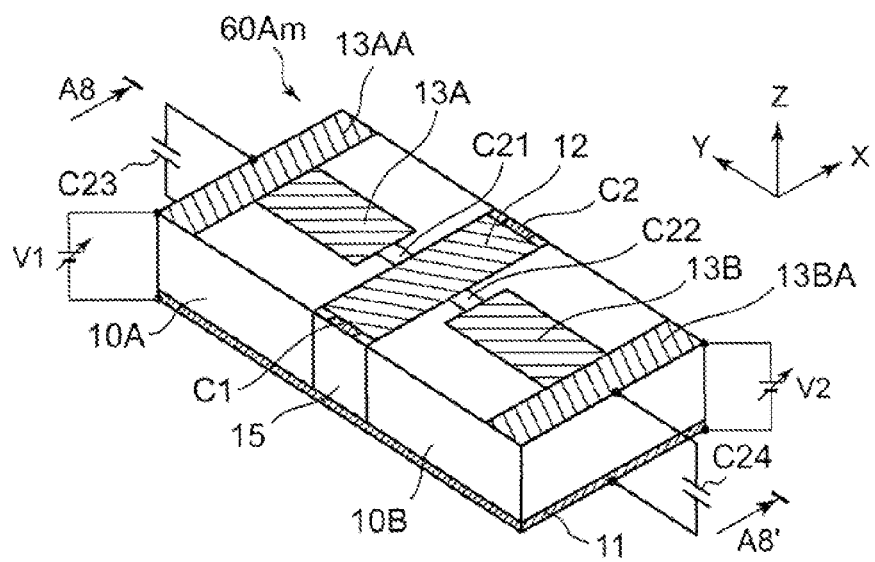
FIG. 115 is a perspective view showing a detailed configuration of a unit cell 60Am of the transmission line in the nonreciprocal transmission line apparatus 70Am of FIG. 114.
Figure 116:
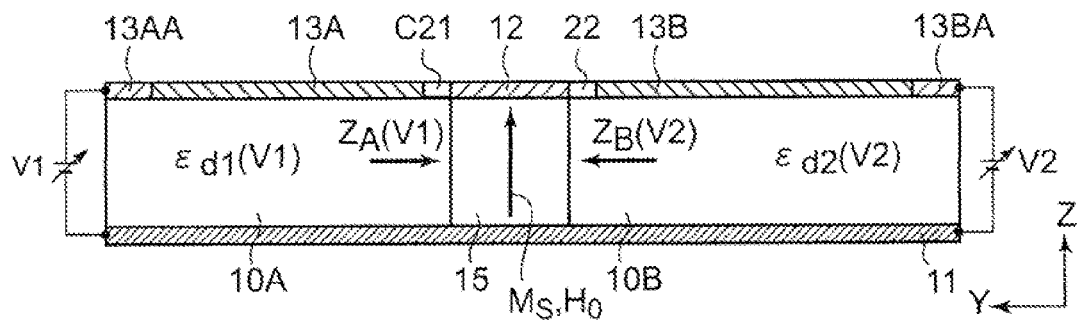
FIG. 116 is a sectional view along a line A8-A8' of FIG. 115.
Figure 117:
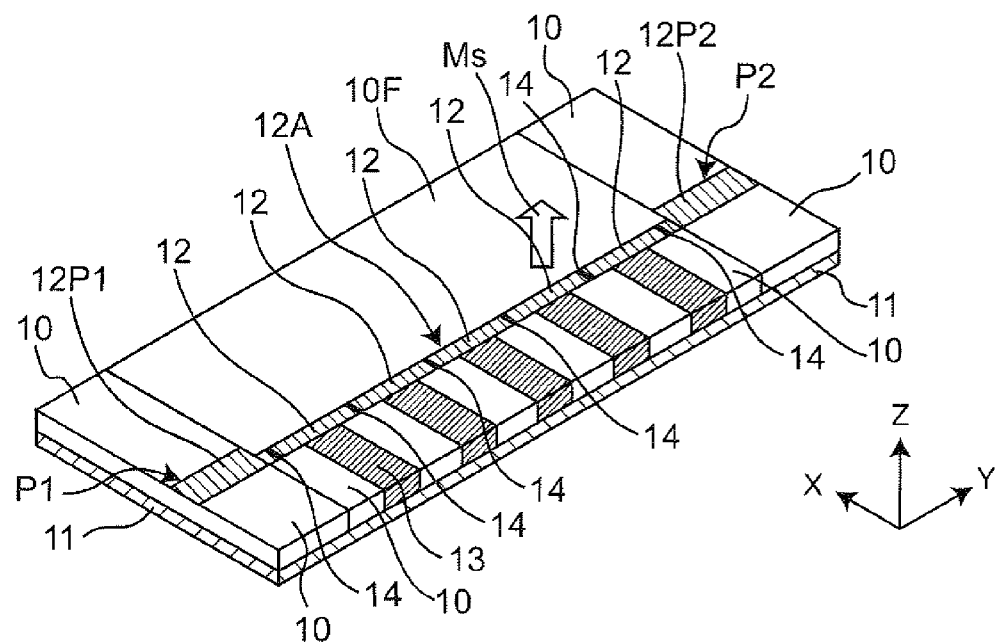
FIG. 117 is a perspective view of a configuration of a conventional nonreciprocal transmission line apparatus.

FIG. 114 is a perspective view showing a configuration of a nonreciprocal transmission line apparatus 70Am according to an eleventh embodiment of the present invention. FIG. 115 is a perspective view showing a detailed configuration of a unit cell 60Am of the transmission line in the nonreciprocal transmission line apparatus 70Am of FIG. 114. FIG. 116 is a sectional view along a line A8-A8' of FIG. 115. A method for achieving the asymmetric line structure of the nonreciprocal transmission line apparatus 70Am is limited neither to changing the lengths of the stub conductors 13A and 13B (FIG. 14 and so on), nor using the phase shifters inserted in the stub conductors 13A and 13B (FIG. 23 and so on). According to the eleventh embodiment, the asymmetric line structure is achieved by applying a voltage to the dielectric substrate.

Referring to FIGS. 114 to 116, the dielectric substrates 10A and 10B provided on both the +Y side and the −Y side of the ferrite square rod 15 on the ground conductor 11 are made of ferroelectric material. The permittivities $\in_{d1}(V1)$ and $\in_{d2}(V2)$ of the dielectric substrates 10A and 10B are respectively changed, by forming electrodes 13AA and 13BA on the dielectric substrates 10A and 10B, respectively, applying a DC voltage V1 between the electrode 13AA and the ground conductor 11 by a variable voltage source, and applying a DC voltage V2 between the electrode 13BA and the ground conductor 11 by another variable voltage source. In the example of FIGS. 114 to 116, the electrode 13AA is connected to the stub conductor 13A, and the electrode 13BA is connected to the stub conductor 13B. Therefore, in order to prevent the microwave signal passing through the microstrip line 12A from flowing to the stub conductors 13A and 13B and prevent the DC currents from the variable voltage sources V1 and V2 from flowing to the microstrip line 12A, a capacitor C21 is inserted between the strip conductor 12 and the stub conductor 13A, and a capacitor C22 is inserted between the strip conductor 12 and the stub conductor 13B. Further, a capacitor C23 is connected between the electrode 13AA and the ground conductors 11, and a capacitor C24 is connected between the electrode 13BA and the ground conductor 11.

The permittivity $\in_{d1}(V1)$ of the dielectric substrate 10A changes by applying the variable DC voltage V1 between the electrode 13AA and the ground conductors 11, and therefore, the impedance $Z_A(V1)$ on the +Y side surface of the ferrite square rod 15 when the dielectric substrate 10A is seen from the ferrite square rod 15 also changes. Similarly, the permittivity $\in_{d2}(V2)$ of the dielectric substrate 10B changes by applying a variable DC voltage V2 between the electrode 13BA and the ground conductor 11, and therefore, the impedance $Z_B(V2)$ on the −Y side surface of the ferrite square rod 15 when the dielectric substrate 10B is seen from the ferrite square rod 15 also changes. According to the nonreciprocal transmission line apparatus 70Am of FIG. 114, it is possible to set the impedances $Z_A(V1)$ and $Z_B(V2)$ to different values from each other, by changing the DC voltages V1 and V2 applied to the dielectric substrates 10A and 10B according to the required degree of nonreciprocity, and achieve the asymmetric line structure due to the difference of the impedances.

The permittivities $\in_{d1}(V1)$ and $\in_{d2}(V2)$ are changed by changing the DC voltages V1 and V2 applied to the dielectric substrates 10A and 10B, and as a result, the input impedances of the stub conductors 13A and 13B (short-circuited stub, open stub, or stub to which a load impedance component is connected) are also changed. Depending on the change in the input impedance, the stub conductors 13A and 13B are not only selectively operable as short-circuited stubs or open stubs, but also operable as inductive elements or capacitive elements. The input impedances of the stub conductors 13A and 13B change by changing the DC voltages V1 and V2 applied to the dielectric substrates 10A and 10B, and as a result, the forward and the backward characteristic impedances and the forward and the backward phase constants of the microstrip line 12A are also changed.

A ferroelectric substance, a piezoelectric substance and the like can be used as material for the dielectric substrates 10A and 10B, since it is only necessary the stub conductors 13A and 13B have input impedances variable by applying the DC voltages V1 and V2.

In the example of FIGS. 114 to 116, the electrodes 13AA and 13BA are connected to the stub conductors 13A and 13B, respectively. However, the electrodes 13AA and 13BA may not be connected to the stub conductors 13A and 13B, respectively.

INDUSTRIAL APPLICABILITY

According to the present invention, it is possible to provide a nonreciprocal transmission line apparatus capable of achieving an asymmetric line structure based on a novel principle, and controlling the nonreciprocity with a small power consumption. Moreover, according to the present invention, it is possible to provide an antenna apparatus provided with such a nonreciprocal transmission line apparatus.

According to the present invention, it is possible to change the degree of nonreciprocity of the nonreciprocal transmission line apparatus by changing a voltage applied to the phase shifter of the nonreciprocal transmission line apparatus, and thus, it is possible to provide a steerable antenna apparatus having a variable radiation angle.

According to the present invention, it is possible to provide a transmission line resonator operable as a novel zeroth-order traveling wave resonator capable of achieving a series resonance state and a shunt resonance state, and further achieving their mixed state.

The antenna apparatus of an embodiment of the present invention is not limited to the transmitter and receiver antenna for information communications in the microwave range, but may be used as, for example, a wireless power transmission antenna.

REFERENCES SIGNS LIST 10, 10A, 10B, 17: dielectric substrate;
11, 11A, 11B, 18: ground conductor;
12, 12C, 12D: strip conductor;
12A, 12E, 12F: microstrip line;

12B, 12P1, 12P1a, 12P1b, 12P2, 12PsA: strip conductor;
12F: feed line conductor;
12S1, 12S2: through-hole conductor;
13A, 13B: stub conductor;
13AA, 13BA: electrode;
13C to 13E: through-hole conductor;
15, 15A: ferrite square rod;
16: ferrite substrate;
19: dielectric layer;
20: controller;
21A, 21B: phase shifter;
30: magnetic field generator;
40: microwave signal generator;
41: power divider;
42, 44: variable attenuator;
43, 45: phase shifter;
46: switch;
50: controller;
60A to 60F, 60A-1 to 60A-M: unit cell of transmission line;
61, 62, 63: transmission line part;
70A to 70F: nonreciprocal transmission line apparatus;
71, 72, 73-1 to 73-N, 74, 75, 76, 77: transmission line;
81: microwave signal generator;
82: transformer;
82a: primary coil;
82b: secondary coil;
82c: shunt inductor;
100: composite right/left-handed transmission line (CRLHTL);
101, 101A, 102, 102A, 111, 112, 121, 122, 123, 131 to 132: transmission line;
120: microwave signal generator;
125: feed line;
141b: directional coupler;
141ba, 141bb: microstrip line;
151c, 152a: varactor diode;
151d, 151e, 152b: inductor;
141: feed line;
141a, 141c, 151a, 151b-1, 151b-3, 151b-4, 152-2, 152-3, 152-4: microstrip line;
151, 152: terminating load;
151R, 152R: reflective element;
151RA, 151RB, 151RC, 152RA, 152RB: reflective circuit;
153, 154: phase shifter;
200: received power detector;
300, 300A, 300B: controller;
400: wireless receiver;
C, C1, C2, C21, C22, C23, C24: capacitor;
Cc1 to CcM+1, Cc-1 to Cc-N, C11 to C14: coupling capacitor;
L, L1, L2: inductor;
P1, P2, P3, P4, P5, P6, P7-1 to P7-N, P11, P12, P21, P22, P23: port;
Q1: field-effect transistor (FET);
R1, R2: load resister;
SW1, SW2, SW3, SW11, SW12, SW21, SW22: switch;
$UC_1, UC_2, \ldots, UC_N$: unit cell; and
V1, V2: variable voltage source.

The invention claimed is:

1. A nonreciprocal transmission line apparatus having forward and backward propagation constants different from each other,
wherein the nonreciprocal transmission line apparatus comprises a cascade connection of at least one unit cell between first and second ports, each of the at least one unit cell comprises a transmission line part for a microwave signal, and first and second shunt branch circuits, and each of the first and second shunt branch circuits is branched from the transmission line part and equivalently include an inductive element,
wherein each of the at least one unit cell has spontaneous magnetization or is magnetized by an external magnetic field so as to have gyrotropy by being magnetized in a magnetization direction different from a propagation direction of the transmission line part, and
wherein in each of the at least one unit cell, the first shunt branch circuit is formed on one side with respect to a plane composed of the propagation direction and the magnetization direction, and the second shunt branch circuit is formed on the other side with respect to the plane, and an impedance of the first shunt branch circuit seen from the transmission line part is different from an impedance of the second shunt branch circuit seen from the transmission line part.

2. The nonreciprocal transmission line apparatus as claimed in claim 1,
wherein each of the at least one unit cell further comprises a series branch circuit inserted in series with the transmission line part and equivalently including a capacitive element.

3. The nonreciprocal transmission line apparatus as claimed in claim 1,
wherein each of the at least one unit cell comprises:
a magnetic material substrate having first and second surfaces; and
a ground conductor provided on the first surface of the magnetic material substrate, and
wherein the transmission line part, and the first and second shunt branch circuits are provided on the second surface of the magnetic material substrate.

4. The nonreciprocal transmission line apparatus as claimed in claim 1,
wherein the first and second shunt branch circuits are stub conductors having electrical lengths different from each other.

5. The nonreciprocal transmission line apparatus as claimed in claim 1,
wherein the first and second shunt branch circuits are stub conductors, each stub conductor including a phase shifter, and the impedances of the first and second shunt branch circuits are changed by controlling voltages applied to the phase shifters.

6. The nonreciprocal transmission line apparatus as claimed in claim 1,
wherein the first and second shunt branch circuits are short-circuited stubs.

7. The nonreciprocal transmission line apparatus as claimed in claim 1,
wherein the first and second shunt branch circuits are open stubs.

8. The nonreciprocal transmission line apparatus as claimed in claim 1,
wherein the transmission line part of each of the at least one unit cell is a microstrip line.

9. The nonreciprocal transmission line apparatus as claimed in claim 1,
wherein a propagation constant and an operating frequency are set in dispersion curves indicative of a relation between propagation constants and operating frequencies, so that forward power transmission occurs as right-handed transmission and backward power transmission occurs as left-handed transmission at a predetermined operating frequency.

10. The nonreciprocal transmission line apparatus as claimed in claim 1,
wherein a propagation constant and an operating frequency are set in dispersion curves indicative of a relation between propagation constants and operating frequencies, so that forward power transmission occurs as left-handed or right-handed transmission and backward power transmission occurs with zero propagation constant and infinite guide wavelength at a predetermined operating frequency.

11. The nonreciprocal transmission line apparatus as claimed in claim 1,
wherein the nonreciprocal transmission line apparatus is a microwave phase shifter for shifting a phase by a predetermined amount of phase shift, the microwave phase shifter being configured by setting a propagation constant and an operating frequency in dispersion curves indicative of a relation between propagation constants and operating frequencies.

12. The nonreciprocal transmission line apparatus as claimed in claim 1,
wherein the capacitive element is a microwave element having a negative effective permeability for an electromagnetic wave mode propagation along the transmission line, and the inductive element is a microwave element a negative effective permittivity for the electromagnetic wave mode of propagation through the transmission line.

13. The nonreciprocal transmission line apparatus as claimed in claim 1, wherein each of the at least one unit cell comprises:
a ground conductor; and
a magnetic rod provided between the transmission line part and the ground conductor.

14. The nonreciprocal transmission line apparatus as claimed in claim 13,
wherein each of the at least one unit cell further comprises:
a first dielectric substrate provided between the first shunt branch circuit and the ground conductor;
a first electrode provided on a surface of the first dielectric substrate, the surface being opposite to the ground conductor;
a second dielectric substrate provided between the second shunt branch circuit and the ground conductor; and
a second electrode provided on a surface of the second dielectric substrate, the surface being opposite to the ground conductor, and
wherein the impedances of the first and second shunt branch circuits are changed by controlling a first voltage applied between the first electrode and the ground conductor, and controlling a second voltage applied between the second electrode and the ground conductor.

15. The nonreciprocal transmission line apparatus as claimed in claim 1,
wherein the nonreciprocal transmission line apparatus operates as a microwave resonator,
wherein each unit cell of the nonreciprocal transmission line apparatus has such a circuit configuration that the nonreciprocal transmission line apparatus has a predetermined phase constant in dispersion curves indicative of a relation between an operating frequency of a microwave signal inputted to the nonreciprocal transmission line apparatus and a phase constant of the nonreciprocal transmission line apparatus,
wherein the nonreciprocal transmission line apparatus further comprises:
a first reflective impedance circuit connected to the first port, and having a first impedance seen from the first port at a predetermined operating frequency, and
a second reflective impedance circuit connected to the second port, and having a second impedance seen from the second port at the operating frequency,
wherein the first impedance is a complex number having substantially no real part, and
wherein the second impedance is a complex number having substantially no real part and substantially conjugate with the first impedance.

16. The nonreciprocal transmission line apparatus as claimed in claim 15,
wherein each unit cell of the nonreciprocal transmission line apparatus has such a circuit configuration that the nonreciprocal transmission line apparatus has such a propagation constant in the dispersion curves that forward power transmission occurs as right-handed transmission and backward power transmission occurs as left-handed transmission at the operating frequency.

17. The nonreciprocal transmission line apparatus as claimed in claim 15,
wherein each unit cell of the nonreciprocal transmission line apparatus has such a circuit configuration that the nonreciprocal transmission line apparatus has such a propagation constant in the dispersion curves that forward power transmission occurs as left-handed transmission and backward power transmission occurs as right-handed transmission at the operating frequency.

18. The nonreciprocal transmission line apparatus as claimed in claim 15,
wherein each unit cell of the nonreciprocal transmission line apparatus has such a circuit configuration that the nonreciprocal transmission line apparatus has such a propagation constant in the dispersion curves that both forward and backward power transmissions occur with the microwave signal having zero phase constant at the operating frequency.

19. The nonreciprocal transmission line apparatus as claimed in claim 15,
wherein the capacitive element is a microwave element having a negative effective permeability for an electromagnetic wave mode propagation along the transmission line, and the inductive element is a microwave element a negative effective permittivity for the electromagnetic wave mode of propagation through the transmission line.

20. The nonreciprocal transmission line apparatus as claimed in claim 9,
wherein the nonreciprocal transmission line apparatus is a microwave resonator satisfying $\beta_+ = -\beta_- \neq 0$, where $\beta_+$ denotes the forward propagation constant as a first mode, and $\beta_-$ denotes the backward propagation constant as a second mode.

21. The nonreciprocal transmission line apparatus as claimed in claim 20, further comprising a coupling transmission line provided to be coupled to the nonreciprocal transmission line apparatus,
wherein the nonreciprocal transmission line apparatus is operable as a microwave filter.

22. The nonreciprocal transmission line apparatus as claimed in claim 20, further comprising a negative resistance element provided to be coupled to the nonreciprocal transmission line apparatus,
wherein the nonreciprocal transmission line apparatus is operable as a microwave oscillator.

23. The nonreciprocal transmission line apparatus as claimed in claim 20, further comprising a feeding transmission line provided to be coupled to the nonreciprocal transmission line apparatus, wherein the nonreciprocal transmission line apparatus is operable as a microwave antenna apparatus.

24. The nonreciprocal transmission line apparatus as claimed in claim 20, further comprising:

a feeding transmission line provided to be coupled to the nonreciprocal transmission line apparatus, and a plurality of branching transmission lines provided to be coupled to the nonreciprocal transmission line apparatus, wherein the nonreciprocal transmission line apparatus is operable as a microwave power divider.

25. An antenna apparatus comprising a nonreciprocal transmission line apparatus having forward and backward propagation constants different from each other, wherein the nonreciprocal transmission line apparatus comprises a cascade connection of at least one unit cell between first and second ports, each of the at least one unit cell comprises a transmission line part for a microwave signal, and first and second shunt branch circuits, and each of the first and second shunt branch circuits is branched from the transmission line part and equivalently include an inductive element, wherein each of the at least one unit cell has spontaneous magnetization or is magnetized by an external magnetic field so as to have gyrotropy by being magnetized in a magnetization direction different from a propagation direction of the transmission line part, and wherein in each of the at least one unit cell, the first shunt branch circuit is formed on one side with respect to a plane composed of the propagation direction and the magnetization direction, and the second shunt branch circuit is formed on the other side with respect to the plane, and an impedance of the first shunt branch circuit seen from the transmission line part is different from an impedance of the second shunt branch circuit seen from the transmission line part, wherein the transmission line part of each of the at least one unit cell is a microstrip line, wherein, when a microwave signal propagates in a predetermined propagation direction of the nonreciprocal transmission line apparatus at a predetermined operating frequency, the nonreciprocal transmission line apparatus radiates an electromagnetic wave with a radiation pattern having a main beam of a leaky wave in a direction substantially the same as the propagation direction, and radiates an electromagnetic wave with a radiation pattern having a main beam of a leaky wave in a direction substantially opposite to or substantially perpendicular to the propagation direction, wherein the antenna apparatus further comprises:

a controller being configured to: input a microwave signal to at least one of a first port and a second port of the nonreciprocal transmission line apparatus, make the nonreciprocal transmission line apparatus operate as a forward transmission line or a backward transmission line at a predetermined operating frequency, and control at least one of an amplitude and a phase of the inputted microwave signal using nonreciprocity of the nonreciprocal transmission line apparatus, so as to form a main beam including a leaky wave from the nonreciprocal transmission line apparatus as a radiation wave.

26. The antenna apparatus as claimed in claim 25, wherein the controller is configured to: input the microwave signal to the first port and the second port of the nonreciprocal transmission line apparatus, and control at least one of the amplitude and the phase of the inputted microwave signal, so as to form the main beam of the radiation wave.

27. The antenna apparatus as claimed in claim 25, wherein the controller is configured to: input the microwave signal to the first port, control at least one of the amplitude and the phase of the inputted microwave signal, and reflect a forward wave at the second port, so as to form the main beam of the radiation wave.

28. The antenna apparatus as claimed in claim 25, wherein the controller is configured to: input the microwave signal to the second port, control at least one of the amplitude and the phase of the inputted microwave signal, and reflect a backward wave at the first port, so as to form the main beam of the radiation wave.

29. The antenna apparatus as claimed in claim 25, wherein the controller is configured to: selectively input the microwave signal to the first port and the second port of the nonreciprocal transmission line apparatus, and control at least one of the amplitude and the phase of the inputted microwave signal, so as to form the main beam of the radiation wave.

30. An antenna apparatus comprising a nonreciprocal transmission line apparatus having forward and backward propagation constants different from each other, wherein the nonreciprocal transmission line apparatus comprises a cascade connection of at least one unit cell between first and second ports, each of the at least one unit cell comprises a transmission line part for a microwave signal, and first and second shunt branch circuits, and each of the first and second shunt branch circuits is branched from the transmission line part and equivalently include an inductive element, wherein each of the at least one unit cell has spontaneous magnetization or is magnetized by an external magnetic field so as to have gyrotropy by being magnetized in a magnetization direction different from a propagation direction of the transmission line part, and wherein in each of the at least one unit cell, the first shunt branch circuit is formed on one side with respect to a plane composed of the propagation direction and the magnetization direction, and the second shunt branch circuit is formed on the other side with respect to the plane, and an impedance of the first shunt branch circuit seen from the transmission line part is different from an impedance of the second shunt branch circuit seen from the transmission line part, wherein the nonreciprocal transmission line apparatus operates as a microwave resonator, wherein each unit cell of the nonreciprocal transmission line apparatus has such a circuit configuration that the nonreciprocal transmission line apparatus has a predetermined phase constant in dispersion curves indicative of a relation between an operating frequency of a microwave signal inputted to the nonreciprocal transmission line apparatus and a phase constant of the nonreciprocal transmission line apparatus, wherein the nonreciprocal transmission line apparatus further comprises:

a first reflective impedance circuit connected to the first port, and having a first impedance seen from the first port at a predetermined operating frequency, and a second reflective impedance circuit connected to the second port, and having a second impedance seen from the second port at the operating frequency, wherein the first impedance is a complex number having substantially no real part, and wherein the second impedance is a complex number having substantially no real part and substantially conjugate with the first impedance, wherein the antenna apparatus further comprises a feeding circuit connected to one of the first reflective impedance circuit and the second reflective impedance circuit, the feeding circuit being configured to supply a microwave signal to the nonreciprocal transmission line apparatus.

31. An antenna apparatus comprising a nonreciprocal transmission line apparatus having forward and backward propagation constants different from each other, wherein the nonreciprocal transmission line apparatus comprises a cascade connection of at least one unit cell between first and second ports, each of the at least one unit cell comprises a transmission line part for a microwave signal, and first and second shunt branch circuits, and each of the first and second shunt branch circuits is branched from the transmission line part and equivalently include an inductive element, wherein each of the at least one unit cell has spontaneous magnetization or is magnetized by an external magnetic field so as to have gyrotropy by being magnetized in a magnetization direction different from a propagation direction of the transmission line part, and wherein in each of the at least one unit cell, the first shunt branch circuit is formed on one side with respect to a plane composed of the propagation direction and the magnetization direction, and the second shunt branch circuit is formed on the other side with respect to the plane, and an impedance of the first shunt branch circuit seen from the transmission line part is different from an impedance of the second shunt branch circuit seen from the transmission line part, wherein the nonreciprocal transmission line apparatus operates as a microwave resonator, wherein each unit cell of the nonreciprocal transmission line apparatus has such a circuit configuration that the nonreciprocal transmission line apparatus has a predetermined phase constant in dispersion curves indicative of a relation between an operating frequency of a microwave signal inputted to the nonreciprocal transmission line apparatus and a phase constant of the nonreciprocal transmission line apparatus, wherein the nonreciprocal transmission line apparatus further comprises:

a first reflective impedance circuit connected to the first port, and having a first impedance seen from the first port at a predetermined operating frequency, and a second reflective impedance circuit connected to the second port, and having a second impedance seen from the second port at the operating frequency, wherein the first impedance is a complex number having substantially no real part, and wherein the second impedance is a complex number having substantially no real part and substantially conjugate with the first impedance, wherein the antenna apparatus further comprises a feeding circuit connected to one of the first reflective impedance circuit and the second reflective impedance circuit, the feeding circuit being configured to output a microwave signal received by the nonreciprocal transmission line apparatus.

32. The antenna apparatus as claimed in claim 31, wherein the first and second shunt branch circuits includes a phase shifter, and impedances of the first and second shunt branch circuits are changed by controlling voltages applied to the phase shifters, and wherein the changes in the impedances of the first and second shunt branch circuits result in a change in the radiation direction of the antenna apparatus.

33. The antenna apparatus as claimed in claim 31, wherein the first reflective impedance circuit comprises a first impedance adjuster being configured to change the first impedance, wherein the second reflective impedance circuit comprises a second impedance adjuster being configured to change the second impedance, wherein the antenna apparatus further comprises:

a received power detector being configured to detect a received power of the outputted microwave signal, and a controller being configured to control the first and second impedance adjuster so as to maximize the received power based on the detected received power, and wherein the changes in the first and second impedances result in a change in the polarization direction of the antenna apparatus.

34. The antenna apparatus as claimed in claim 33, wherein the first and second impedances change discretely.

35. The antenna apparatus as claimed in claim 33, wherein the first and second impedances change continuously.

36. The antenna apparatus as claimed in claim 35, wherein each of the first and second reflective impedance circuits comprises a varactor diode and an inductor.

37. The antenna apparatus as claimed in claim 35, wherein each of the first and second reflective impedance circuits comprises a phase shifter and a transmission line.

* * * * *